(12) United States Patent
Li et al.

(10) Patent No.: US 12,414,338 B2
(45) Date of Patent: Sep. 9, 2025

(54) NANOSTRUCTURE FET AND METHOD OF FORMING SAME

(71) Applicant: Taiwan Semiconductor Manufacturing Co., Ltd., Hsinchu (TW)

(72) Inventors: Yi-Yun Li, Hsinchu (TW); Tsai-Yu Huang, Taoyuan (TW); Li-Ting Wang, Hsinchu (TW); Huicheng Chang, Tainan (TW); Yee-Chia Yeo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 470 days.

(21) Appl. No.: 17/663,290

(22) Filed: May 13, 2022

(65) Prior Publication Data
US 2023/0114216 A1   Apr. 13, 2023

Related U.S. Application Data

(60) Provisional application No. 63/254,787, filed on Oct. 12, 2021.

(51) Int. Cl.
*H10D 30/69* (2025.01)
*B82Y 10/00* (2011.01)
(Continued)

(52) U.S. Cl.
CPC ....... *H10D 30/794* (2025.01); *H10D 30/6735* (2025.01); *H10D 62/118* (2025.01);
(Continued)

(58) Field of Classification Search
CPC ............ H10D 30/794; H10D 30/6735; H10D 62/118; H10D 64/017; H10D 64/258;
(Continued)

(56) References Cited

U.S. PATENT DOCUMENTS 9,209,247 B2   12/2015   Colinge et al.
9,236,267 B2   1/2016    De et al.
(Continued)

FOREIGN PATENT DOCUMENTS

KR    20180018426 A    2/2018
KR    20210084206 A    7/2021
(Continued)

*Primary Examiner* — Herve-Louis Y Assouman
(74) *Attorney, Agent, or Firm* — Slater Matsil, LLP

(57) ABSTRACT

A semiconductor device and a method of forming the same are provided. A method includes forming a fin structure on a substrate. The fin structure includes a plurality of first nanostructures and a plurality of second nanostructures alternately stacked. A dummy gate is formed along sidewalls and a top surface of the fin structure. A portion of the fin structure exposed by the dummy gate is recessed to form a first recess. An epitaxial source/drain region is formed in the first recess. Dopant atoms within the epitaxial source/drain region are driven into the plurality of second nanostructures. The dummy gate and the plurality of first nanostructures are removed. A replacement gate is formed wrapping around the plurality of second nanostructures.

20 Claims, 108 Drawing Sheets

(51) Int. Cl.
  *H10D 30/01* (2025.01)
  *H10D 30/43* (2025.01)
  *H10D 30/67* (2025.01)
  *H10D 62/10* (2025.01)
  *H10D 62/13* (2025.01)
  *H10D 62/822* (2025.01)
  *H10D 64/01* (2025.01)
  *H10D 64/23* (2025.01)
  *H10D 64/62* (2025.01)
  *H10D 84/85* (2025.01)

(52) U.S. Cl.
  CPC ......... *H10D 64/017* (2025.01); *H10D 64/258* (2025.01); *H10D 64/62* (2025.01)

(58) Field of Classification Search
  CPC .. H10D 64/62; H10D 64/252; H10D 84/0188; H10D 84/144; H10D 84/201; H10D 84/903; H10D 64/117; B82Y 10/00
  See application file for complete search history.

(56) References Cited

U.S. PATENT DOCUMENTS

| | | | |
|---|---|---|---|
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 9,842,835 B1* | 12/2017 | Cheng | H10D 30/6744 |
| 2003/0199145 A1* | 10/2003 | Noguchi | H01L 21/324 |
| | | | 257/E21.409 |
| 2017/0222007 A1 | 8/2017 | Colinge | |
| 2017/0323949 A1* | 11/2017 | Loubet | H10D 30/014 |
| 2018/0047832 A1 | 2/2018 | Tapily et al. | |
| 2019/0067122 A1* | 2/2019 | Cheng | H01L 21/30604 |
| 2019/0131396 A1* | 5/2019 | Zhang | H01L 29/0673 |
| 2020/0357931 A1 | 11/2020 | Lee et al. | |
| 2021/0066452 A1 | 3/2021 | Liaw | |
| 2021/0134952 A1 | 5/2021 | Fung | |
| 2021/0202697 A1 | 7/2021 | Young et al. | |
| 2021/0234047 A1 | 7/2021 | Tsai et al. | |
| 2021/0273096 A1 | 9/2021 | Yang et al. | |
| 2021/0313419 A1 | 10/2021 | Lee et al. | |

FOREIGN PATENT DOCUMENTS

| | | |
|---|---|---|
| KR | 20210095989 A | 8/2021 |
| TW | 201740565 A | 11/2017 |
| TW | 202133271 A | 9/2021 |

* cited by examiner

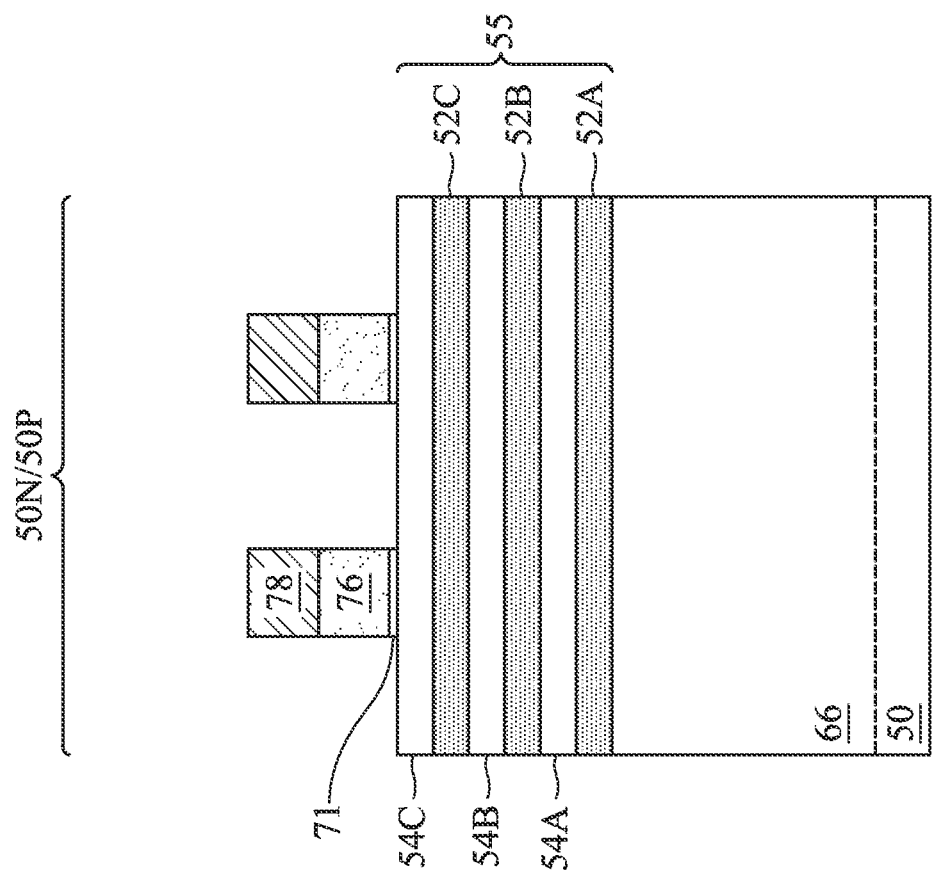
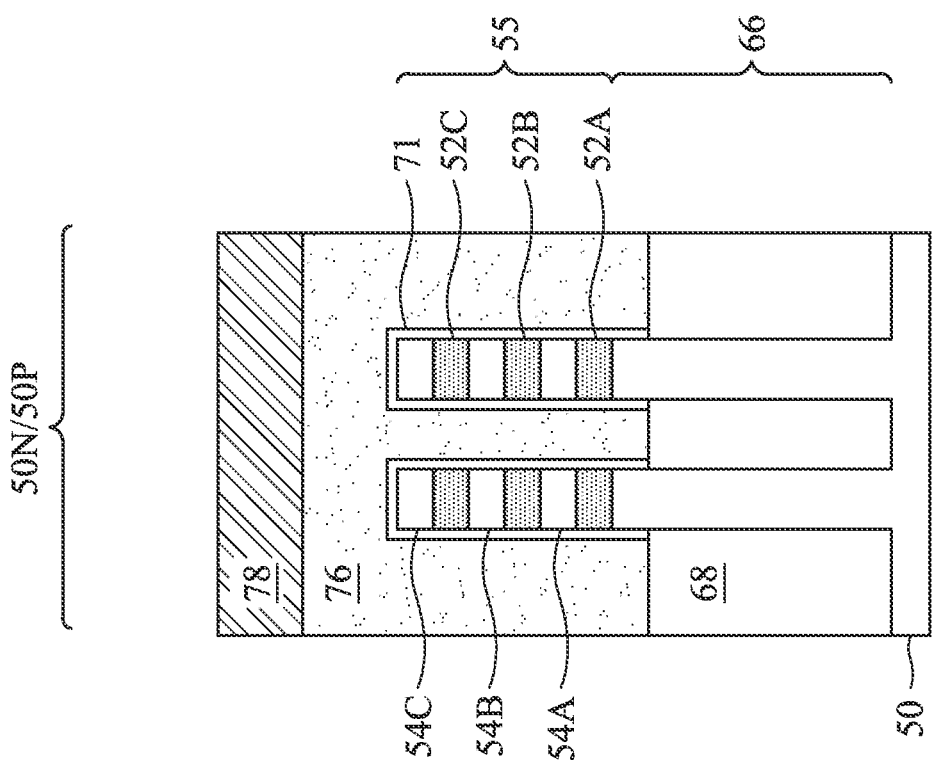
Figure 6B
Figure 6A

NANOSTRUCTURE FET AND METHOD OF FORMING SAME

PRIORITY CLAIM AND CROSS-REFERENCE

This application claims the benefit of U.S. Provisional Application No. 63/254,787, filed on Oct. 12, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 7A, 7B, 8A, 8B, 9A, 9B, 9C, 10A, 10B, 11A, 11B, 12A, 12B, 12C, 13A, 13B, 14A, 14B, 15A, 15B, 16A, 16B, 17A, 17B, 17C, 18A, 18B, 18C, 19A, 19B, 20A, 20B, 21A, 21B, 22A, 22B, 23A, 23B, 23C, 24A, 24B, 24C, 25A, 25B, 25C, 25D, and 25E are cross-sectional views of intermediate stages in the manufacturing of nano-FETs, in accordance with some embodiments.

DETAILED DESCRIPTION

Figure 1:
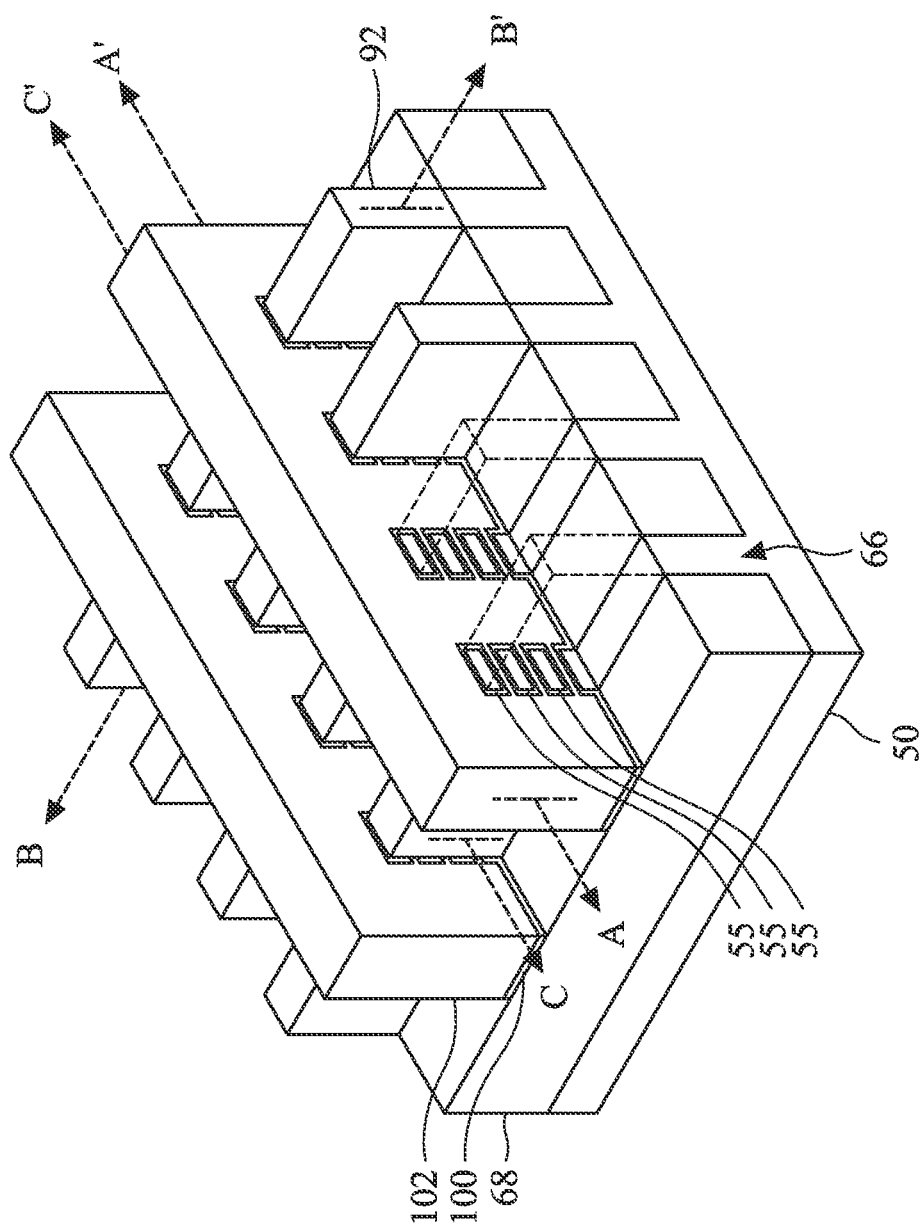
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments are described below in a particular context, a gate all around (GAA) transistor device (such as a nano-FET device) and a method of forming the same. Some embodiments discussed herein are discussed in the context of nano-FETs formed using a gate-last process. In other embodiments, a gate-first process may be used. Various embodiments presented herein allow for reducing a channel resistance ($R_{ch}$) of a nano-FET. In some embodiments, the channel resistance may be reduced by thermally driving dopants within epitaxial source/drain regions into nanostructures (e.g., nanosheets, nanowire, or the like) of a nano-FET device.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIG. 1 illustrates an example of nano-FETs (e.g., nanowire FETs, nanosheet FETs, or the like) in a three-dimensional view, in accordance with some embodiments. The nano-FETs comprise nanostructures 55 (e.g., nanosheets, nanowire, or the like) over fins 66 on a substrate 50 (e.g., a semiconductor substrate), wherein the nanostructures 55 act as channel regions for the nano-FETs. The nanostructure 55 may include p-type nanostructures, n-type nanostructures, or a combination thereof. Isolation regions 68 are disposed between adjacent fins 66, which may protrude above and from between neighboring isolation regions 68. Although the isolation regions 68 are described/illustrated as being separate from the substrate 50, as used herein, the term "substrate" may refer to the semiconductor substrate alone or a combination of the semiconductor substrate and the isolation regions. Additionally, although a bottom portion of the fins 66 are illustrated as being single, continuous materials with the substrate 50, the bottom portion of the fins 66 and/or the substrate 50 may comprise a single material or a plurality of materials. In this context, the fins 66 refer to the portion extending between the neighboring isolation regions 68.

Gate dielectric layers 100 are over top surfaces of the fins 66 and along top surfaces, sidewalls, and bottom surfaces of the nanostructures 55. Gate electrodes 102 are over the gate dielectric layers 100 and wrap around the nanostructures 55. Epitaxial source/drain regions 92 are disposed on the fins 66 on opposing sides of the gate dielectric layers 100 and the gate electrodes 102.

FIG. 1 further illustrates reference cross-sections that are used in later figures. Cross-section A-A' is along a longitudinal axis of a gate electrode 102 and in a direction, for example, perpendicular to the direction of current flow between the epitaxial source/drain regions 92 of a nano-FET. Cross-section B-B' is perpendicular to cross-section A-A' and is parallel to a longitudinal axis of a fin 66 of the nano-FET and in a direction of, for example, a current flow between the epitaxial source/drain regions 92 of the nano-FET. Cross-section C-C' is parallel to cross-section A-A' and extends through the epitaxial source/drain regions 92 of the nano-FETs. Subsequent figures refer to these reference cross-sections for clarity.

FIGS. 2, 3, 4, 5, 6A, 6B, 7A, 7B, 8A, 8B, 9A, 9B, 9C, 10A, 10B, 11A, 11B, 12A, 12B, 12C, 13A, 13B, 14A, 14B, 15A, 15B, 16A, 16B, 17A, 17B, 17C, 18A, 18B, 18C, 19A, 19B, 20A, 20B, 21A, 21B, 22A, 22B, 23A, 23B, 23C, 24A, 24B, 24C, 25A, 25B, 25C, 25D, and 25E are cross-sectional views of intermediate stages in the manufacturing of nano-FETs, in accordance with some embodiments. FIGS. 2-5, 6A, and 18A-25A illustrate reference cross-section A-A' illustrated in FIG. 1. FIGS. 6B, 7B, 8B, 9B, 9C, 10B, 11B, 12B, 13B, 14B, 15B, 16B, 17B, 18B, 19B, 20B, 21B, 22B, 23B, 25B, 25D, and 25E illustrate reference cross-section B-B' illustrated in FIG. 1. FIGS. 7A, 8A, 9A, 10A, 11A, 12A, 12C, 13A, 14A, 15A, 16A, 17A, 17C, 18C, 23C, 24C, and 25C illustrate reference cross-section C-C' illustrated in FIG. 1.

Figure 2:
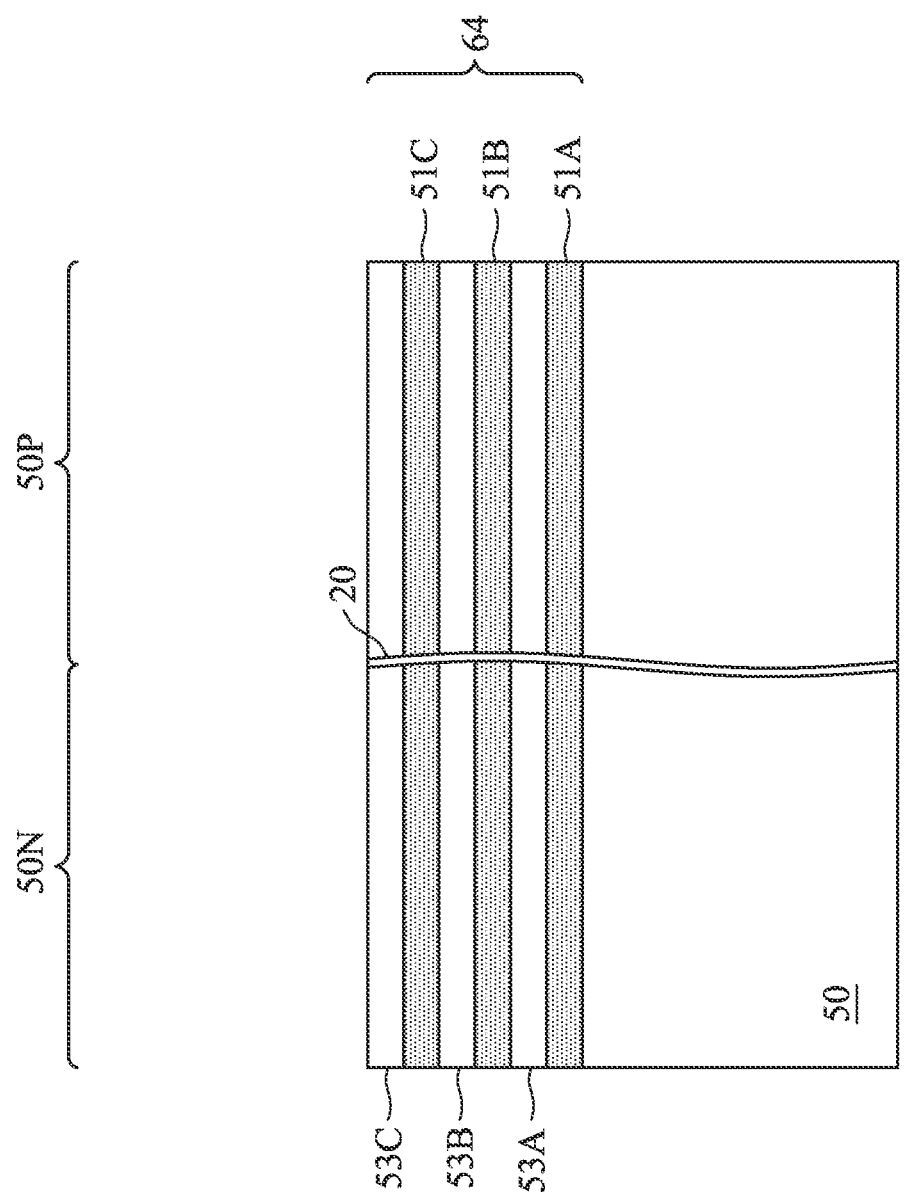

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (as illustrated by a divider 20), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Further in FIG. 2, a multi-layer stack 64 is formed over the substrate 50. The multi-layer stack 64 includes alternating layers of first semiconductor layers 51A-C (collectively referred to as first semiconductor layers 51) and second semiconductor layers 53A-C (collectively referred to as second semiconductor layers 53). Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. The first semiconductor layers 51 are formed of a first semiconductor material, and the second semiconductor layers 53 are formed of a second semiconductor material. The semiconductor materials may each be selected from the candidate semiconductor materials of the substrate 50. In the illustrated embodiment, the multi-layer stack 64 includes three layers of each of the first semiconductor layers 51 and the second semiconductor layers 53. It should be appreciated that the multi-layer stack 64 may include any number of the first semiconductor layers 51 and the second semiconductor layers 53.

In the illustrated embodiment, and as will be subsequently described in greater detail, the first semiconductor layers 51 will be removed and the second semiconductor layers 53 will be patterned to form channel regions for the nano-FETs in both the n-type region 50N and the p-type region 50P. The first semiconductor layers 51 are sacrificial layers (or dummy layers), which will be removed in subsequent processing to expose the top surfaces and the bottom surfaces of the second semiconductor layers 53. The first semiconductor material of the first semiconductor layers 51 is a material that has a high etching selectivity from the etching of the second semiconductor layers 53, such as silicon germanium. The second semiconductor material of the second semiconductor layers 53 is a material suitable for both n-type and p-type devices, such as silicon. As such, the first semiconductor layers 51 of the first semiconductor material may be removed without significantly removing the second semiconductor layers 53 of the second semiconductor material. In such embodiments, the channel regions in both the n-type region 50N and the p-type region 50P may have a same material composition (e.g., silicon, or another semiconductor material). Each of the first semiconductor layers 51 may have a thickness in a range from about 2 nm to about 6 nm. Each of the second semiconductor layers 53 may have a thickness in a range from about 2 nm to about 6 nm.

Figure 3:
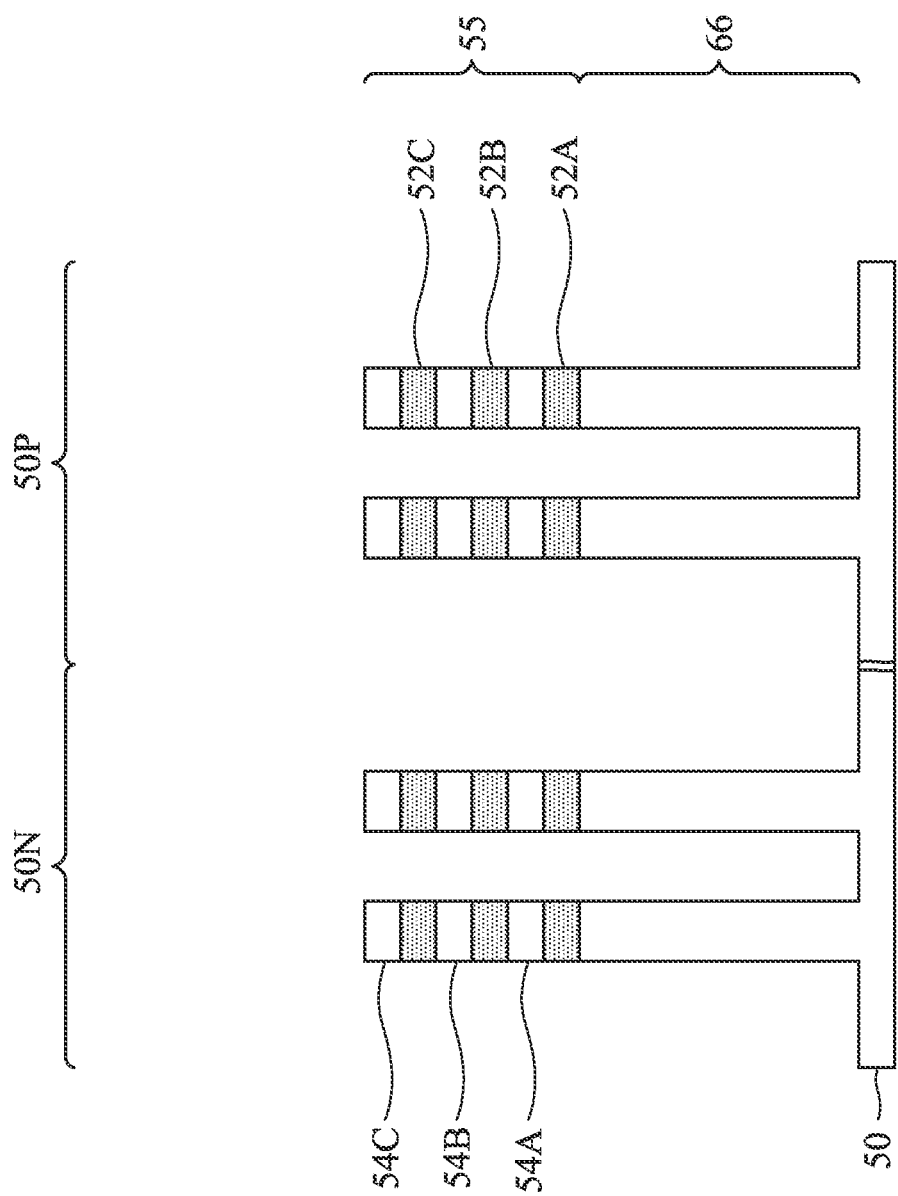

Referring now to FIG. 3, fins 66 are formed in the substrate 50 and nanostructures 55 are formed in the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-52C (collectively referred to as the first nanostructures 52) from the first semiconductor layers 51 and define second nanostructures 54A-54C (collectively referred to as the second nanostructures 54) from the second semiconductor layers 53. The first nanostructures 52 and the second nanostructures 54 may further be collectively referred to as nanostructures 55. The fins 66 and the nanostructures 55 may collectively be referred to as "fin structures."

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a multi-layer stack (such as the multi-layer stack 64 illustrated in FIG. 2) formed over a substrate and patterned using a photolithography process. Spacers are formed alongside the patterned sacrificial layer using a self-aligned process. The sacrificial layer is then removed, and the remaining spacers may then be used to pattern the nanostructures 55 and the fins 66.

FIG. 3 illustrates the fins 66 in the n-type region 50N and the p-type region 50P as having substantially equal widths for illustrative purposes. In some embodiments, widths of the fins 66 in the n-type region 50N may be greater or thinner than the fins 66 in the p-type region 50P. Further, while each of the fins 66 and the nanostructures 55 are illustrated as having a consistent width throughout, in other embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape.

Figure 4:
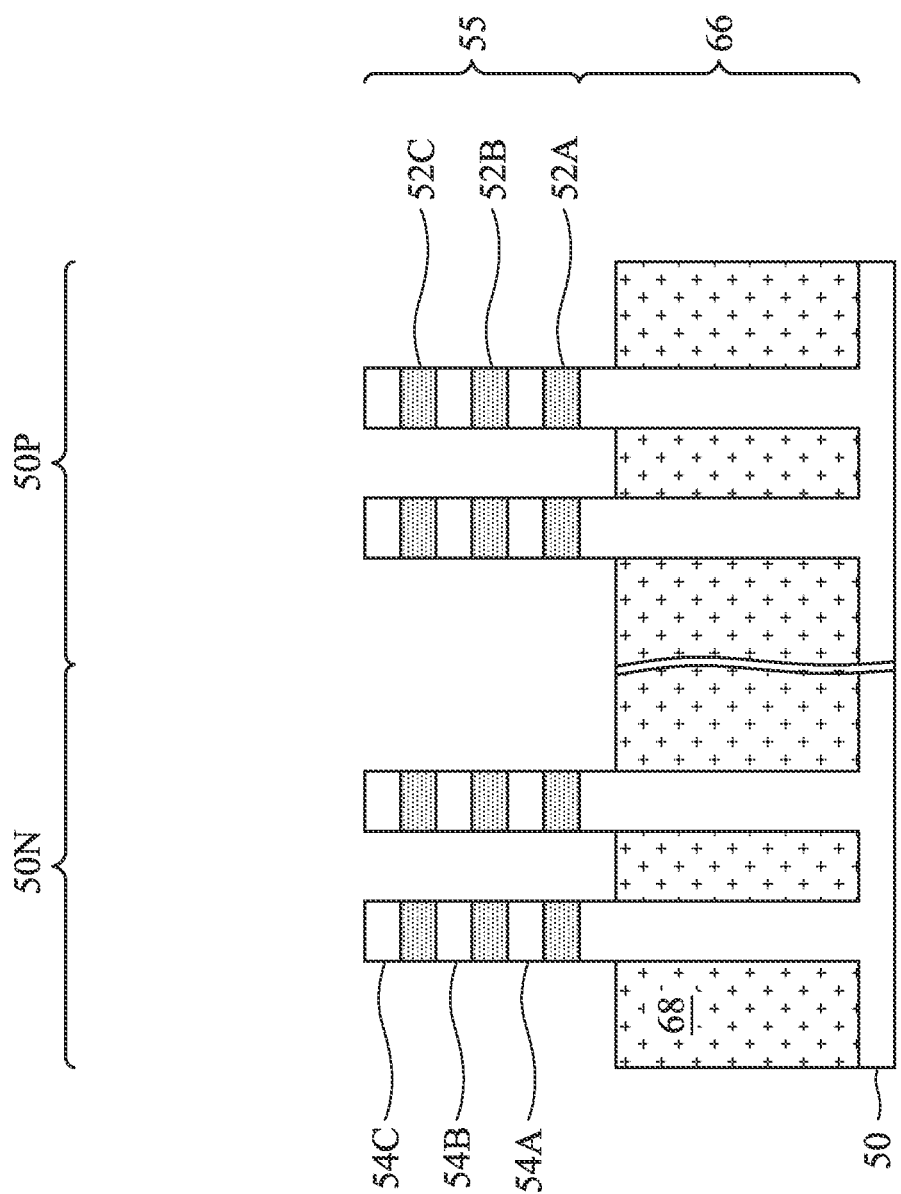

In FIG. 4, shallow trench isolation (STI) regions 68 are formed adjacent the fins 66. The STI regions 68 may be formed by depositing an insulation material over the substrate 50, the fins 66, and nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments a liner (not separately illustrated) may first be formed along a surface of the substrate 50, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that upper portions of fins 66 in the n-type region 50N and the p-type region 50P protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Further in FIG. 4, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about 5E18 atoms/cm$^3$ to about 5E21 atoms/cm$^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about 5E18 atoms/cm$^3$ to about 5E21 atoms/cm$^3$. After the implant, the photoresist may be removed, such as by an acceptable ashing process.

After the implant processes of the n-type region 50N and the p-type region 50P have been completed, an anneal may be performed to repair implant damage and to activate the p-type and/or n-type impurities that were implanted. In some embodiments, the grown materials of epitaxial fins and nanostructures may be in situ doped during growth, which may obviate the implantations, although in situ and implantation doping may be used together.

Figure 5:
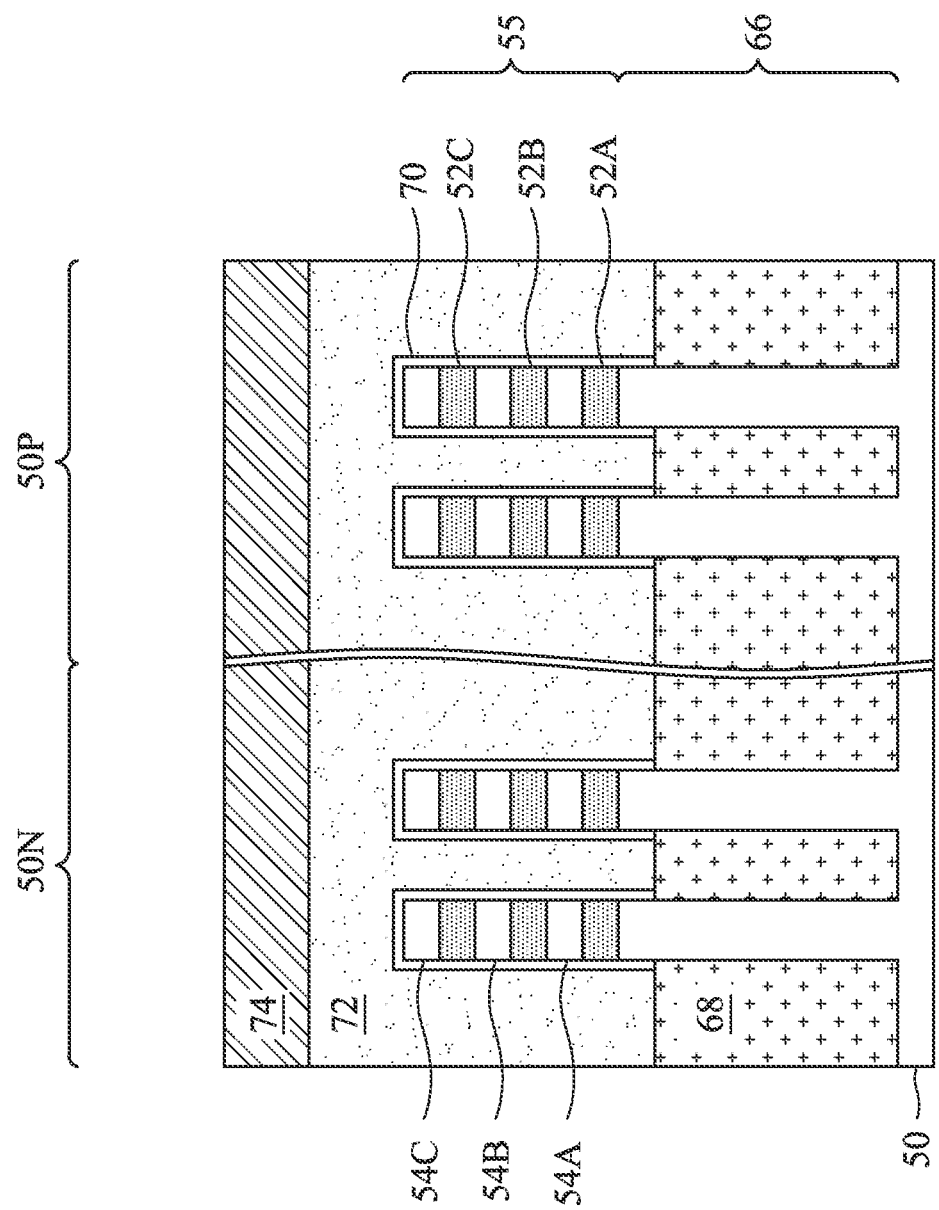

In FIG. 5, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, a combination thereof, or the like. In this example, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

FIGS. 6A, 6B, 7A, 7B, 8A, 8B, 9A, 9B, 9C, 10A, 10B, 11A, 11B, 12A, 12B, 12C, 13A, 13B, 14A, 14B, 15A, 15B, 16A, 16B, 17A, 17B, 17C, 18A, 18B, 18C, 19A, 19B, 20A, 20B, 21A, 21B, 22A, 22B, 23A, 23B, 23C, 24A, 24B, 24C, 25A, 25B, 25C, 25D, and 25E illustrate various additional steps in the manufacturing of embodiment devices. FIGS. 6A, 6B, 7A, 7B 8A, 8B, 9A, 9B, 9C, 10A, 10B, 11A, 11B, 12A, 12B, 12C, 13A, 13B, 14A, 14B, 15A, 15B, 16A, 16B, 17A, 17B, 17C, 18A, 18B, 18C, 19A, 19B, 20A, 20B, 21A, 21B, 22A, 22B, 23A, 23B, 23C, 24A, 24B, 24C, 25A, 25B, 25C, 25D, and 25E illustrate features in either of the n-type region 50N and the p-type region 50P. For example, the structures illustrated may be applicable to both the n-type region 50N and the p-type region 50P. Differences (if any) in the structures of the n-type region 50N and the p-type region 50P are described in the text accompanying each figure.

In FIGS. 6A and 6B, the mask layer 74 (see FIG. 5) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the nanostructures 55. The pattern of the masks 78 may be used to physically separate each of the dummy gates 76 from adjacent dummy gates 76. The dummy gates 76 may also have a lengthwise direction substantially perpendicular to the lengthwise direction of respective nanostructures 55 and fins 66.

Figure 7B:
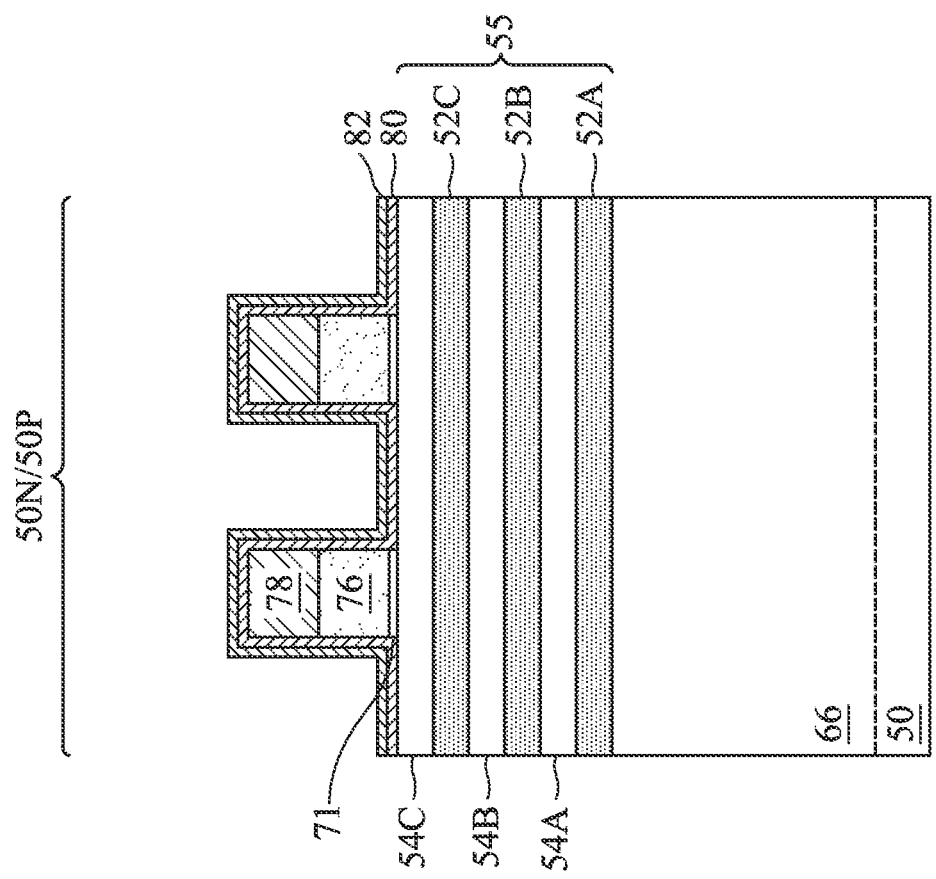
Figure 7A:
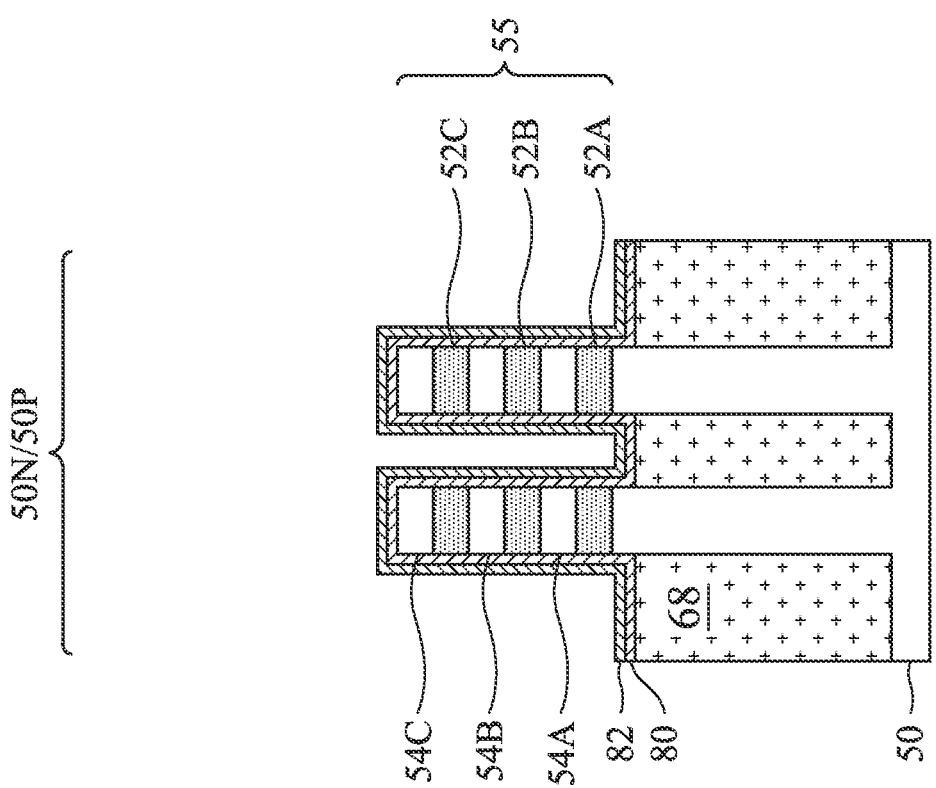

In FIGS. 7A and 7B, a first spacer layer 80 and a second spacer layer 82 are formed over the structure illustrated in FIGS. 6A and 6B. The first spacer layer 80 and the second spacer layer 82 will be subsequently patterned to act as spacers for forming self-aligned source/drain regions. In FIGS. 7A and 7B, the first spacer layer 80 is formed on top surfaces of the STI regions 68; top surfaces and sidewalls of the fins 66, the nanostructures 55, and the masks 78; and sidewalls of the dummy gates 76 and the dummy gate dielectrics 71. The second spacer layer 82 is deposited over the first spacer layer 80. The first spacer layer 80 may be formed of silicon oxide, silicon nitride, silicon oxynitride, a combination thereof, or the like, using techniques such as thermal oxidation or deposited by CVD, ALD, a combination thereof, or the like. The second spacer layer 82 may be formed of a material having a different etch rate than the material of the first spacer layer 80, such as silicon oxide, silicon nitride, silicon oxynitride, a combination thereof, or the like, and may be deposited by CVD, ALD, a combination thereof, or the like.

In some embodiments, after the first spacer layer 80 is formed and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed fins 66 and nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about 1E18 atoms/cm$^3$ to about 1E20 atoms/cm$^3$. An anneal may be used to repair implant damage and to activate the implanted impurities.

Figure 8A:
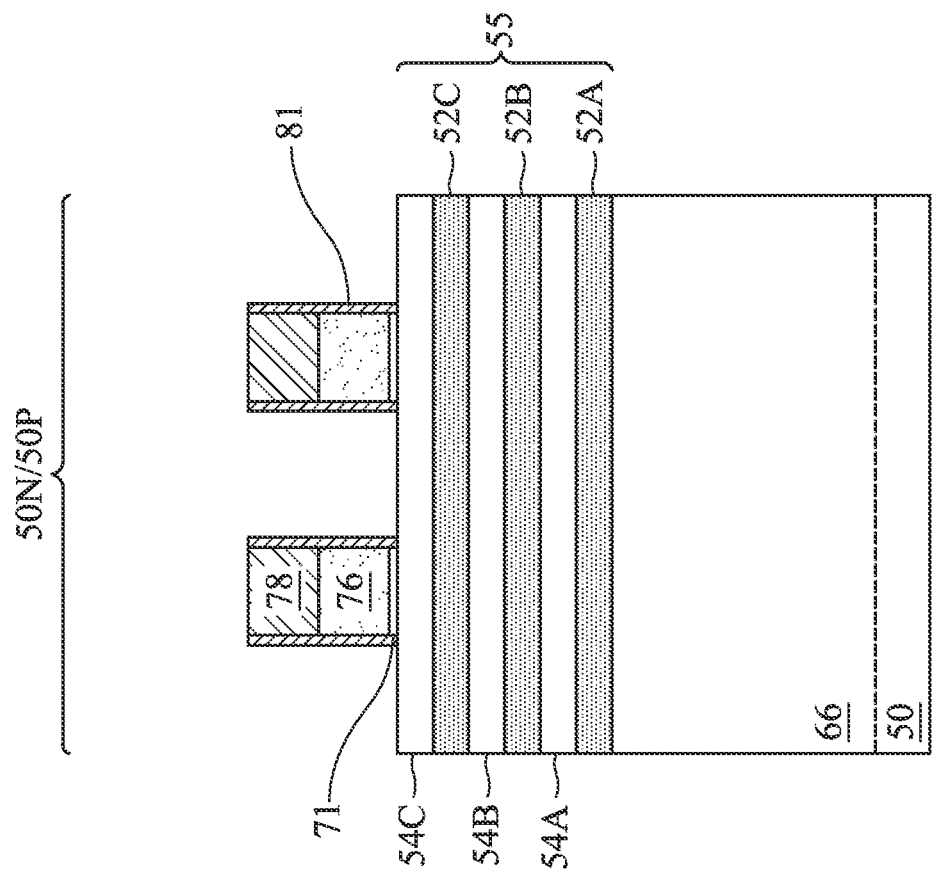
Figure 8B:
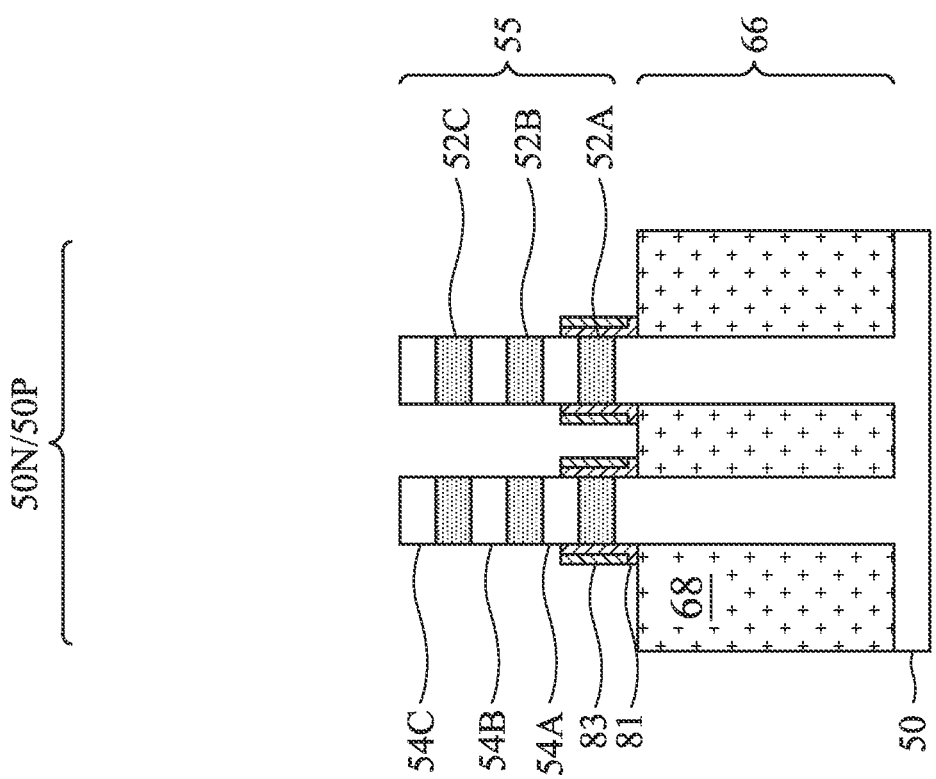

In FIGS. 8A and 8B, the first spacer layer 80 (see FIGS. 7A and 7B) and the second spacer layer 82 (see FIGS. 7A and 7B) are etched to form first spacers 81 and second spacers 83. As will be discussed in greater detail below, the first spacers 81 and the second spacers 83 act to self-align subsequently formed source/drain regions, as well as to protect sidewalls of the fins 66 and/or nanostructure 55 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 8A. Thereafter, the second spacers 83 acts as a mask while etching exposed portions of the first spacer layer 80, thereby forming first spacers 81 as illustrated in FIG. 8A.

As illustrated in FIG. 8A, the first spacers 81 and the second spacers 83 are disposed on sidewalls of the fins 66 and/or nanostructures 55. As illustrated in FIG. 8B, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy gate dielectrics 71. In other embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 9A:
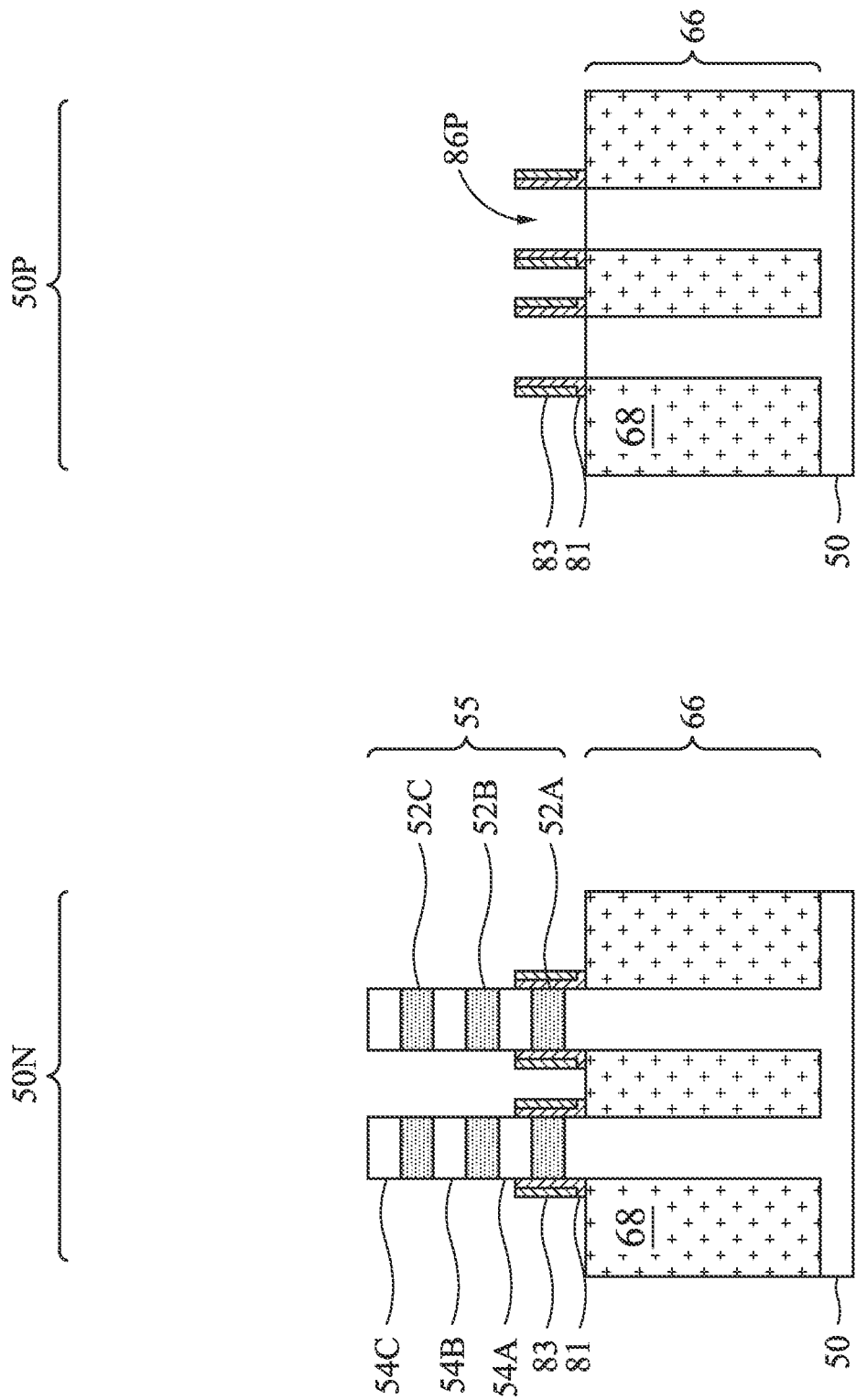
Figure 9B:
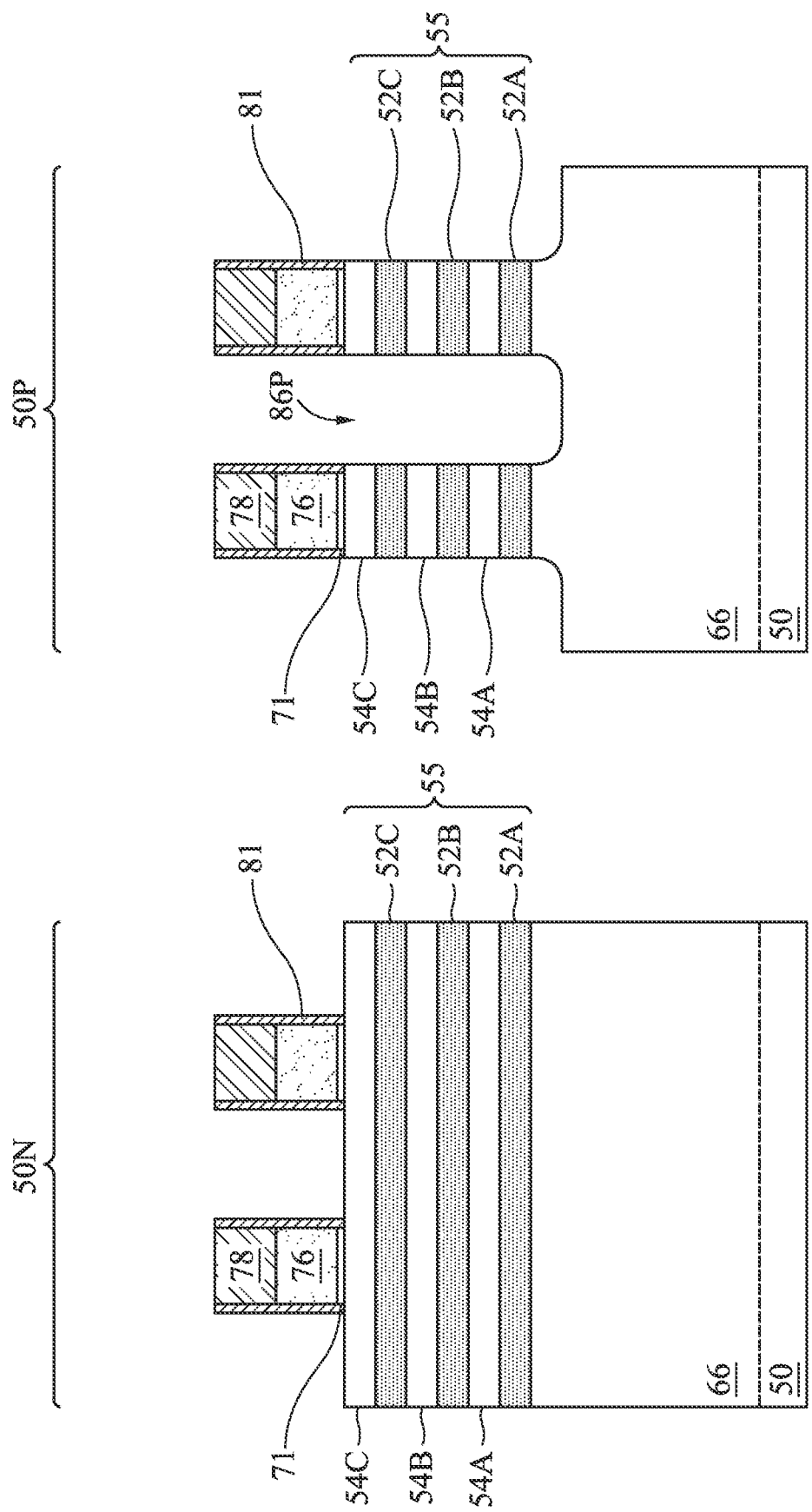

In FIGS. 9A-9C, 10A, 10B, 11A, 11B, and 12A-12C, epitaxial source/drain regions 92P are formed over the fins 66 in the p-type region 50P. In some embodiments, a mask such as, for example, a photoresist (not shown) is formed over the n-type region 50N to protect the n-type region 50N from process steps performed on the p-type region 50P to form the epitaxial source/drain regions 92P (see FIGS. 12A-12C). In FIGS. 9A and 9B, recesses 86P are formed in the fins 66 and the nanostructures 55 in the p-type region 50P, in accordance with some embodiments. Epitaxial source/drain regions 92P (see FIGS. 12A-12C) will be subsequently formed in the recesses 86P. The recesses 86P may extend through the first nanostructures 52 and the second nanostructures 54, and into the fin 66. As illustrated in FIG. 9A, top surfaces of the STI regions 68 may be level with bottom surfaces of the recesses 86P. In various embodiments, the fins 66 may be etched such that bottom surfaces of the recesses 86P are disposed below the top surfaces of the STI regions 68. The recesses 86P may be formed by etching the fins 66 and the nanostructures 55 using anisotropic etching processes, such as RIE, NBE, or the like. The first spacers 81, the second spacers 83, and the masks 78 mask portions of the fins 66 and the nanostructures 55 during the etching processes used to form the recesses 86P. A single etch process or multiple etch processes may be used to etch each layer of the nanostructures 55 and/or the fins 66. Timed etch processes may be used to stop the etching of the recesses 86P after the recesses 86P reach a desired depth.

Figure 9C:
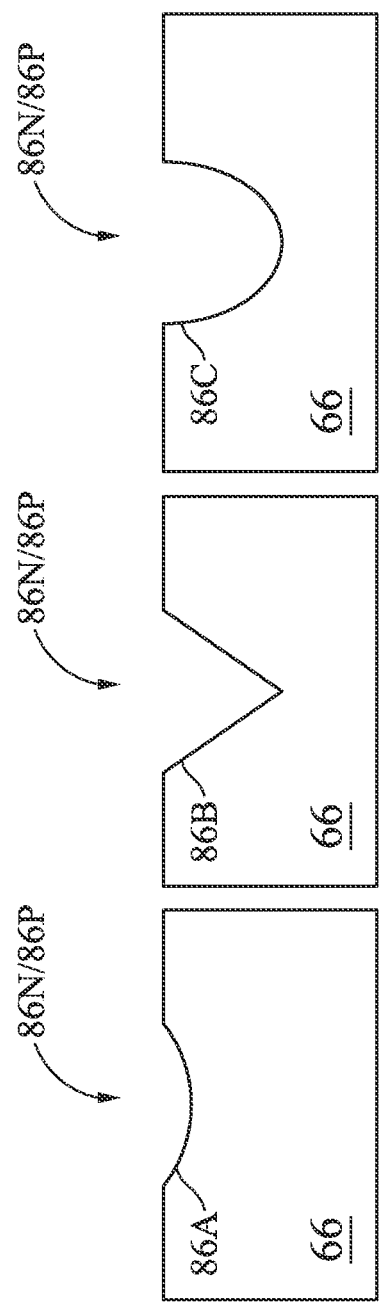

FIG. 9C illustrates various profiles 86A, 86B, and 86C of the recess 86P as the recess 86P extends into the fin 66, in accordance with some embodiments. The profiles 86A and 86C of the recess 86P are U-shaped profiles. A depth of the profile 86C is greater than a depth of the profile 86A. The profile 86B of the recess 86P is a V-shaped profile.

Figure 10A:
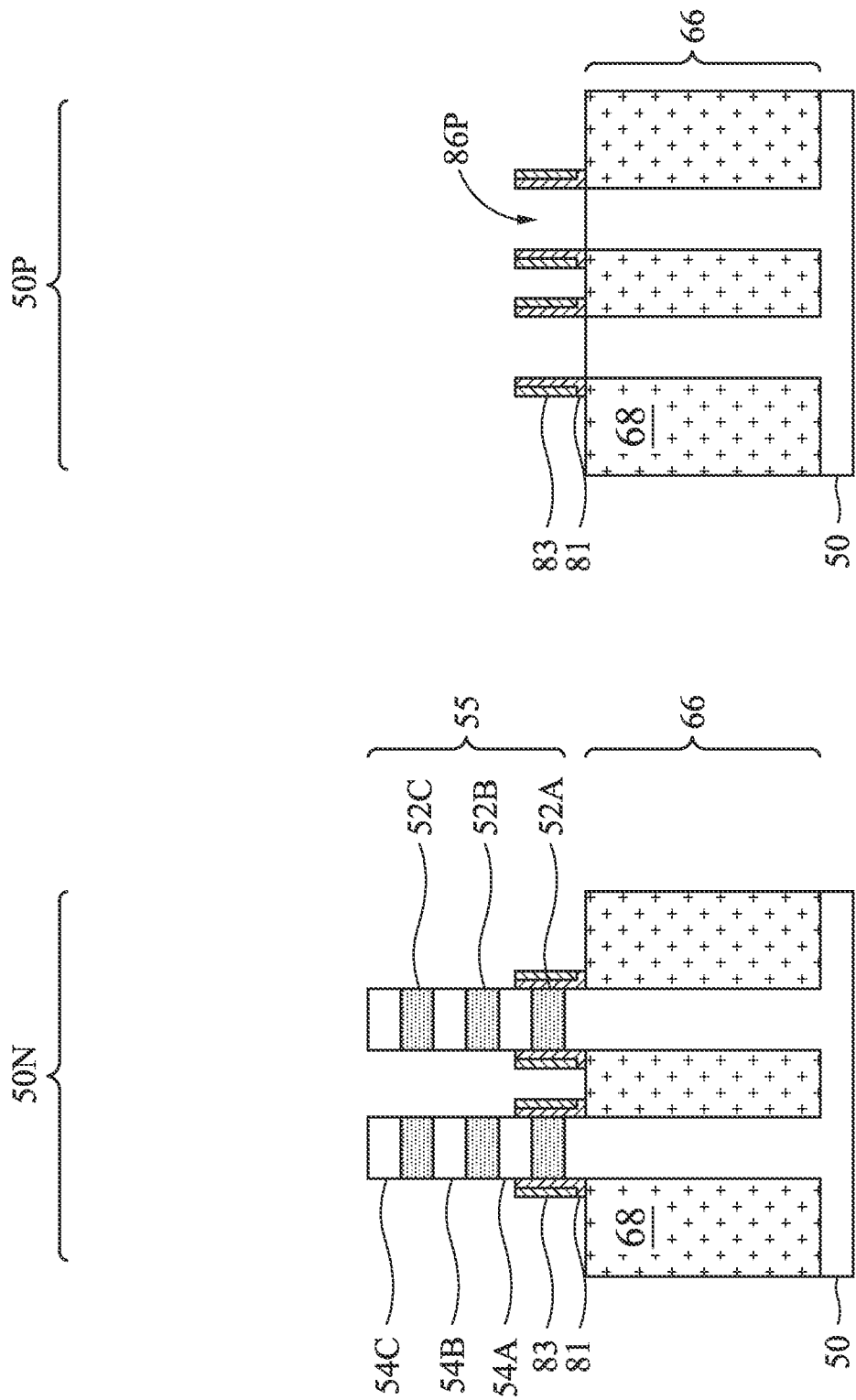
Figure 10B:
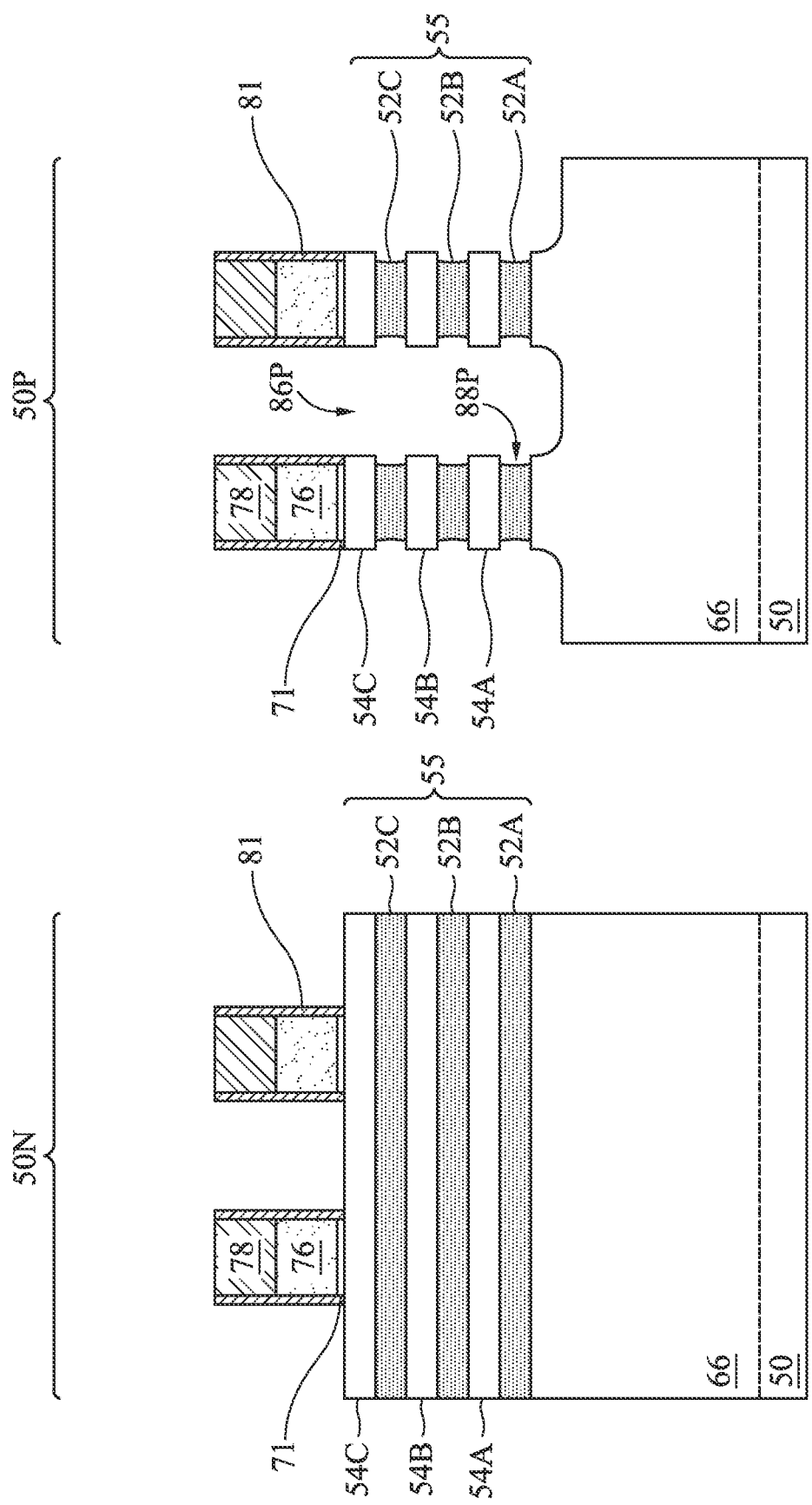

In FIGS. 10A and 10B, portions of sidewalls of the layers of the nanostructures 55 formed of the first semiconductor materials (e.g., the first nanostructures 52) exposed by the recesses 86P are etched to form sidewall recesses 88P in the p-type region 50P. Although sidewalls of the first nanostructures 52 in the sidewall recesses 88P are illustrated as being concave in FIG. 10B, the sidewalls may be straight or convex. The sidewalls may be etched using isotropic etching processes, such as wet etching or the like. Etchants selective to the first semiconductor materials are used to etch the first nanostructures 52 such that the second nanostructures 54 and the fins 66 remain relatively unetched as compared to the first nanostructures 52. In an embodiment in which the first nanostructures 52 include, e.g., SiGe, and the second nanostructures 54 include, e.g., Si or SiC, a wet etch process with tetramethylammonium hydroxide (TMAH), ammonium hydroxide (NH$_4$OH), or the like may be used to etch sidewalls of the first nanostructures 52 in the p-type region 50P.

Figure 11A:
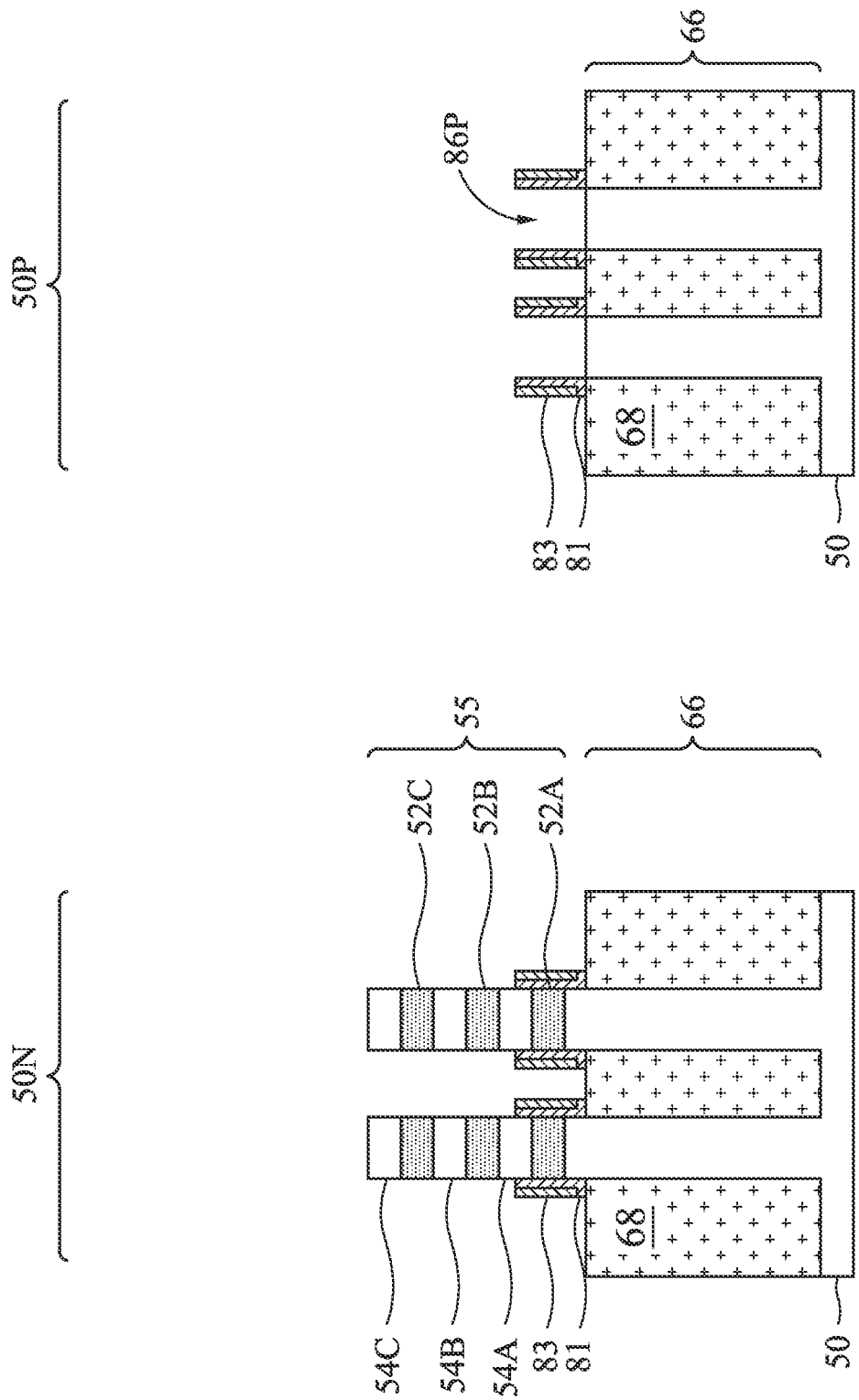
Figure 11B:
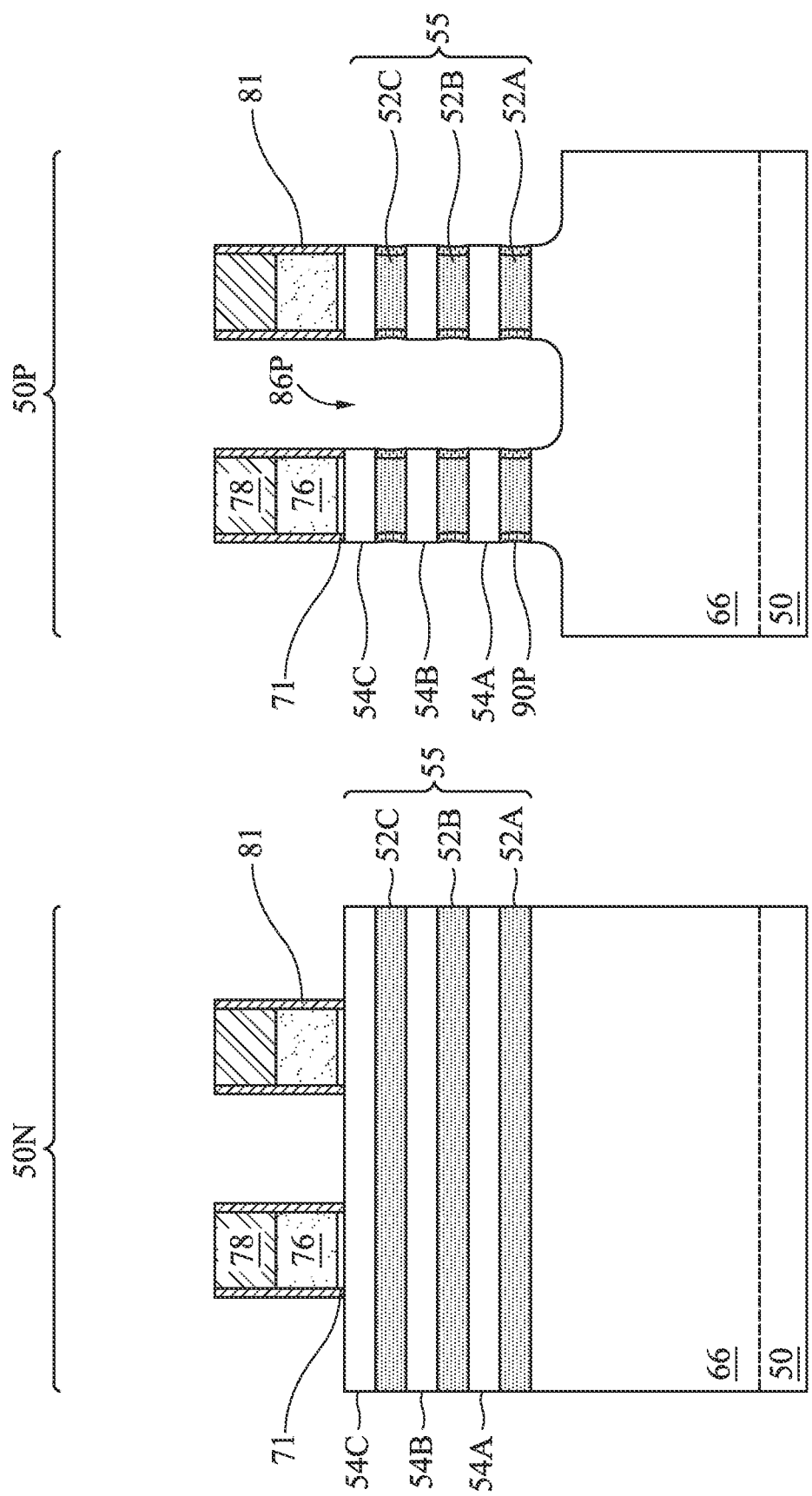

In FIGS. 11A and 11B, inner spacers 90P are formed in the sidewall recesses 88P (see FIG. 10B). The inner spacers 90P may be formed by depositing an inner spacer layer (not separately illustrated) over the structure illustrated in FIGS. 10A and 10B and subsequently patterned to form the inner spacers 90P. The inner spacers 90P act as isolation features between subsequently formed epitaxial source/drain regions 92P and a gate structure. As will be discussed in greater detail below, epitaxial source/drain regions 92P will be formed in the recesses 86N, while the first nanostructures 52 in the p-type region 50P will be replaced with corresponding gate structures.

The inner spacer layer may be deposited by a conformal deposition process, such as CVD, ALD, a combination thereof, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the inner spacers 90P. The inner spacer layer may be etched by an anisotropic etching process, such as RIE, NBE, or the like. Although outer sidewalls of the inner spacers 90P are illustrated as being flush with sidewalls of the second nanostructures 54A-54C in the p-type region 50P (such that top and bottom surfaces of the second nanostructures 54A-54C are not exposed at the sidewalls of the second nanostructures 54A-54C), the outer sidewalls of the inner spacers 90P may extend beyond or be recessed from sidewalls of the second nanostructures 54A-54C. Moreover, although the outer sidewalls of the inner spacers 90P are illustrated as being concave in FIG. 11B, the outer sidewalls of the inner spacers 90P may be straight or convex. The inner spacers 90P may be used to prevent damage to subsequently formed source/drain regions (such as the epitaxial source/drain regions 92P, discussed below with respect to FIGS. 12A-12C) by subsequent etching processes, such as etching processes used to form gate structures. In some embodiments, the inner spacers 90P have a width between about 2 nm and about 6 nm.

Figure 12A:
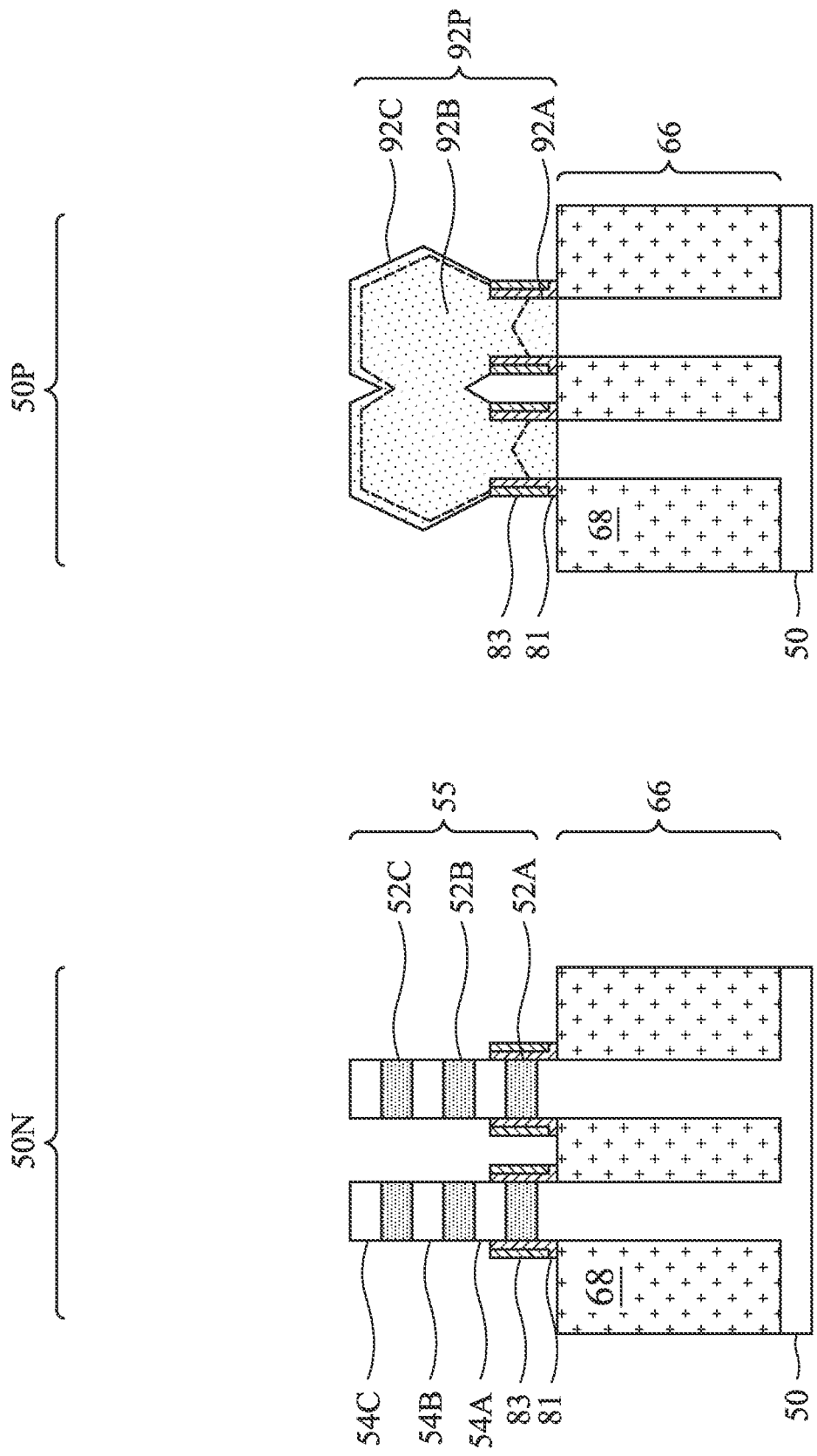
Figure 12B:
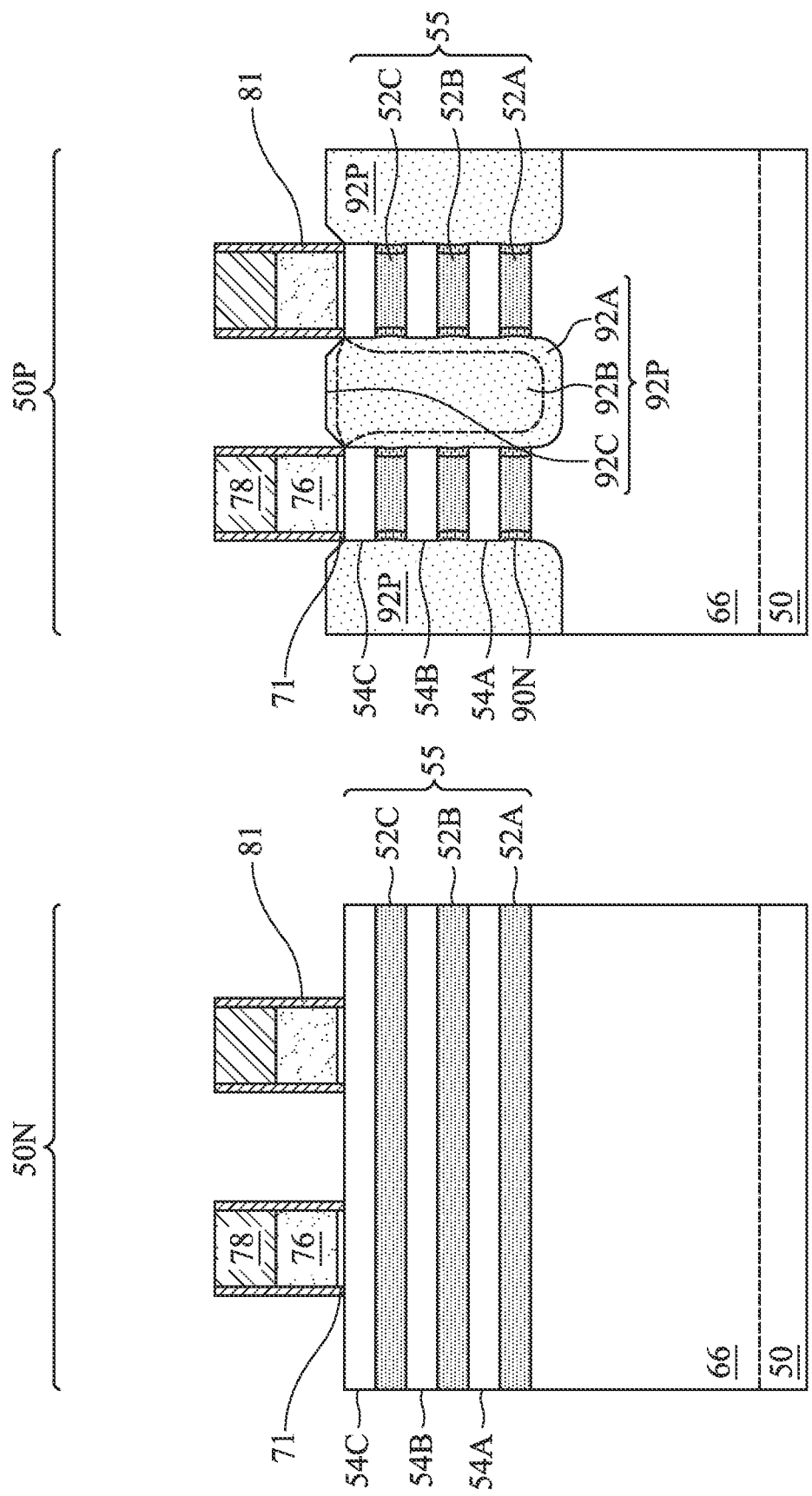
Figure 12C:
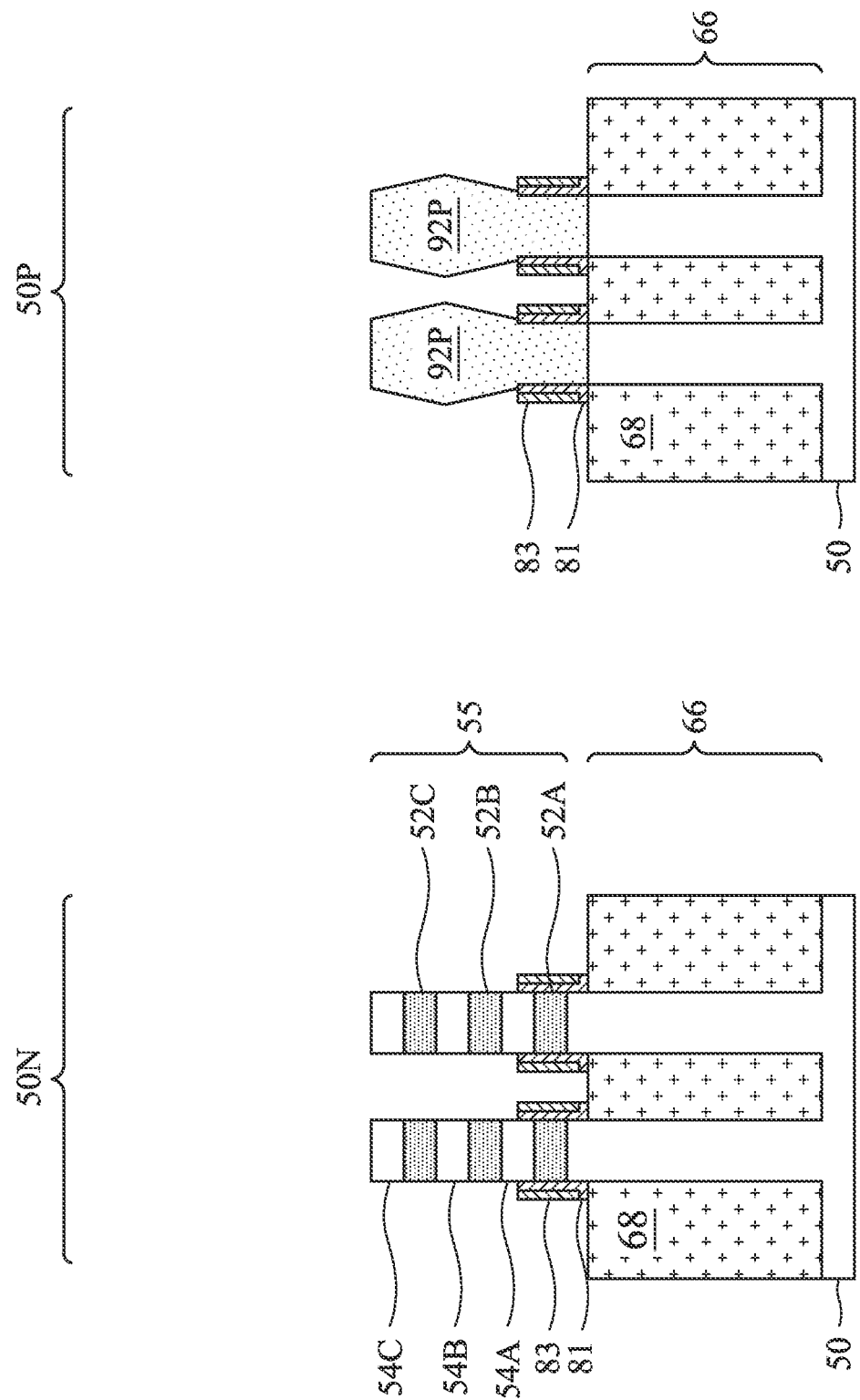

In FIGS. 12A-12C, epitaxial source/drain regions 92P are formed in the recesses 86P (see FIGS. 11A and 11B). In some embodiments, the epitaxial source/drain regions 92P may exert stress on the second nanostructures 54A-54C in the p-type region 50P, thereby improving performance. As illustrated in FIG. 12B, the epitaxial source/drain regions 92P are formed in the recesses 86P such that each dummy gate 76 is disposed between respective neighboring pairs of the epitaxial source/drain regions 92P. In some embodiments, the first spacers 81 are used to separate the epitaxial source/drain regions 92P from the dummy gates 76 and the inner spacers 90P are used to separate the epitaxial source/drain regions 92P from the nanostructures 55 by an appropriate lateral distance so that the epitaxial source/drain regions 92P do not short out with subsequently formed gates of the resulting nano-FETs.

The epitaxial source/drain regions 92P are epitaxially grown in the recesses 86P. The epitaxial source/drain regions 92P may include any acceptable material appropriate for p-type nano-FETs. For example, if the second nanostructures 54A-54C are silicon, the epitaxial source/drain regions 92P may include materials exerting a compressive strain on the second nanostructures 54A-54C, such as silicon germanium, boron doped silicon germanium, silicon germanium phosphide, germanium, germanium tin, or the like. The epitaxial source/drain regions 92P may be also referred to as "p-type source/drain regions." The epitaxial source/drain regions 92P may have surfaces raised from respective surfaces of the fins 66 and the nanostructures 55, and may have facets.

The epitaxial source/drain regions 92P, the first nanostructures 52A-52C, the second nanostructures 54A-54C, and/or the fins 66 may be implanted with dopants to form source/drain regions, similar to the process previously discussed for forming lightly-doped source/drain regions, followed by an anneal. The source/drain regions may have an impurity concentration of between about 1E19 atoms/cm$^3$ and about 1E21 atoms/cm$^3$. The p-type impurities for source/drain regions may be any of the impurities previously discussed. In some embodiments, the epitaxial source/drain regions 92P may be in situ doped during growth. In some embodiments, the epitaxial source/drain regions 92P comprises a boron doped silicon germanium ($Si_{1-x}Ge_x$:B), with x being between about 0 and 0.75. In some embodiments, the boron concentration within the epitaxial source/drain regions 92P between about 5E18 atoms/cm$^3$ to about 5E21 atoms/cm$^3$.

As a result of the epitaxy processes used to form the epitaxial source/drain regions 92P, upper surfaces of the epitaxial source/drain regions 92P have facets which expand laterally outward beyond sidewalls of the fins 66. In some embodiments, these facets cause adjacent epitaxial source/drain regions 92P of a same nano-FET to merge as illustrated by FIG. 12A. In other embodiments, adjacent epitaxial source/drain regions 92P remain separated after the epitaxy process is completed as illustrated by FIG. 12C. In the embodiments illustrated in FIGS. 12A and 12C, the first spacers 81 may be formed to a top surface of the STI regions 68 thereby blocking the epitaxial growth. In some other embodiments, the first spacers 81 may cover portions of the sidewalls of the nanostructures 55 further blocking the epitaxial growth. In some other embodiments, the spacer etch used to form the first spacers 81 may be adjusted to remove the spacer material to allow the epitaxially grown region to extend to the surface of the STI region 68.

The epitaxial source/drain regions 92P may comprise one or more semiconductor material layers. For example, the epitaxial source/drain regions 92P may comprise a first semiconductor material layer 92A, a second semiconductor material layer 92B, and a third semiconductor material layer 92C. Any number of semiconductor material layers may be used for the epitaxial source/drain regions 92P. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92P comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 13A:
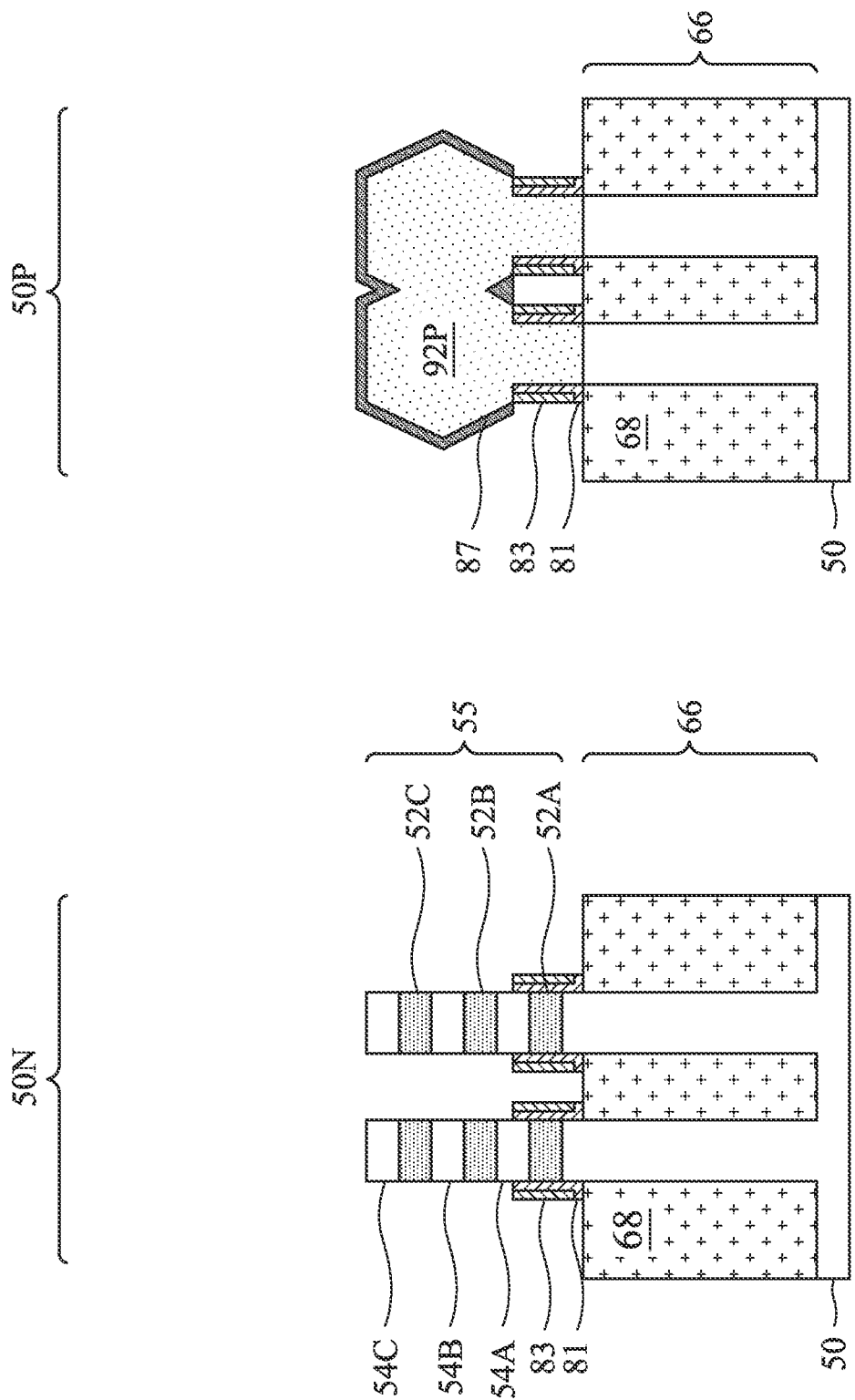
Figure 13B:
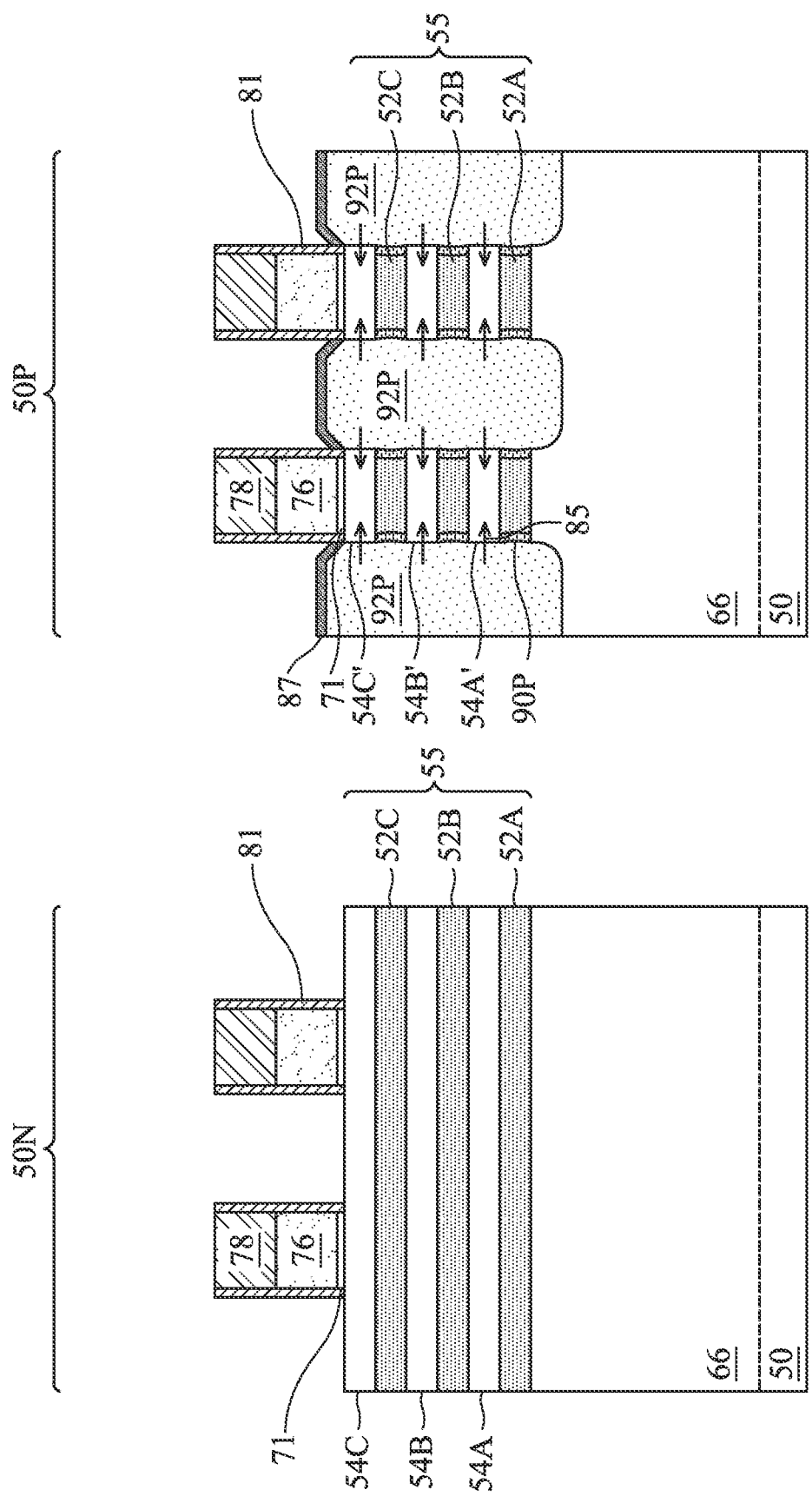

In FIGS. 13A and 13B, a thermal anneal process is performed on the structure of FIGS. 12A and 12B, in accordance with some embodiments. The thermal anneal process drives dopants of the epitaxial source/drain regions 92P into the nanostructures 54A-54C to form doped nanostructures 54A'-54C'. In some embodiments when the epitaxial source/drain structures 92P comprise a boron doped silicon germanium ($Si_{1-x}Ge_x$:B), the thermal anneal process drives (indicated by arrows 85 in FIG. 13B) boron atoms into the nanostructures 54A-54C. In some embodiments, the thermal anneal process is a high temperature anneal process. The high temperature anneal process may be performed under a gas atmosphere, at a temperature between about 875° C. and about 1000° C., for a duration between 1 sec and 2 sec. The gas atmosphere may comprise $N_2$ gas, $O_2$ gas, a mixture thereof, or the like. In some embodiments when the gas atmosphere comprises a mixture of $N_2$ gas and $O_2$ gas, the gas atmosphere comprises between about 0% to about 2% $O_2$ by volume. By using such a mixture of $N_2$ gas and $O_2$ gas as the gas atmosphere, Si sublimation is retarded from the epitaxial source/drain regions 92P.

In some embodiments, before performing the thermal anneal process, cap layers 87 are formed over the epitaxial source/drain regions 92P to protect the epitaxial source/drain regions 92P while performing the thermal anneal process. The cap layers 87 may comprise SiN, $Al_2O_3$, $SiO_2$, a combination thereof, or the like. In some embodiments, the material of the cap layers 87 is blanket deposited on the structure of FIGS. 12A and 12B using ALD, CVD, a combination thereof, or the like, and is subsequently patterned to remove portions of the material from sidewalls of the spacers 81 and 82, and top surfaces of the masks 78. The patterning process may comprise suitable photolithography and etch processes. In other embodiments, the material of the cap layers 87 is deposited on exposed surfaces of the epitaxial source/drain regions 92P.

Figure 14A:
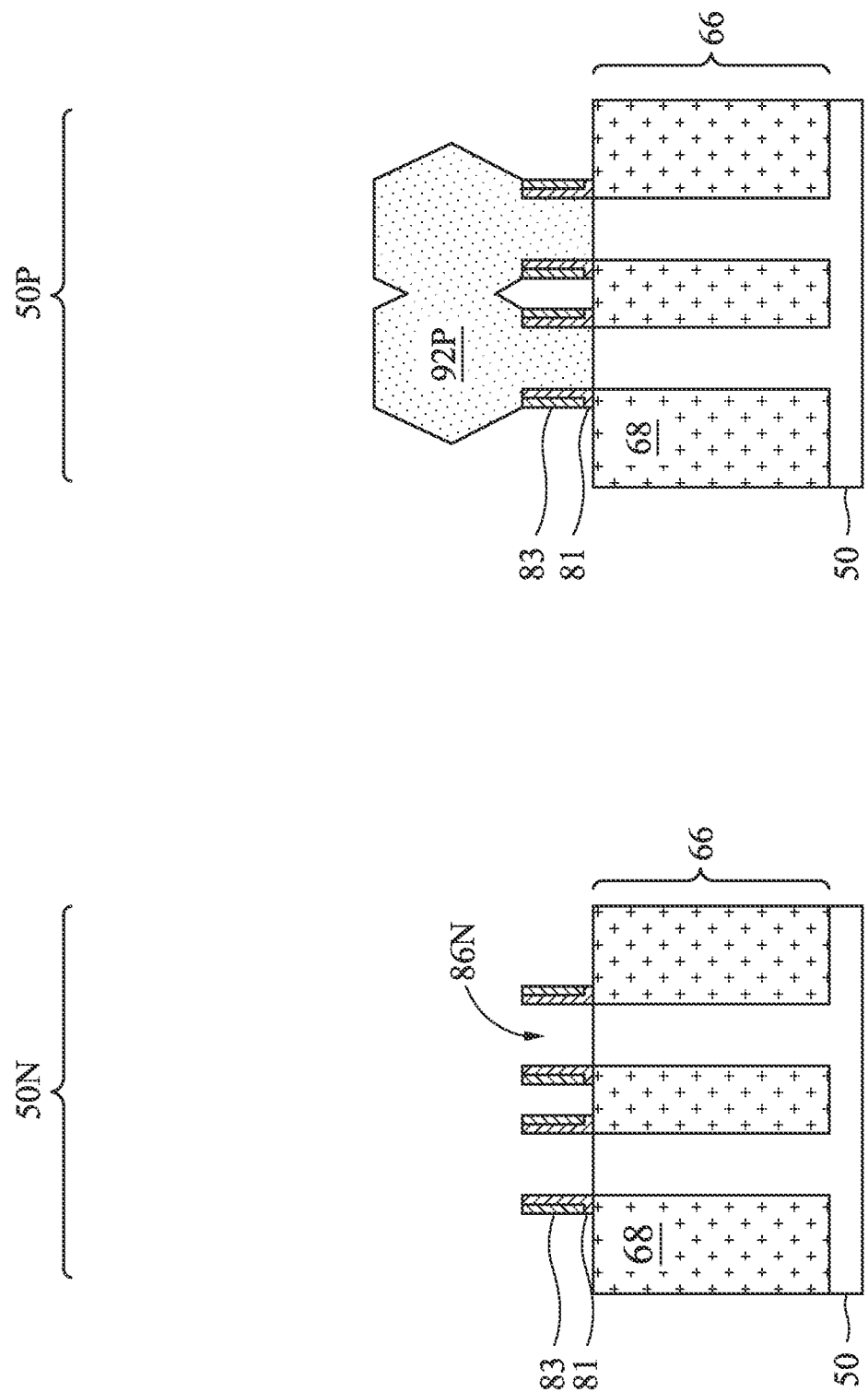
Figure 14B:
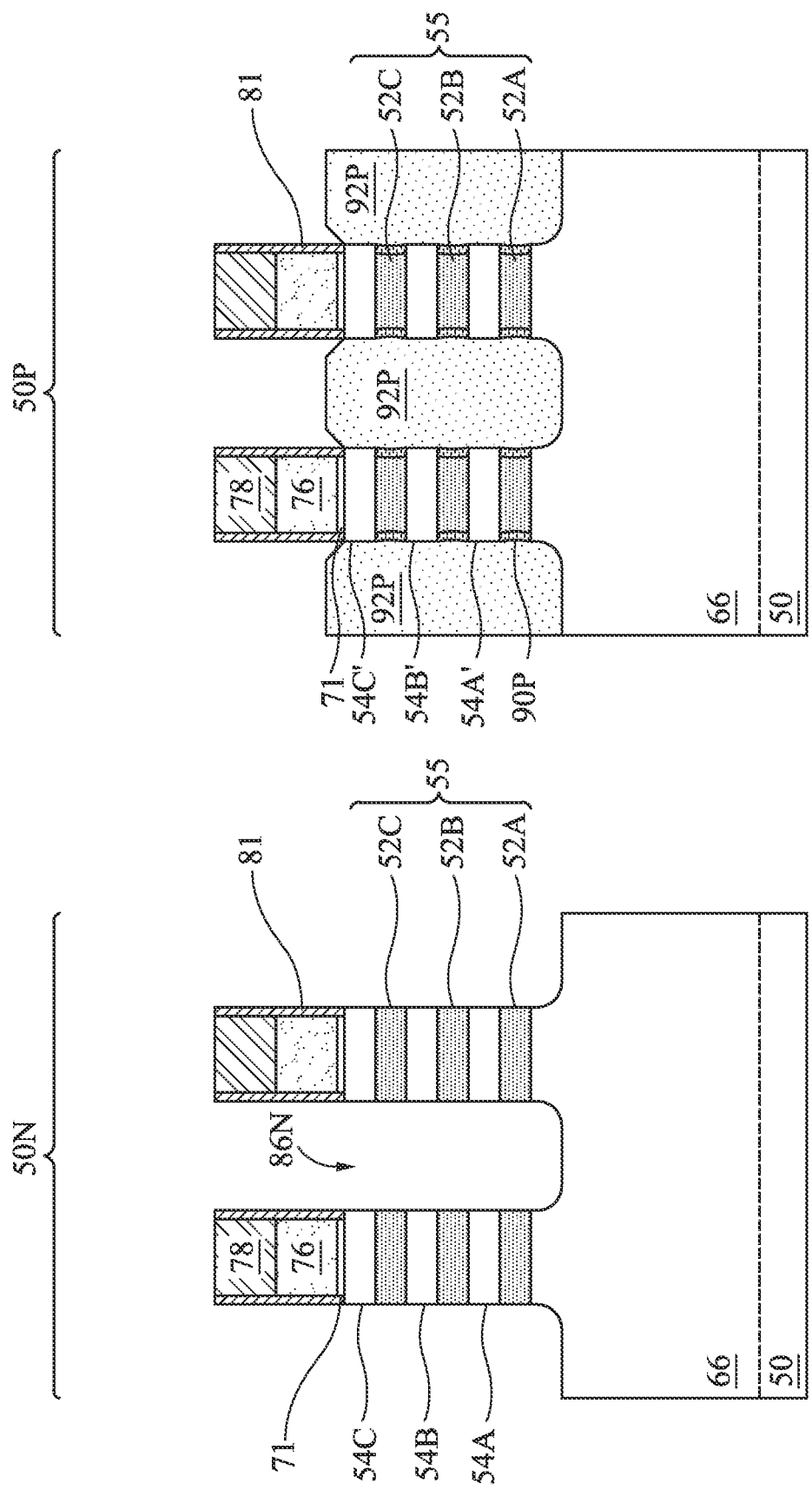

In FIGS. 14A, 14B, 15A, 15B, 16A, 16B, and 17A-17C, epitaxial source/drain regions 92N are formed over the fins 66 in the n-type region 50N. In some embodiments, a mask such as, for example, a photoresist (not shown) is formed over the p-type region 50P to protect the p-type region 50P from process steps performed on the n-type region 50N to form the epitaxial source/drain regions 92N (see FIGS. 17A-17C). In FIGS. 14A and 14B, recesses 86N are formed in the fins 66 and the nanostructures 55 in the n-type region 50N, in accordance with some embodiments. Epitaxial source/drain regions 92N (see FIGS. 17A-17C) will be subsequently formed in the recesses 86N. The recesses 86N may extend through the first nanostructures 52A-52C and the second nanostructures 54A-54C, and into the fin 66. As illustrated in FIG. 14A, top surfaces of the STI regions 68 may be level with bottom surfaces of the recesses 86N. In various embodiments, the fins 66 may be etched such that bottom surfaces of the recesses 86N are disposed below the top surfaces of the STI regions 68. The recesses 86N may be formed in a similar manner as the recesses 86P described above with reference to FIGS. 9A and 9B, and the description is not repeated herein.

Referring back to FIG. 9C, various profiles 86A, 86B, and 86C of the recess 86N are illustrated as the recess 86N extends into the fin 66, in accordance with some embodiments. The profiles 86A and 86C of the recess 86N are U-shaped profiles. A depth of the profile 86C is greater than a depth of the profile 86A. The profile 86B of the recess 86N is a V-shaped profile.

Figure 15A:
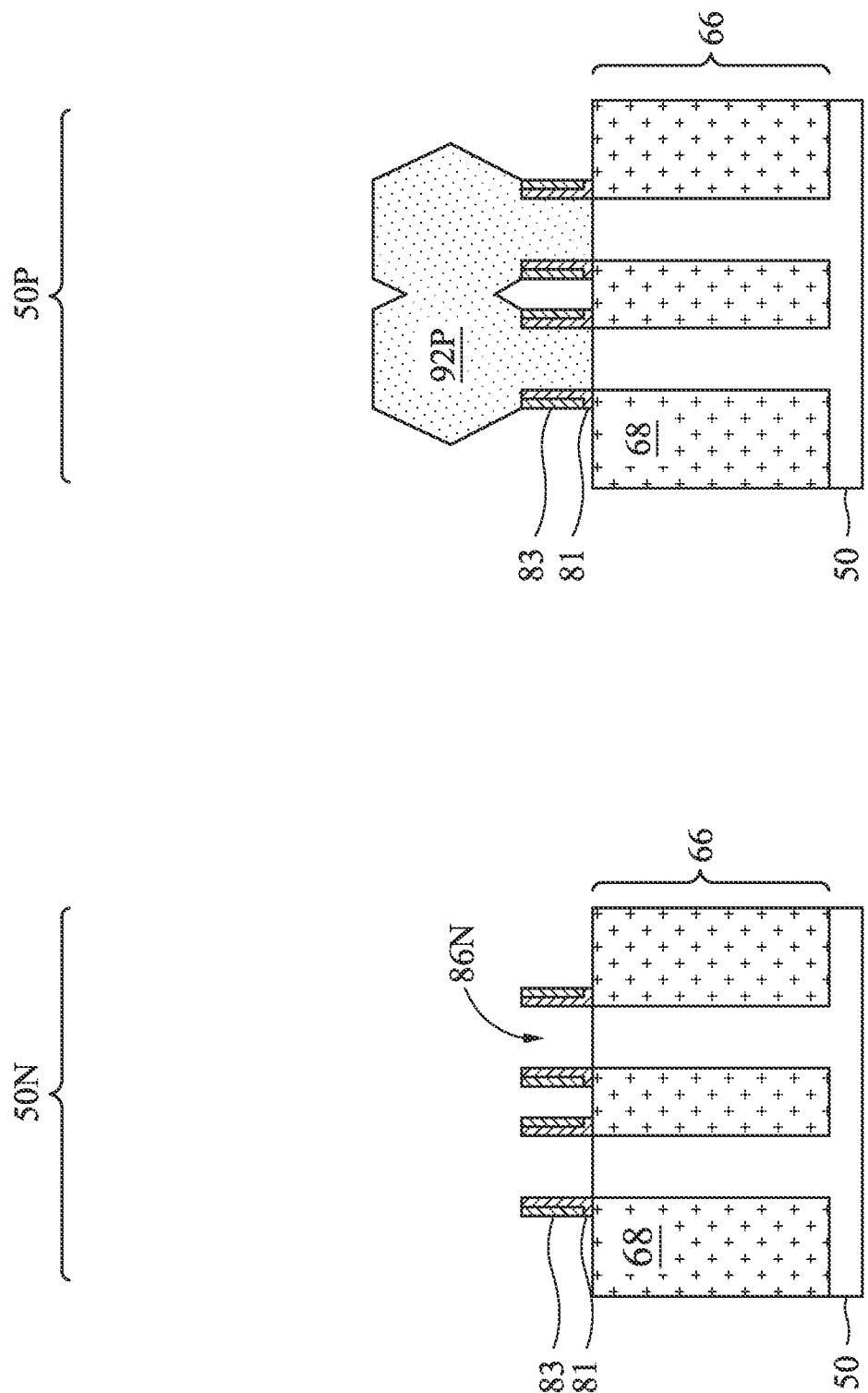
Figure 15B:
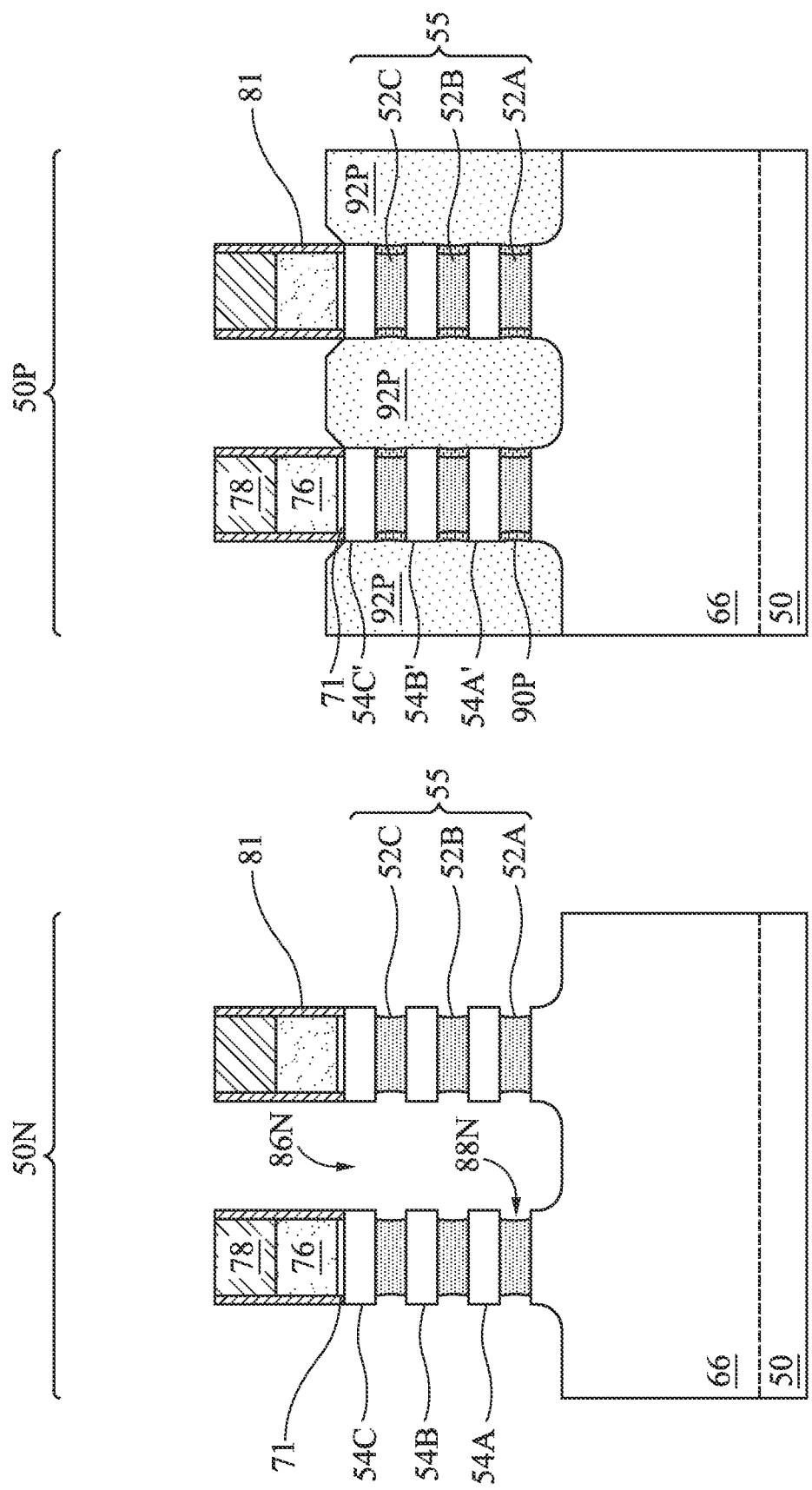

In FIGS. 15A and 15B, portions of sidewalls of the layers of the nanostructures 55 formed of the first semiconductor materials (e.g., the first nanostructures 52A-52C) exposed by the recesses 86N are etched to form sidewall recesses 88N in the n-type region 50N. Although sidewalls of the first nanostructures 52A-52C in the sidewall recesses 88N are illustrated as being concave in FIG. 15B, the sidewalls may be straight or convex. In some embodiments, the sidewall recesses 88N may be formed in a similar manner as the sidewall recesses 88P described above with reference to FIGS. 10A and 10B, and the description is not repeated herein.

Figure 16A:
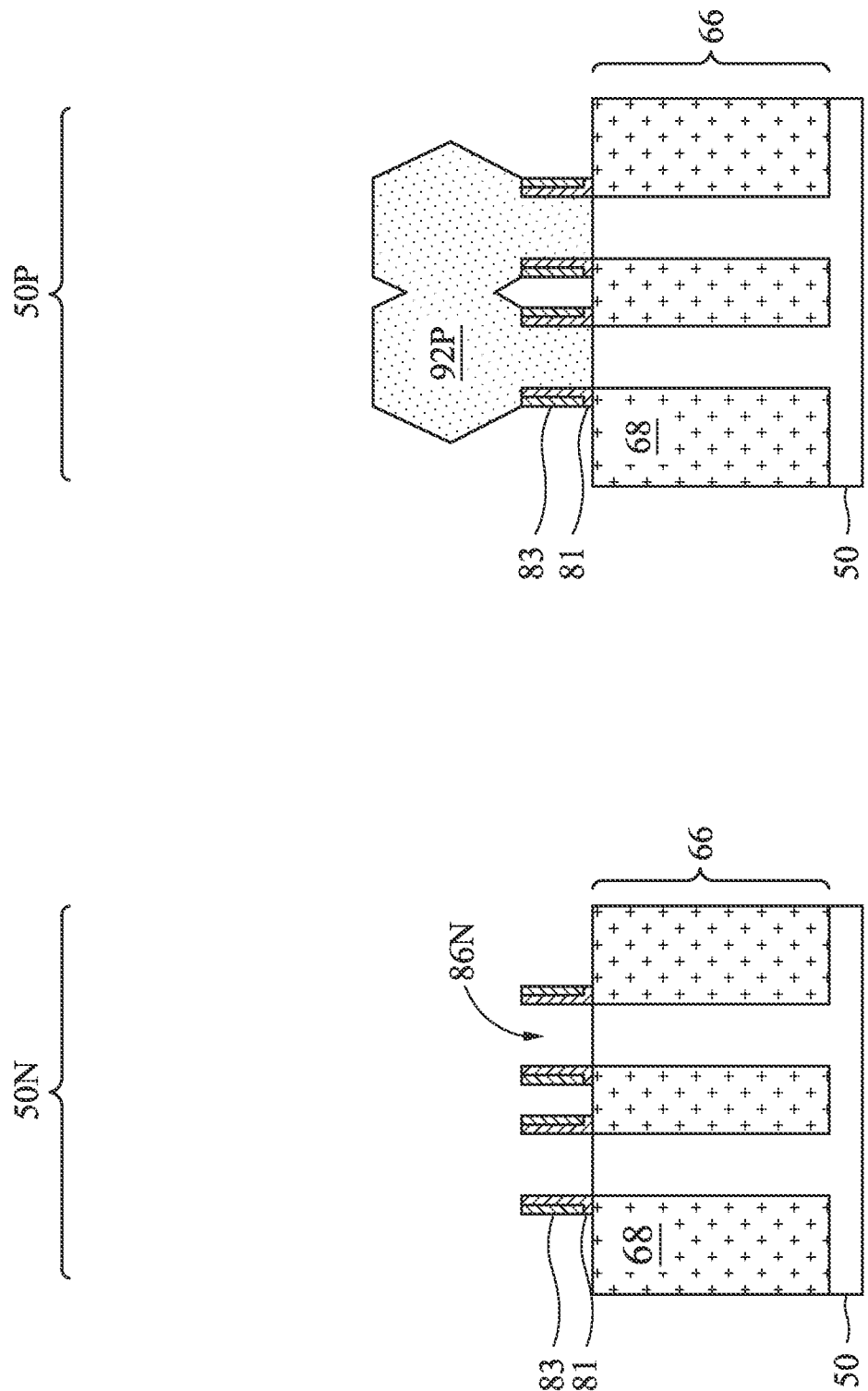
Figure 16B:
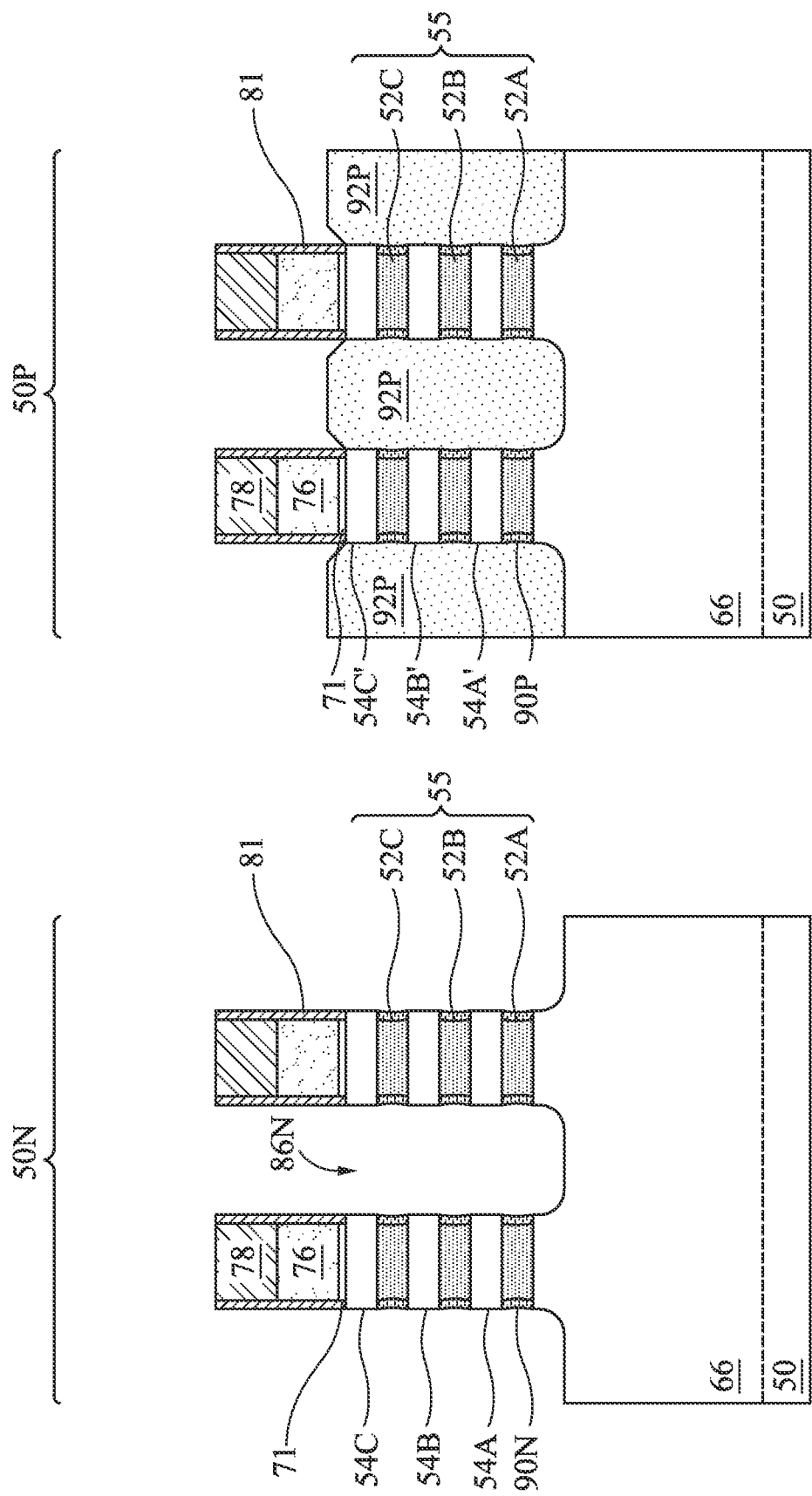

In FIGS. 16A and 16B, inner spacers 90N are formed in the sidewall recesses 88N (see FIG. 15B). The inner spacers 90N act as isolation features between subsequently formed epitaxial source/drain regions 92N and a gate structure. As will be discussed in greater detail below, epitaxial source/drain regions 92N will be formed in the recesses 86N, while the nanostructures 52A-52C in the n-type region 50N will be replaced with corresponding gate structures. In some embodiments, the inner spacers 90N as formed using similar materials and methods as the inner spacers 90P described above with reference to FIGS. 11A and 11B, and the description is not repeated herein. Although outer sidewalls of the inner spacers 90N are illustrated as being flush with sidewalls of the second nanostructures 54A-54C in the n-type region 50N (such that top and bottom surfaces of the second nanostructures 54A-54C are not exposed at the sidewalls of the second nanostructures 54A-54C), the outer sidewalls of the inner spacers 90N may extend beyond or be recessed from sidewalls of the second nanostructures 54A-54C. Moreover, although the outer sidewalls of the inner spacers 90N are illustrated as being concave in FIG. 16B, the outer sidewalls of the inner spacers 90N may be straight or convex. The inner spacers 90N may be used to prevent damage to subsequently formed source/drain regions (such as the epitaxial source/drain regions 92N, discussed below with respect to FIGS. 17A-17C) by subsequent etching processes, such as etching processes used to form gate structures. In some embodiments, the inner spacers 90N have a width between about 2 nm and about 6 nm.

Figure 17A:
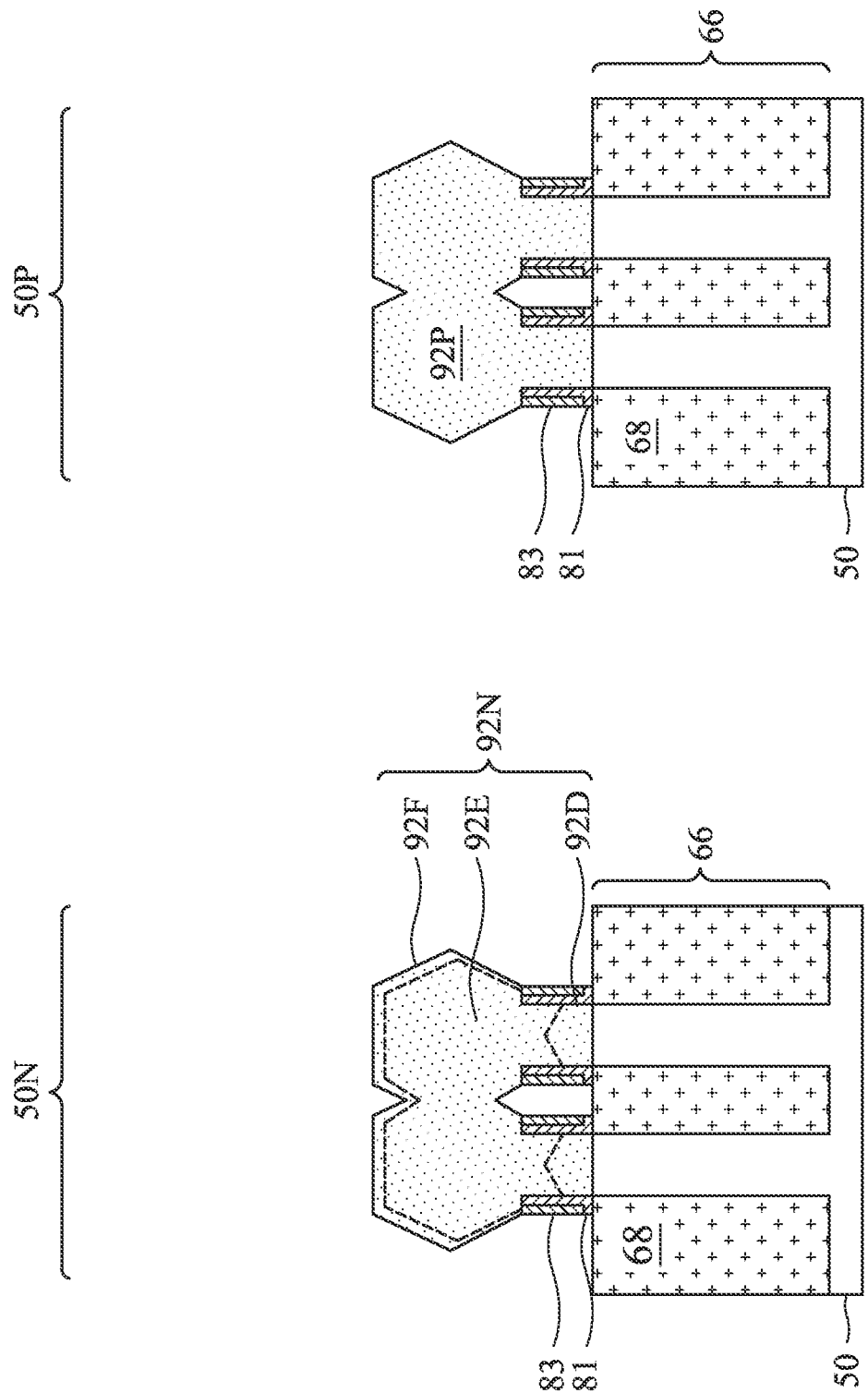
Figure 17B:
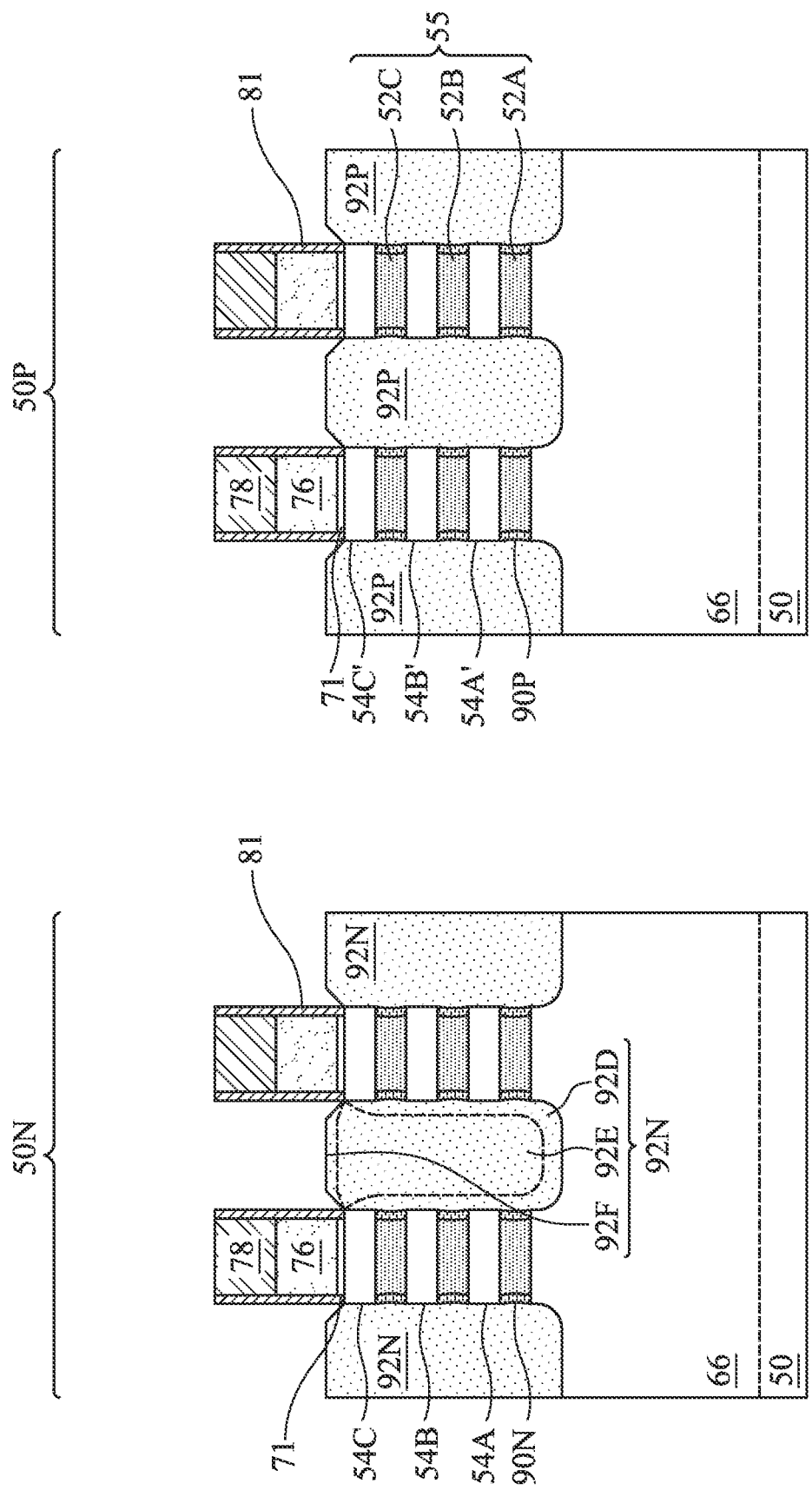
Figure 17C:
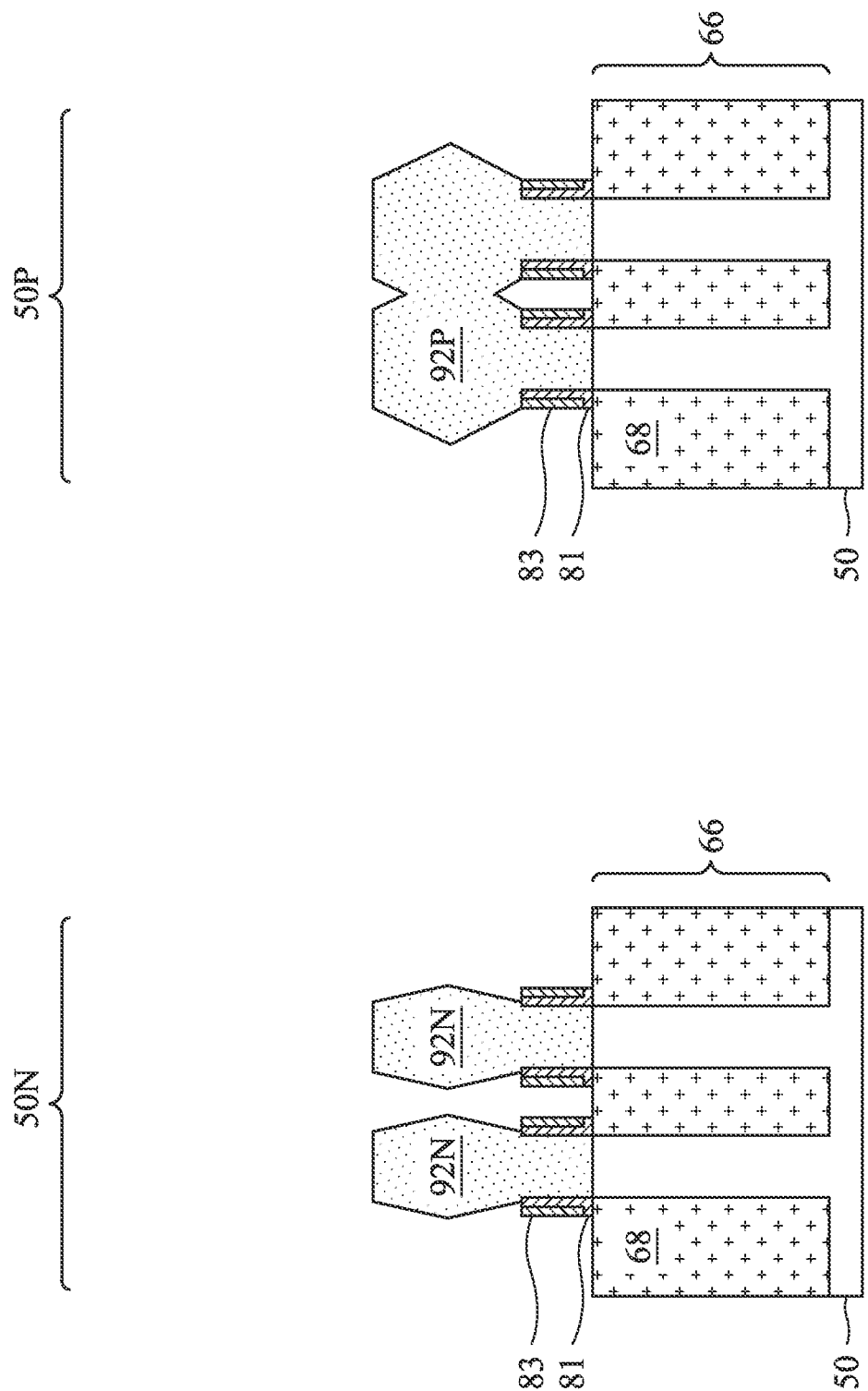

In FIGS. 17A-17C, epitaxial source/drain regions 92N are formed in the recesses 86N (see FIGS. 16A and 16B). In some embodiments, the epitaxial source/drain regions 92N may exert stress on the second nanostructures 54A-54C in the n-type region 50N, thereby improving performance. As illustrated in FIG. 17B, the epitaxial source/drain regions 92N are formed in the recesses 86N such that each dummy gate 76 is disposed between respective neighboring pairs of the epitaxial source/drain regions 92N. In some embodiments, the first spacers 81 are used to separate the epitaxial source/drain regions 92N from the dummy gates 76 and the inner spacers 90N are used to separate the epitaxial source/drain regions 92N from the nanostructures 55 by an appropriate lateral distance so that the epitaxial source/drain regions 92N do not short out with subsequently formed gates of the resulting nano-FETs.

The epitaxial source/drain regions 92N are epitaxially grown in the recesses 86N. The epitaxial source/drain regions 92N may include any acceptable material appropriate for n-type nano-FETs. For example, if the second nanostructures 54A-54C are silicon, the epitaxial source/drain regions 92N may include materials exerting a tensile strain on the second nanostructures 54A-54C, such as silicon, phosphorous doped silicon, silicon carbide, phosphorous doped silicon carbide, silicon phosphide, or the like. The epitaxial source/drain regions 92N may be also referred to as "n-type source/drain regions." The epitaxial source/drain regions 92N may have surfaces raised from respective surfaces of the fins 66 and the nanostructures 55, and may have facets.

The epitaxial source/drain regions 92N, the first nanostructures 52A-52C, the second nanostructures 54A-54C, and/or the fins 66 may be implanted with dopants to form source/drain regions, similar to the process previously discussed for forming lightly-doped source/drain regions, followed by an anneal. The source/drain regions may have an impurity concentration of between about 5E18 atoms/cm$^3$ and about 5E21 atoms/cm$^3$. The n-type impurities for source/drain regions may be any of the impurities previously discussed. In some embodiments, the epitaxial source/drain regions 92N may be in situ doped during growth.

As a result of the epitaxy processes used to form the epitaxial source/drain regions 92N, upper surfaces of the epitaxial source/drain regions 92N have facets which expand laterally outward beyond sidewalls of the fins 66. In some embodiments, these facets cause adjacent epitaxial source/drain regions 92N of a same nano-FET to merge as illustrated by FIG. 17A. In other embodiments, adjacent epitaxial source/drain regions 92N remain separated after the epitaxy process is completed as illustrated by FIG. 17C. In the embodiments illustrated in FIGS. 17A and 17C, the first spacers 81 may be formed to a top surface of the STI regions 68 thereby blocking the epitaxial growth. In some other embodiments, the first spacers 81 may cover portions of the sidewalls of the nanostructures 55 further blocking the epitaxial growth. In some other embodiments, the spacer etch used to form the first spacers 81 may be adjusted to remove the spacer material to allow the epitaxially grown region to extend to the surface of the STI region 68.

The epitaxial source/drain regions 92N may comprise one or more semiconductor material layers. For example, the epitaxial source/drain regions 92N may comprise a first semiconductor material layer 92D, a second semiconductor material layer 92E, and a third semiconductor material layer 92F. Any number of semiconductor material layers may be used for the epitaxial source/drain regions 92N. Each of the first semiconductor material layer 92D, the second semiconductor material layer 92E, and the third semiconductor material layer 92F may be formed of different semiconductor materials and may be doped to different dopant concentrations. In some embodiments, the first semiconductor material layer 92D may have a dopant concentration less than the second semiconductor material layer 92E and greater than the third semiconductor material layer 92F. In embodiments in which the epitaxial source/drain regions 92N comprise three semiconductor material layers, the first semiconductor material layer 92D may be deposited, the second semiconductor material layer 92E may be deposited over the first semiconductor material layer 92D, and the third semiconductor material layer 92F may be deposited over the second semiconductor material layer 92E. In the illustrated embodiment, the epitaxial source/drain regions 92P are formed before forming the epitaxial source/drain regions 92N. In other embodiments, the epitaxial source/drain regions 92P are formed after forming the epitaxial source/drain regions 92N.

Figure 18A:
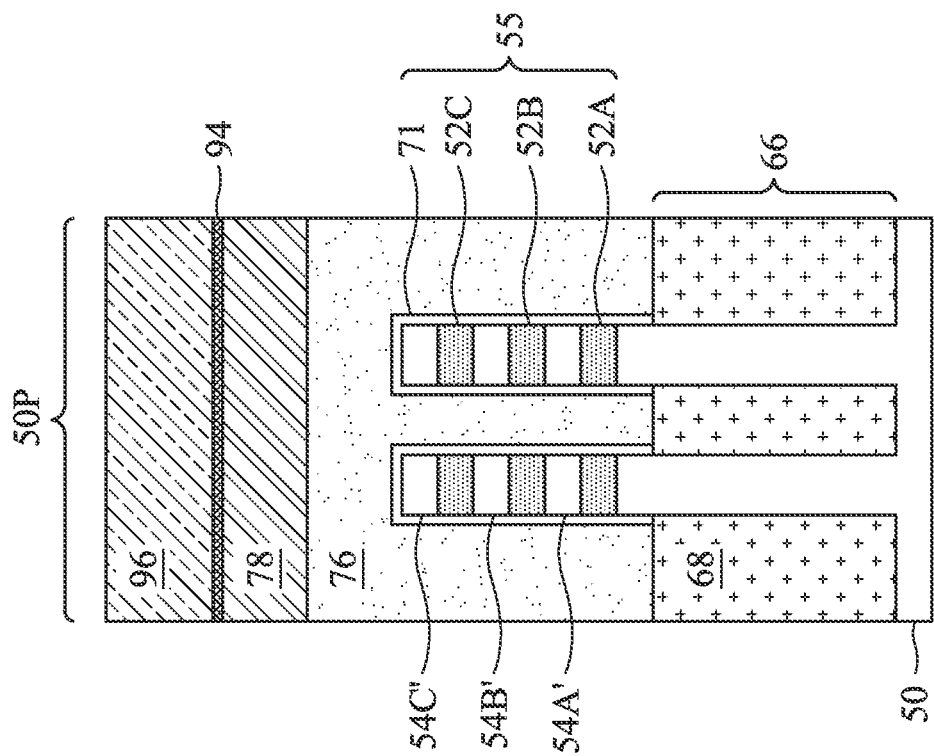
Figure 18A:
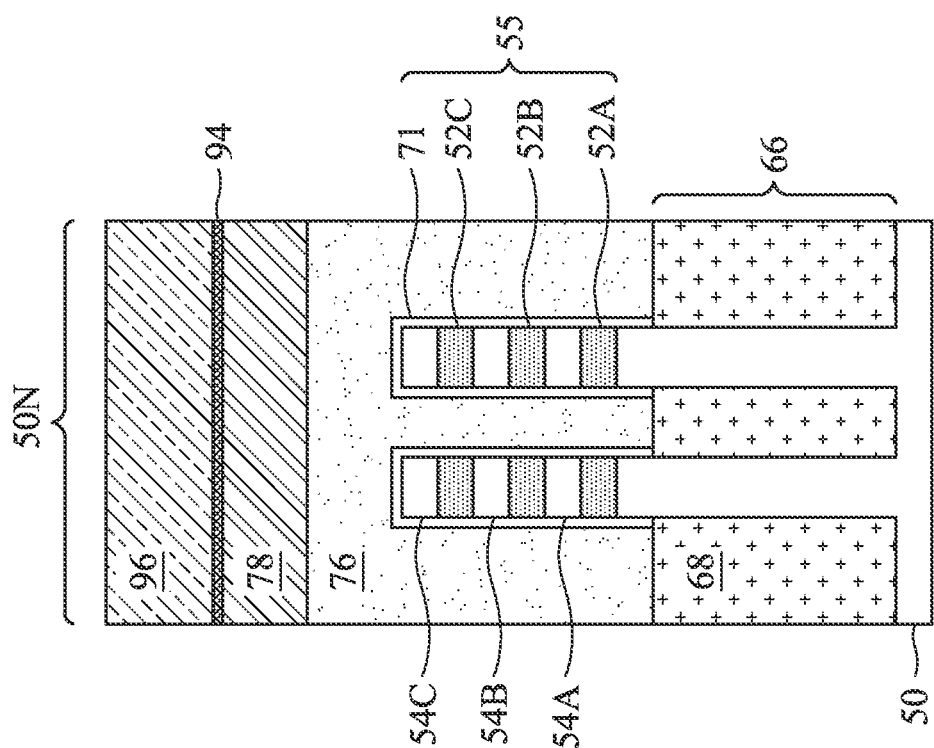
Figure 18B:
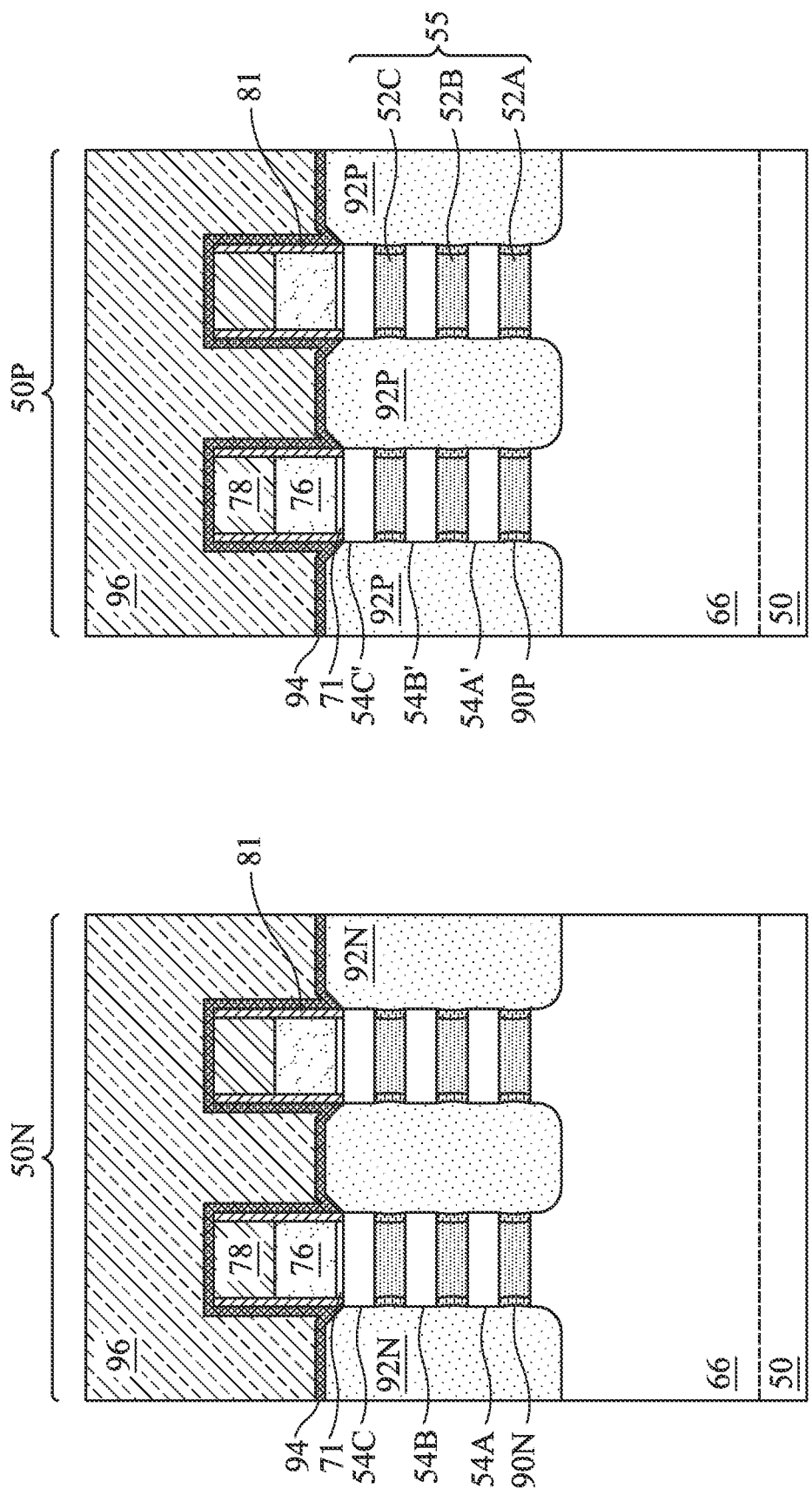
Figure 18C:
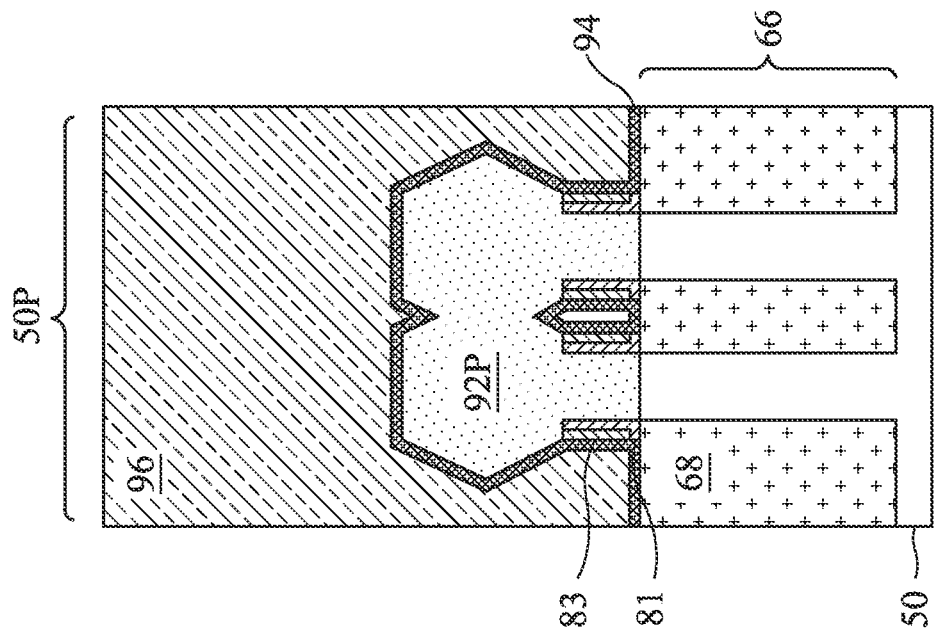
Figure 18C:
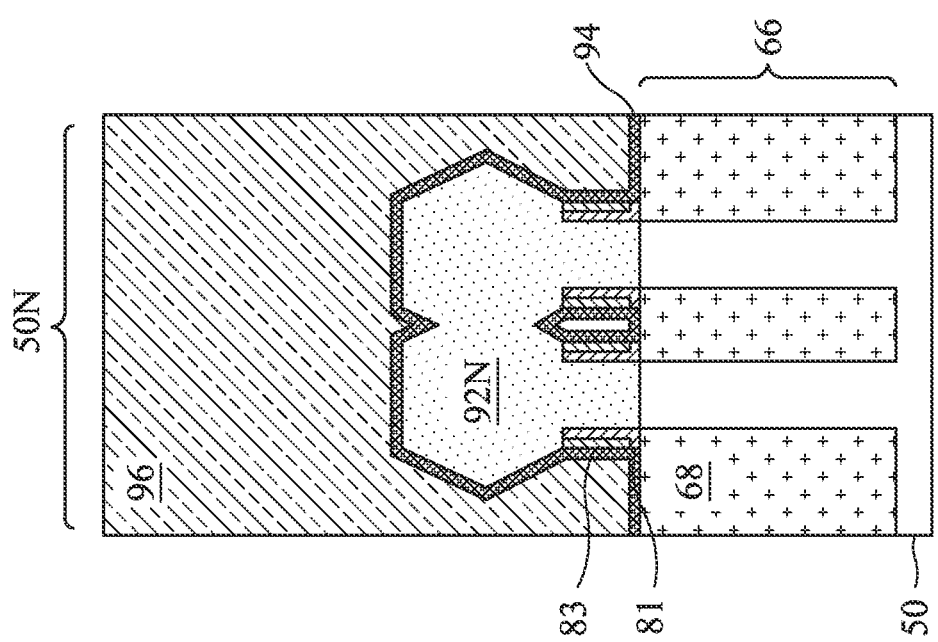

In FIGS. 18A-18C, a first interlayer dielectric (ILD) 96 is deposited over the structure illustrated in FIGS. 6A, 17B, and 17A (the processes of FIGS. 7A, 7B, 8A, 8B, 9A, 9B, 9C, 10A, 10B, 11A, 11B, 12A, 12B, 12C, 13A, 13B, 14A, 14B, 15A, 15B, 16A, 16B, 17A, 17B, and 17C do not alter the cross-section illustrated in FIGS. 6A), respectively. The first ILD 96 may be formed of a dielectric material, and may be deposited by any suitable method, such as CVD, PECVD, or FCVD. Dielectric materials may include phospho-silicate glass (PSG), boro-silicate glass (BSG), boron-doped phospho-silicate glass (BPSG), undoped silicate glass (USG), a combination thereof, or the like. Other insulation materials formed by any acceptable process may be used. In some embodiments, a contact etch stop layer (CESL) 94 is disposed between the first ILD 96 and the epitaxial source/drain regions 92N and 92P, the masks 78, and the first spacers 81. The CESL 94 may comprise a dielectric material, such as, silicon nitride, silicon oxide, silicon oxynitride, a combination thereof, or the like, having a different etch rate than the material of the overlying first ILD 96.

Figure 19A:
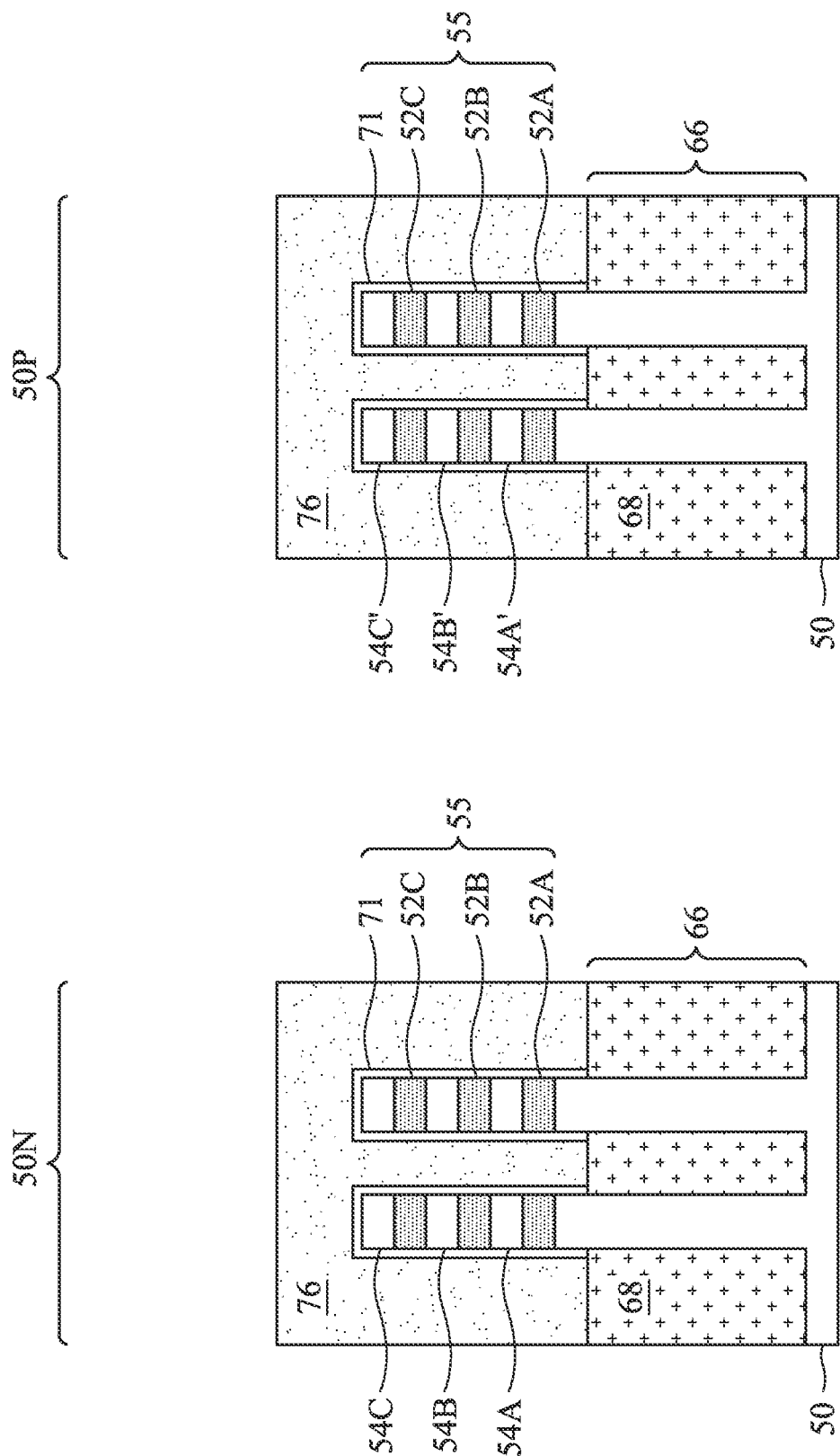
Figure 19B:
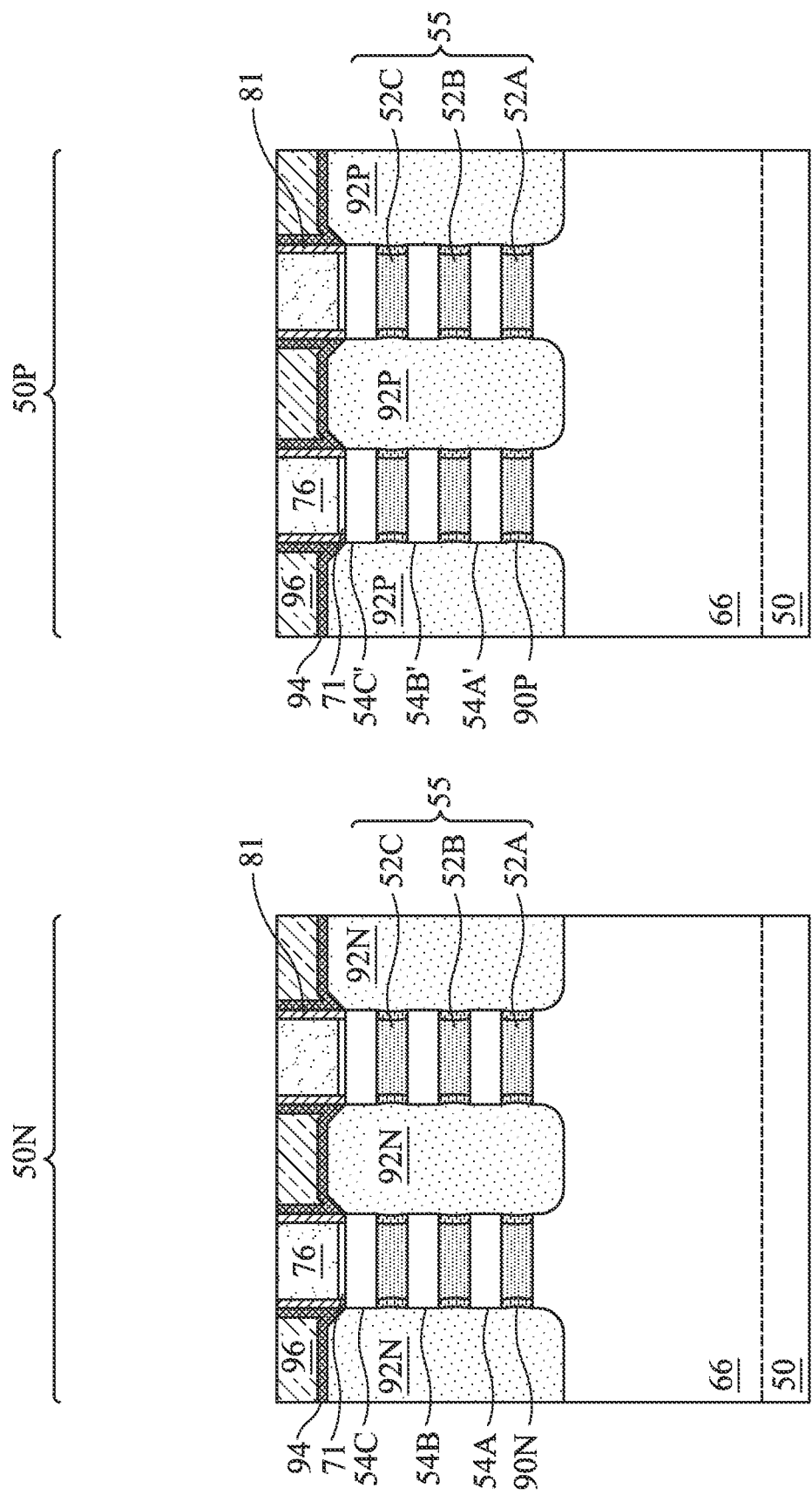

In FIGS. 19A and 19B, a planarization process, such as a CMP, may be performed to level the top surface of the first ILD 96 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, and the first ILD 96 are level within process variations. Accordingly, the top surfaces of the dummy gates 76 are exposed through the first ILD 96. In some embodiments, the masks 78 may remain, in which case the planarization process levels the top surface of the first ILD 96 with top surface of the masks 78 and the first spacers 81.

Figure 20A:
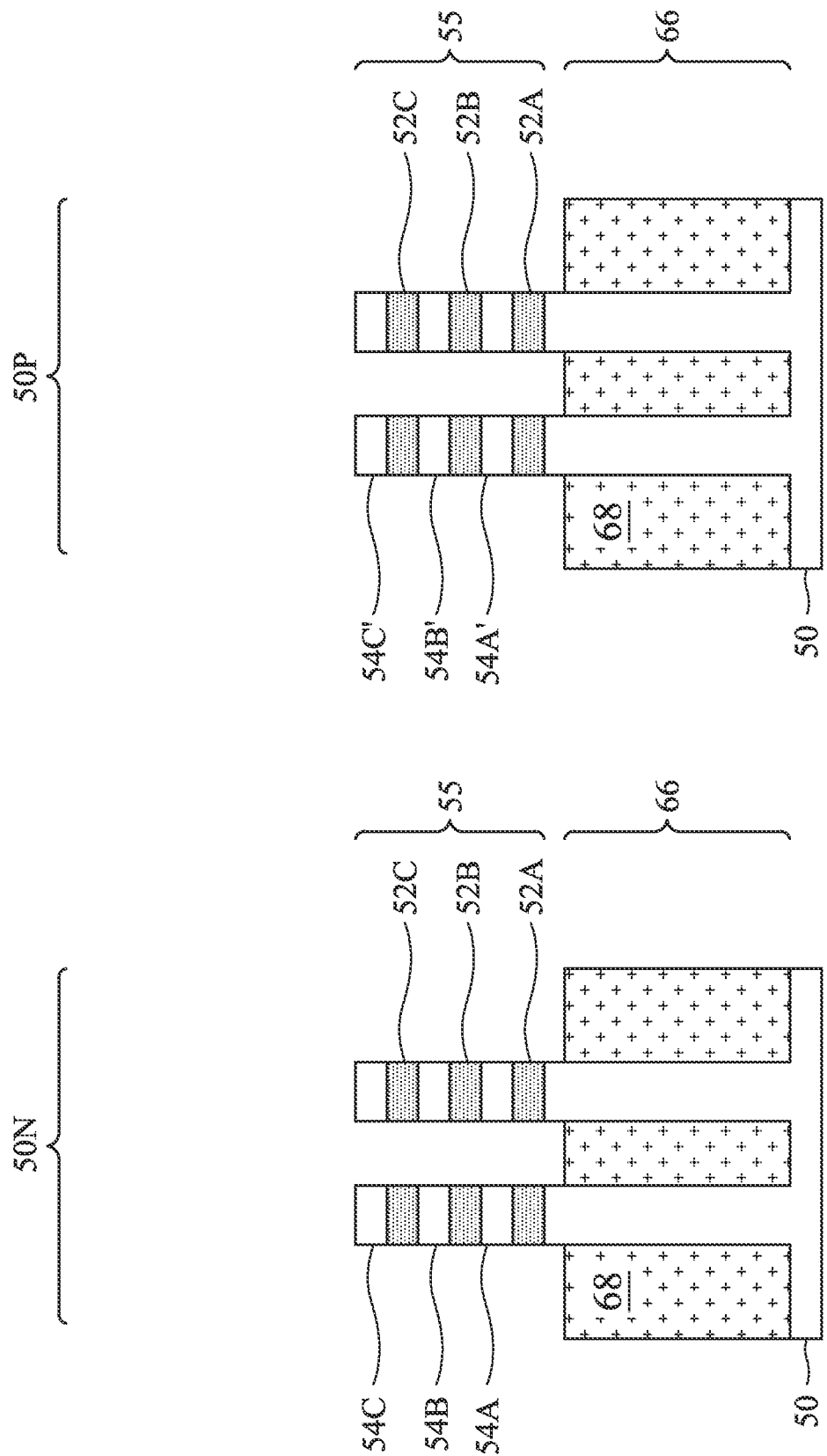
Figure 20B:
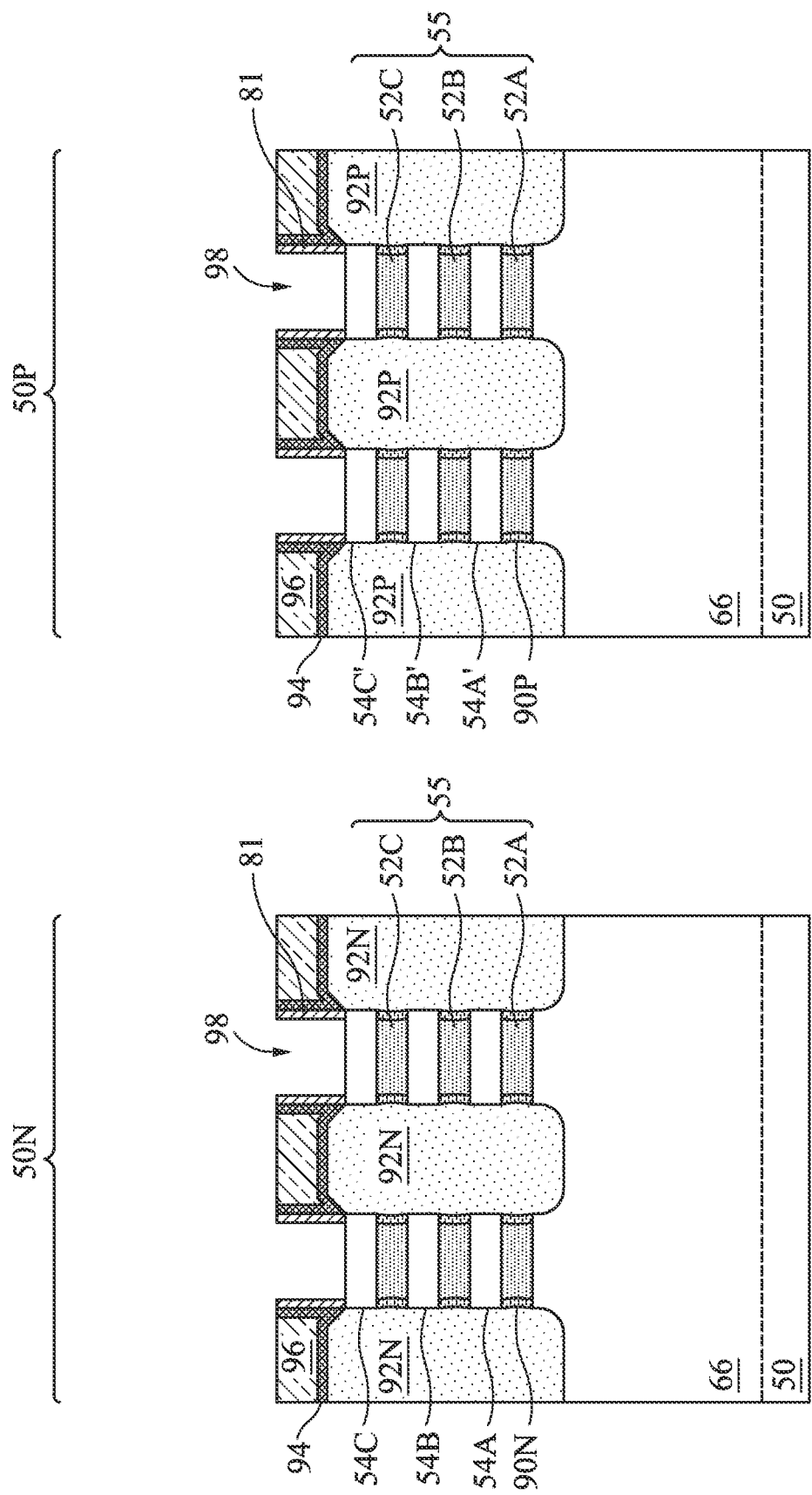

In FIGS. 20A and 20B, the dummy gates 76, and the masks 78 if present, are removed in one or more etching steps, so that recesses 98 are formed. Portions of the dummy gate dielectrics 71 in the recesses 98 are also be removed. In some embodiments, the dummy gates 76 and the dummy gate dielectrics 71 are removed by an anisotropic dry etch process. For example, the etching process may include a dry etch process using reaction gas(es) that selectively etch the dummy gates 76 at a faster rate than the first ILD 96 or the first spacers 81. Each recess 98 exposes and/or overlies portions of nanostructures 54A-54C, which act as channel regions in subsequently completed nano-FETs. Portions of the nanostructures 54A-54C which act as the channel regions are disposed between neighboring pairs of the epitaxial source/drain regions 92P in the p-type region 50P. Portions of the nanostructures 54A-54C which act as the channel regions are disposed between neighboring pairs of the epitaxial source/drain regions 92N in the n-type region 50N. During the removal, the dummy gate dielectrics 71 may be used as etch stop layers when the dummy gates 76 are etched. The dummy gate dielectrics 71 may then be removed after the removal of the dummy gates 76.

Figure 21A:
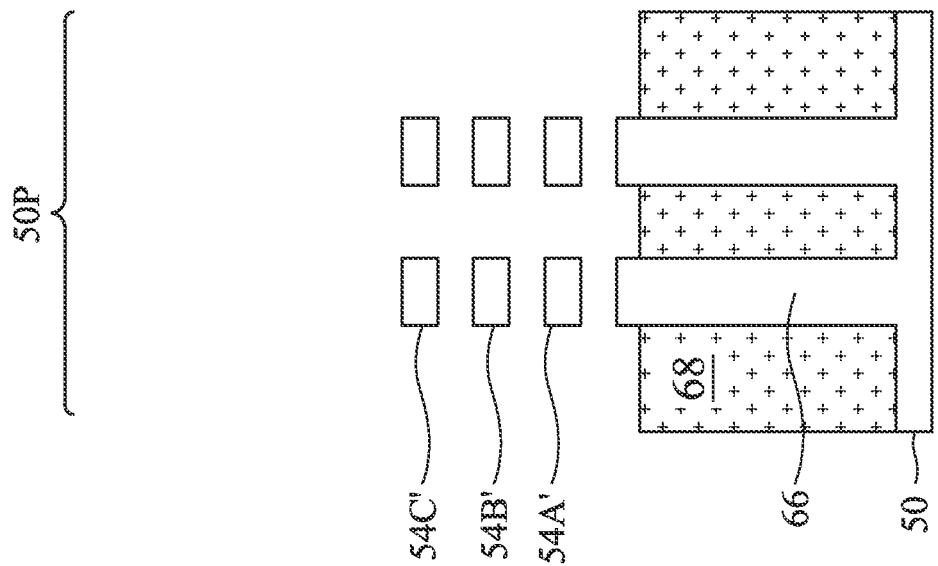
Figure 21A:
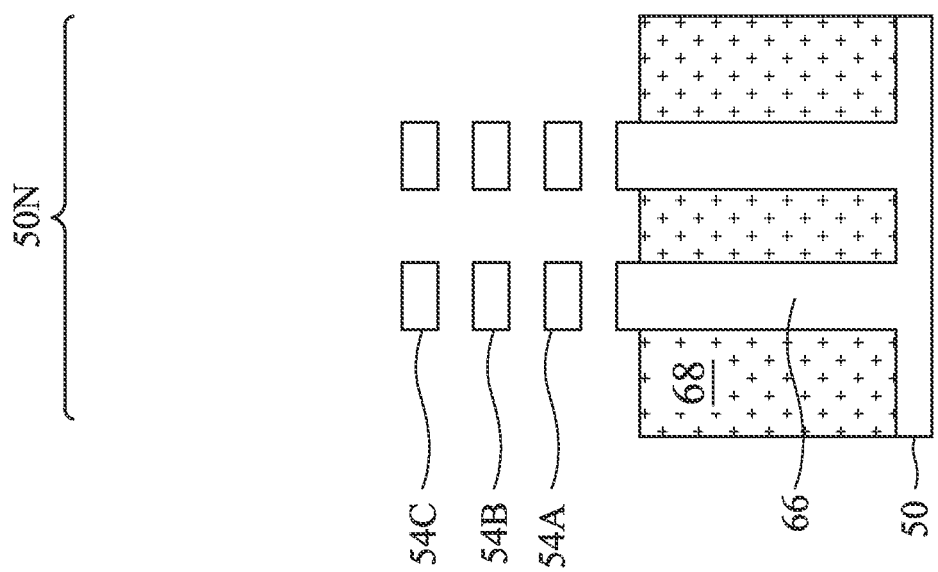
Figure 21B:
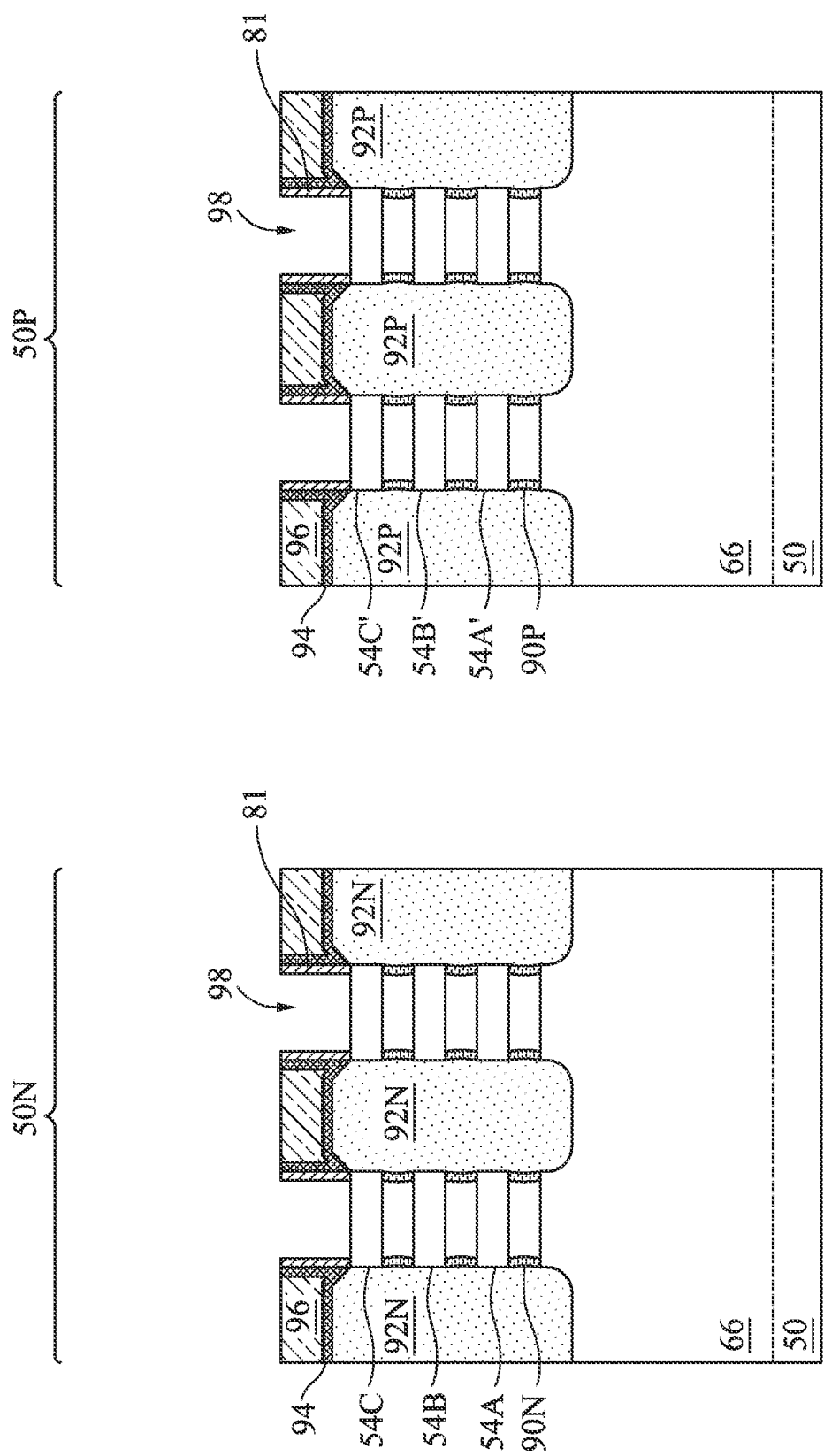

In FIGS. 21A and 21B, the first nanostructures 52A-52C in the n-type region 50N and the p-type region 50P are removed extending the recesses 98. The first nanostructures 52A-52C may be removed performing an isotropic etching process such as wet etching or the like using etchants which are selective to the materials of the first nanostructures 52A-52C, while the second nanostructures 54A-54C, the fin 66, and the STI regions 68 remain relatively unetched as compared to the first nanostructures 52A-52C. In embodiments in which the first nanostructures 52A-52C include, e.g., SiGe, and the second nanostructures 54A-54C include, e.g., Si or SiC, tetramethylammonium hydroxide (TMAH), ammonium hydroxide ($NH_4OH$), or the like may be used to remove the first nanostructures 52A-52C.

Figure 22A:
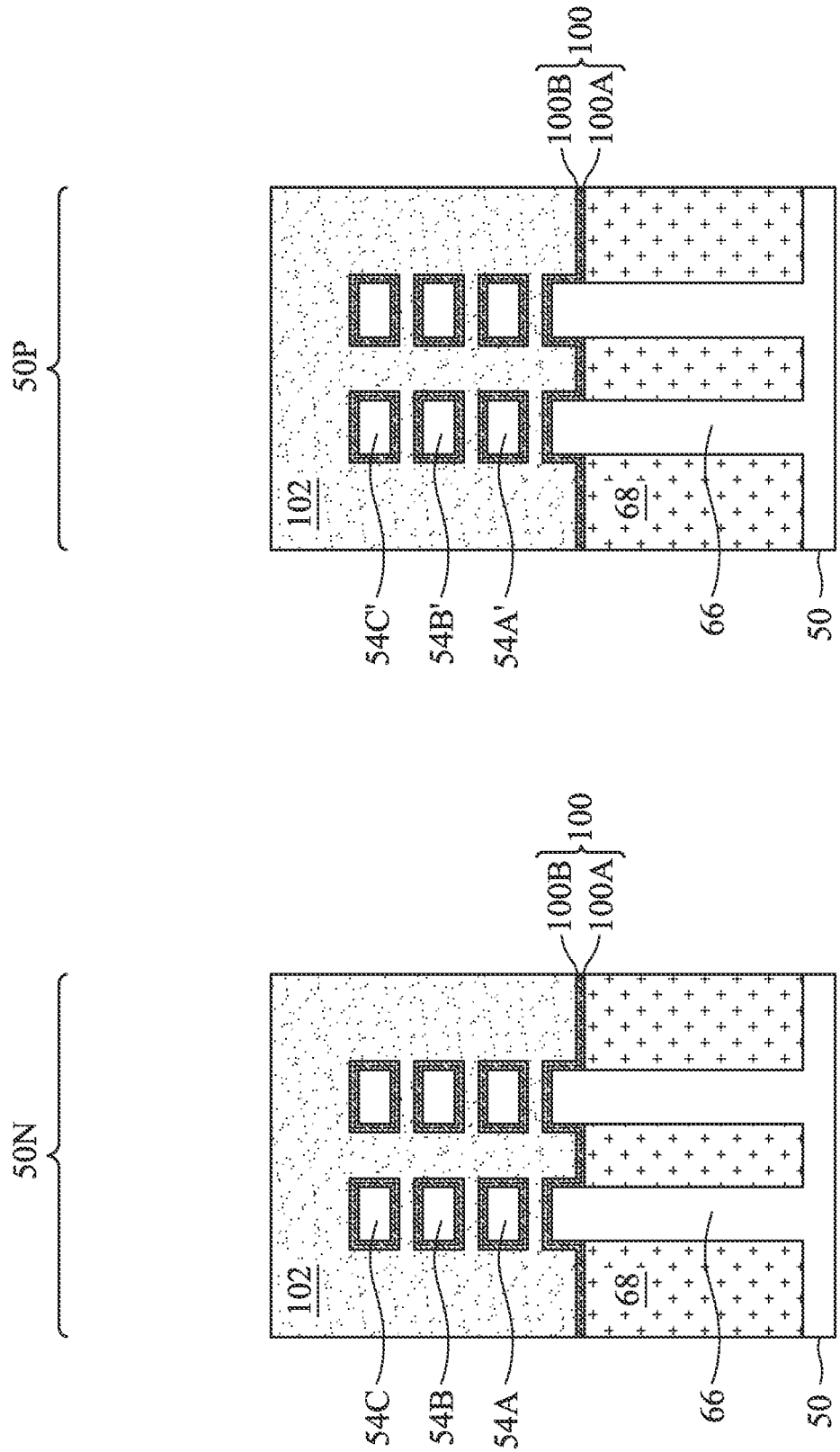
Figure 22B:
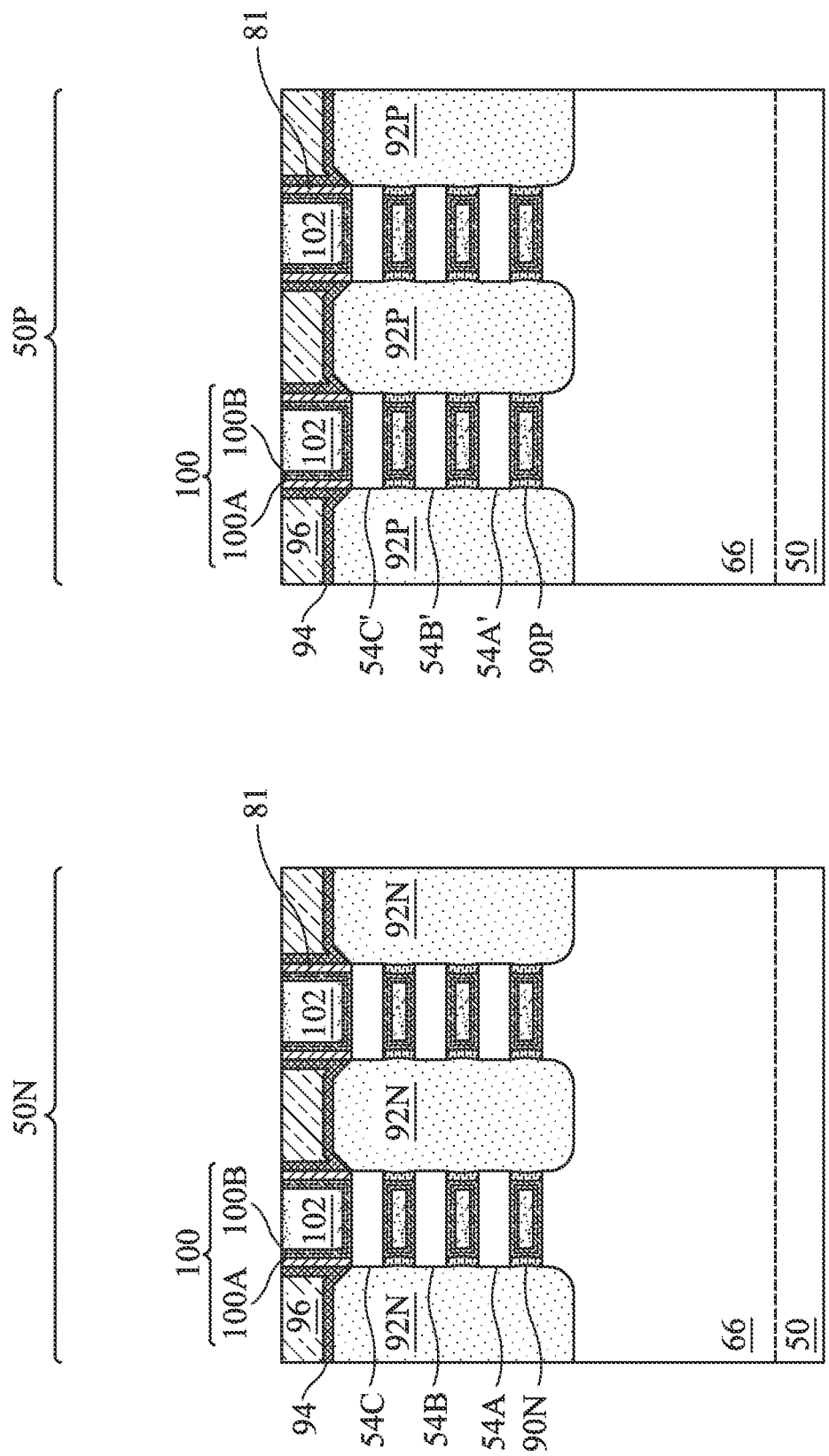

In FIGS. 22A and 22B, gate dielectric layers 100 and gate electrodes 102 are formed for replacement gates. The gate dielectric layers 100 are deposited conformally in the recesses 98. The gate dielectric layers 100 are formed on top surfaces and sidewalls of the fin 66 and on top surfaces, sidewalls, and bottom surfaces of the second nanostructures 54A-54C. The gate dielectric layers 100 may also be deposited on top surfaces of the first ILD 96, the CESL 94, the first spacers 81, and the STI regions 68.

In some embodiments, the gate dielectric layers 100 comprise one or more layers of a dielectric material such as an oxide, a metal oxide, a metal silicate, the like, or combinations thereof. For example, in some embodiments, the gate dielectric layers 100 may comprise an interfacial layer 100A and a high-k dielectric layer 100B over the interfacial layer 100A. The interfacial layer 100A may comprise silicon oxide or the like and may be formed using thermal oxidation, ALD, CVD, a combination thereof, or the like. The high-k dielectric layer 100B may include a high-k dielectric material (for example, a dielectric material having a k value greater than about 7.0), such as a metal oxide or a silicate of hafnium, aluminum, zirconium, lanthanum, manganese, barium, titanium, lead, and combinations thereof, and may be formed using molecular-beam deposition (MBD), ALD, PECVD, a combination thereof, or the like. The structure of the gate dielectric layers 100 may be the same or different in the n-type region 50N and the p-type region 50P.

The gate electrodes 102 are deposited over the gate dielectric layers 100, respectively, and fill the remaining portions of the recesses 98. Although single layer gate electrodes 102 are illustrated in FIGS. 22A and 22B, the gate electrodes 102 may comprise any number of liner layers, any number of work function tuning layers, and a fill material. The liner layers may include TiN, TiO, TaN, TaC, combinations thereof, multi-layers thereof, or the like, and may be formed using PVD, CVD, ALD, a combination thereof, or the like. In the n-type region 50N, the work function tuning layers may include Ti, Ag, Al, TiAl, TiAlN, TiAlC, TaC, TaCN, TaSiN, TaAlC, Mn, Zr, combinations thereof, multi-layers thereof, or the like, and may be formed using PVD, CVD, ALD, a combination thereof, or the like. In the p-type region 50P, the work function tuning layers may include TiN, WN, TaN, Ru, Co, combinations thereof, multi-layers thereof, or the like, and may be formed using PVD, CVD, ALD, a combination thereof, or the like. The conductive fill material may comprise Co, Ru, Al, Ag, Au, W, Ni, Ti, Cu, Mn, Pd, Re, Ir, Pt, Zr, alloys thereof, combinations thereof, multi-layers thereof, or the like, and may be formed using PVD, CVD, ALD, plating, a combination thereof, or the like.

The formation of the gate dielectric layers 100 in the n-type region 50N and the p-type region 50P may occur simultaneously such that the gate dielectric layers 100 in each region are formed from the same materials, and the formation of the gate electrodes 102 in the n-type region 50N and the p-type region 50P may occur simultaneously such that the gate electrodes 102 in each region are formed from the same materials. In some embodiments, the gate dielectric layers 100 in each region may be formed by distinct processes, such that the gate dielectric layers 100 may be different materials and/or have a different number of layers, and/or the gate electrodes 102 in each region may be formed by distinct processes, such that the gate electrodes 102 may be different materials and/or have a different number of layers. Various masking steps may be used to mask and expose appropriate regions when using distinct processes.

After the filling of the recesses 98, a planarization process, such as a CMP, may be performed to remove the excess portions of the gate dielectric layers 100 and the material of the gate electrodes 102, which excess portions are over the top surface of the first ILD 96. The remaining portions of material of the gate electrodes 102 and the gate dielectric layers 100 thus form replacement gate structures of the resulting nano-FETs. The gate electrodes 102 and the gate dielectric layers 100 may be collectively referred to as "gate structures." After performing the planarization process, top surfaces of the gate structures and the top surface of the first ILD 96 are substantially co-planar or level within process variations of the planarization process.

Figure 23A:
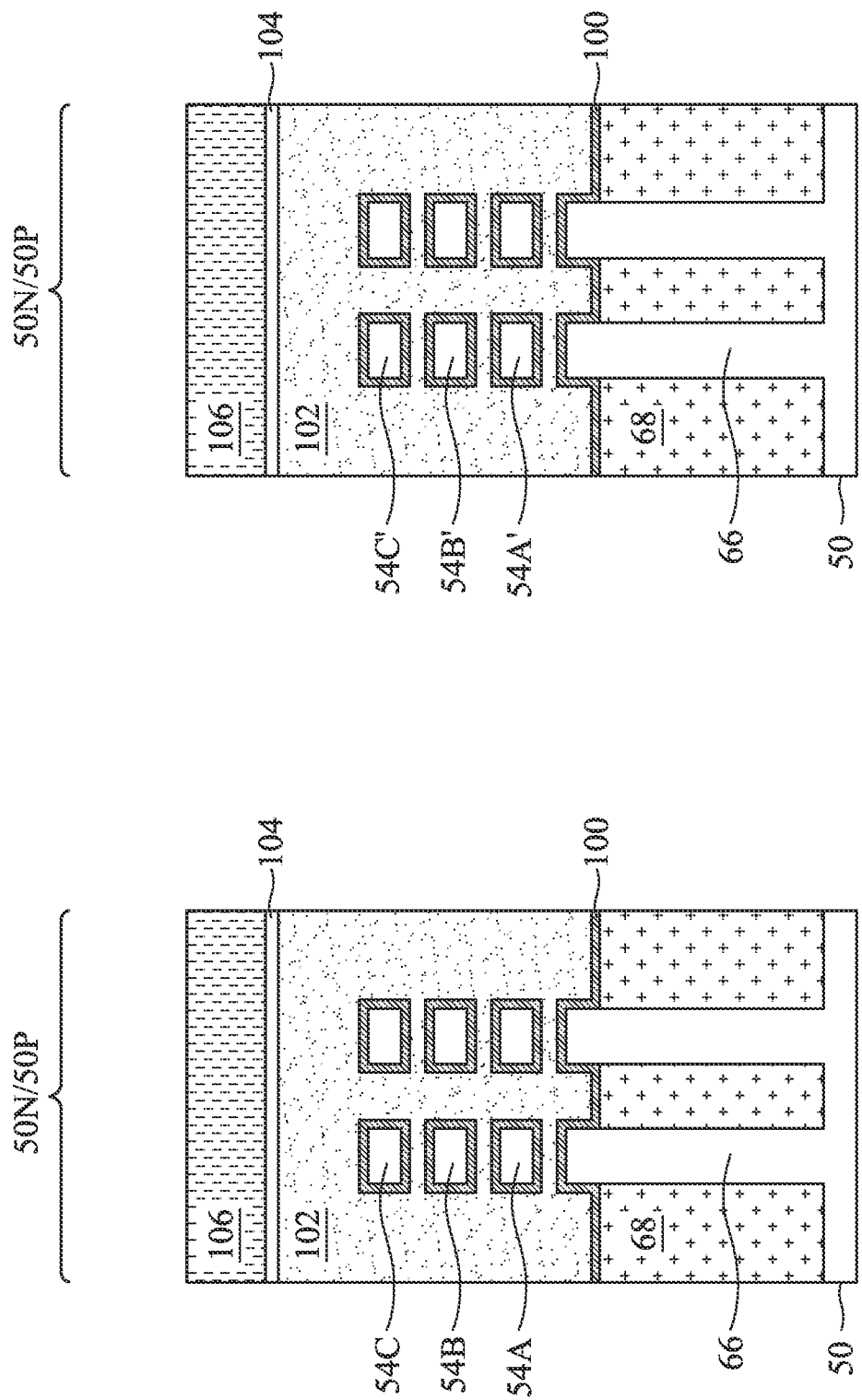
Figure 23B:
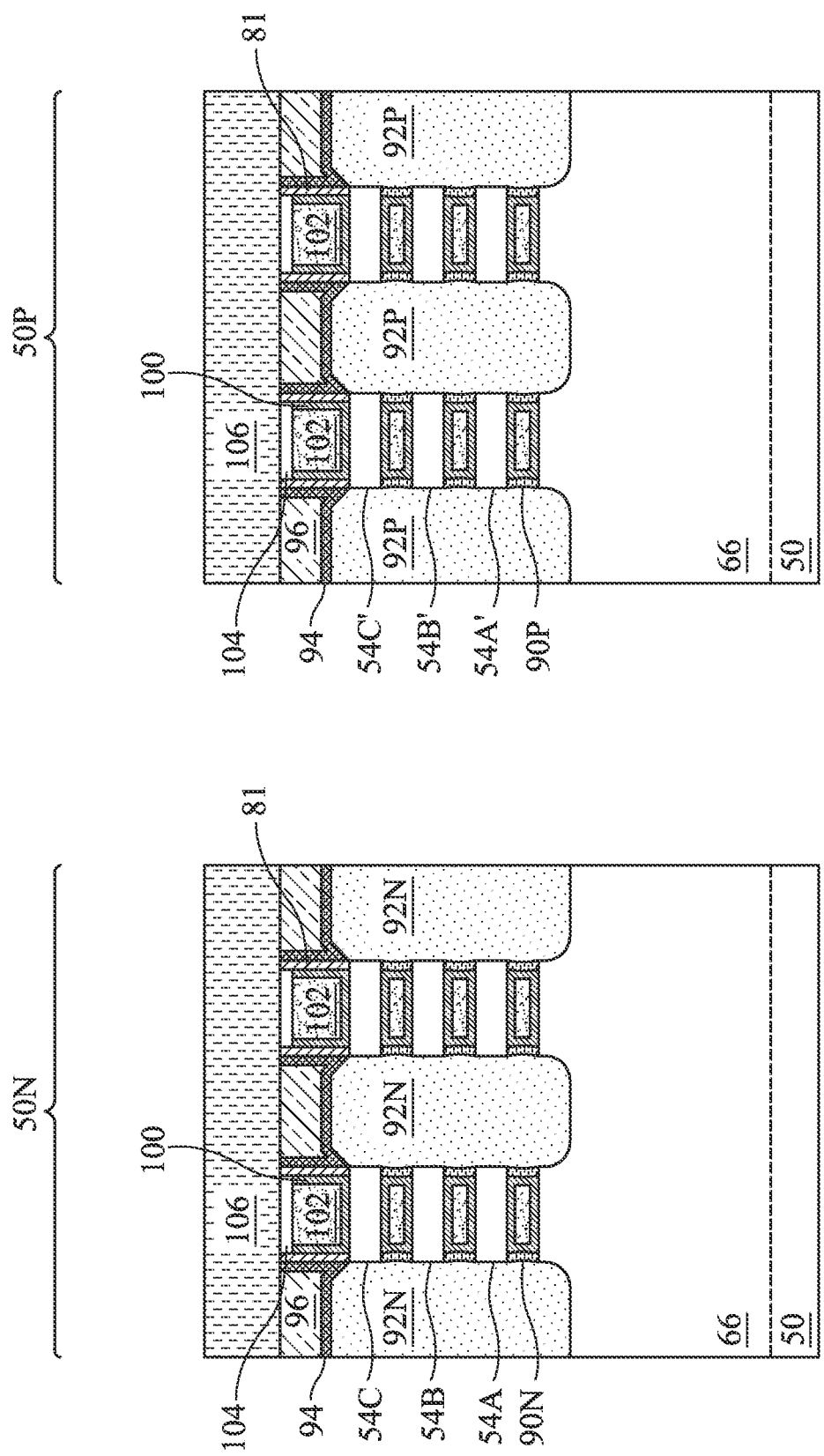
Figure 23C:
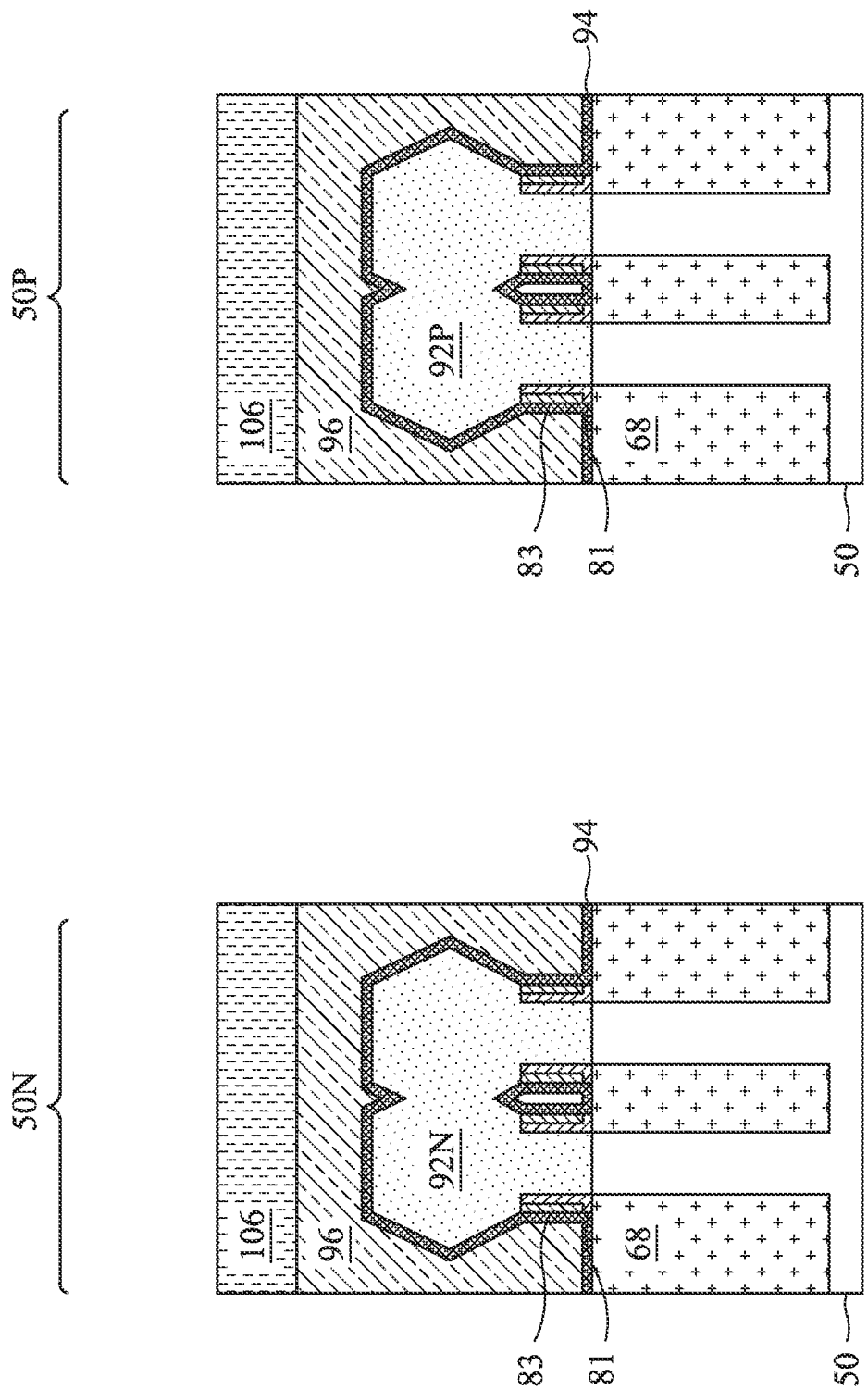

In FIGS. 23A-23C, the gate structures (including the gate dielectric layers 100 and the corresponding overlying gate electrodes 102) are recessed, so that recesses are formed directly over the gate structures and between opposing portions of first spacers 81. Gate masks 104 comprising one or more layers of dielectric material, such as silicon nitride, silicon oxynitride, a combination thereof, or the like, are filled in the respective recesses, followed by a planarization process to remove excess portions of the dielectric material extending over the first ILD 96. Subsequently formed gate contacts (such as the contacts 114, discussed below with respect to FIGS. 25A and 25B) penetrate through the gate masks 104 to contact top surfaces of the corresponding recessed gate electrodes 102.

As further illustrated by FIGS. 23A-23C, a second ILD 106 is deposited over the first ILD 96 and over the gate masks 104. In some embodiments, the second ILD 106 is a flowable film formed by FCVD. In some embodiments, the second ILD 106 is formed of a dielectric material such as PSG, BSG, BPSG, USG, a combination thereof, or the like, and may be deposited by any suitable method, such as CVD, PECVD, a combination thereof, or the like. In some embodiments, the first ILD 96 and the second ILD 106 are formed of a same material. In other embodiments, the first ILD 96 and the second ILD 106 are formed of different materials.

Figure 24A:
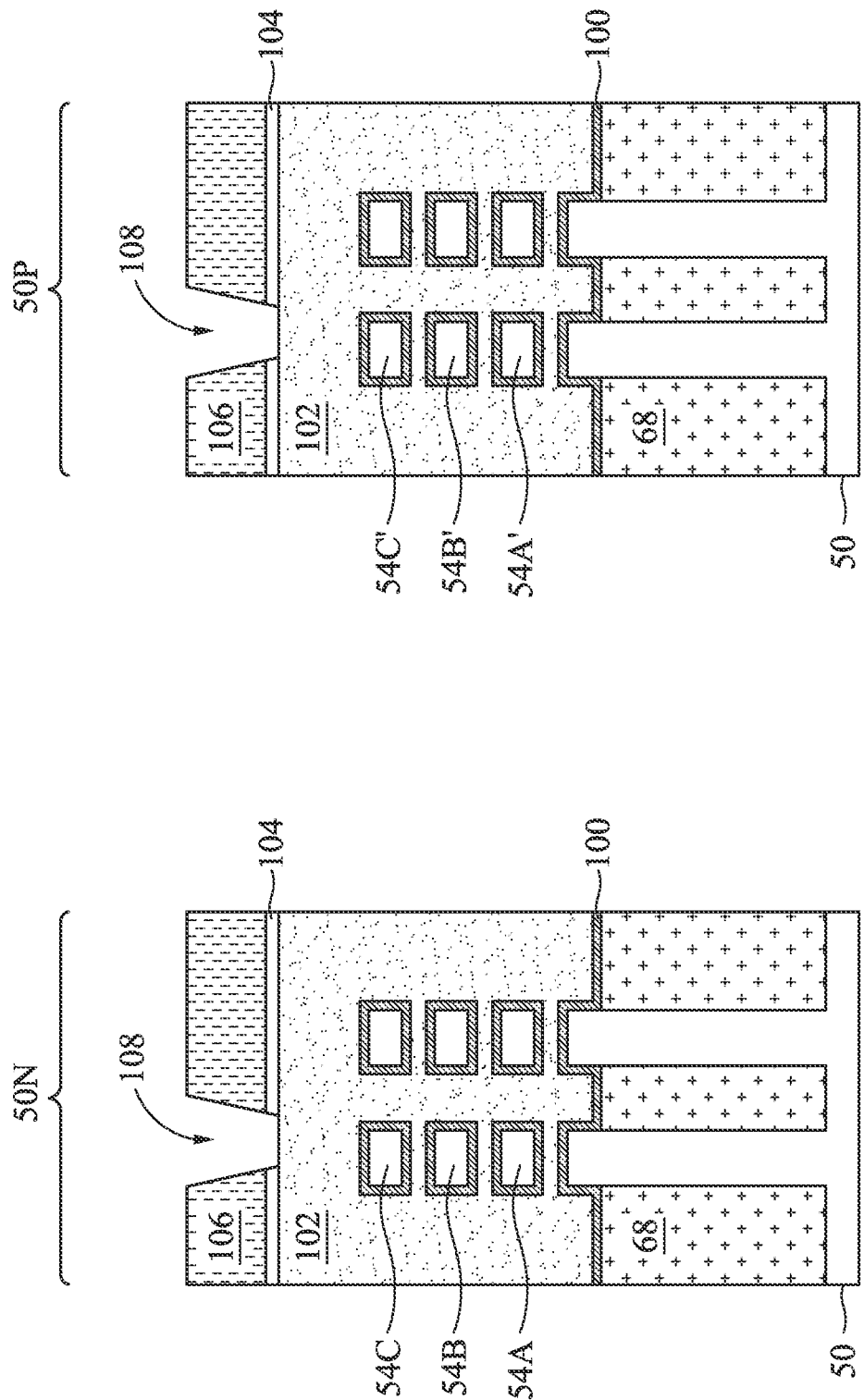
Figure 24B:
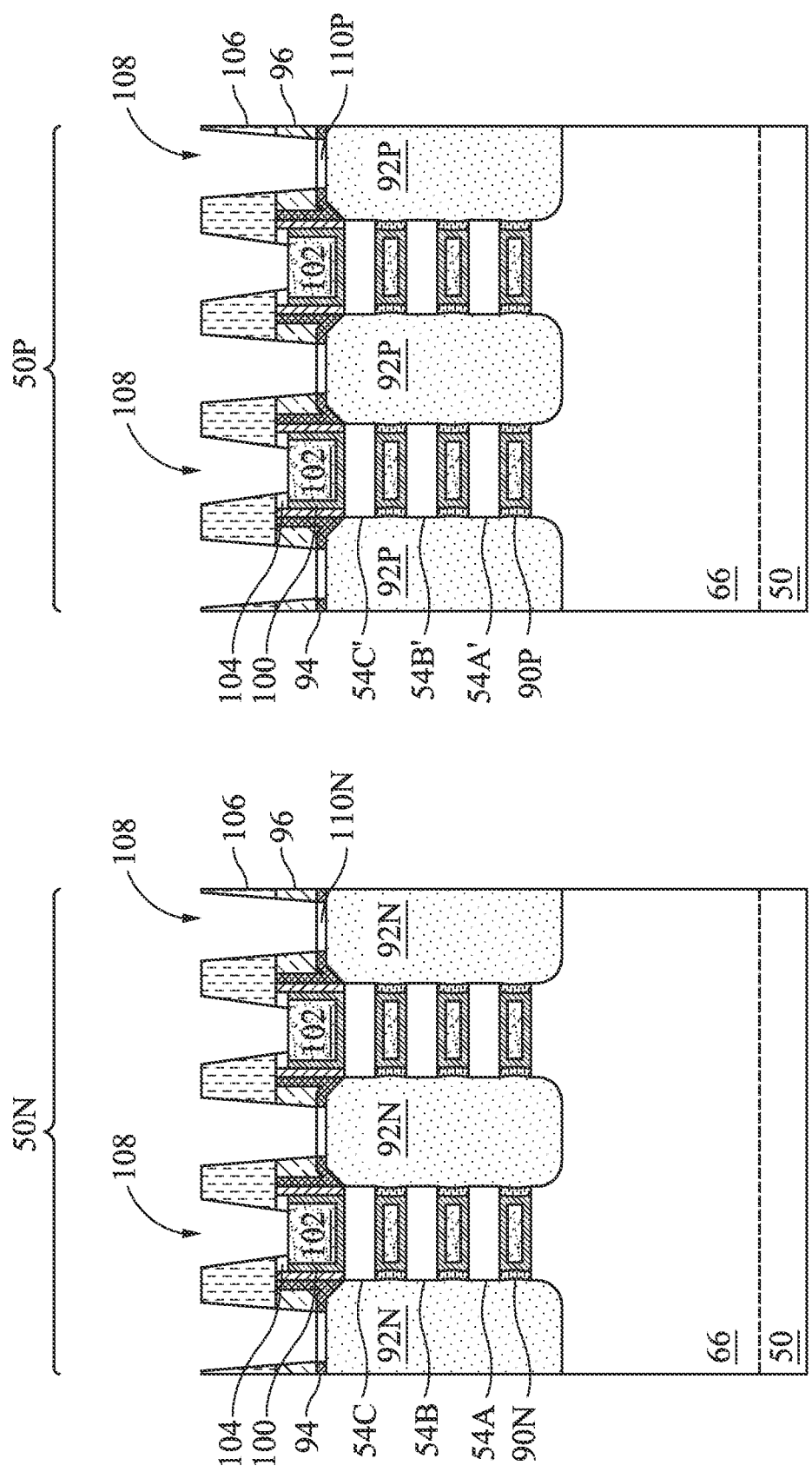
Figure 24C:
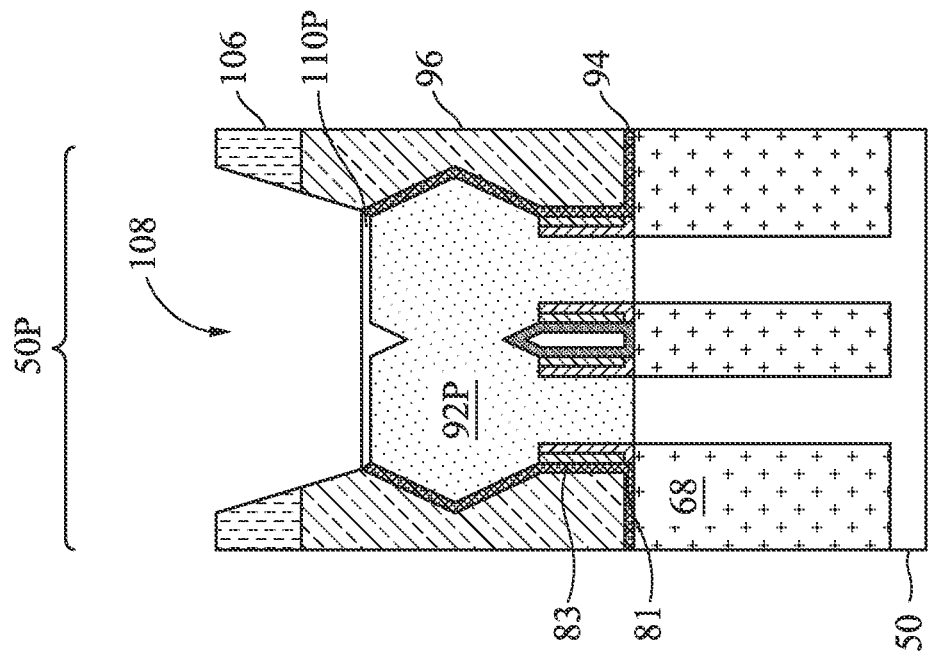
Figure 24C:
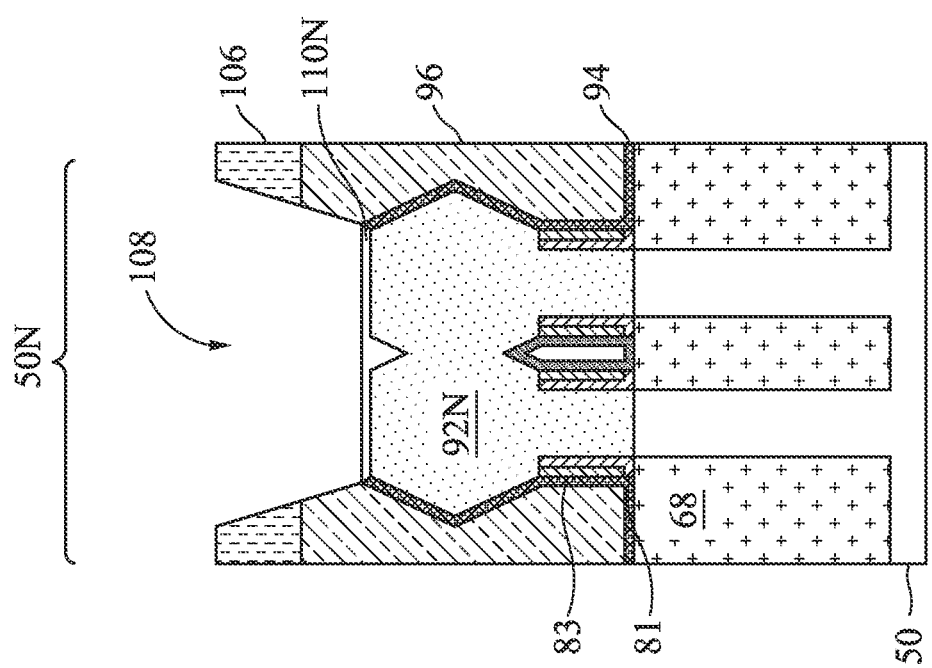

In FIGS. 24A-24C, the second ILD 106, the first ILD 96, the CESL 94, and the gate masks 104 are etched to form recesses 108 exposing surfaces of the epitaxial source/drain regions 92P and 92N and/or the gate structure. The recesses 108 may be formed by etching using an anisotropic etching process, such as RIE, NBE, or the like. In some embodiments, the recesses 108 may be etched through the second ILD 106 and the first ILD 96 using a first etching process; may be etched through the gate masks 104 using a second etching process; and may then be etched through the CESL 94 using a third etching process. A mask, such as a photoresist, may be formed and patterned over the second ILD 106 to mask portions of the second ILD 106 from the first etching process and the second etching process. In some embodiments, the etching process may over-etch, and therefore, the recesses 108 extend into the epitaxial source/drain regions 92N and 92P, and/or the gate structures, and a bottom of the recesses 108 may be level with (e.g., at a same level, or having a same distance from the substrate 50), or lower than (e.g., closer to the substrate 50) the epitaxial source/drain regions 92N and 92P, and/or the gate structures. Although FIG. 24B illustrate the recesses 108 as exposing the epitaxial source/drain regions 92N and 92P, and the gate structures in a same cross section, in various embodiments, the epitaxial source/drain regions 92N and 92P, and the gate structures may be exposed in different cross-sections, thereby reducing the risk of shorting subsequently formed contacts.

After the recesses 108 are formed, silicide regions 110N and 110P are formed over the epitaxial source/drain regions 92N and 92P, respectively. In some embodiments, the silicide regions 110N and 110P are formed by first depositing a metal (not shown) capable of reacting with the semiconductor materials of the underlying epitaxial source/drain regions 92N and 92P (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92N and 92P, then performing a thermal anneal process to form the silicide regions 110N and 110P, respectively. The un-reacted portions of the deposited metal are then removed, e.g., by an etching process. Although silicide regions 110N and 110P are referred to as silicide regions, silicide regions 110N and 110P may also be germanide regions, or silicon germanide regions (e.g., regions comprising silicide and germanide).

Figure 25A:
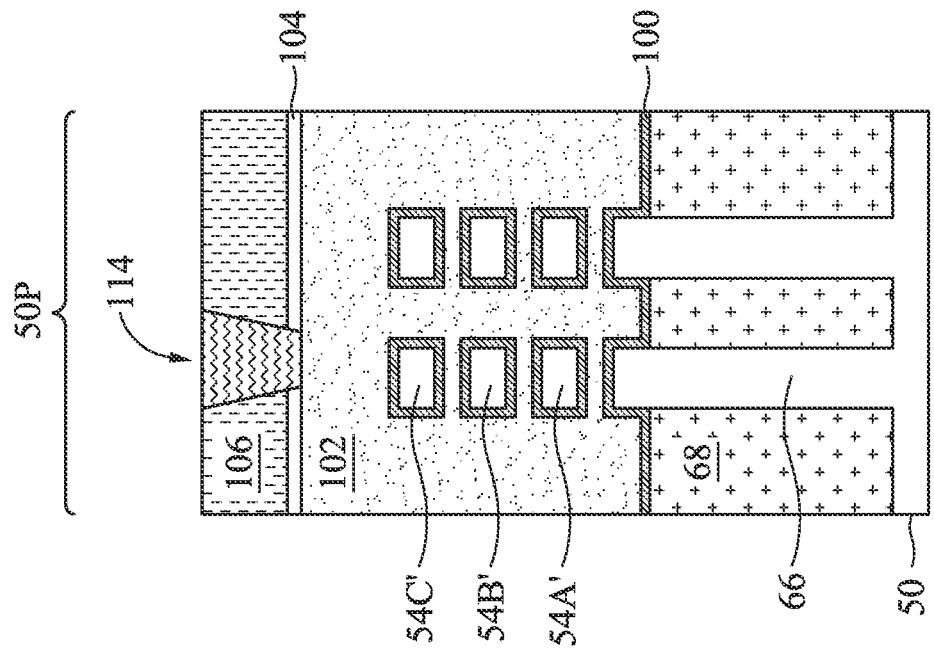
Figure 25A:
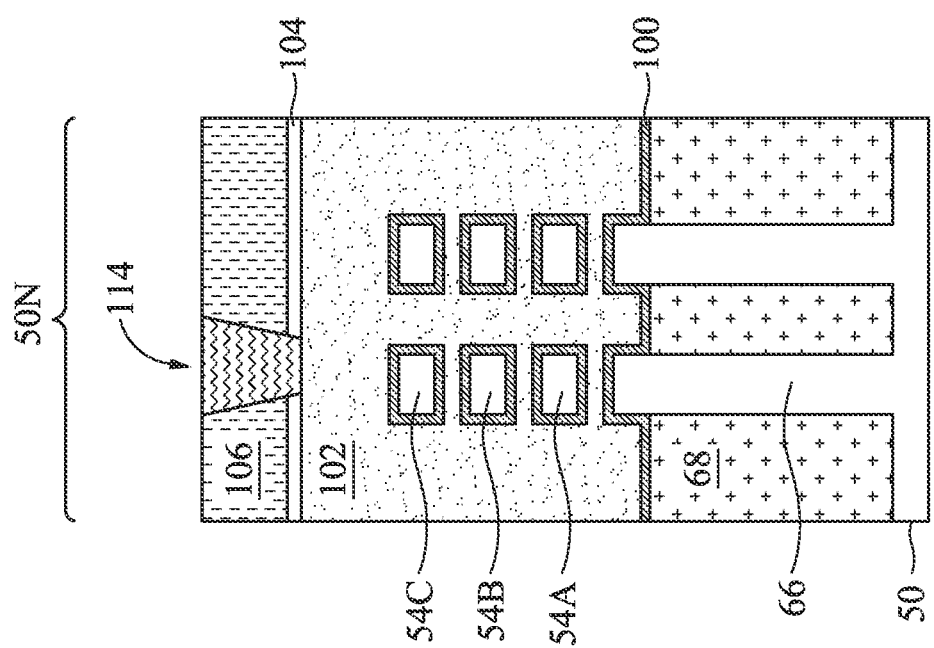
Figure 25B:
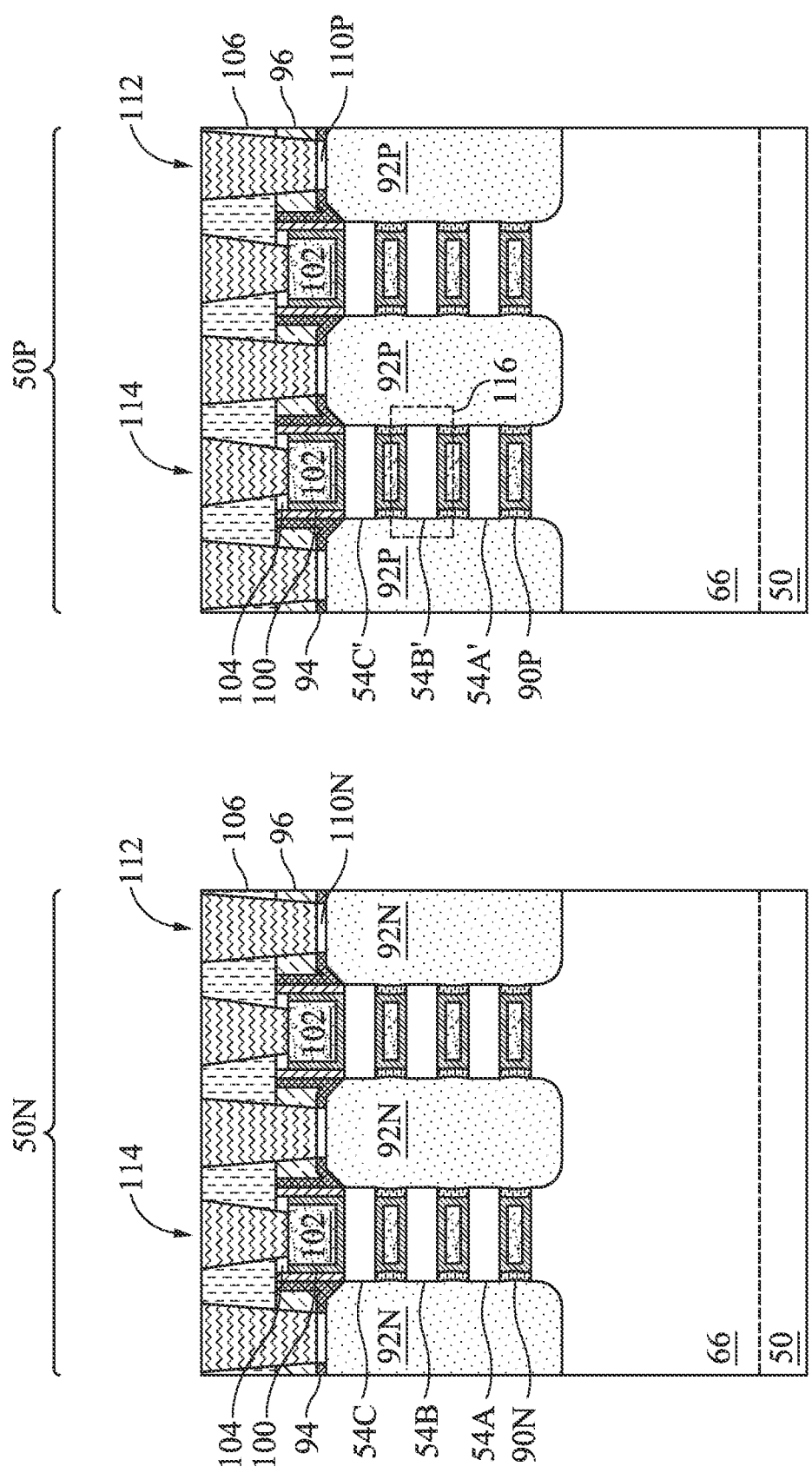
Figure 25C:
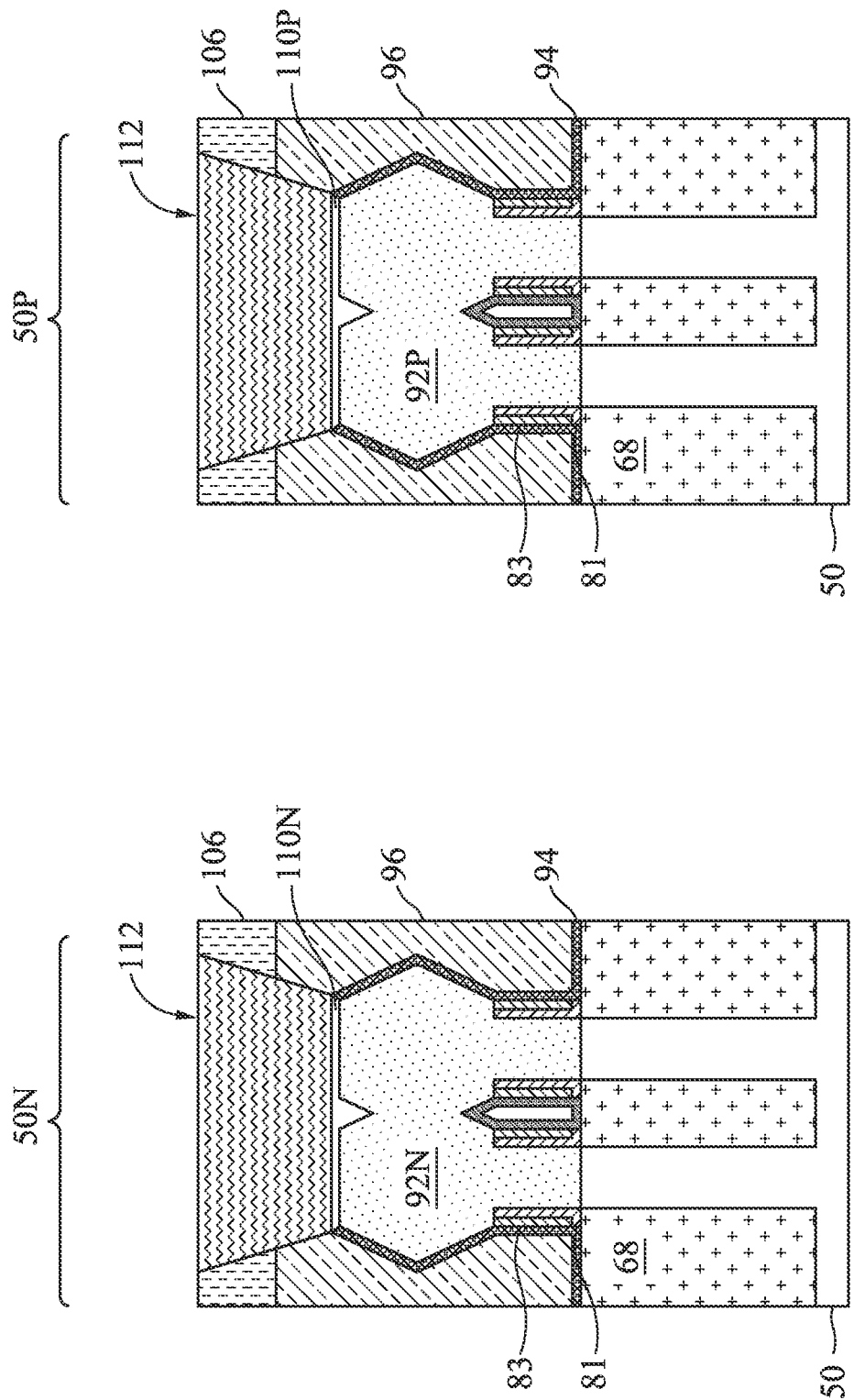

Next, in FIGS. 25A-25C, contacts 112 and 114 (may also be referred to as contact plugs) are formed in the recesses 108 (see FIGS. 24A-24C). The contacts 112 and 114 may each comprise one or more layers, such as barrier layers, diffusion layers, and fill materials. For example, in some embodiments, each of the contacts 112 and 114 includes a barrier layer and a conductive material (not individually illustrated) and is electrically coupled to the underlying conductive feature (e.g., gate electrodes 102 and/or silicide regions 110N and 110P in the illustrated embodiment). The contacts 114 are electrically coupled to the gate structures 102 and may be referred to as gate contacts, and the contacts 112 are electrically coupled to the silicide regions 110N and 110P, and may be referred to as source/drain contacts. The barrier layer may include titanium, titanium nitride, tantalum, tantalum nitride, a combination thereof, or the like. The conductive material may be copper, a copper alloy, silver, gold, tungsten, cobalt, aluminum, nickel, a combination thereof, or the like. A planarization process, such as a CMP, may be performed to remove excess material from a surface of the second ILD 106.

Figure 25D:
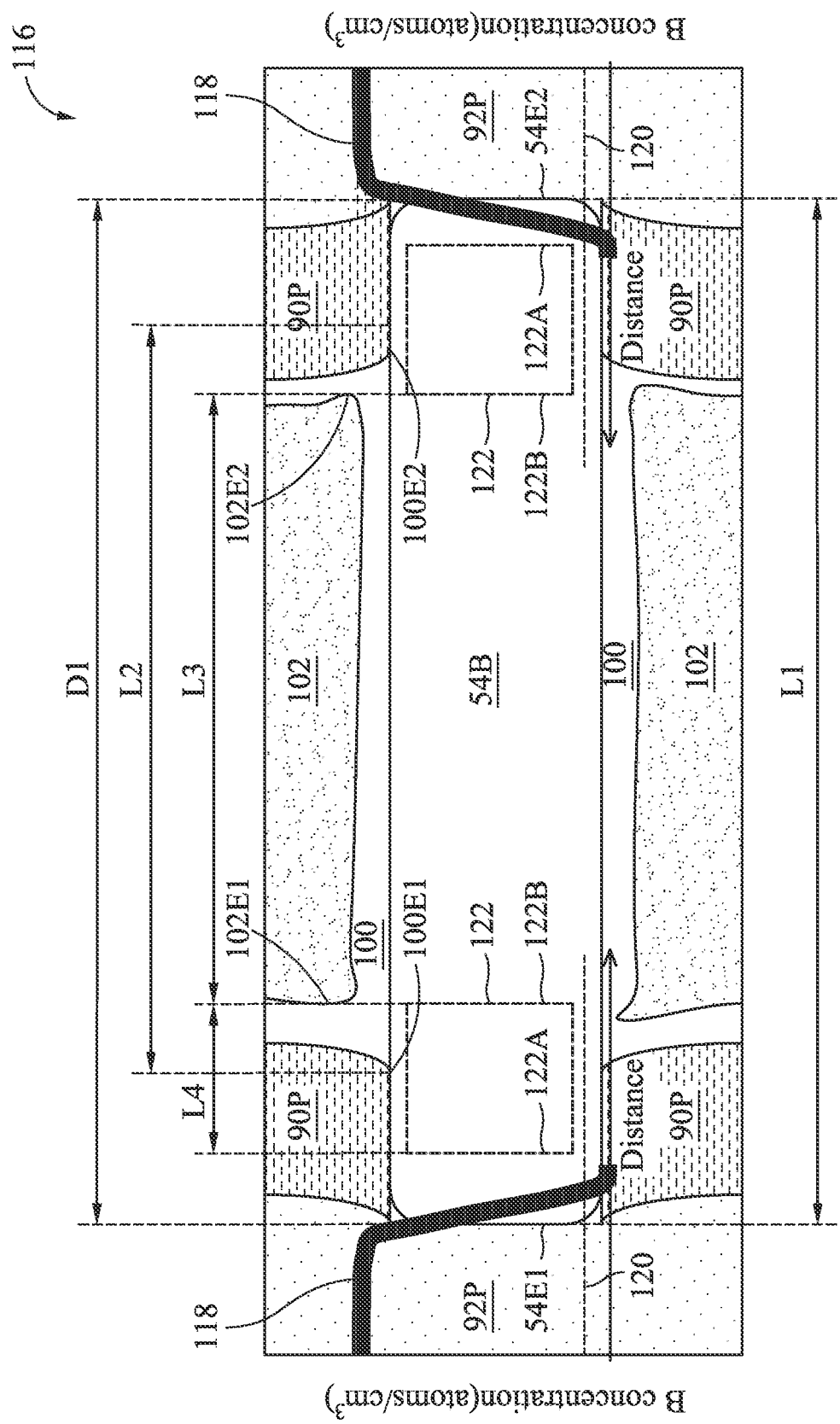

FIG. 25D illustrates a magnified view of a region 116 of the structure shown in FIG. 25B, in accordance with some embodiments. In particular, FIG. 25D illustrates the region 116 for embodiments when the thermal anneal process described above with reference to FIGS. 13A and 13B is omitted. The nanostructure 54B has a length L1 as measured from a first sidewall 54E1 of the nanostructure 54B to an opposite second sidewall 54E2 of the nanostructure 54B. The length L1 may be between about 10 nm and about 30 nm. The gate dielectric layer 100 has a length L2 as measured from a first edge 100E1 of the gate dielectric layer 100 to an opposite second edge 100E2 of the gate dielectric layer 100. The length L2 may be between about 5 nm and about 25 nm. The gate electrode 102 has a length L3 as measured from a first edge 102E1 of the gate electrode 102 to an opposite second edge 102E2 of the gate electrode 102. The length L3 may be between about 4 nm and about 24 nm. In the illustrated embodiment, the first edge 54E1 of the nanostructure 54B is aligned with the outer edge (facing away from the gate dielectric layer 100) of the first inner spacer 90P and the opposite second edge 54E2 of the nanostructure 54B is aligned with the outer edge (facing away from the gate dielectric layer 100) of the opposite second inner spacer 90P. In such embodiments, a distance D1 between the outer edge of the first inner spacer 90P and the outer edge of the opposite inner spacer 90P is equal to the length L1 of the nanostructure 54B.

FIG. 25D further illustrates curves 118 showing concentration profiles of p-type dopants (such as, for example, boron) at interfaces between the nanostructure 54B and the epitaxial source/drain regions 92P. The curves 118 illustrate that dopant concentration continuously decreases as the dopants extend into the nanostructure 54B. The dashed horizontal lines 120 correspond to a boron concentration of about 5E18 atoms/cm$^3$. In embodiments when the thermal anneal process is not performed, the dopants of the epitaxial source/drain regions 92P do not substantially extend into the nanostructure 54B and have a concentration less than about 5E18 atoms/cm$^3$ at the channel edges in nanostructure 54B, with the channel edges being aligned with respective edges of the gate electrode 102. Accordingly, the effective channel length and the channel resistance ($R_{ch}$) are not substantially affected. In such embodiments, the effective channel length is equal to the length L3 of the gate electrode 102.

To characterize a degree of the dopant penetration into the nanostructure 54B, dopant concentrations within regions of interest (ROIs) 122 (illustrated by the dashed squares) may be considered. The ROIs 122 have a shape of a square box that has equal sides (forming a square) in the illustrated cross section. The sides of the ROIs 122 in the illustrated cross-section have a length L4. In some embodiments, the length L4 is about 5 nm. A length of the ROIs 122 in a direction perpendicular to the illustrated cross section is equal to a width of the nanostructure 54B. A first ROI 122 is located within the nanostructure 54B, such that the first ROI 122 is interposed between a first edge 54E1 of the nanostructure 54B and a first edge 102E1 of the gate electrode 102. A first side 122A of the first ROI 122 is spaced apart from the first edge 54E1 of the nanostructure 54B. A second side 122B of the first ROI 122 coincides with a first channel edge and is aligned with the first edge 102E1 of the gate electrode 102. A second ROI 122 is located within the nanostructure 54B, such that the second ROI 122 is interposed between a second edge 54E2 of the nanostructure 54B (opposite to the first edge 54E1 of the nanostructure 54B) and a second edge 102E2 of the gate electrode 102. A first side 122A of the second ROI 122 is spaced apart from the second edge 54E2 of the nanostructure 54B. A second side 122B of the second ROI 122 coincides with a second channel edge (opposite to the first channel edge) and is aligned with the second edge 102E2 of the gate electrode 102 (opposite to the first edge 102E1 of the gate electrode 102). In embodiments when the thermal anneal process is not performed, the average boron concentration within the ROIs 122 is less than about 1E19 atoms/cm3 or less than about 0.2 at %. The average boron concentration being less than about 1E19 atoms/cm3 or less than about 0.2 at % within the ROIs 122 implies that the dopants of the epitaxial source/drain regions 92P do not substantially extend into the nanostructure 54B, and the effective channel length and the channel resistance (Rch) are not substantially affected.

Figure 25E:
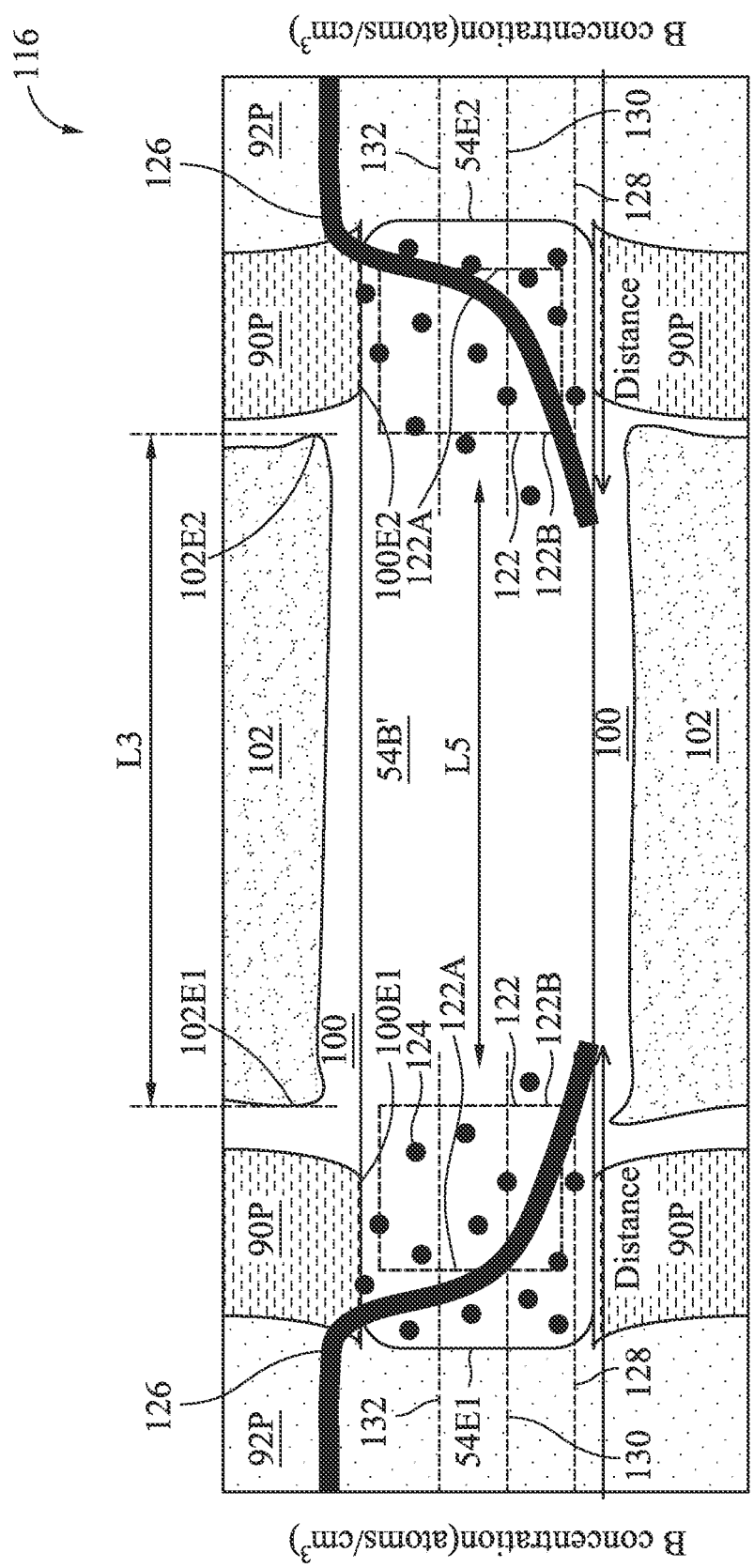

FIG. 25E illustrates the magnified view of the region 116 of the structure shown in FIG. 25B, in accordance with some embodiments. In particular, FIG. 25E illustrates the region 116 shown in FIG. 25D when the thermal anneal process described above with reference to FIGS. 13A and 13B has been performed. In such embodiments, p-type dopant atoms 124 (such as, for example, boron atoms) of the epitaxial source/drain regions 92P extend into the nanostructure 54B (see FIG. 25D) and form the doped nanostructure 54B'.

FIG. 25E further illustrates curves 126 showing concentration profiles of p-type dopants (such as, for example, boron) at interfaces between the doped nanostructure 54B' and the epitaxial source/drain regions 92P. The curves 126 illustrate that dopant concentration continuously decreases as the dopants extend into the doped nanostructure 54B'. The dashed horizontal lines 128 correspond to a boron concentration of about 5E18 atoms/cm$^3$. The dashed horizontal lines 130 correspond to a boron concentration of about 1E19 atoms/cm$^3$. The dashed horizontal lines 132 correspond to boron concentration of about 5E19 atoms/cm$^3$. In embodiments when the thermal anneal process is performed, a dopant concentration may reach to about 5E18 atoms/cm$^3$ or greater at the channel edge.

To characterize a degree of the dopant penetration into the doped nanostructure 54B', dopant concentrations within ROIs 122 may be considered. In embodiments when the thermal anneal process is performed, the boron concentration within the ROIs 122 is greater than about 1E19 atoms/cm$^3$ or greater than about 0.2 at %. The boron concentration being greater than about 1E19 atoms/cm$^3$ or greater than about 0.2 at % implies that the dopants of the epitaxial source/drain regions 92P extend into the channel and reduce an effective channel length. Accordingly, the channel resistance ($R_{ch}$) is reduced. The effective channel length L5 is equal to a length of the un-doped portion the doped nanostructure 54B'. In the illustrated embodiment, the effective channel length L5 is less than the length L3 of the gate electrode 102.

Figure 25F:
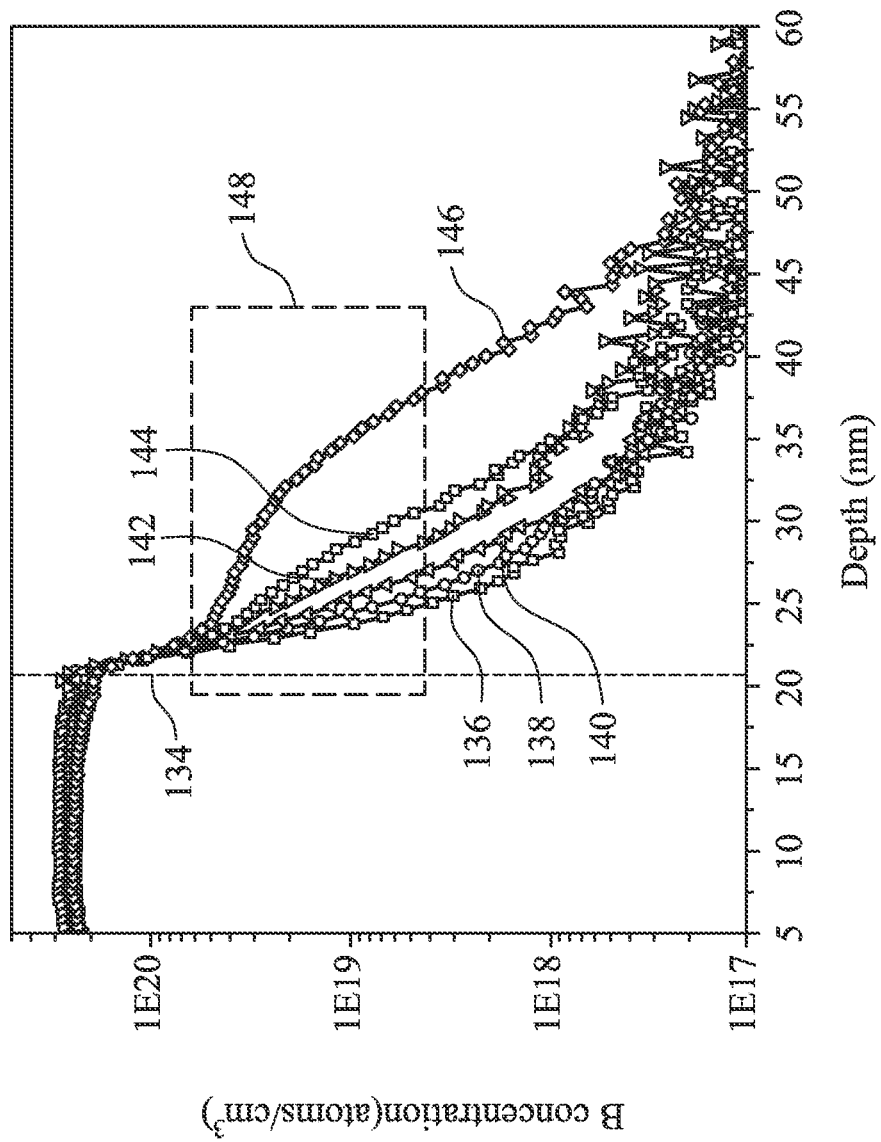
FIGS. 25F and 25G illustrate a dopant concentration profile in a nanosheet, in accordance with some embodiments.

FIG. 25F illustrates dopant concentration profiles as a function of the penetration depth into the doped nanostructure 54B'. In particular, FIG. 25F illustrates an embodiment when the epitaxial source/drain region 92P (see FIG. 25E) comprises SiGe:B, with a boron concentration of about 3E20 atoms/cm$^3$. In the illustrated embodiment, the vertical dashed line corresponds to an interface between the epitaxial source/drain regions 92P and the doped nanostructure 54B'. A curve 136 is a dopant concentration profile as a function of the penetration depth for embodiments when the thermal anneal process described above with reference to FIGS. 13A and 13B is not performed or is omitted. A curve 138 is a dopant concentration profile as a function of the penetration depth for embodiments when the thermal anneal process described above with reference to FIGS. 13A and 13B is performed at a temperature of about 850° C. A curve 140 is a dopant concentration profile as a function of the penetration depth for embodiments when the thermal anneal process described above with reference to FIGS. 13A and 13B is performed at a temperature of about 900° C. A curve 142 is a dopant concentration profile as a function of the penetration depth for embodiments when the thermal anneal process described above with reference to FIGS. 13A and 13B is performed at a temperature of about 925° C. A curve 144 is a dopant concentration profile as a function of the penetration depth for embodiments when the thermal anneal process described above with reference to FIGS. 13A and 13B is performed at a temperature of about 950° C. A curve 146 is a dopant concentration profile as a function of the penetration depth for embodiments when the thermal anneal process described above with reference to FIGS. 13A and 13B is performed at a temperature of about 990° C. The curves 136, 138, 140, 142, 144, and 146 illustrate that dopant concentration continuously decreases as the dopants extend into the doped nanostructures 54B'.

Figure 25G:
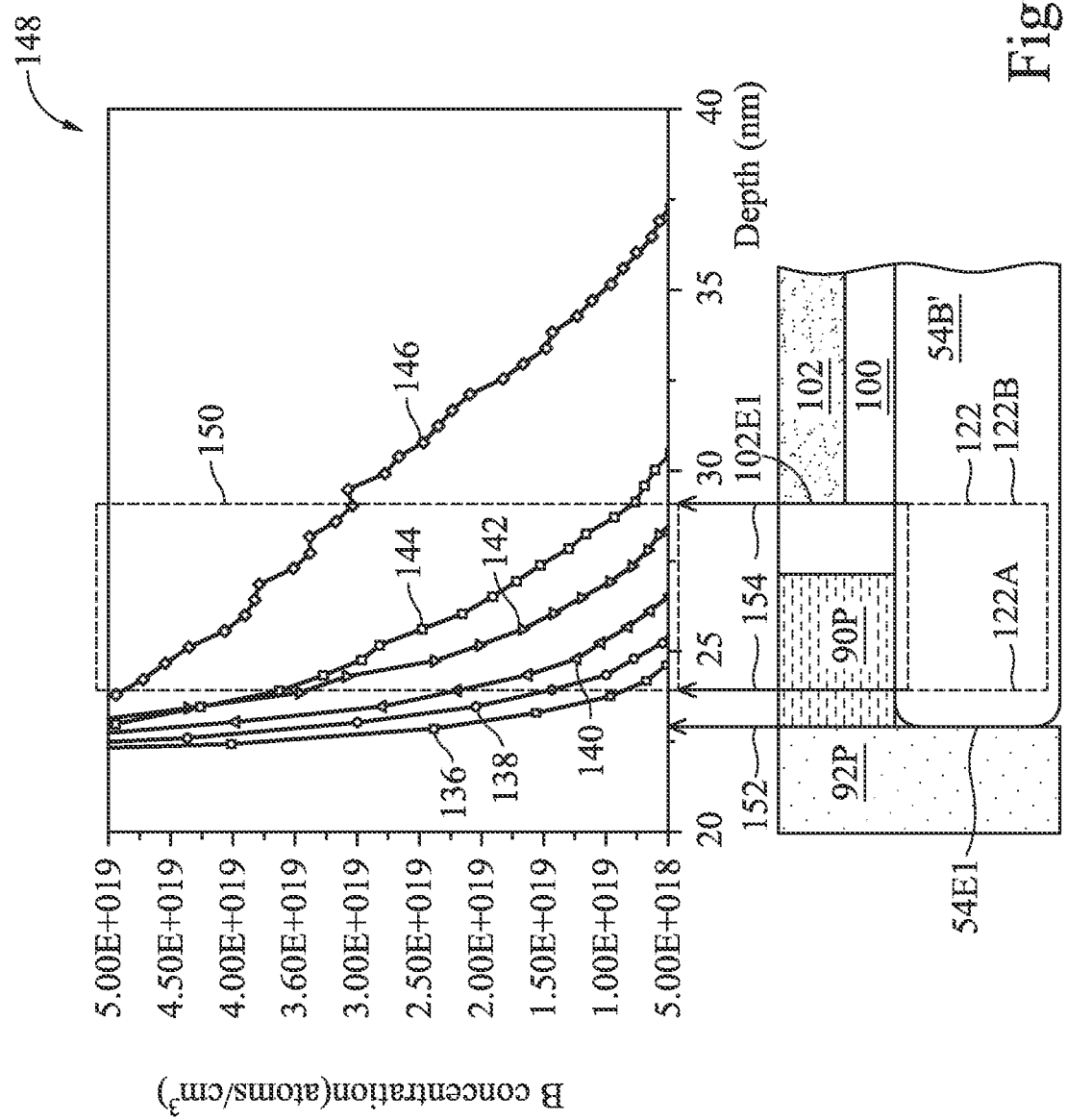

FIG. 25G illustrated a magnified view of a region 148 of FIG. 25F. In the illustrated embodiment, a depth indicated by arrow 152 corresponds to an interface between the epitaxial source/drain region 92P and the doped nanostructure 54B'. The region 150 corresponds to the ROI 122, such that depths indicated by arrows 154 correspond to edges (or sides) of the ROI 122. For thermal anneal temperatures less than about 925° C., the dopant concentration at the channel edge (corresponding to the side 122B of the ROI 122 that is aligned with the edge 102E1 of the gate electrode 102) is less than about 5E18 atoms/cm$^3$. For such thermal anneal temperatures, an average dopant concentration in the ROI 122 is less than about 1E19 atoms/cm$^3$ or less than about 0.2 at %. Accordingly, for thermal anneal temperatures less than about 925° C., dopants do not significantly extend into the channel and the channel resistance ($R_{ch}$) is not substantially affected. For thermal anneal temperatures greater than or equal to about 925° C., the dopant concentration at the channel edge is greater than or equal to about 5E18 atoms/cm$^3$. For such thermal anneal temperatures, an average dopant concentration in the ROI 122 is greater than or equal to about 1E19 atoms/cm$^3$ or greater than or equal to about 0.2 at %. Accordingly, for thermal anneal temperatures greater than or equal to about 925° C., dopants significantly extend in to the channel, such that the effective channel length and the channel resistance ($R_{ch}$) are reduced.

Referring further to FIGS. 25E-25G, dopant concentration profiles of the doped nanostructures 54B' are illustrated. In some embodiments, dopants may extend into the doped nanostructures 54A' and 54C' in a similar manner as in the doped nanostructures 54B', and the description is not repeated herein.

Figure 26A:
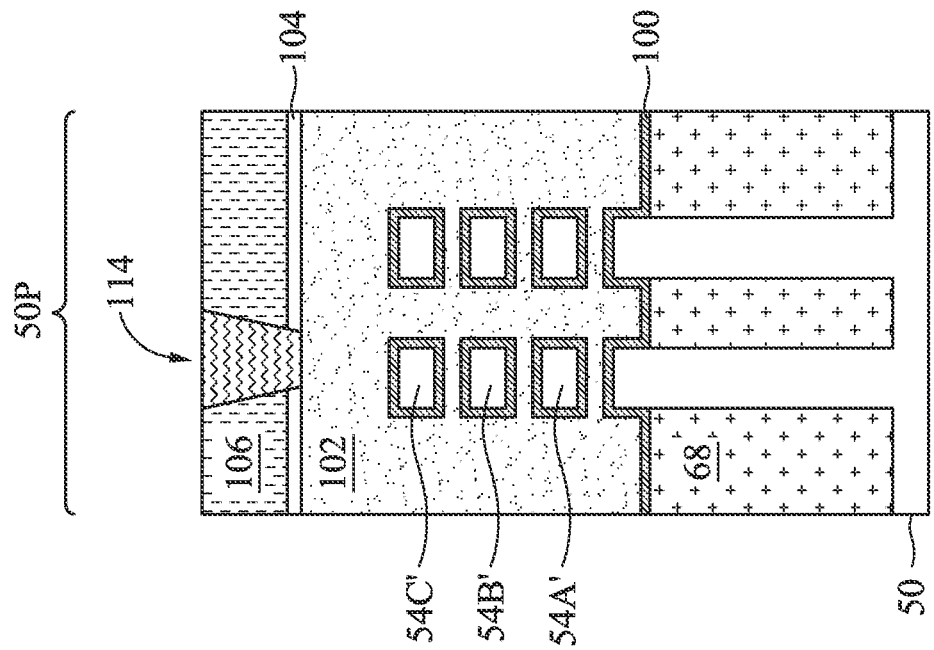
FIGS. 26A, 26B, and 26C are cross-sectional views of a nano-FET, in accordance with some embodiments.
Figure 26A:
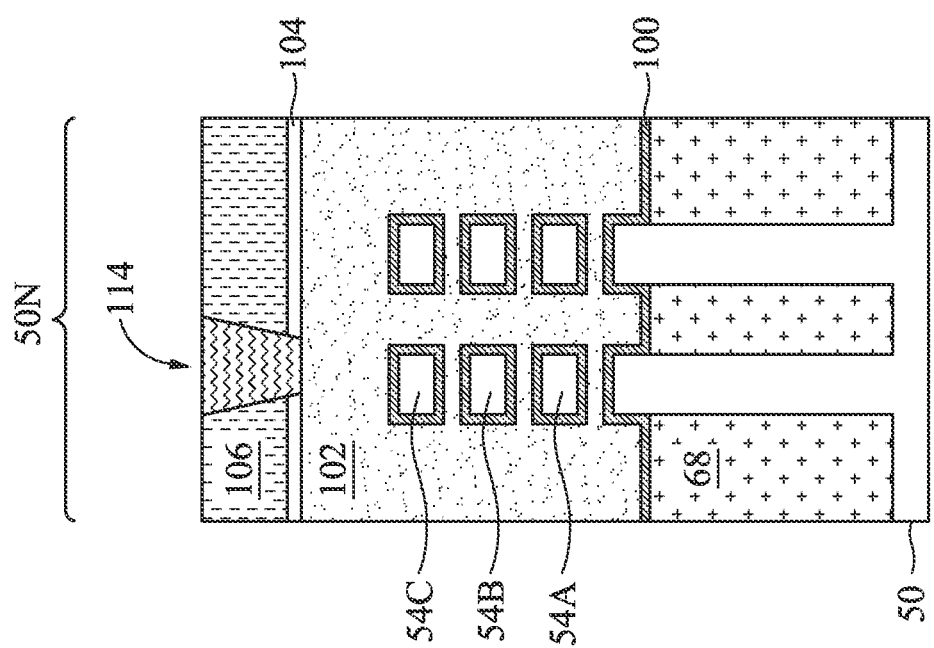
Figure 26B:
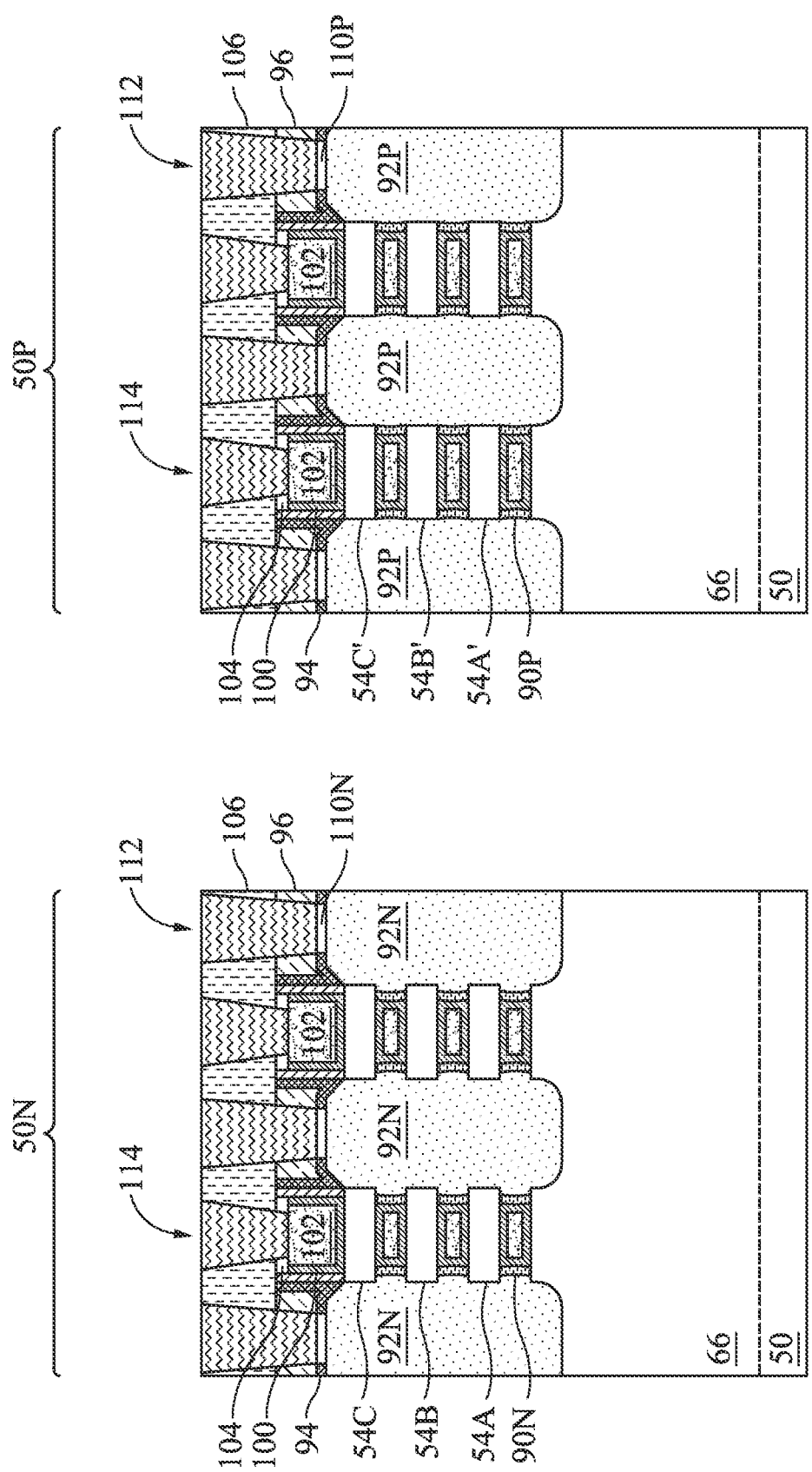
Figure 26C:
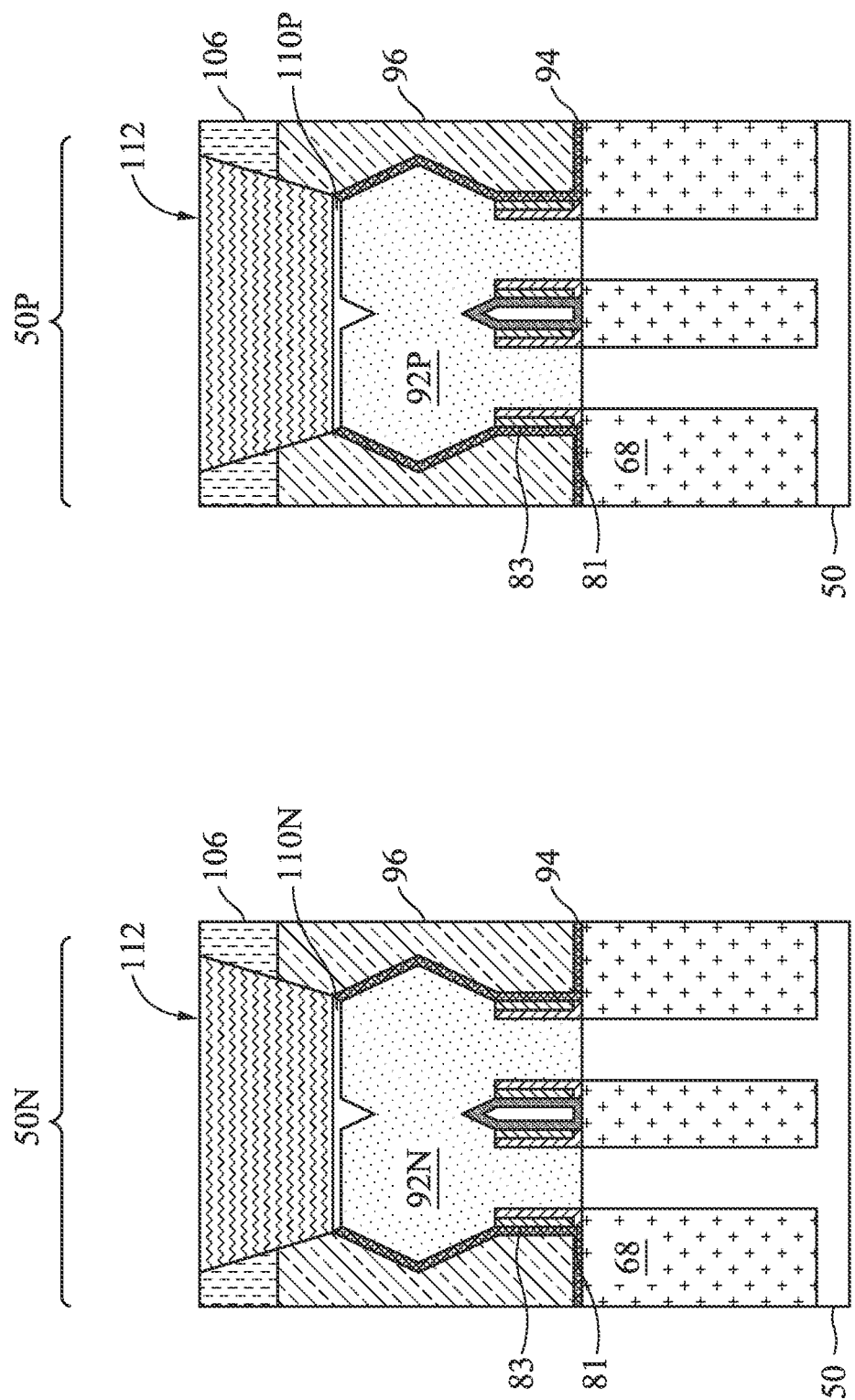

FIGS. 26A-26C illustrate cross-sectional views of a nanoFET device in accordance with some embodiments. FIG. 26A illustrates reference cross-section A-A' illustrated in FIG. 1. FIG. 26B illustrates reference cross-section B-B' illustrated in FIG. 1. FIG. 26C illustrates reference cross-section C-C' illustrated in FIG. 1. The structure of FIGS. 26A-26C is similar to the structure of FIGS. 25A-25C, with like reference numerals indicating like elements formed by like processes and the description is not repeated herein. In the illustrated embodiment, the inner spacers 90N are formed such that the inner spacers 90N do not fully fill the sidewall recesses 88N (see FIG. 16B), the epitaxial source/drain regions 92N extend into the sidewall recesses 88N and physically contact bottom surfaces of the nanostructures 54C, top and bottom surfaces of the nanostructures 54B, top and bottom surfaces of the nanostructures 54A, and top surfaces of the fins 66. In some embodiments, the inner spacers 90N as illustrated in FIGS. 26A-26C may be formed using process steps similar to the process steps described above with reference to FIGS. 16A and 16B, for example, by altering a thickness of the inner spacer layer and/or by tuning the etch process for patterning the inner spacer layer.

Figure 27A:
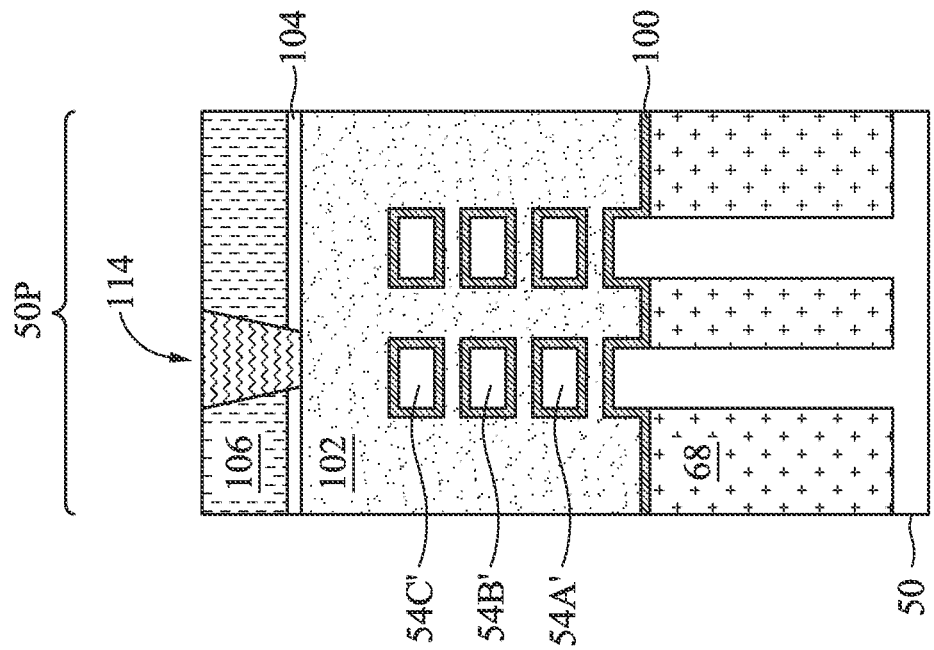
FIGS. 27A, 27B, and 27C are cross-sectional views of a nano-FET, in accordance with some embodiments.
Figure 27A:
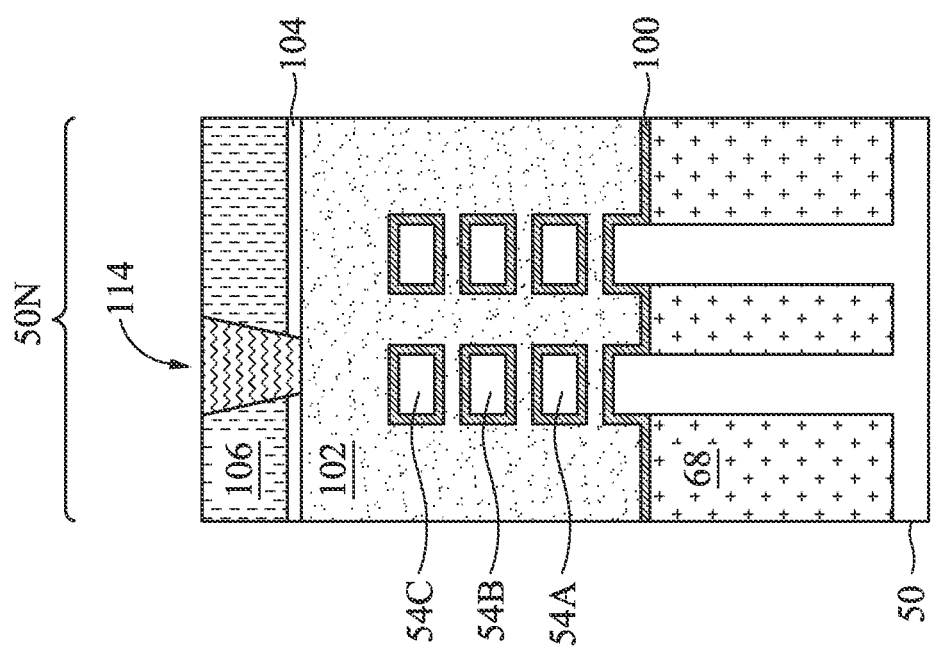
Figure 27B:
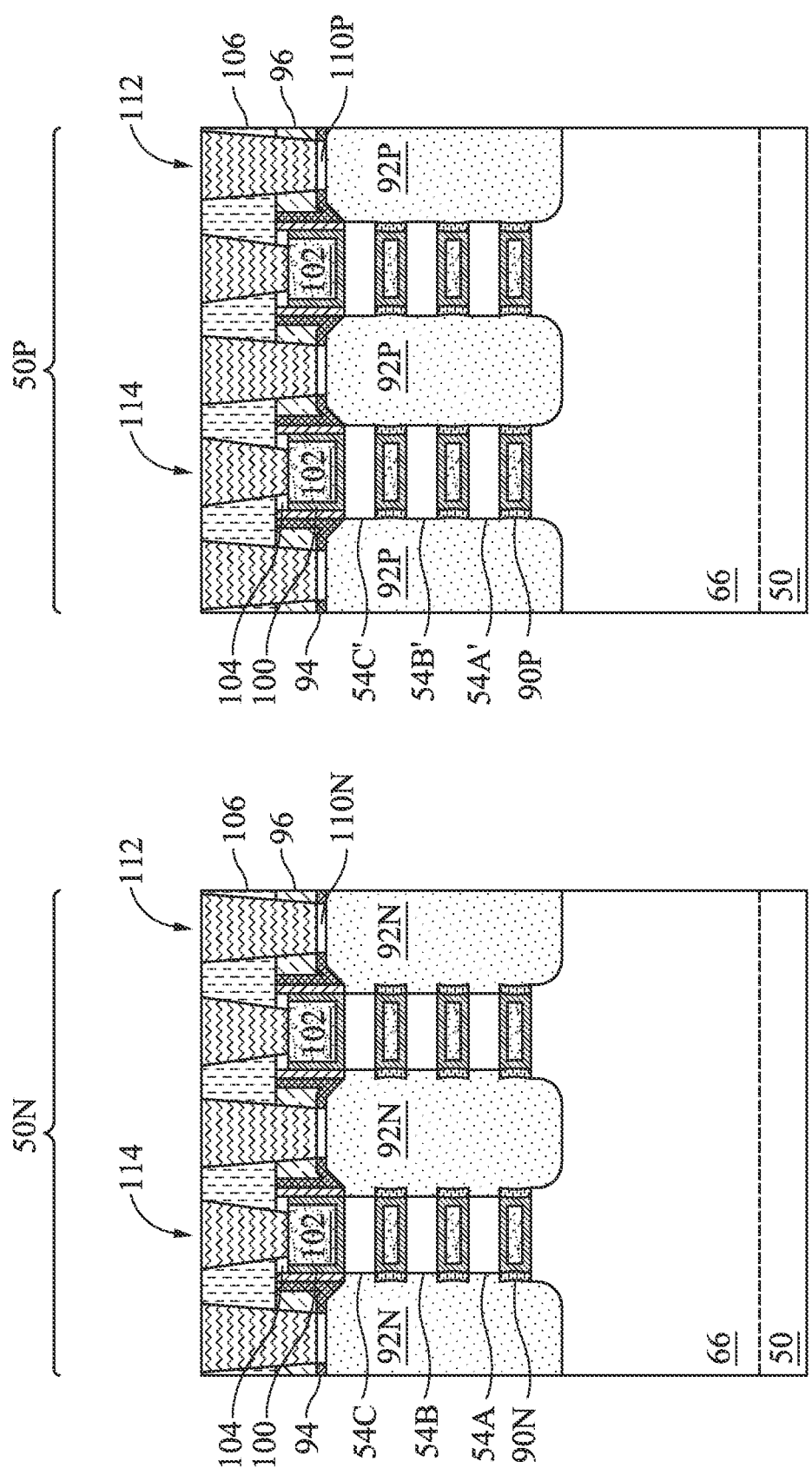
Figure 27C:
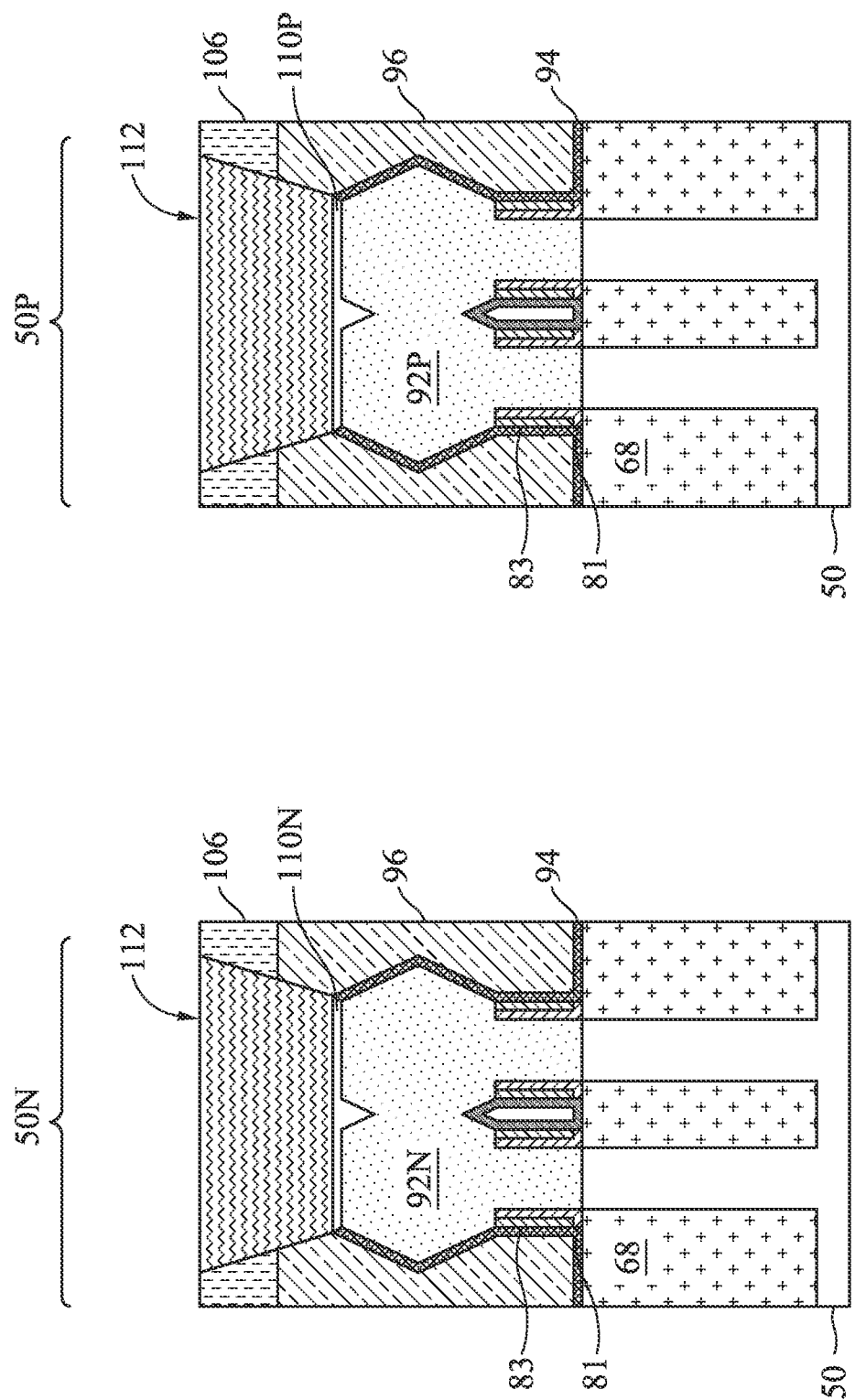

FIGS. 27A-27C illustrate cross-sectional views of a nanoFET device in accordance with some embodiments. FIG. 27A illustrates reference cross-section A-A' illustrated in FIG. 1. FIG. 27B illustrates reference cross-section B-B' illustrated in FIG. 1. FIG. 27C illustrates reference cross-section C-C' illustrated in FIG. 1. The structure of FIGS. 27A-27C is similar to the structure of FIGS. 25A-25C, with like reference numerals indicating like elements formed by like processes and the description is not repeated herein. In the illustrated embodiment, the inner spacers 90N extend into the epitaxial source/drain regions 92N, such that the epitaxial source/drain regions 92N are in physical contact with top and bottom surfaces of the inner spacers 90N. In some embodiments, such a structure may be formed, for example, by recessing the nanostructures 54A-54C after the inner spacers 90N have been formed as described above with reference to FIGS. 16A and 16B. In some embodiments, the recessing process may comprise an etch process that selectively removes a material of the nanostructures 54A-54C without substantially removing a material of the inner spacers 90N.

Figure 28A:
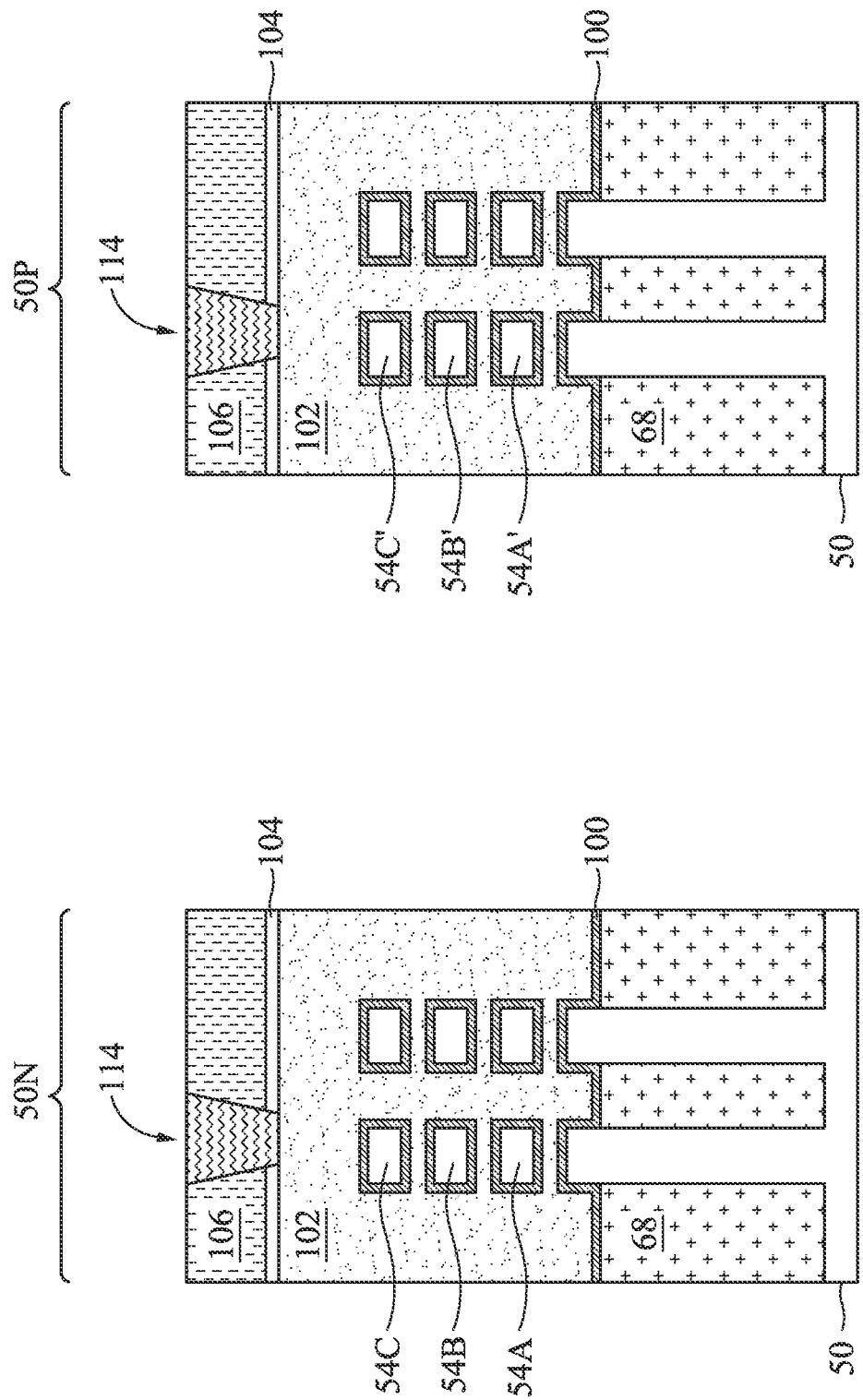
FIGS. 28A, 28B, 28C, 28D, and 28E are cross-sectional views of a nano-FET, in accordance with some embodiments.
Figure 28B:
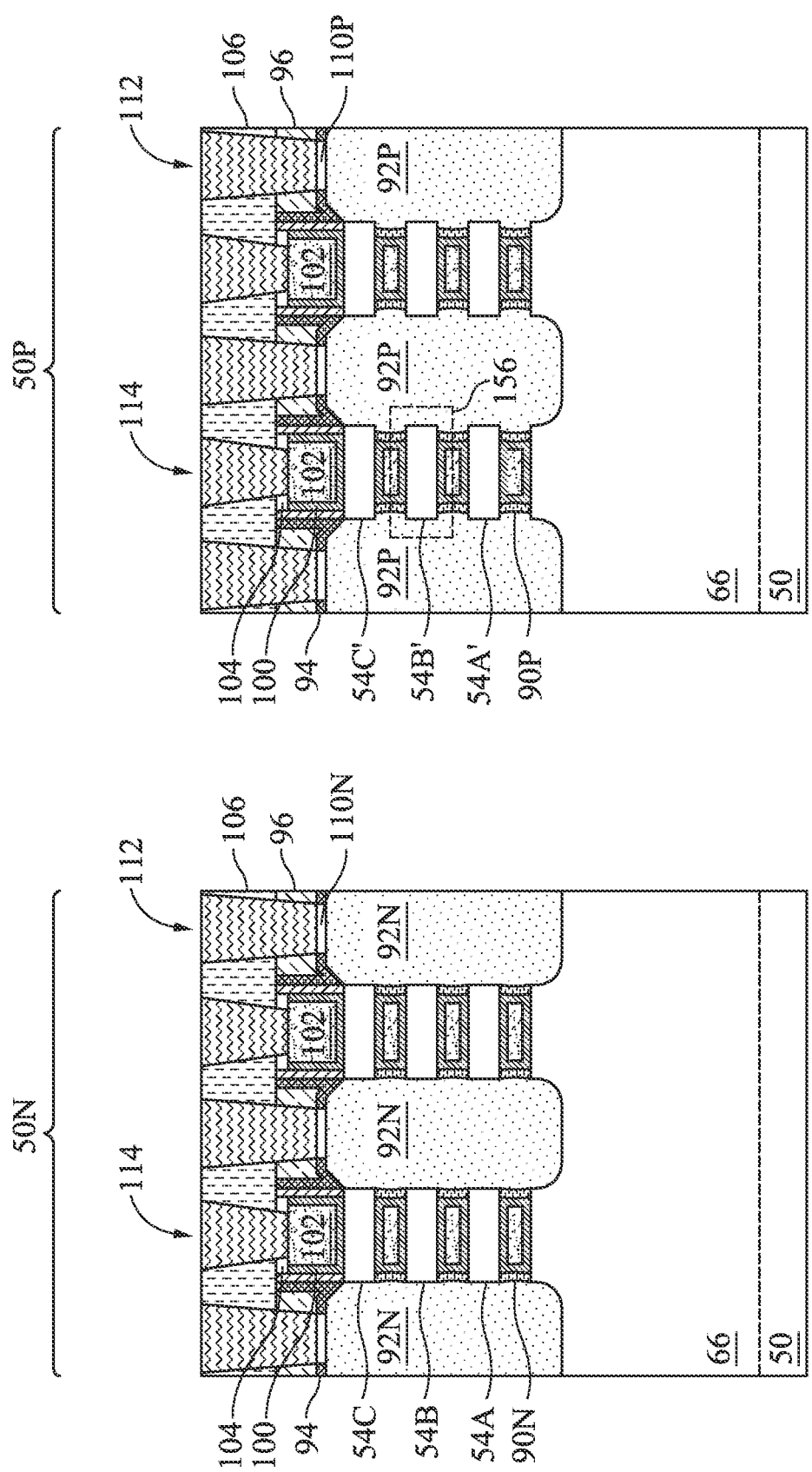
Figure 28C:
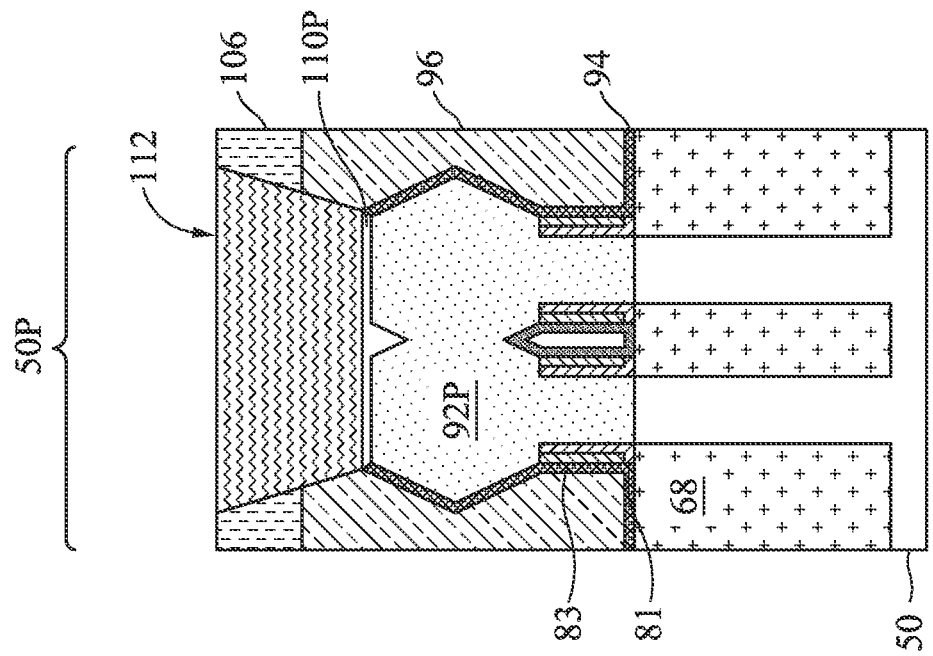
Figure 28C:
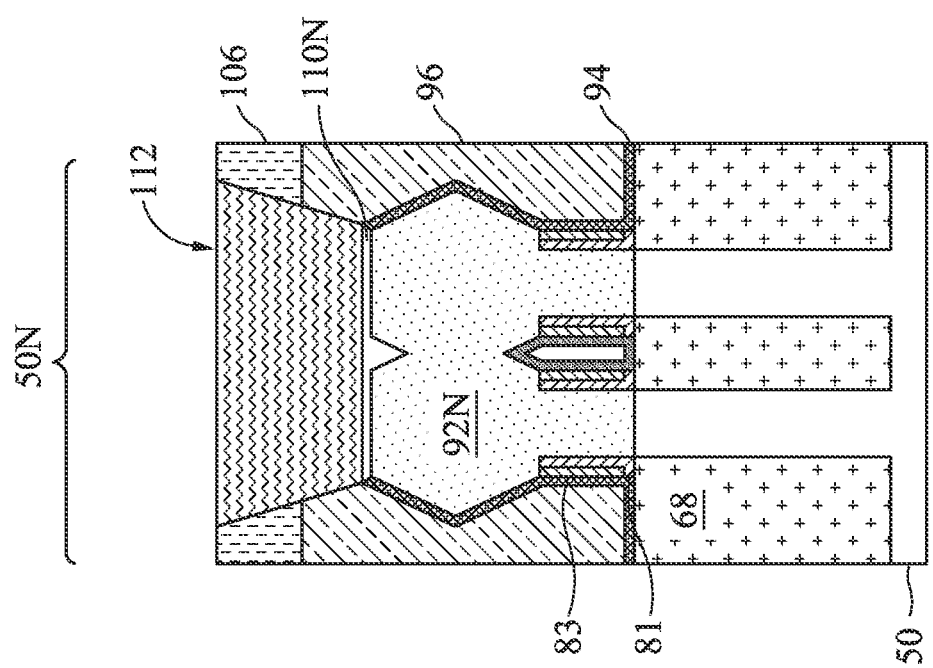

FIGS. 28A-28C illustrate cross-sectional views of a nanoFET device in accordance with some embodiments. FIG. 28A illustrates reference cross-section A-A' illustrated in FIG. 1. FIG. 28B illustrates reference cross-section B-B' illustrated in FIG. 1. FIG. 28C illustrates reference cross-section C-C' illustrated in FIG. 1. The structure of FIGS. 28A-28C is similar to the structure of FIGS. 25A-25C, with like reference numerals indicating like elements formed by like processes and the description is not repeated herein. In the illustrated embodiment, the inner spacers 90P are formed such that the inner spacers 90P do not fully fill the sidewall recesses 88P (see FIG. 10B), the epitaxial source/drain regions 92P extend into the sidewall recesses 88P and physically contact bottom surfaces of the doped nanostructures 54C', top and bottom surfaces of the doped nanostructures 54B', top and bottom surfaces of the doped nanostructures 54A', and top surfaces of the fins 66. In some embodiments, the inner spacers 90P as illustrated in FIGS. 28A-28C may be formed using process steps similar to the process steps described above with reference to FIGS. 11A and 11B, for example, by altering a thickness of the inner spacer layer and/or by tuning the etch process for patterning the inner spacer layer.

Figure 28D:
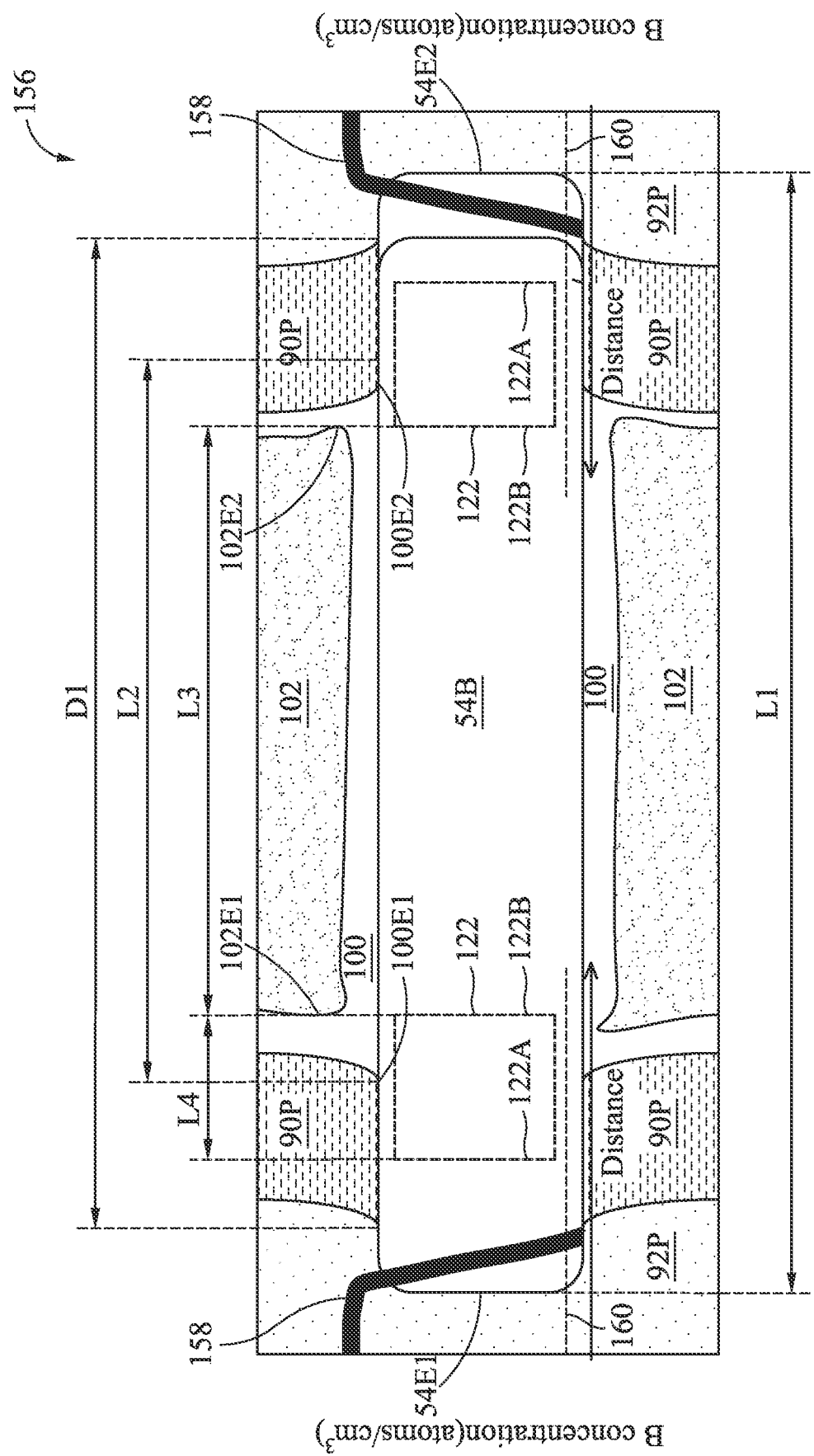

FIG. 28D illustrates a magnified view of a region 156 of the structure shown in FIG. 28B, in accordance with some embodiments. In particular, FIG. 28D illustrates the region 156 for embodiments when the thermal anneal process described above with reference to FIGS. 13A and 13B is not performed or is omitted. The nanostructure 54B has a length L1 as measured from a first sidewall 54E1 of the nanostructure 54B to an opposite second sidewall 54E2 of the nanostructure 54B. The length L1 may be between about 11 nm and about 32 nm. The gate dielectric layer 100 has a length L2 as measured from a first edge 100E1 of the gate dielectric layer 100 to an opposite second edge 100E2 of the gate dielectric layer 100. The length L2 may be between about 5 nm and about 25 nm. The gate electrode 102 has a length L3 as measured from a first edge 102E1 of the gate electrode 102 to an opposite second edge 102E2 of the gate electrode 102. The length L3 may be between about 4 nm and about 24 nm. In the illustrated embodiment, edges 54E1 and 54E2 of the nanostructure 54B are not aligned with the edges of the first inner spacer 90P, such that a distance D1 between the outer edge of the first inner spacer 90P and the outer edge of the second opposite inner spacer 90P is less than the length L1 of the nanostructure 54B.

FIG. 28D further illustrates curves 158 showing concentration profiles of p-type dopants (such as, for example, boron) at interfaces between the nanostructure 54B and the epitaxial source/drain regions 92P. The curves 158 illustrate that dopant concentration continuously decreases as the dopants extend into the nanostructure 54B. The dashed horizontal lines 160 correspond to boron concentration of about 5E18 atoms/cm$^3$. In embodiments when the thermal anneal process is not performed, the dopants of the epitaxial source/drain regions 92P do not substantially extend into the nanostructure 54B and have a concentration less than 5E18 atoms/cm$^3$ at the channel edges in nanostructure 54B, with the channel edges being aligned with respective edges 102E1 and 102E2 of the gate electrode 102. Accordingly, the effective channel length and the channel resistance ($R_{ch}$) are not substantially affected. In such embodiments, the effective channel length is equal to the length L3 of the gate electrode 102.

To characterize a degree of the dopant penetration into the nanostructure 54B, dopant concentrations within regions of interest (ROIs) 122 (illustrated by the dashed squares) may be considered. A shape and a location of the ROIs 122 have been described above with reference to FIG. 25D, and the description is not repeated herein. In embodiments when the thermal anneal process is not performed, the average boron concentration within the ROIs 122 is less than about 1E19 atoms/cm$^3$ or less than about 0.2 at %. The average boron concentration being less than about 1E19 atoms/cm$^3$ or less than about 0.2 at % within the ROIs 122 implies that the dopants of the epitaxial source/drain regions 92P do not substantially extend into the nanostructure 54B and the channel region of the nanostructure 54B. Accordingly, the effective channel length and the channel resistance ($R_{ch}$) are not substantially affected.

Figure 28E:
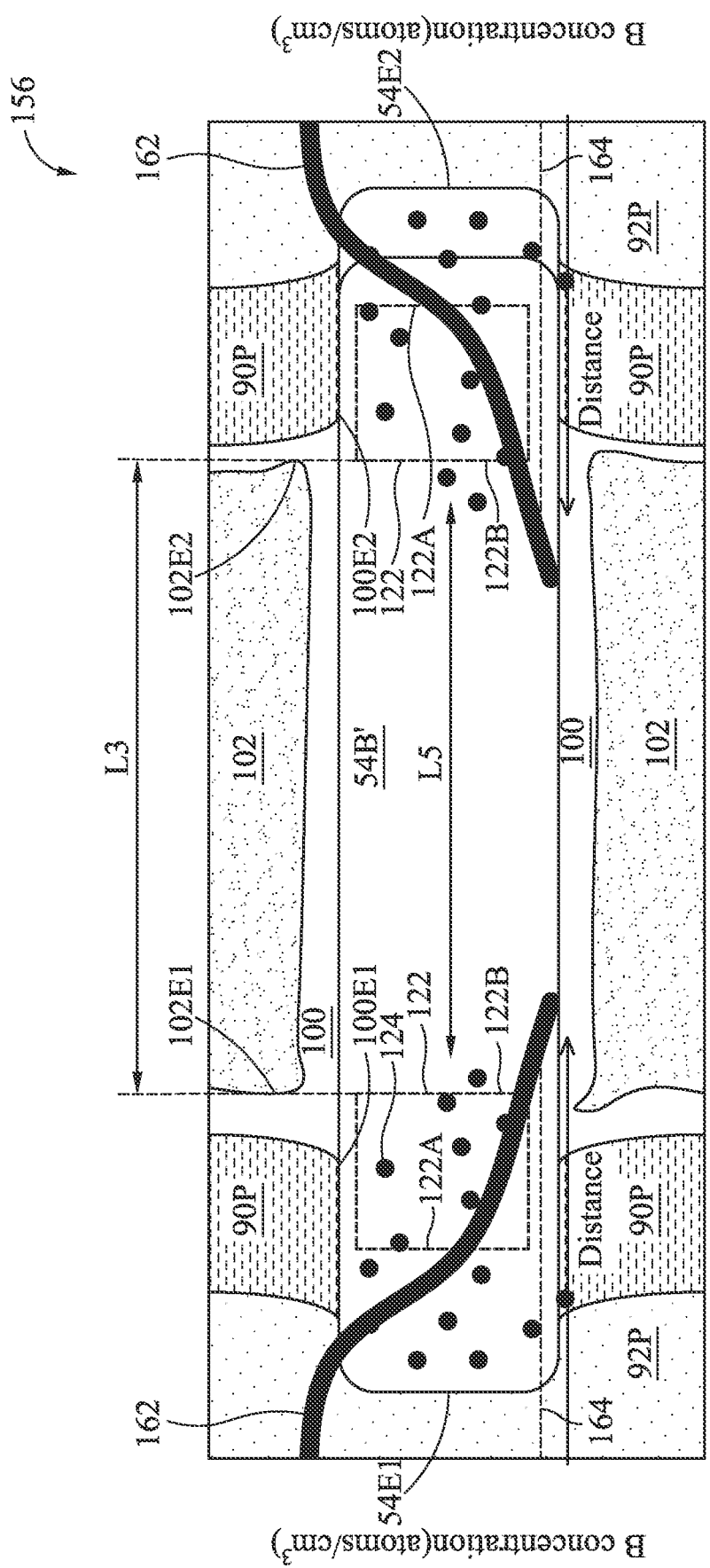

FIG. 28E illustrates the magnified view of the region 156 of the structure shown in FIG. 28B, in accordance with some embodiments. In particular, FIG. 28E illustrates the region 156 shown in FIG. 28D when the thermal anneal process described above with reference to FIGS. 13A and 13B has been performed. In such embodiments, p-type dopant atoms 124 (such as, for example, boron atoms) of the epitaxial source/drain regions 92P extend into the nanostructure 54B (see FIG. 28D) and form the doped nanostructure 54B'.

FIG. 28E further illustrates curves 162 showing concentration profiles of dopants at interfaces between the doped nanostructure 54B' and the epitaxial source/drain regions 92P. The curves 162 illustrate that dopant concentration continuously decreases as the dopants extend into the doped nanostructure 54B'. The dashed horizontal lines 164 correspond to a boron concentration of about 5E18 atoms/cm$^3$. In embodiments when the thermal anneal process is performed, a dopant concentration may reach to about 5E18 atoms/cm$^3$ or greater at the channel edges.

To characterize a degree of the dopant penetration into the doped nanostructure 54B', dopant concentrations within ROIs 122 may be considered. In embodiments when the thermal anneal process is performed, the average boron concentration within the ROIs 122 is greater than about 1E19 atoms/cm$^3$ or greater than about 0.2 at %. The average boron concentration being greater than about 1E19 atoms/cm$^3$ or greater than about 0.2 at % implies that the dopants of the epitaxial source/drain regions 92P extend into the channel region and reduce an effective channel length. Accordingly, the channel resistance ($R_{ch}$) is reduced. The effective channel length L5 is equal to a length of the un-doped portion the doped nanostructure 54B'. In the illustrated embodiment, the effective channel length L5 is less than the length L3 of the gate electrode 102.

Referring further to FIG. 28E, dopant concentration profiles of the doped nanostructures 54B' are illustrated. In some embodiments, dopants may extend into the doped nanostructures 54A' and 54C' in a similar manner as in the doped nanostructures 54B', and the description is not repeated herein.

Figure 29A:
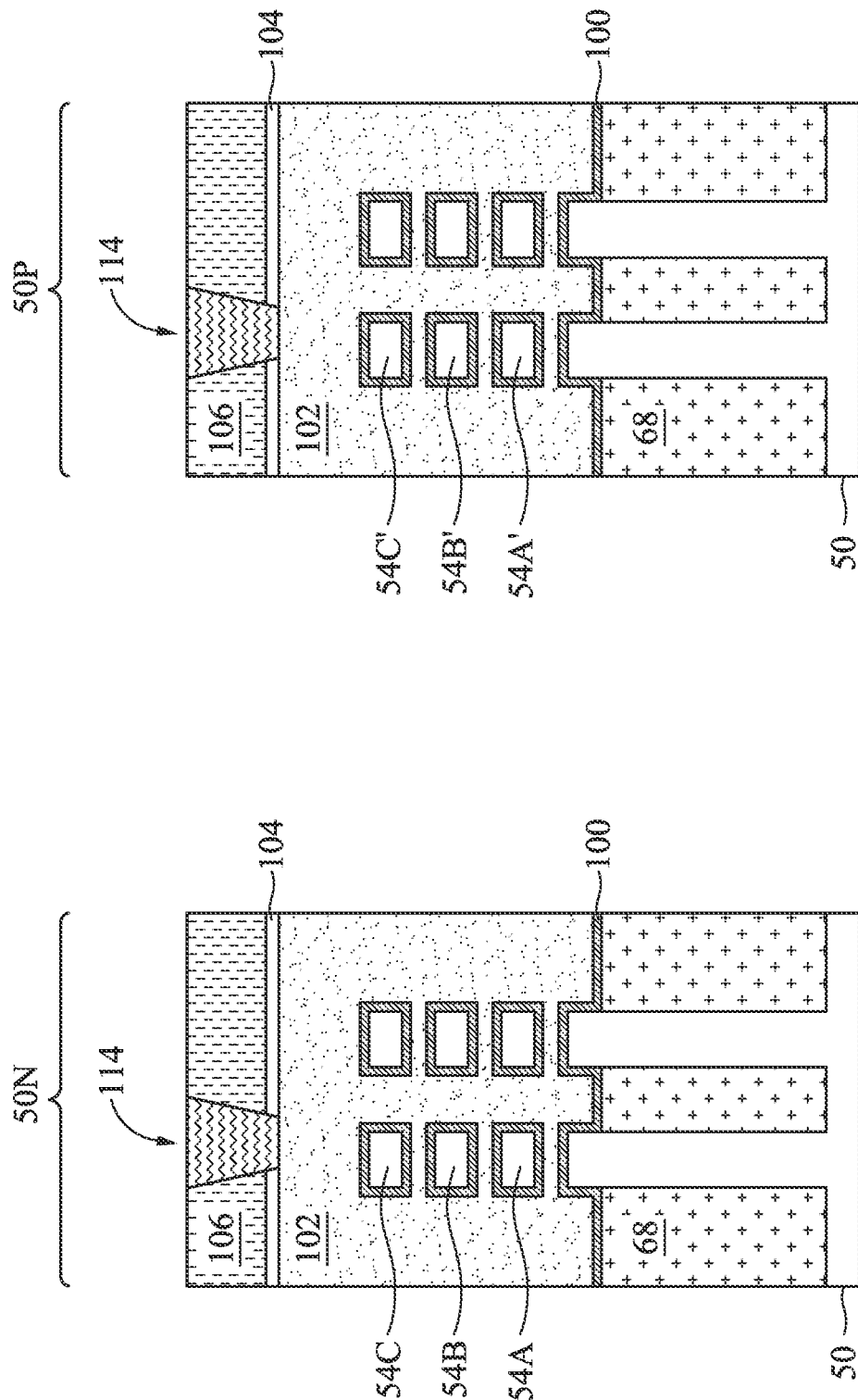
FIGS. 29A, 29B, and 29C are cross-sectional views of a nano-FET, in accordance with some embodiments.
Figure 29B:
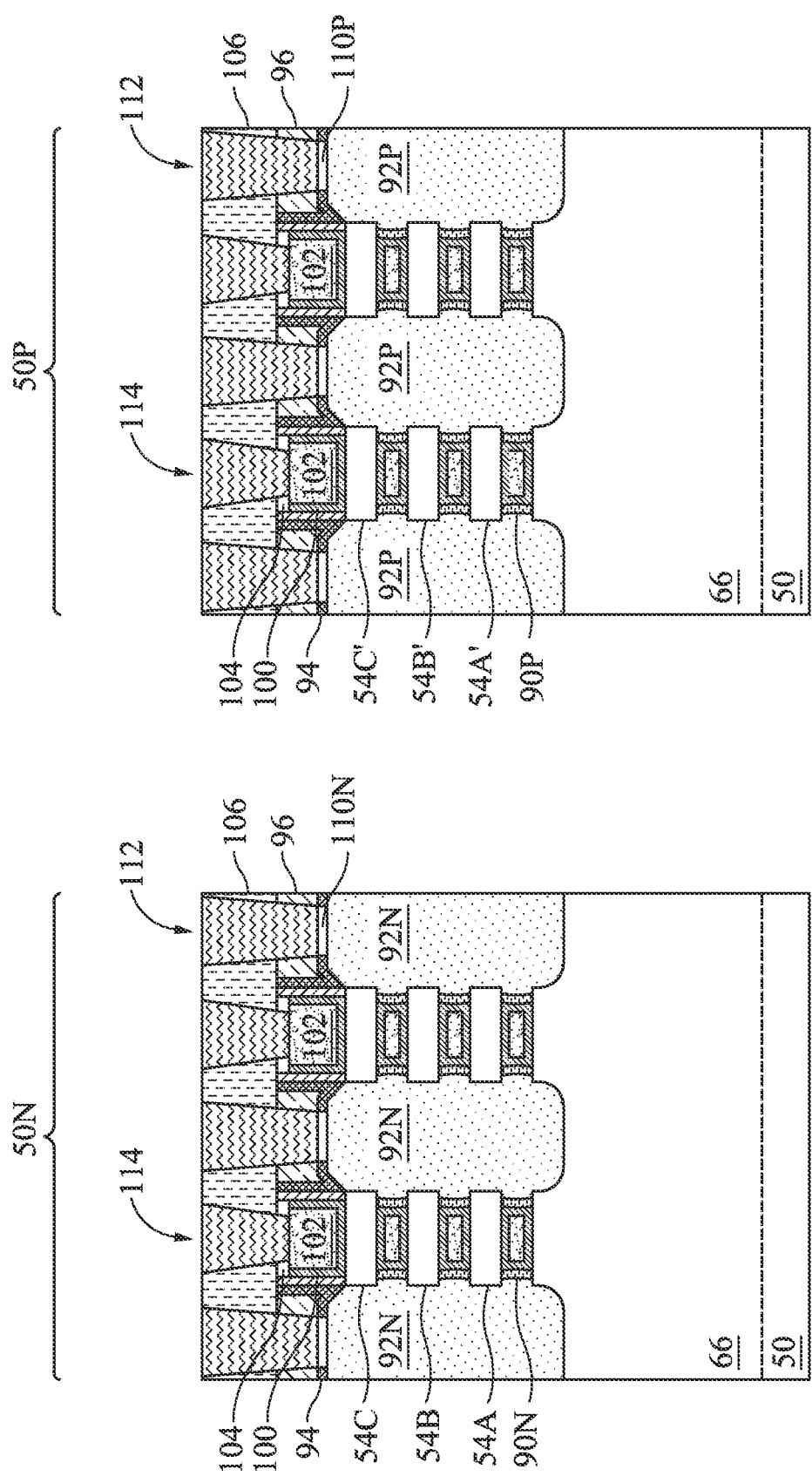
Figure 29C:
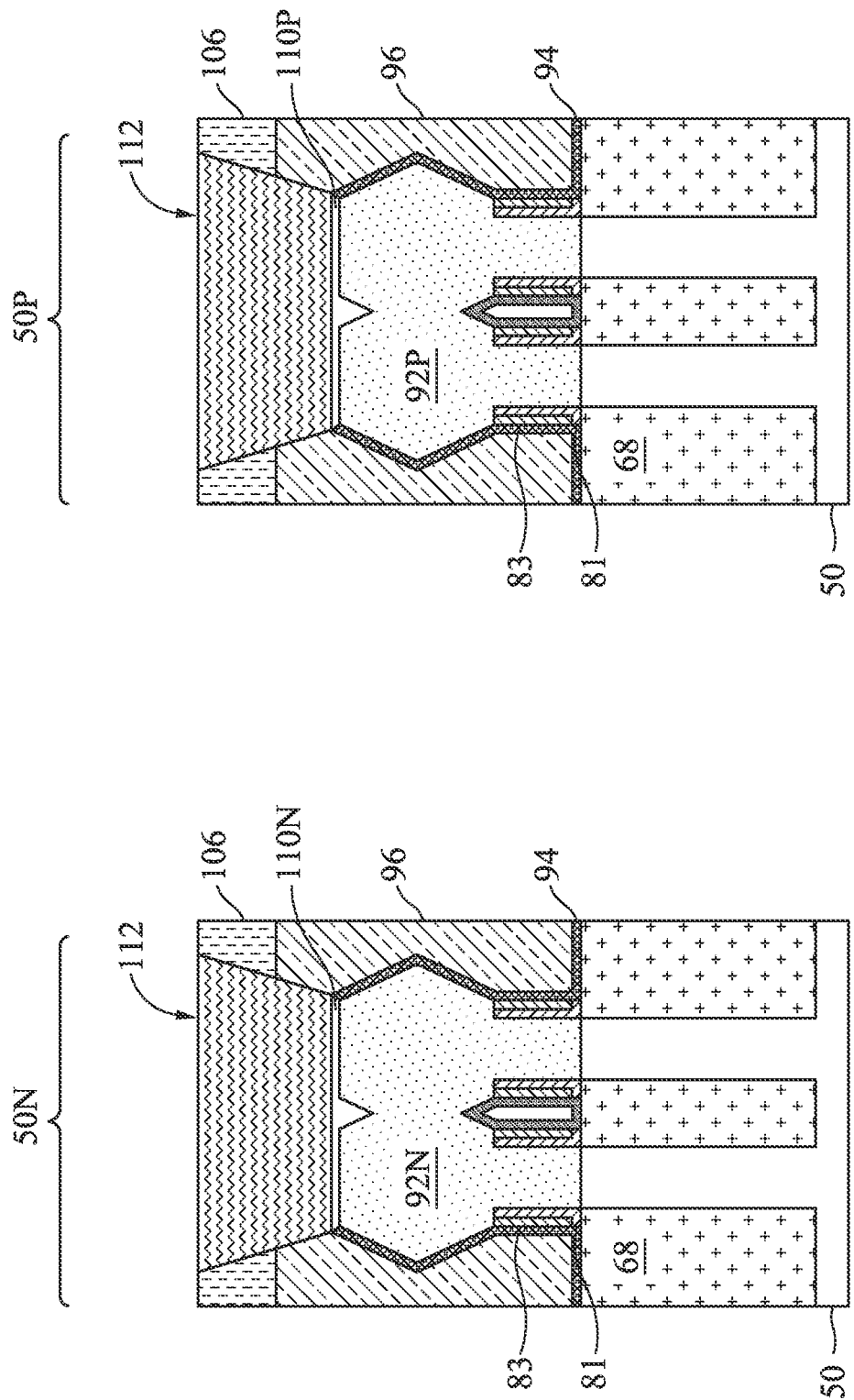

FIGS. 29A-29C illustrate cross-sectional views of a nanoFET device in accordance with some embodiments. FIG. 29A illustrates reference cross-section A-A' illustrated in FIG. 1. FIG. 29B illustrates reference cross-section B-B' illustrated in FIG. 1. FIG. 29C illustrates reference cross-section C-C' illustrated in FIG. 1. The structure of FIGS. 29A-29C is similar to the structure of FIGS. 28A-28C, with like reference numerals indicating like elements formed by like processes and the description is not repeated herein. In the illustrated embodiment, the inner spacers 90N are formed such that the inner spacers 90N do not fully fill the sidewall recesses 88N (see FIG. 16B), the epitaxial source/drain regions 92N extend into the sidewall recesses 88N and physically contact bottom surfaces of the nanostructures 54C, top and bottom surfaces of the nanostructures 54B, top and bottom surfaces of the nanostructures 54A, and top surfaces of the fins 66. In some embodiments, the inner spacers 90N as illustrated in FIGS. 29A-29C may be formed using process steps similar to the process steps described above with reference to FIGS. 16A and 16B, for example, by altering a thickness of the inner spacer layer and/or by tuning the etch process for patterning the inner spacer layer.

Figure 30A:
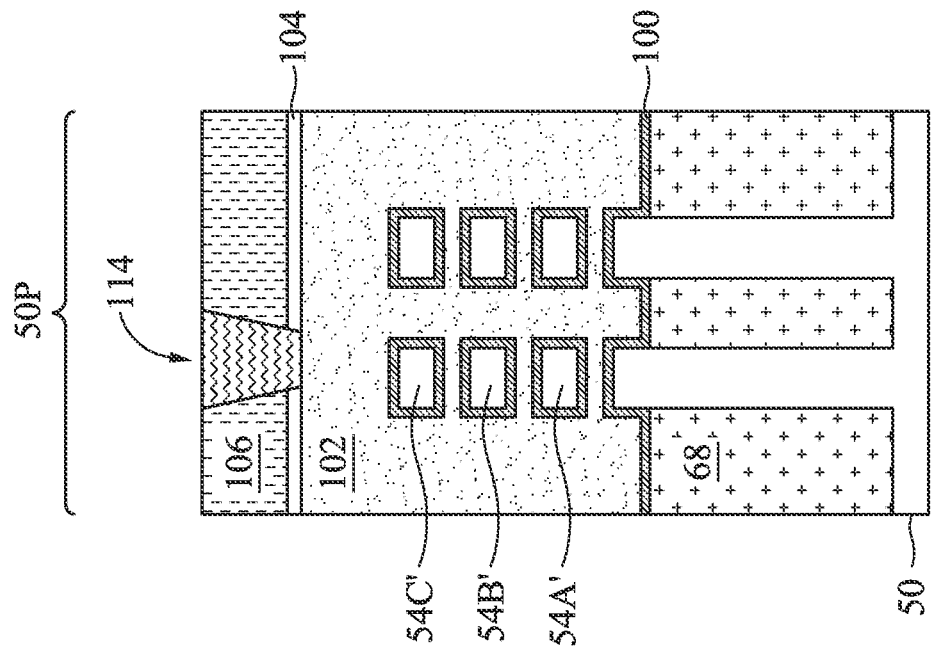
FIGS. 30A, 30B, and 30C are cross-sectional views of a nano-FET, in accordance with some embodiments.
Figure 30A:
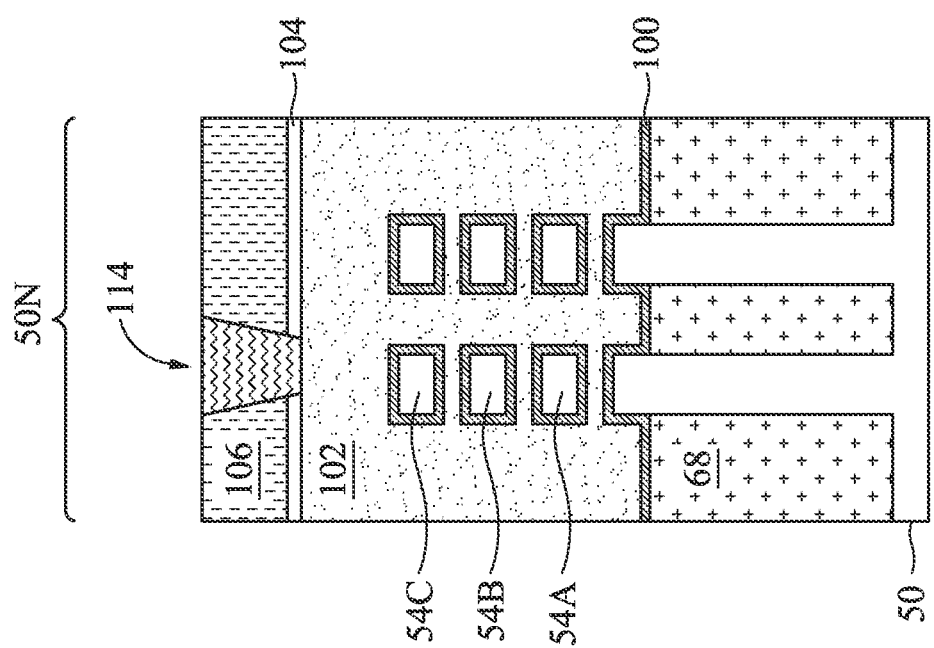
Figure 30B:
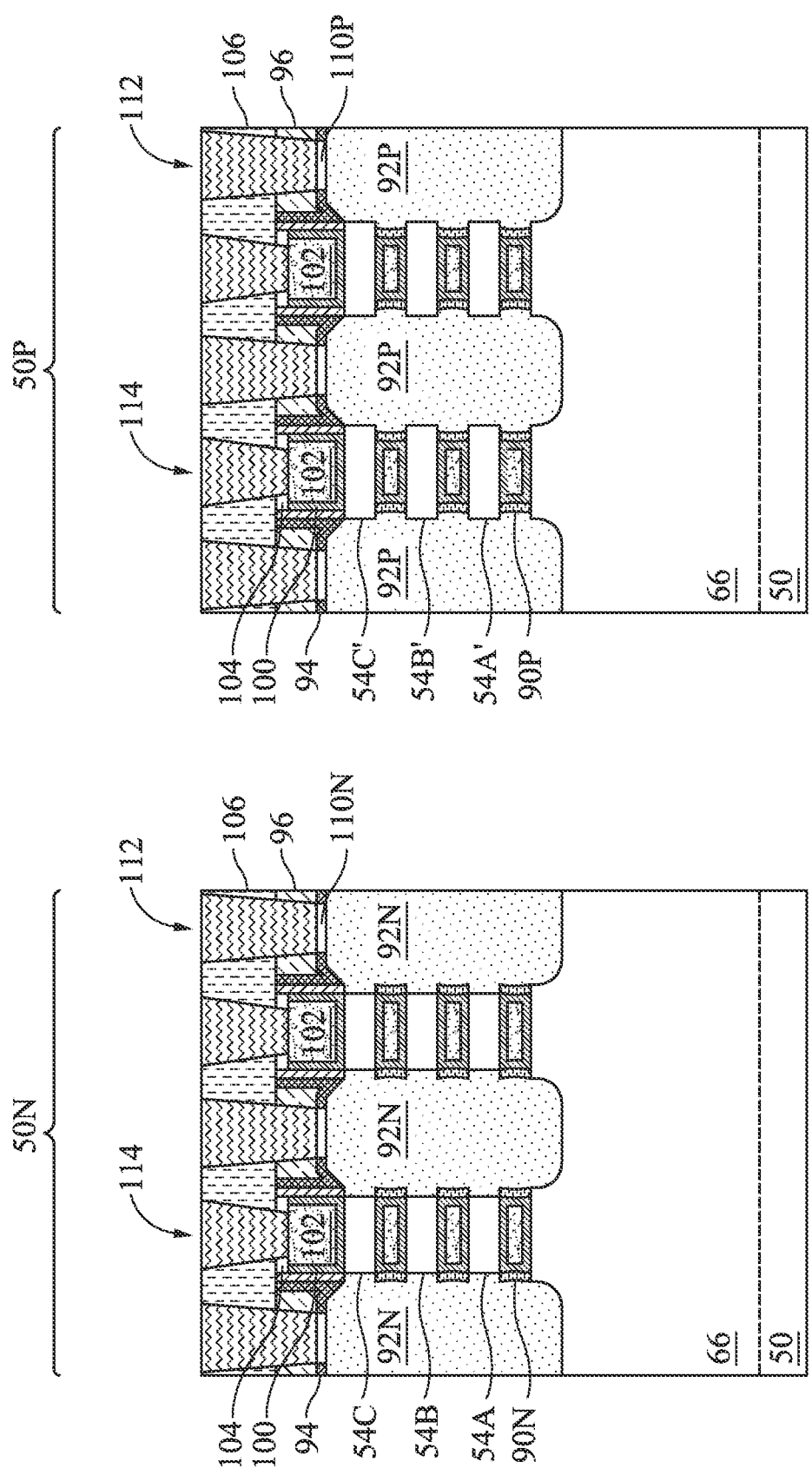
Figure 30C:
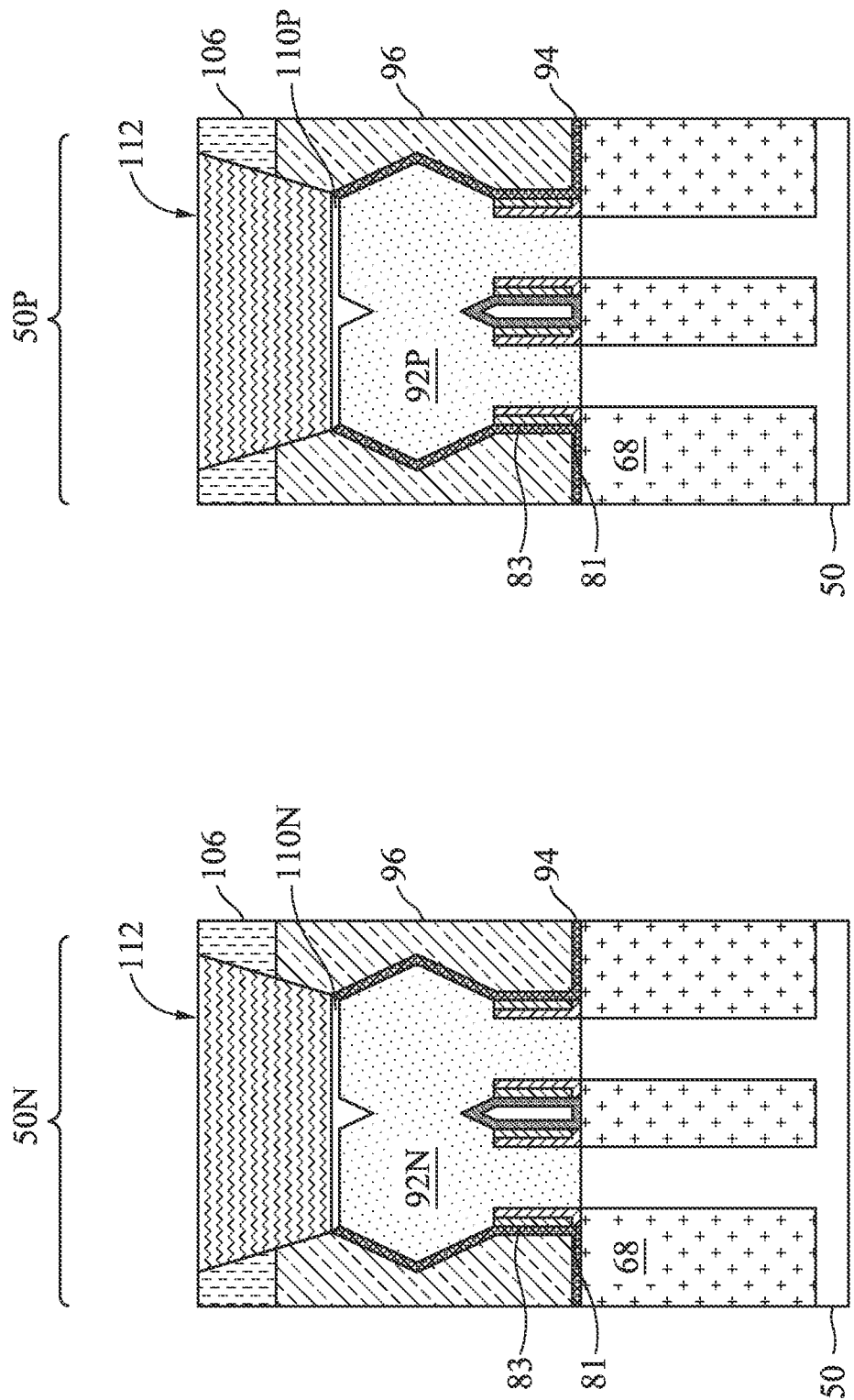

FIGS. 30A-30C illustrate cross-sectional views of a nanoFET device in accordance with some embodiments. FIG. 30A illustrates reference cross-section A-A' illustrated in FIG. 1. FIG. 30B illustrates reference cross-section B-B' illustrated in FIG. 1. FIG. 30C illustrates reference cross-section C-C' illustrated in FIG. 1. The structure of FIGS. 30A-30C is similar to the structure of FIGS. 28A-28C, with like reference numerals indicating like elements formed by like processes and the description is not repeated herein. In the illustrated embodiment, the inner spacers 90N extend into the epitaxial source/drain regions 92N, such that the epitaxial source/drain regions 92N are in physical contact with top and bottom surfaces of the inner spacers 90N. In some embodiments, such a structure may be formed, for example, by recessing the nanostructures 54A-54C after the inner spacers 90N have been formed as described above with reference to FIGS. 16A and 16B. In some embodiments, the recessing process may comprise an etch process that selectively removes a material of the nanostructures 54A-54C without substantially removing a material of the inner spacers 90N.

Figure 31A:
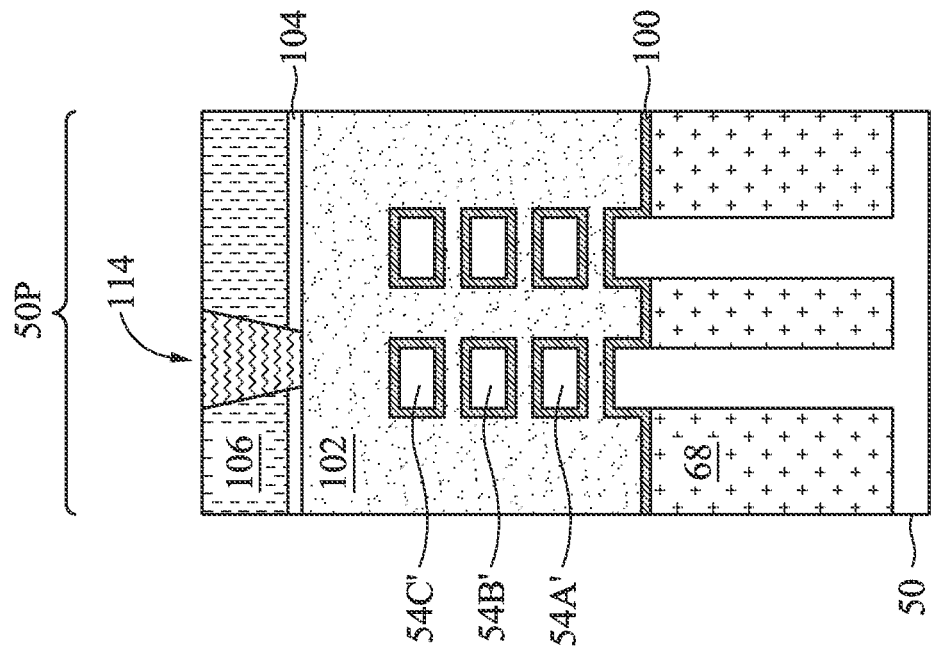
FIGS. 31A, 31B, 31C, 31D, and 31E are cross-sectional views of a nano-FET, in accordance with some embodiments.
Figure 31A:
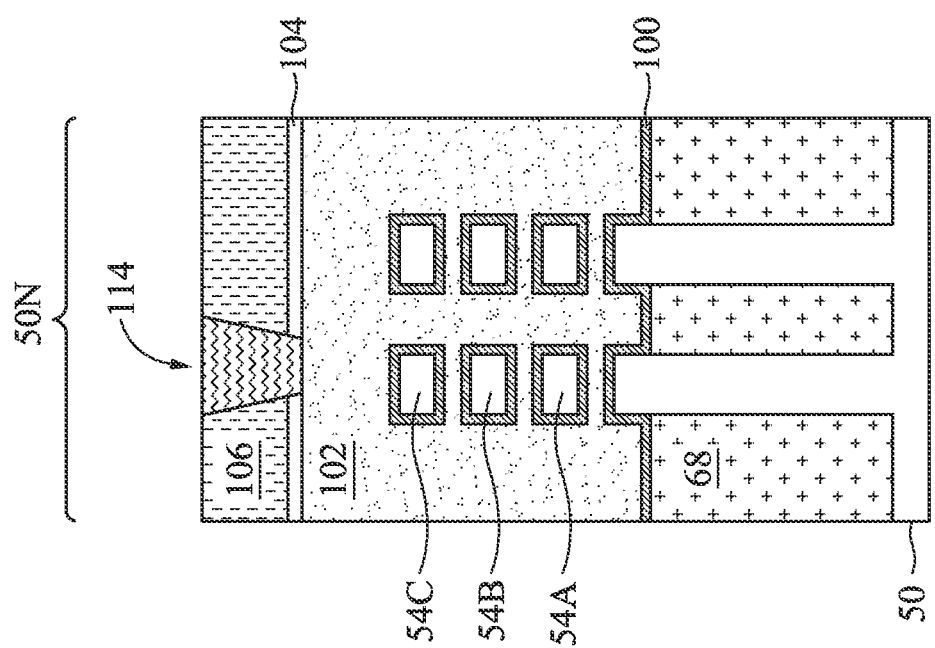
Figure 31B:
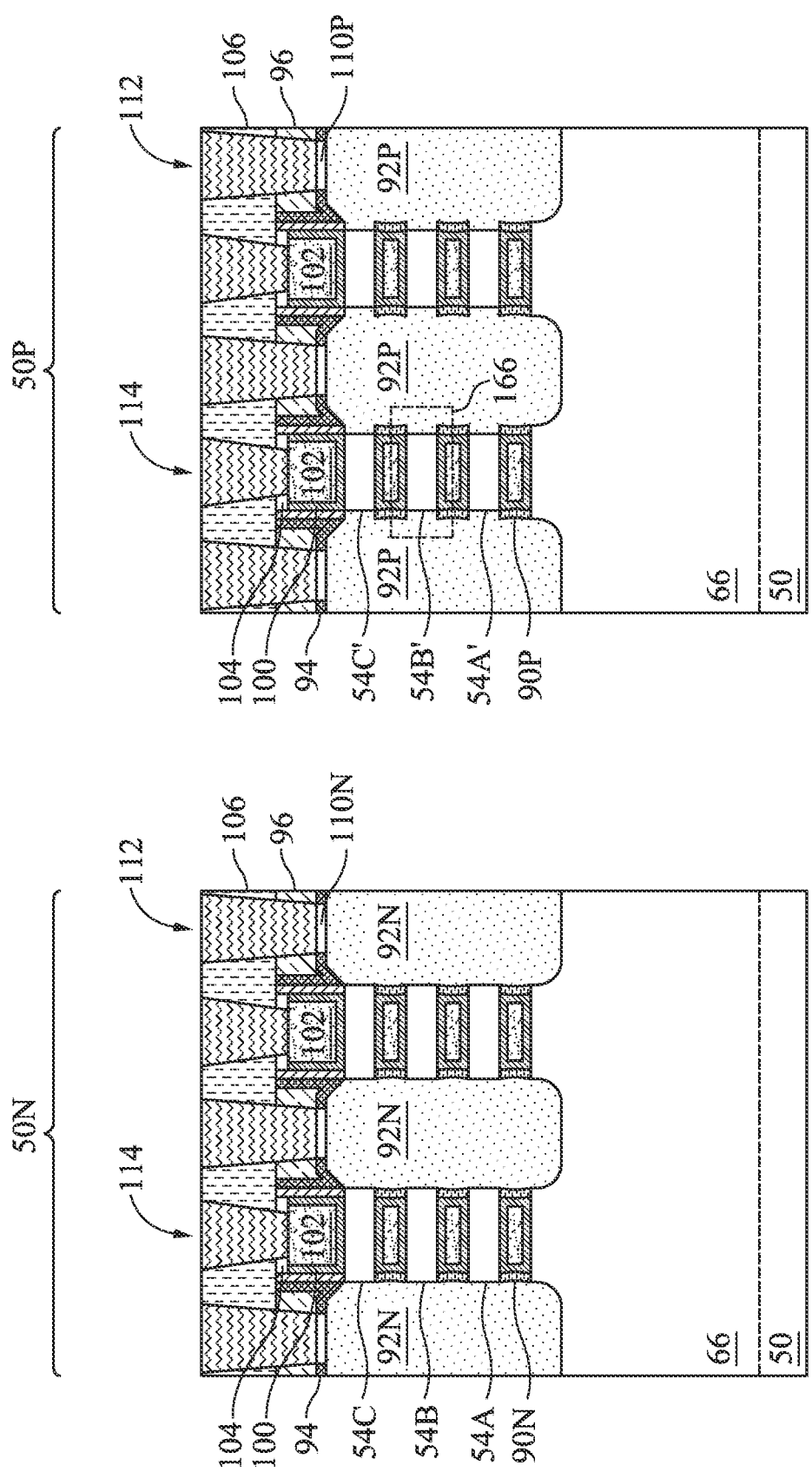
Figure 31C:
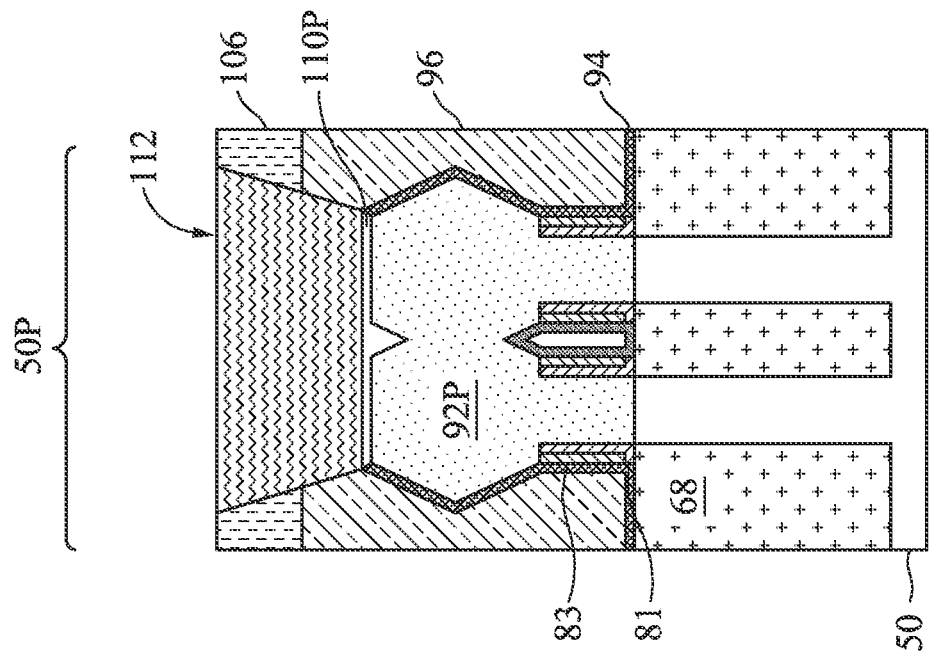
Figure 31C:
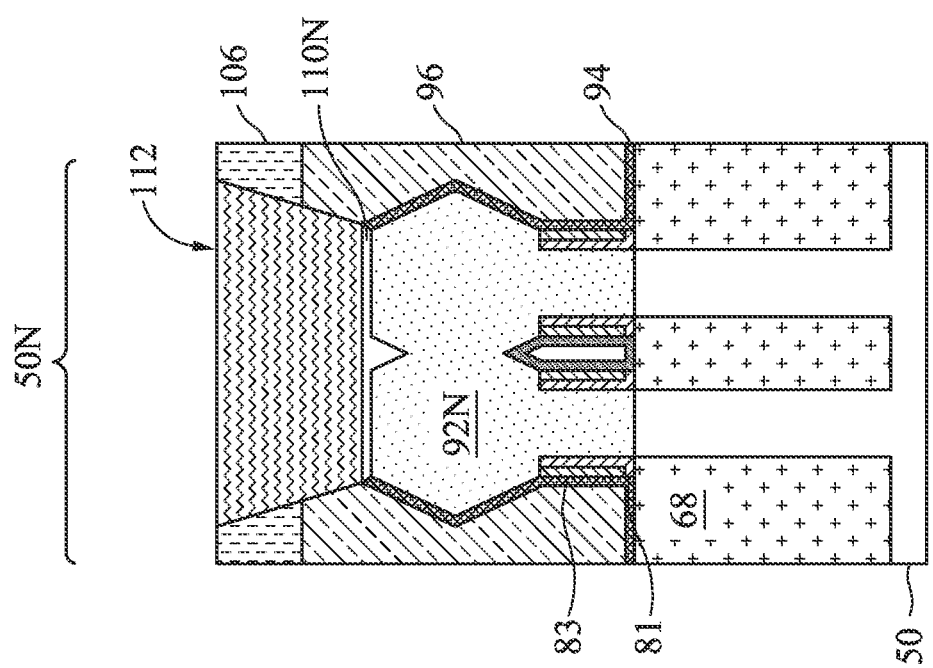

FIGS. 31A-31C illustrate cross-sectional views of a nanoFET device in accordance with some embodiments. FIG. 31A illustrates reference cross-section A-A' illustrated in FIG. 1. FIG. 31B illustrates reference cross-section B-B' illustrated in FIG. 1. FIG. 31C illustrates reference cross-section C-C' illustrated in FIG. 1. The structure of FIGS. 31A-31C is similar to the structure of FIGS. 25A-25C, with like reference numerals indicating like elements formed by like processes and the description is not repeated herein. In the illustrated embodiment, the inner spacers 90P extend into the epitaxial source/drain regions 92P, such that the epitaxial source/drain regions 92P are in physical contact with top and bottom surfaces of the inner spacers 90P. In some embodiments, such a structure may be formed, for example, by recessing the nanostructures 54A-54C after the inner spacers 90P have been formed as described above with reference to FIGS. 11A and 11B. In some embodiments, the recessing process may comprise an etch process that selectively removes a material of the nanostructures 54A-54C without substantially removing a material of the inner spacers 90P.

Figure 31D:
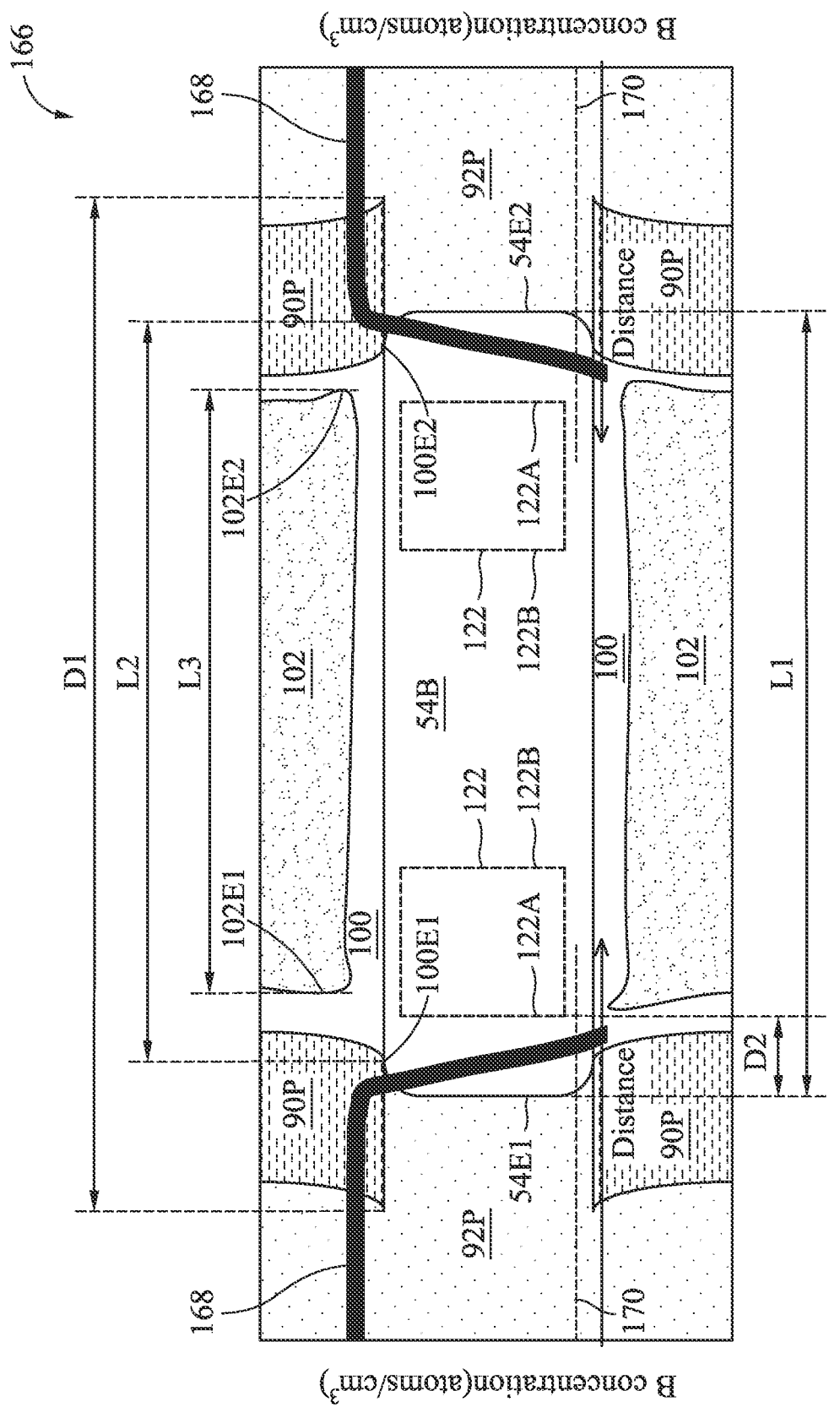

FIG. 31D illustrates a magnified view of a region 166 of the structure shown in FIG. 31B, in accordance with some embodiments. In particular, FIG. 31D illustrates the region 166 for embodiments when the thermal anneal process described above with reference to FIGS. 13A and 13B is not performed or is omitted. The nanostructure 54B has a length L1 as measured from a first sidewall 54E1 of the nanostructure 54B to an opposite second sidewall 54E2 of the nanostructure 54B. The length L1 may be between about 7 nm and about 27 nm. The gate dielectric layer 100 has a length L2 as measured from a first edge 100E1 of the gate dielectric layer 100 to an opposite second edge 100E2 of the gate dielectric layer 100. The length L2 may be between about 5 nm and about 25 nm. The gate electrode 102 has a length L3 as measured from a first edge 102E1 of the gate electrode 102 to an opposite second edge 102E2 of the gate electrode 102. The length L3 may be between about 4 nm and about 24 nm. In the illustrated embodiment, edges 54E1 and 54E2 of the nanostructure 54B are not aligned with the edges of the first inner spacer 90P. In some embodiments, a distance D1 between the outer edge of the first inner spacer 90P and the outer edge of the opposite second inner spacer 90P is greater than the length L1 of the nanostructure 54B. In some embodiments, the length L1 is greater than the length L3.

FIG. 31D further illustrates curves 168 showing concentration profiles of p-type dopants (such as, for example, boron) at interfaces between the nanostructure 54B and the epitaxial source/drain regions 92P. The curves 168 illustrate that dopant concentration continuously decreases as the dopants extend into the nanostructure 54B. The dashed horizontal lines 170 correspond to boron concentration of about 5E18 atoms/cm$^3$. In embodiments when the thermal anneal process is not performed, the dopants of the epitaxial source/drain regions 92P do not substantially extend into the nanostructure 54B and have a concentration less than about 5E18 atoms/cm$^3$ at the channel edges in nanostructure 54B, with the channel edges being aligned with respective edges of the gate electrode 102. Accordingly, the effective channel length and the channel resistance ($R_{ch}$) are not substantially affected. In such embodiments, the effective channel length is equal to the length L3 of the gate electrode 102.

To characterize a degree of the dopant penetration into the nanostructure 54B, dopant concentrations within regions of interest (ROIs) 122 (illustrated by the dashed squares) may be considered. A shape of the ROIs 122 has been described above with reference to FIG. 25D, and the description is not repeated herein. In the illustrated embodiment, the ROIs 122 are located such that a first side 122A of each ROI is spaced apart from a respective one of the edges 54E1 and 54E1 of the nanostructure 54B by a distance D2. In some embodiments, the distance D2 is about 3 nm. In embodiments when the thermal anneal process is not performed, the average boron concentration within the ROIs 122 is less than about 1E19 atoms/cm$^3$ or less than about 0.2 at %. The average boron concentration being less than about 1E19 atoms/cm$^3$ or less than about 0.2 at % within the ROIs 122 implies that the dopants of the epitaxial source/drain regions 92P do not substantially extend into the nanostructure 54B and into the channel regions. Accordingly, the effective channel length and the channel resistance ($R_{ch}$) are not substantially affected.

Figure 31E:
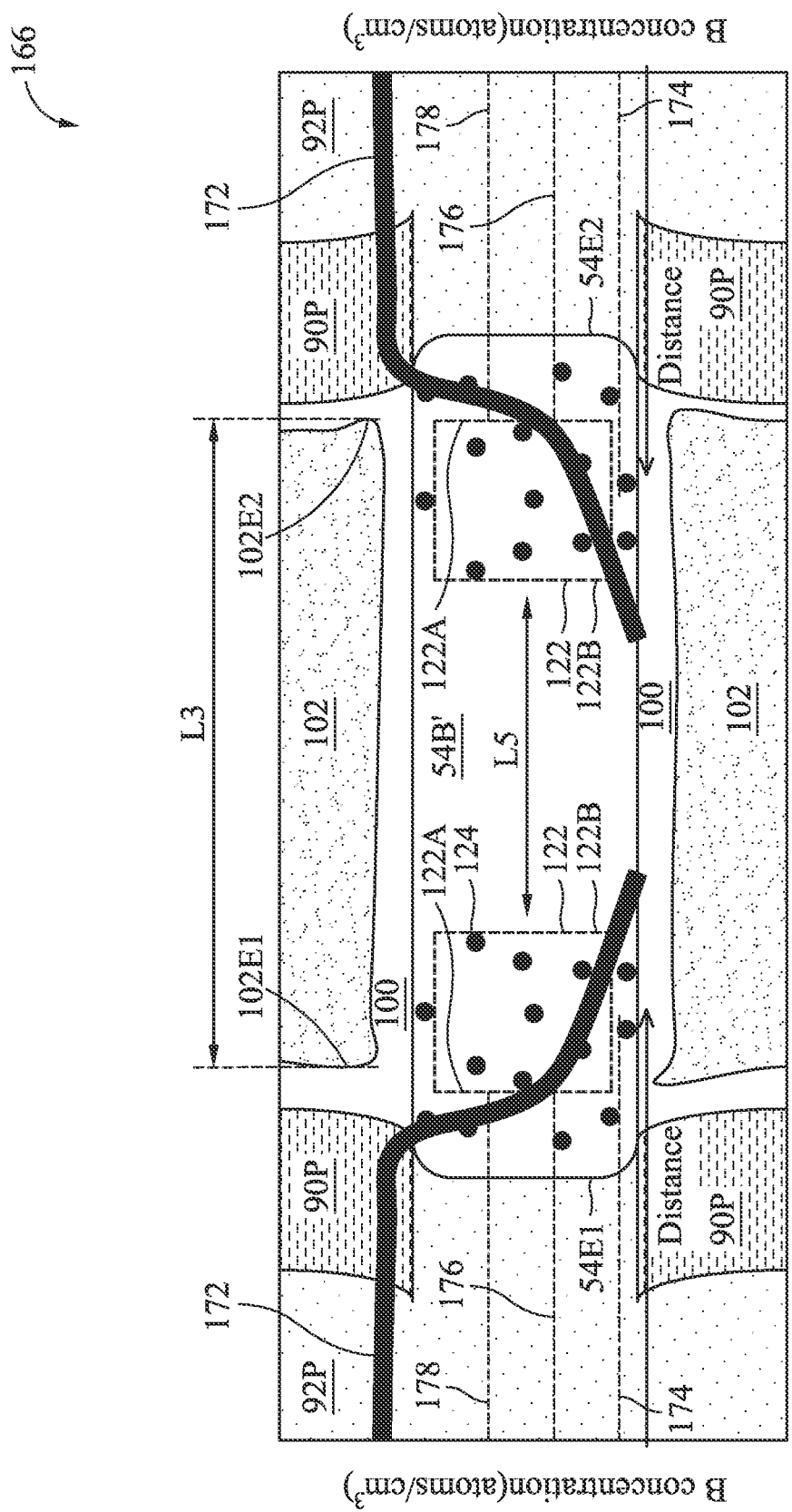

FIG. 31E illustrates the magnified view of the region 166 of the structure shown in FIG. 31B, in accordance with some embodiments. In particular, FIG. 31E illustrates the region 166 shown in FIG. 31D when the thermal anneal process described above with reference to FIGS. 13A and 13B has been performed. In such embodiments, p-type dopant atoms 124 (such as, for example, boron atoms) of the epitaxial source/drain regions 92P extend into the nanostructure 54B (see FIG. 31D) and form the doped nanostructure 54B'.

FIG. 31E further illustrates curves 172 showing concentration profiles of p-type dopants (such as, for example, boron) at interfaces between the doped nanostructure 54B' and the epitaxial source/drain regions 92P. The curves 172 illustrate that dopant concentration continuously decreases as the dopants extend into the doped nanostructure 54B'. The dashed horizontal lines 174 correspond to a boron concentration of about 5E18 atoms/cm$^3$. The dashed horizontal lines 176 correspond to a boron concentration of about 1E19 atoms/cm$^3$. The dashed horizontal lines 178 correspond to a boron concentration of about 5E19 atoms/cm$^3$. In embodiments when the thermal anneal process is performed, a dopant concentration may reach to about 5E18 atoms/cm$^3$ or greater at the channel edges.

To characterize a degree of the dopant penetration into the doped nanostructure 54B', dopant concentrations within ROIs 122 may be considered. In embodiments when the thermal anneal process is performed, the average boron concentration within the ROIs 122 is greater than about 1E19 atoms/cm$^3$ or greater than about 0.2 at %. The average boron concentration being greater than about 1E19 atoms/cm$^3$ or greater than about 0.2 at % that the dopants of the epitaxial source/drain regions 92P extend into the channel region and reduce an effective channel length. Accordingly, the channel resistance ($R_{ch}$) is reduced. The effective channel length L5 is equal to a length of the un-doped portion the doped nanostructure 54B'. In the illustrated embodiment, the effective channel length L5 is less than the length L3 of the gate electrode 102.

Referring further to FIG. 31E, dopant concentration profiles of the doped nanostructures 54B' are illustrated. In some embodiments, dopants may extend into the doped nanostructures 54A' and 54C' in a similar manner as in the doped nanostructures 54B', and the description is not repeated herein.

Figure 32A:
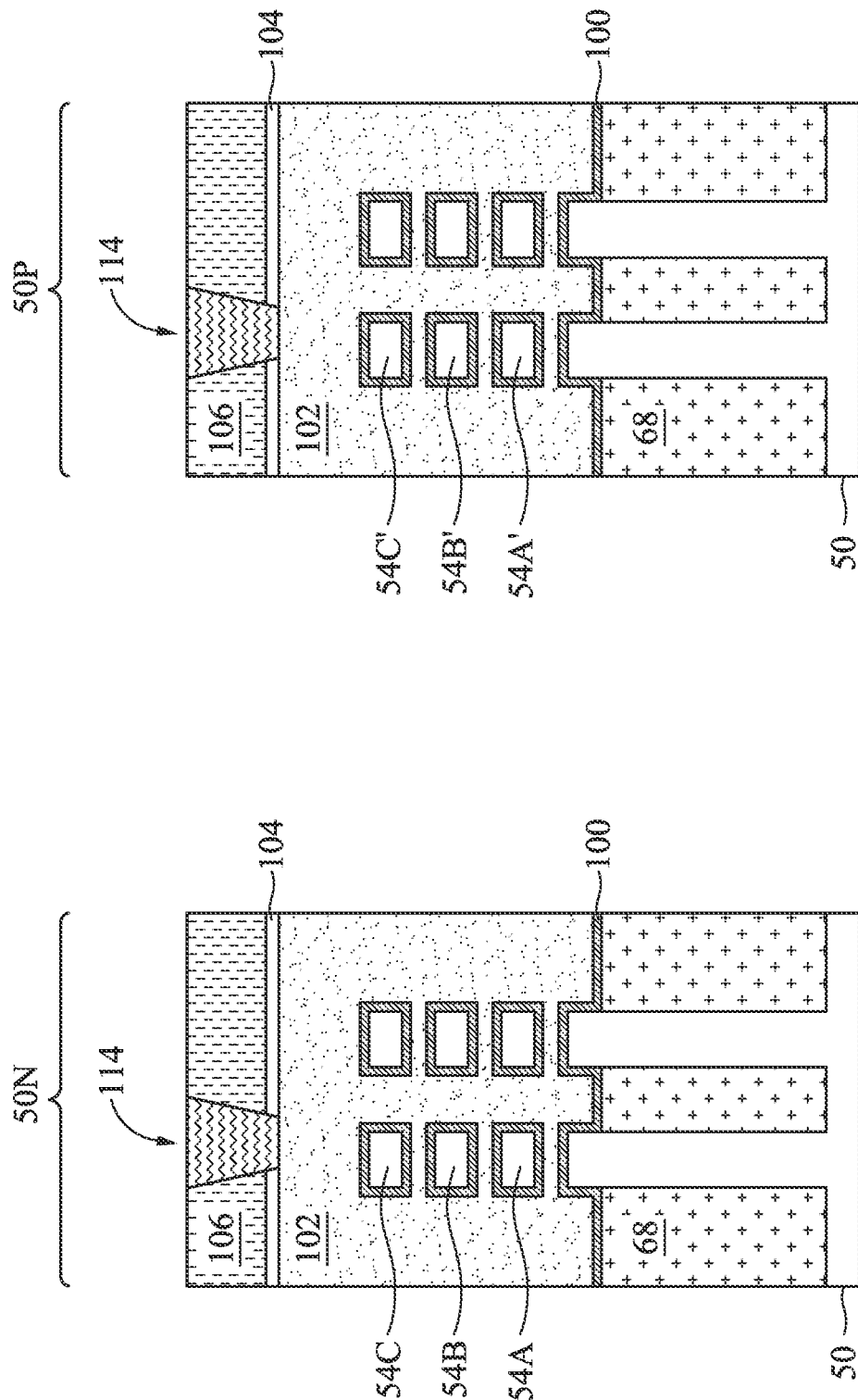
FIGS. 32A, 32B, and 32C are cross-sectional views of a nano-FET, in accordance with some embodiments.
Figure 32B:
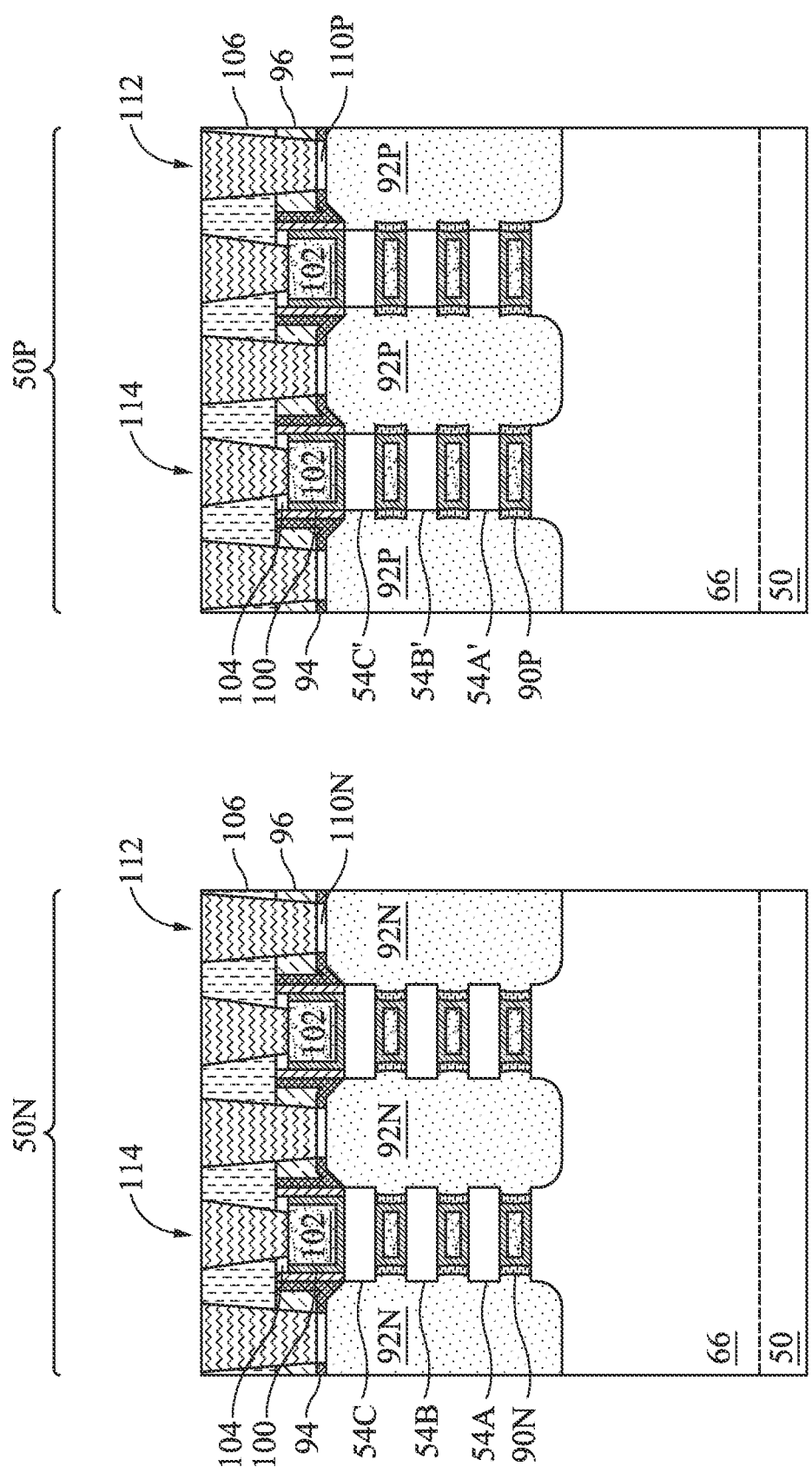
Figure 32C:
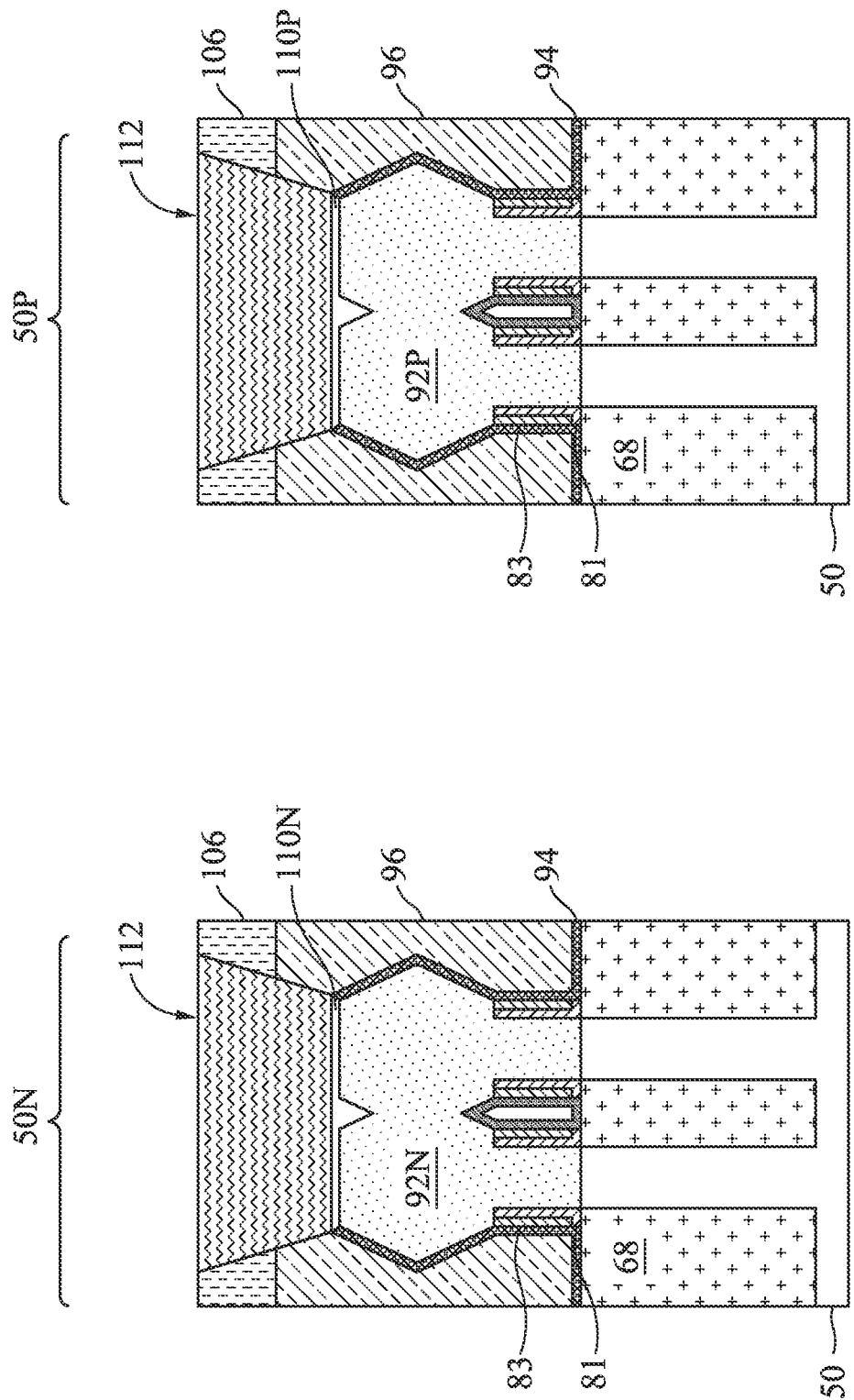

FIGS. 32A-32C illustrate cross-sectional views of a nanoFET device in accordance with some embodiments. FIG. 32A illustrates reference cross-section A-A' illustrated in FIG. 1. FIG. 32B illustrates reference cross-section B-B' illustrated in FIG. 1. FIG. 32C illustrates reference cross-section C-C' illustrated in FIG. 1. The structure of FIGS. 32A-32C is similar to the structure of FIGS. 31A-31C, with like reference numerals indicating like elements formed by like processes and the description is not repeated herein. In the illustrated embodiment, the inner spacers 90N are formed such that the inner spacers 90N do not fully fill the sidewall recesses 88N (see FIG. 16B), the epitaxial source/drain regions 92N extend into the sidewall recesses 88N and physically contact bottom surfaces of the nanostructures 54C, top and bottom surfaces of the nanostructures 54B, top and bottom surfaces of the nanostructures 54A, and top surfaces of the fins 66. In some embodiments, the inner spacers 90N as illustrated in FIGS. 32A-32C may be formed using process steps similar to the process steps described above with reference to FIGS. 16A and 16B, for example, by altering a thickness of the inner spacer layer and/or by tuning the etch process for patterning the inner spacer layer.

Figure 33A:
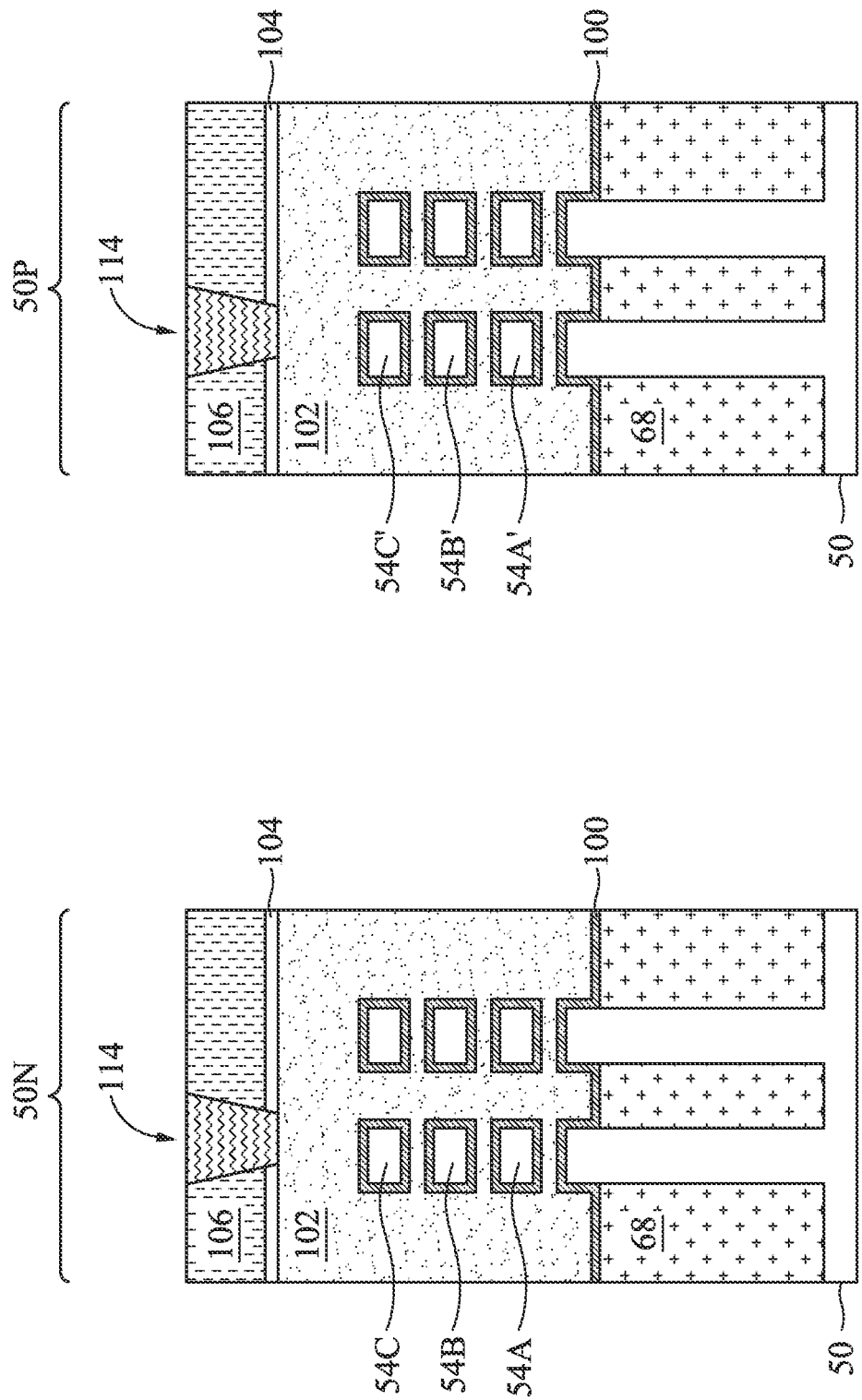
FIGS. 33A, 33B, and 33C are cross-sectional views of a nano-FET, in accordance with some embodiments.
Figure 33B:
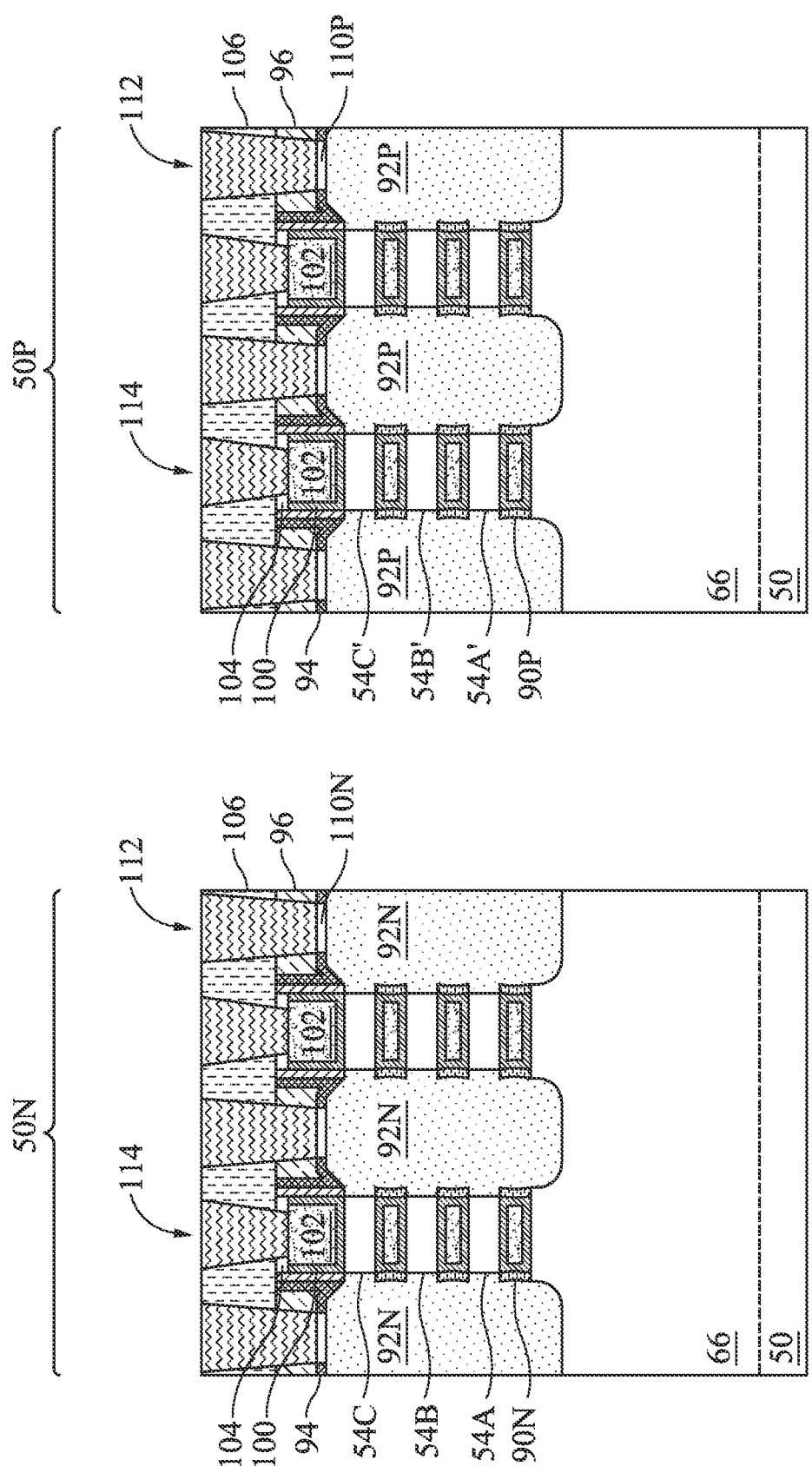
Figure 33C:
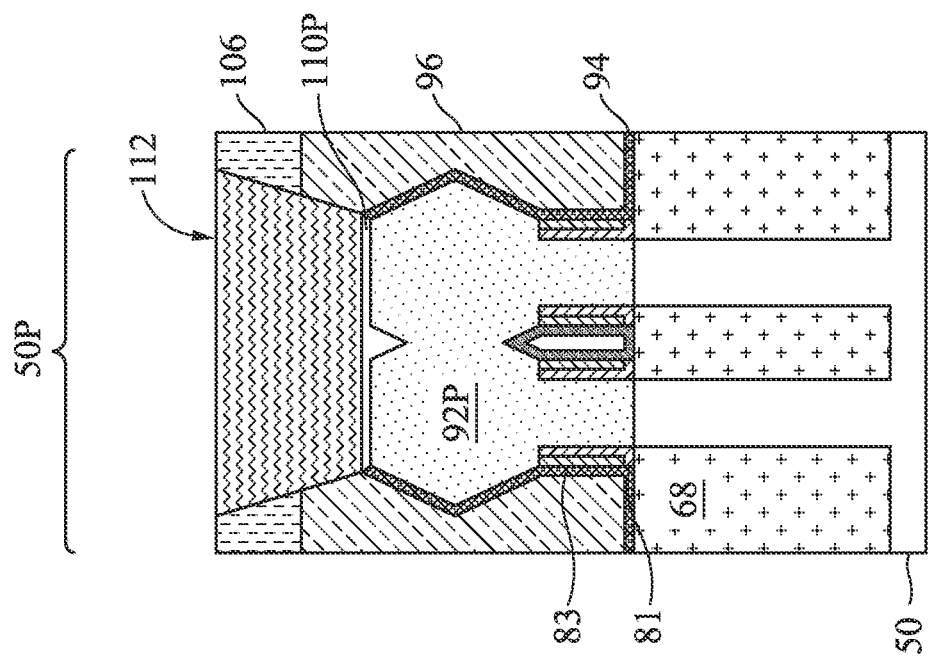
Figure 33C:
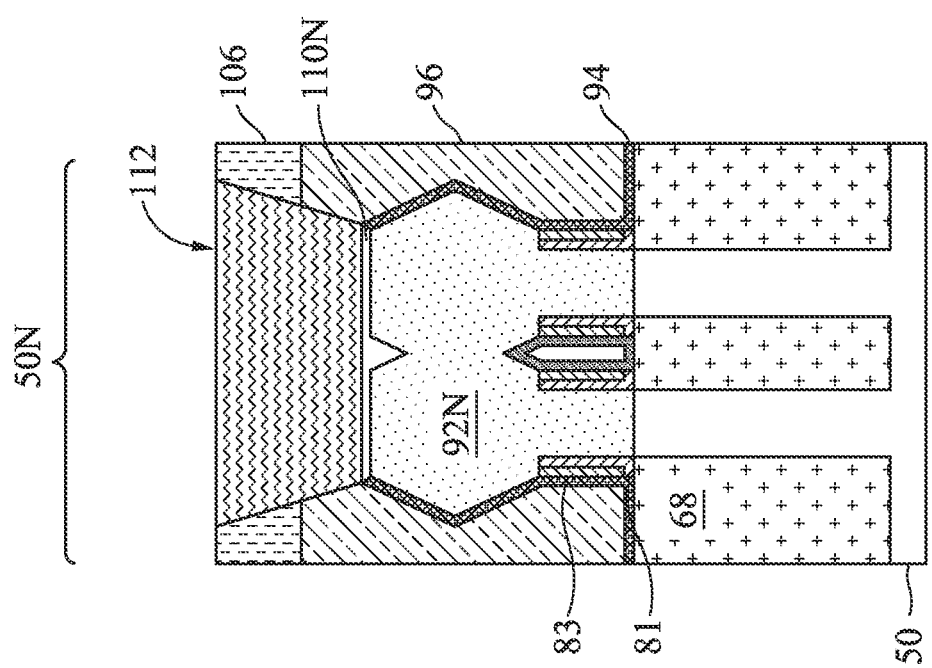

FIGS. 33A-33C illustrate cross-sectional views of a nano-FET device in accordance with some embodiments. FIG. 33A illustrates reference cross-section A-A' illustrated in FIG. 1. FIG. 33B illustrates reference cross-section B-B' illustrated in FIG. 1. FIG. 33C illustrates reference cross-section C-C' illustrated in FIG. 1. The structure of FIGS. 33A-33C is similar to the structure of FIGS. 31A-31C, with like reference numerals indicating like elements formed by like processes and the description is not repeated herein. In the illustrated embodiment, the inner spacers 90N extend into the epitaxial source/drain regions 92N, such that the epitaxial source/drain regions 92N are in physical contact with top and bottom surfaces of the inner spacers 90N. In some embodiments, such a structure may be formed, for example, by recessing the nanostructures 54A-54C after the inner spacers 90N have been formed as described above with reference to FIGS. 16A and 16B. In some embodiments, the recessing process may comprise an etch process that selectively removes a material of the nanostructures 54A-54C without substantially removing a material of the inner spacers 90N.

Figure 34A:
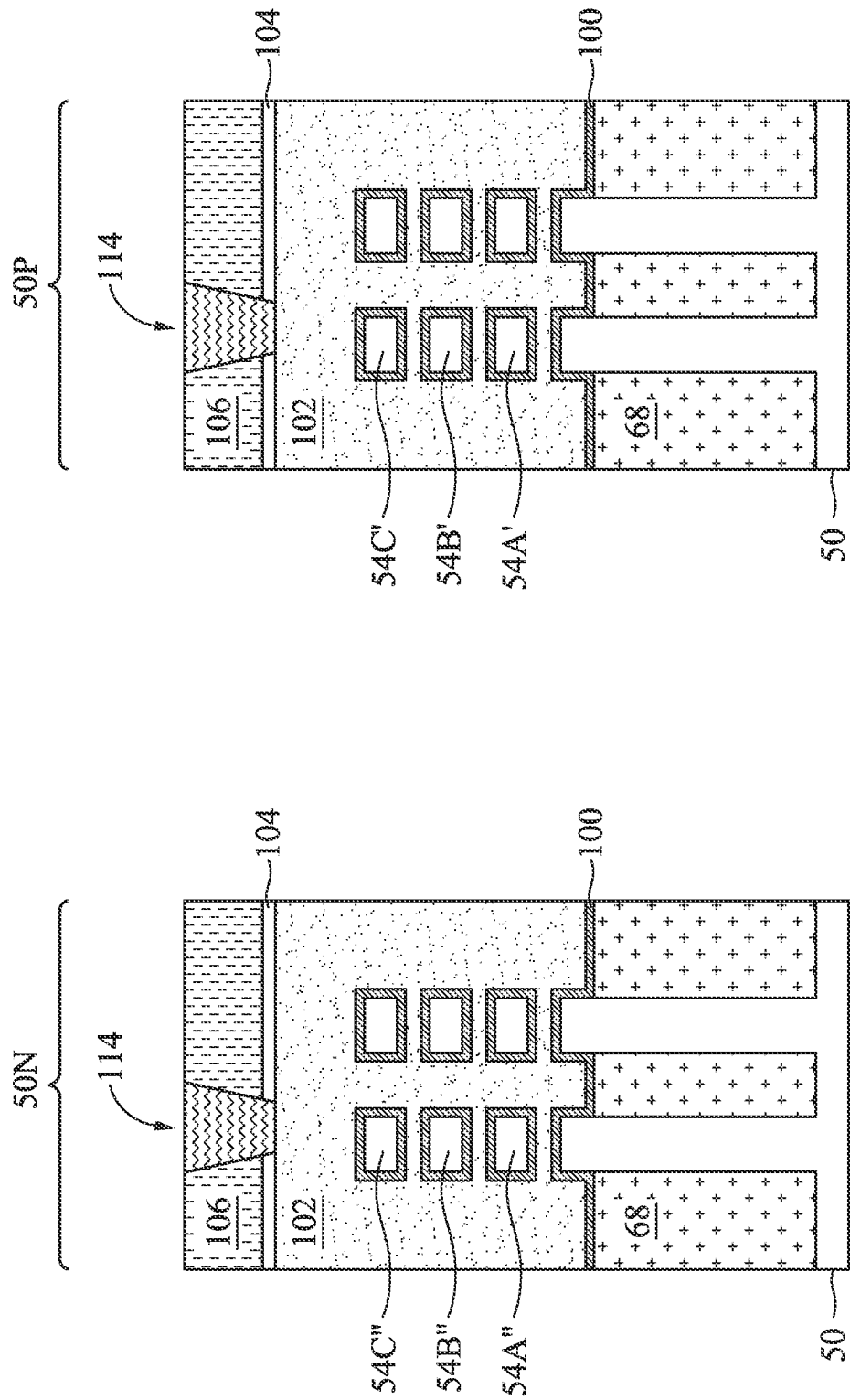
FIGS. 34A, 34B, and 34C are cross-sectional views of a nano-FET, in accordance with some embodiments.
Figure 34B:
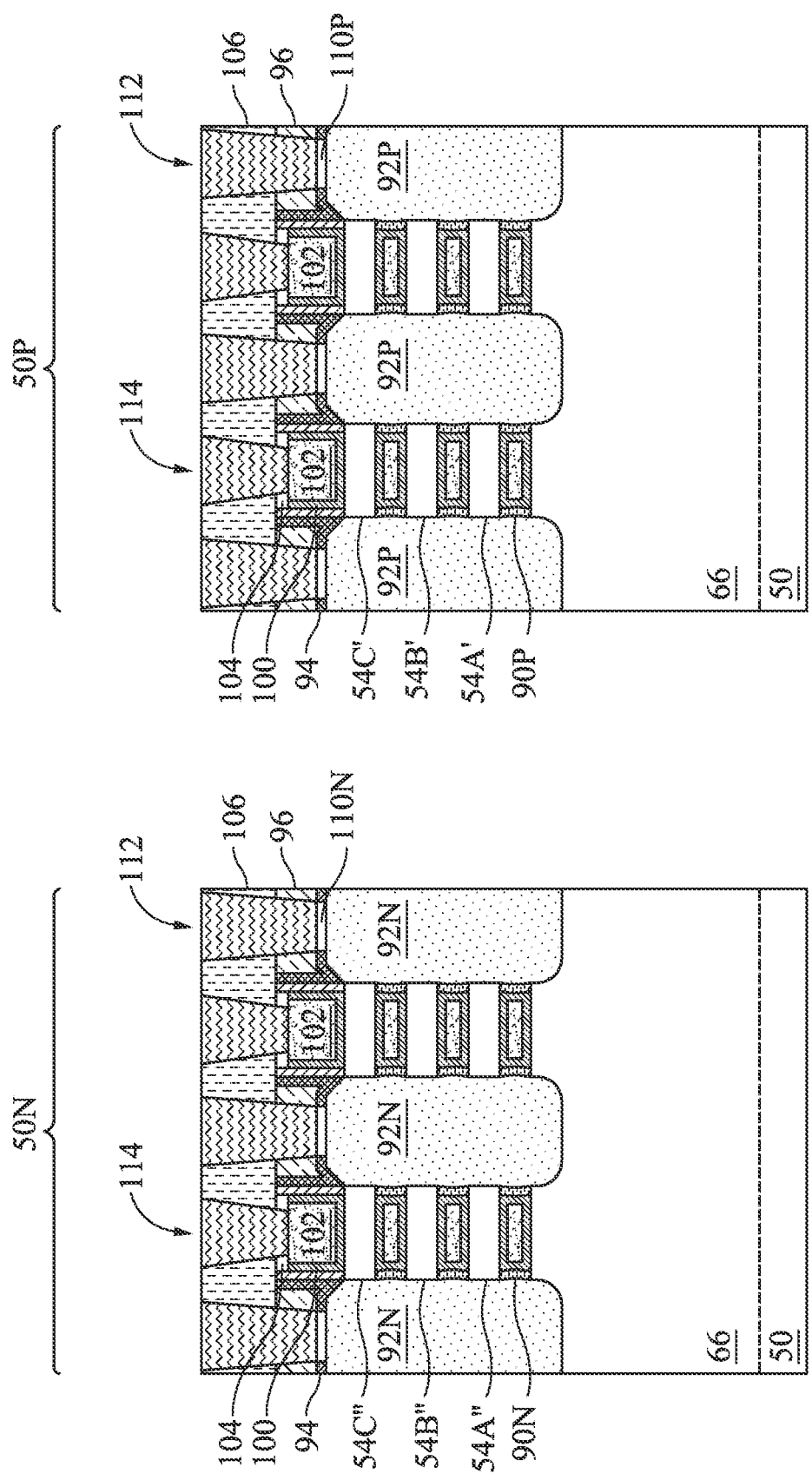
Figure 34C:
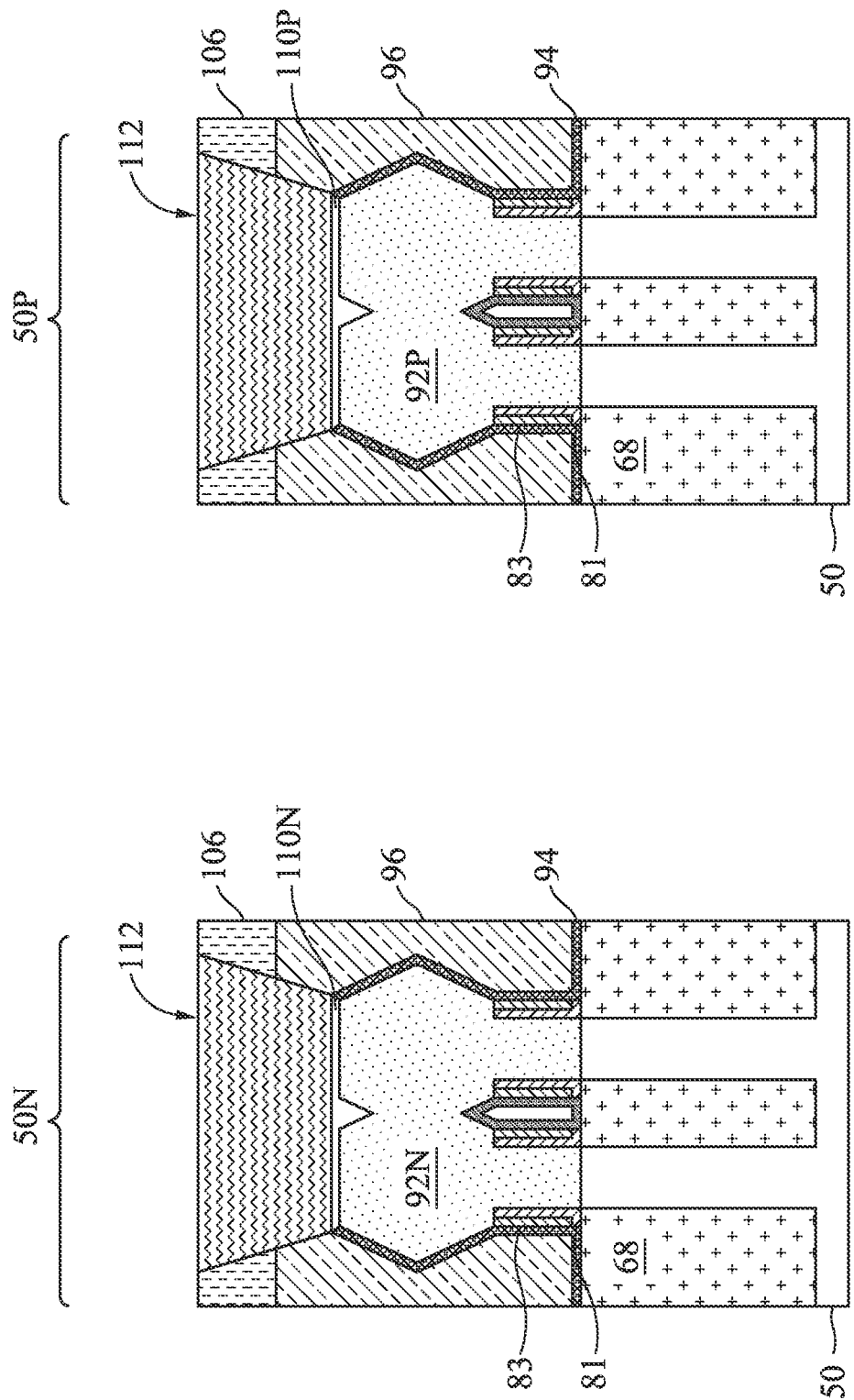

FIGS. 34A-34C illustrate cross-sectional views of a nano-FET device in accordance with some embodiments. FIG. 34A illustrates reference cross-section A-A' illustrated in FIG. 1. FIG. 34B illustrates reference cross-section B-B' illustrated in FIG. 1. FIG. 34C illustrates reference cross-section C-C' illustrated in FIG. 1. The structure of FIGS. 34A-34C is similar to the structure of FIGS. 25A-25C, with like reference numerals indicating like elements formed by like processes and the description is not repeated herein. In the illustrated embodiment, after forming the epitaxial source/drain regions 92N as described above with reference to FIGS. 17A and 17B, a thermal process similar to the thermal process described above with reference to FIGS. 13A and 13B is performed to drive dopants of the epitaxial source/drain regions 92N into the nanostructures 54A-54C to form doped nanostructures 54A"-54C", with the distinction that n-type dopants such as, for example, phosphorus (P) atoms are driven into the nanostructures 54A-54C to form the doped nanostructures 54A"-54C". A dopant concentration profile in the doped nanostructures 54A"-54C" is similar to the dopant concentration profile in the doped nanostructures 54A'-54C' as described above with reference to FIG. 25E, with the distinction that, in the illustrated embodiment, the doped nanostructures 54A"-54C" comprise n-type dopants compared to the doped nanostructures 54A'-54C' that comprise p-type dopants.

Figure 35A:
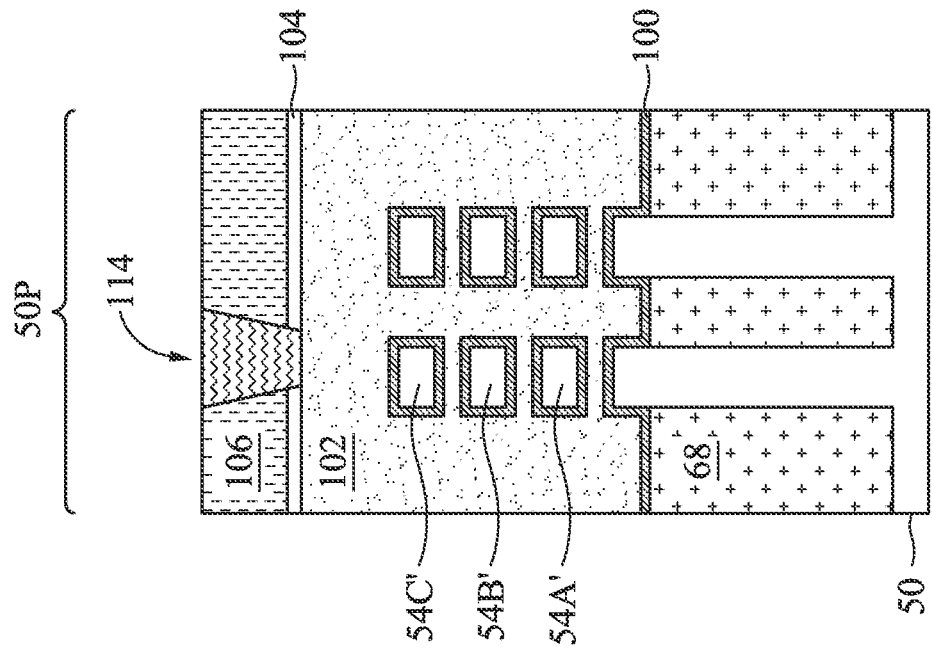
FIGS. 35A, 35B, and 35C are cross-sectional views of a nano-FET, in accordance with some embodiments.
Figure 35A:
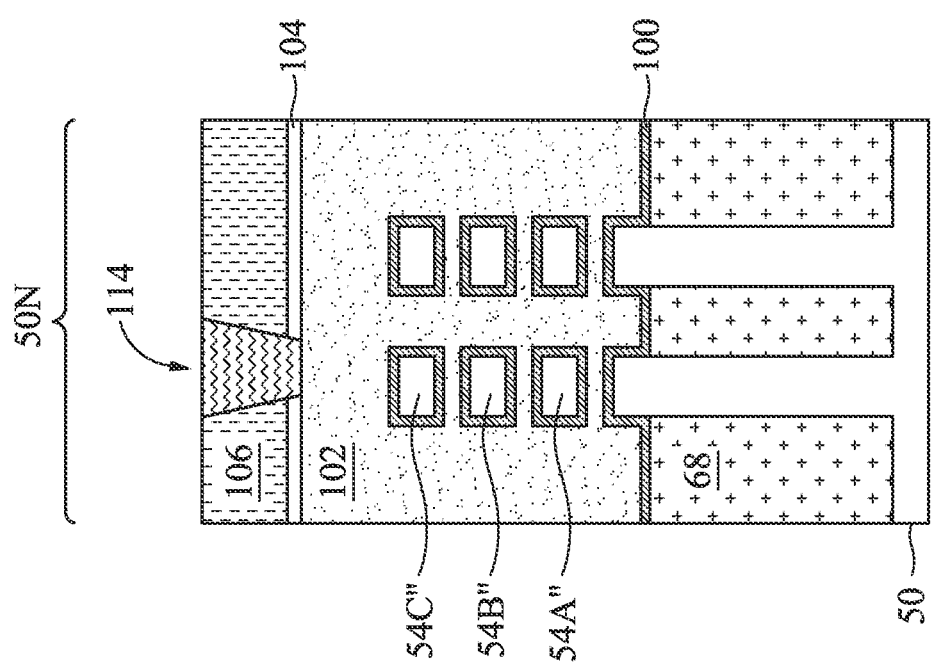
Figure 35B:
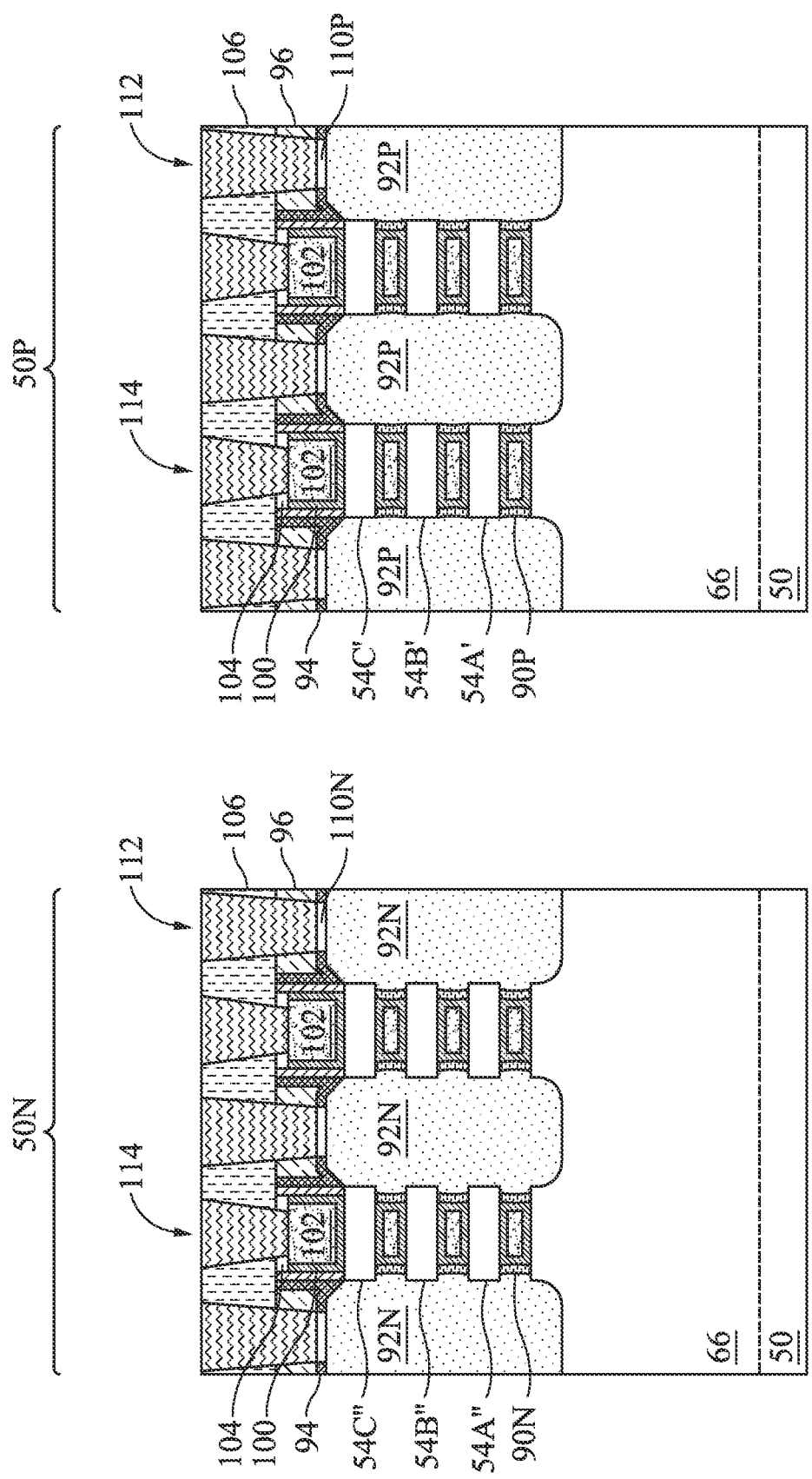
Figure 35C:
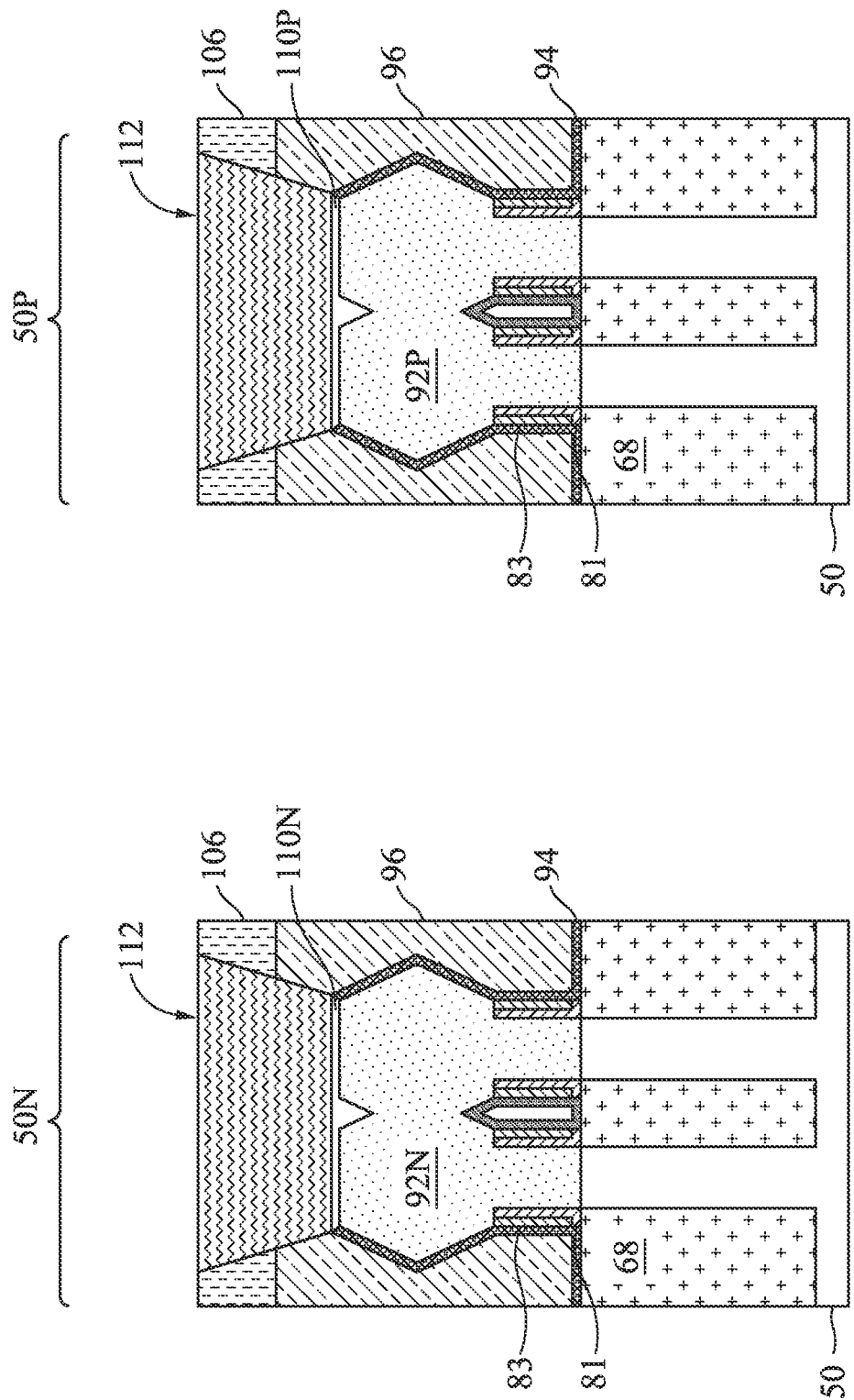

FIGS. 35A-35C illustrate cross-sectional views of a nano-FET device in accordance with some embodiments. FIG. 35A illustrates reference cross-section A-A' illustrated in FIG. 1. FIG. 35B illustrates reference cross-section B-B' illustrated in FIG. 1. FIG. 35C illustrates reference cross-section C-C' illustrated in FIG. 1. The structure of FIGS. 35A-35C is similar to the structure of FIGS. 26A-26C, with like reference numerals indicating like elements formed by like processes and the description is not repeated herein. In the illustrated embodiment, after forming the epitaxial source/drain regions 92N as described above with reference to FIGS. 17A and 17B, a thermal process similar to the thermal process described above with reference to FIGS. 13A and 13B is performed to drive dopants of the epitaxial source/drain regions 92N into the nanostructures 54A-54C to form doped nanostructures 54A"-54C", with the distinction that n-type dopants such as, for example, phosphorus (P) atoms are driven into the nanostructures 54A-54C to form the doped nanostructures 54A"-54C". A dopant concentration profile in the doped nanostructures 54A"-54C" is similar to the dopant concentration profile in the doped nanostructures 54A'-54C' as described above with reference to FIG. 28E, with the distinction that, in the illustrated embodiment, the doped nanostructures 54A"-54C" comprise n-type dopants compared to the doped nanostructures 54A'-54C' that comprise p-type dopants.

Figure 36A:
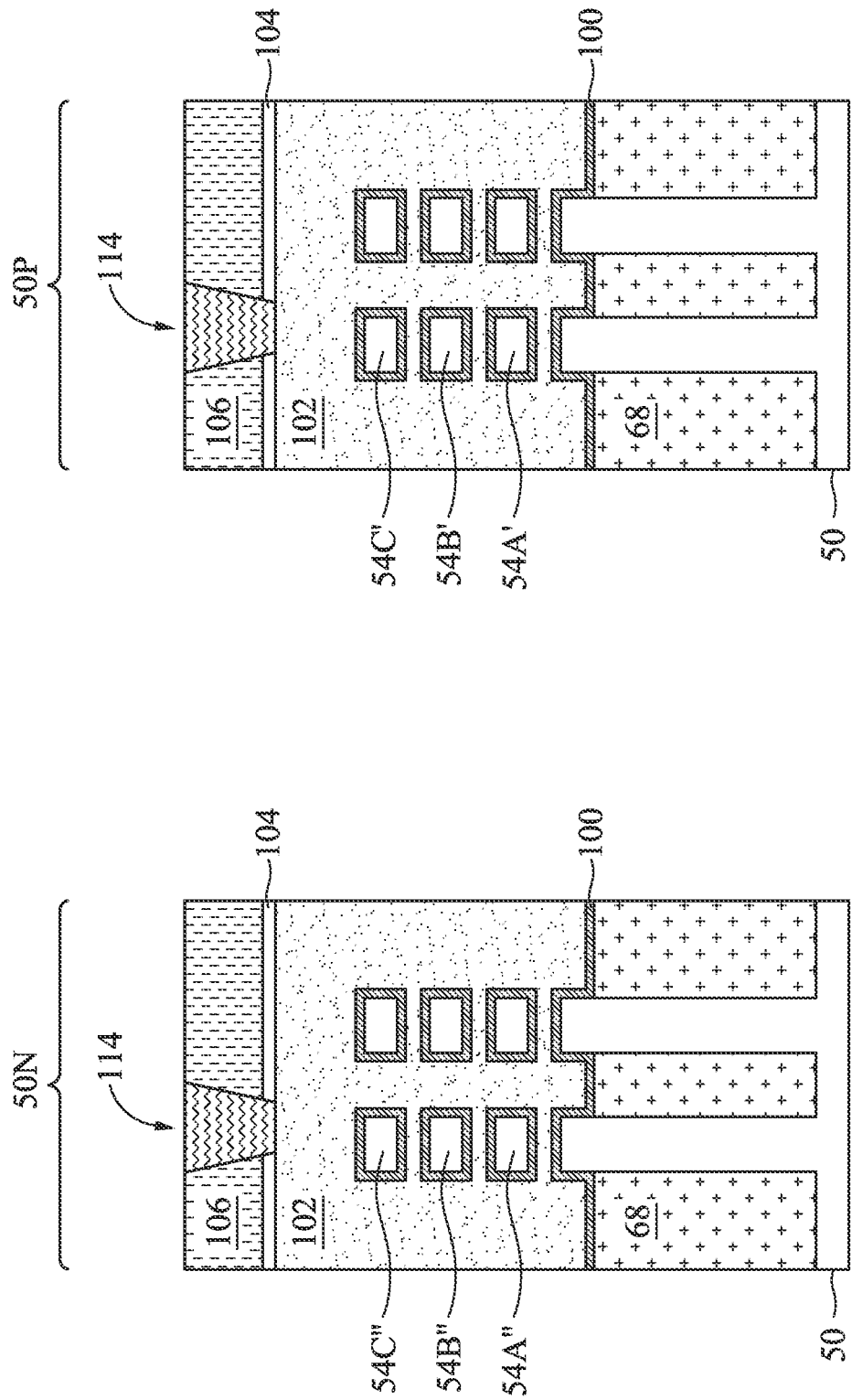
FIGS. 36A, 36B, and 36C are cross-sectional views of a nano-FET, in accordance with some embodiments.
Figure 36B:
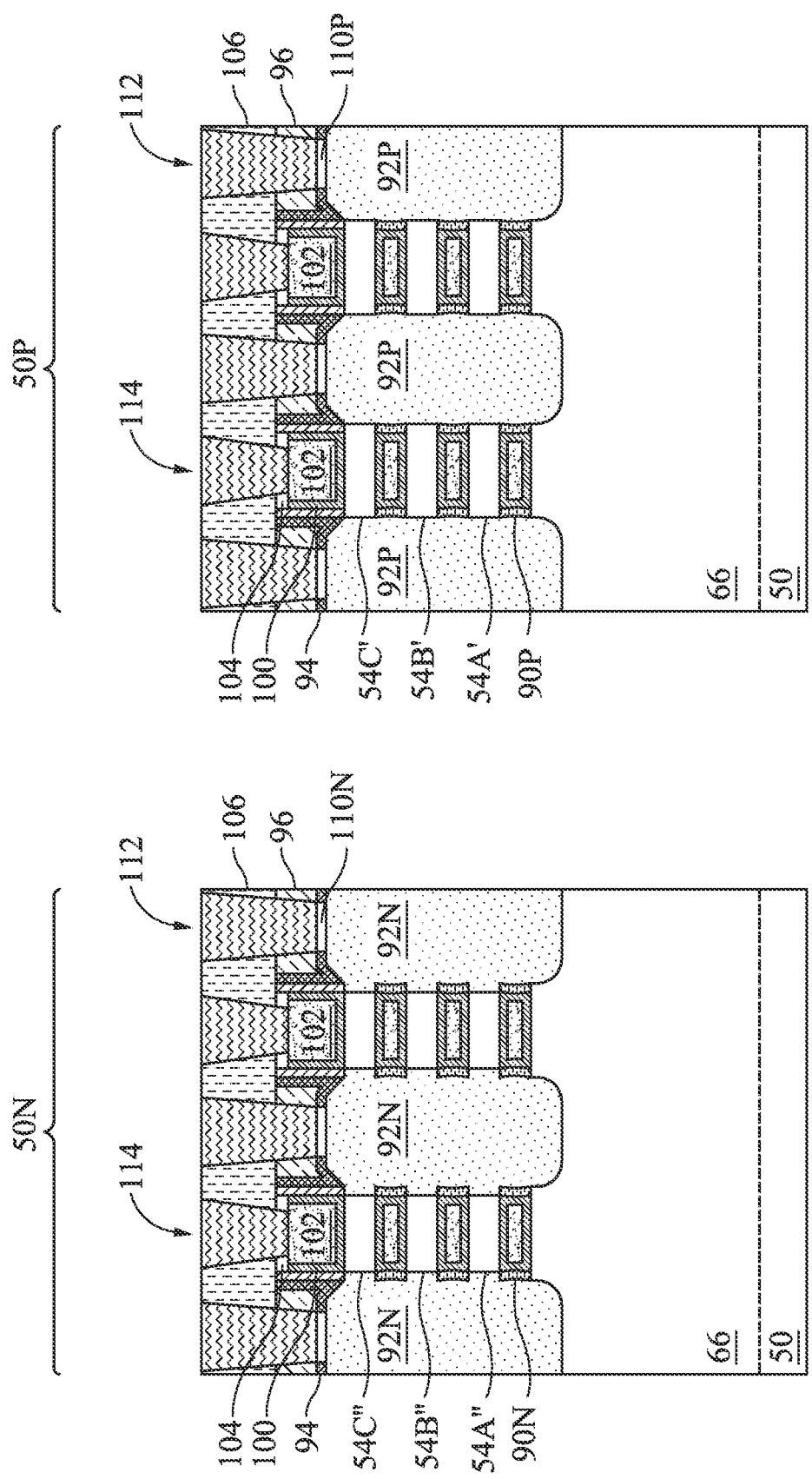
Figure 36C:
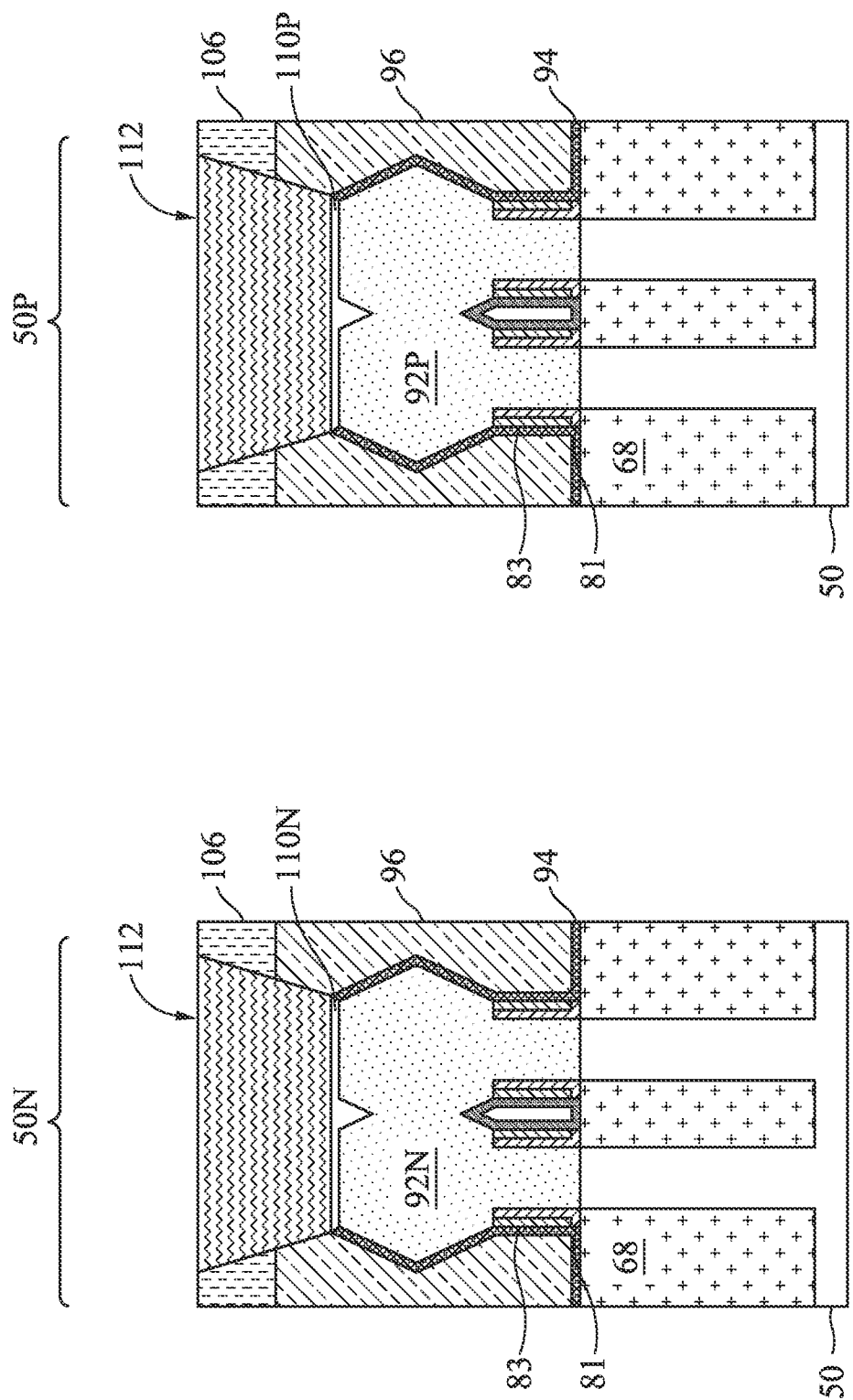

FIGS. 36A-36C illustrate cross-sectional views of a nano-FET device in accordance with some embodiments. FIG. 36A illustrates reference cross-section A-A' illustrated in FIG. 1. FIG. 36B illustrates reference cross-section B-B' illustrated in FIG. 1. FIG. 36C illustrates reference cross-section C-C' illustrated in FIG. 1. The structure of FIGS. 36A-36C is similar to the structure of FIGS. 27A-27C, with like reference numerals indicating like elements formed by like processes and the description is not repeated herein. In the illustrated embodiment, after forming the epitaxial source/drain regions 92N as described above with reference to FIGS. 17A and 17B, a thermal process similar to the thermal process described above with reference to FIGS. 13A and 13B is performed to drive dopants of the epitaxial source/drain regions 92N into the nanostructures 54A-54C to form doped nanostructures 54A"-54C", with the distinction that n-type dopants such as, for example, phosphorus (P) atoms are driven into the nanostructures 54A-54C to form the doped nanostructures 54A"-54C". A dopant concentration profile in the doped nanostructures 54A"-54C" is similar to the dopant concentration profile in the doped nanostructures 54A'-54C' as described above with reference to FIG. 31E, with the distinction that, in the illustrated embodiment, the doped nanostructures 54A"-54C" comprise n-type dopants compared to the doped nanostructures 54A'-54C' that comprise p-type dopants.

Figure 37A:
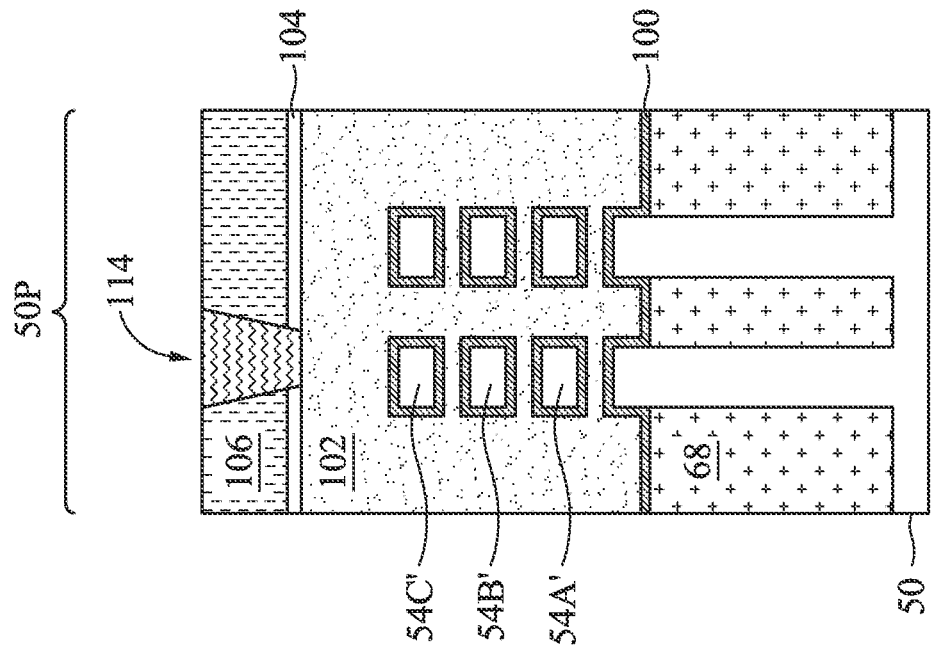
FIGS. 37A, 37B, and 37C are cross-sectional views of a nano-FET, in accordance with some embodiments.
Figure 37A:
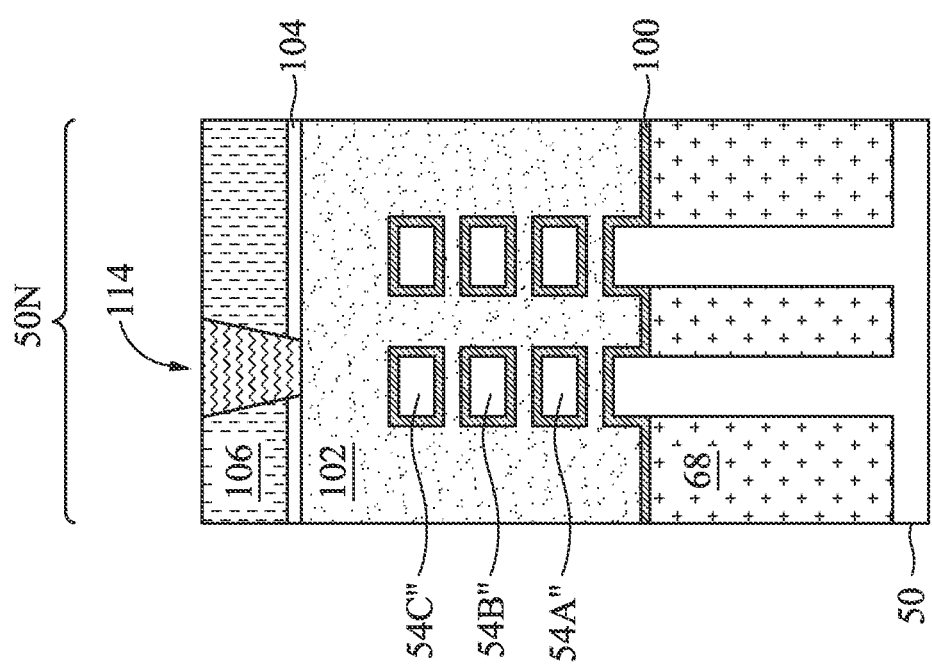
Figure 37B:
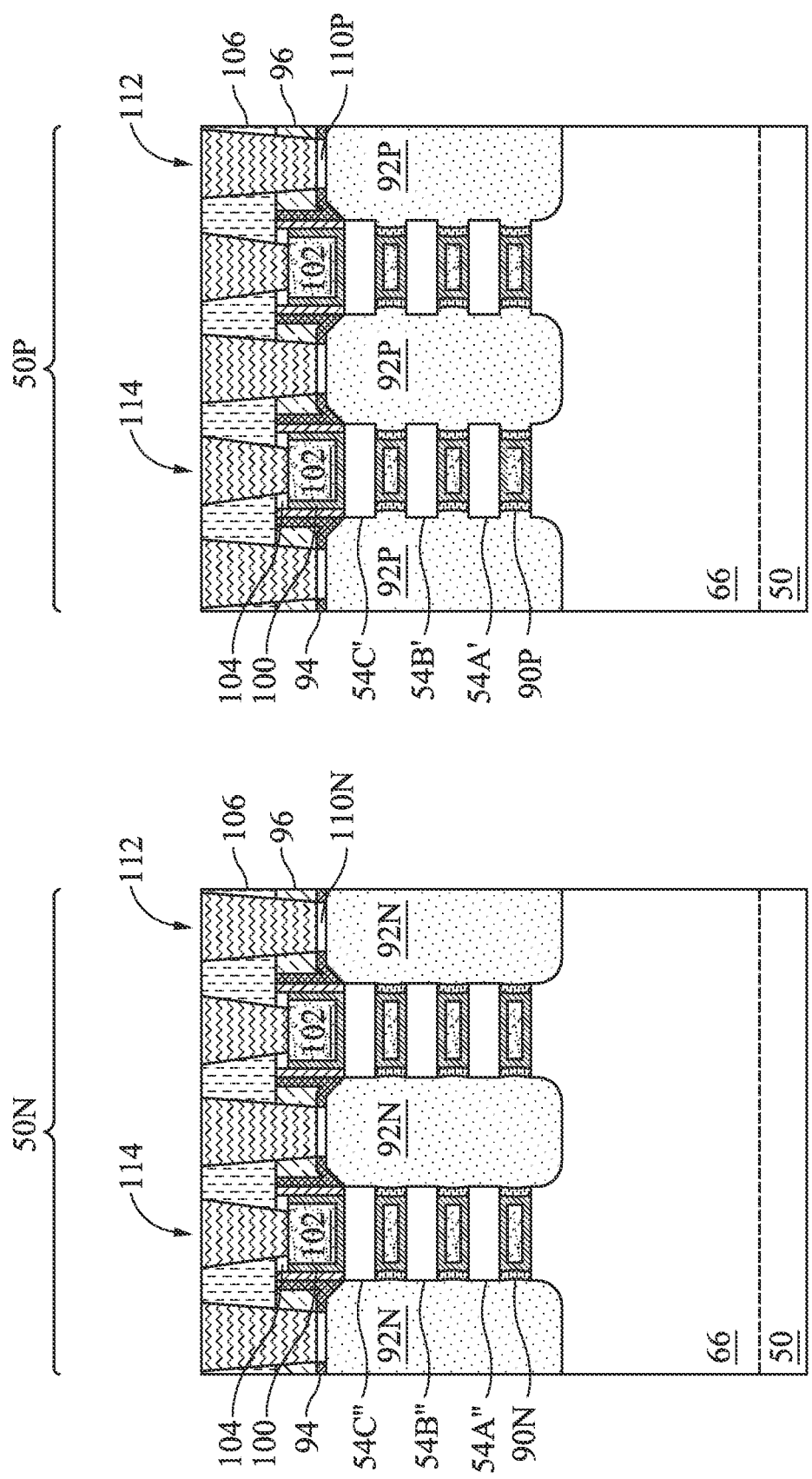
Figure 37C:
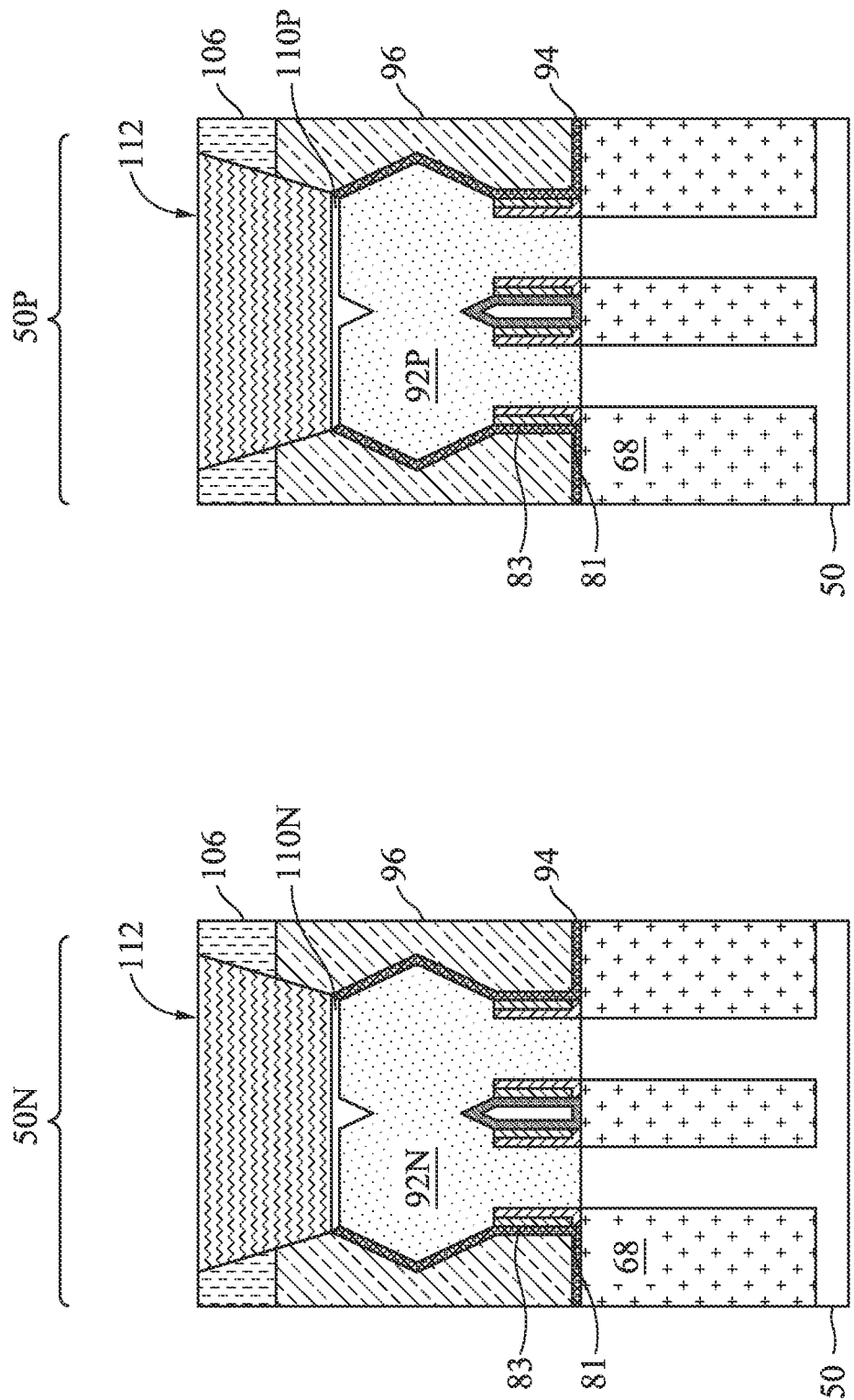

FIGS. 37A-37C illustrate cross-sectional views of a nano-FET device in accordance with some embodiments. FIG. 37A illustrates reference cross-section A-A' illustrated in FIG. 1. FIG. 37B illustrates reference cross-section B-B' illustrated in FIG. 1. FIG. 37C illustrates reference cross-section C-C' illustrated in FIG. 1. The structure of FIGS. 37A-37C is similar to the structure of FIGS. 28A-28C, with like reference numerals indicating like elements formed by like processes and the description is not repeated herein. In the illustrated embodiment, after forming the epitaxial source/drain regions 92N as described above with reference to FIGS. 17A and 17B, a thermal process similar to the thermal process described above with reference to FIGS. 13A and 13B is performed to drive dopants of the epitaxial source/drain regions 92N into the nanostructures 54A-54C to form doped nanostructures 54A"-54C", with the distinction that n-type dopants such as, for example, phosphorus (P) atoms are driven into the nanostructures 54A-54C to form the doped nanostructures 54A"-54C". A dopant concentration profile in the doped nanostructures 54A"-54C" is similar to the dopant concentration profile in the doped nanostructures 54A'-54C' as described above with reference to FIG. 25E, with the distinction that, in the illustrated embodiment, the doped nanostructures 54A"-54C" comprise n-type dopants compared to the doped nanostructures 54A'-54C' that comprise p-type dopants.

Figure 38A:
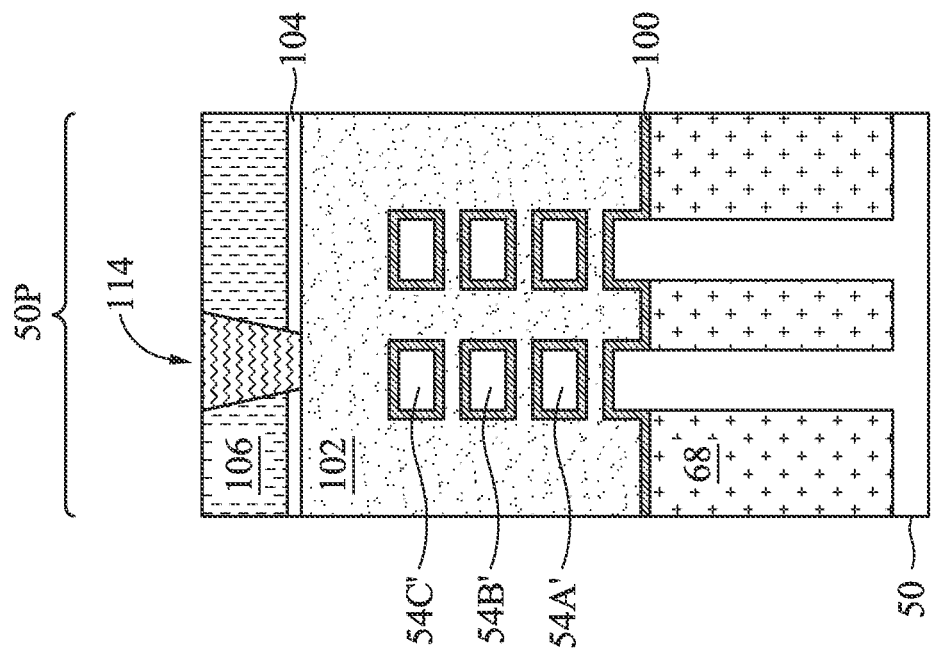
FIGS. 38A, 38B, and 38C are cross-sectional views of a nano-FET, in accordance with some embodiments.
Figure 38A:
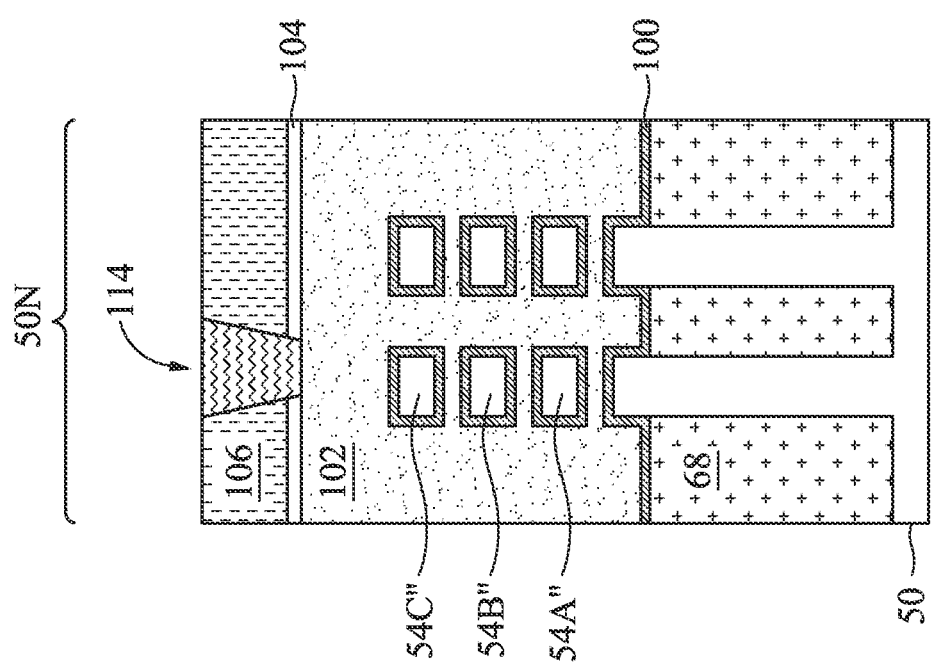
Figure 38B:
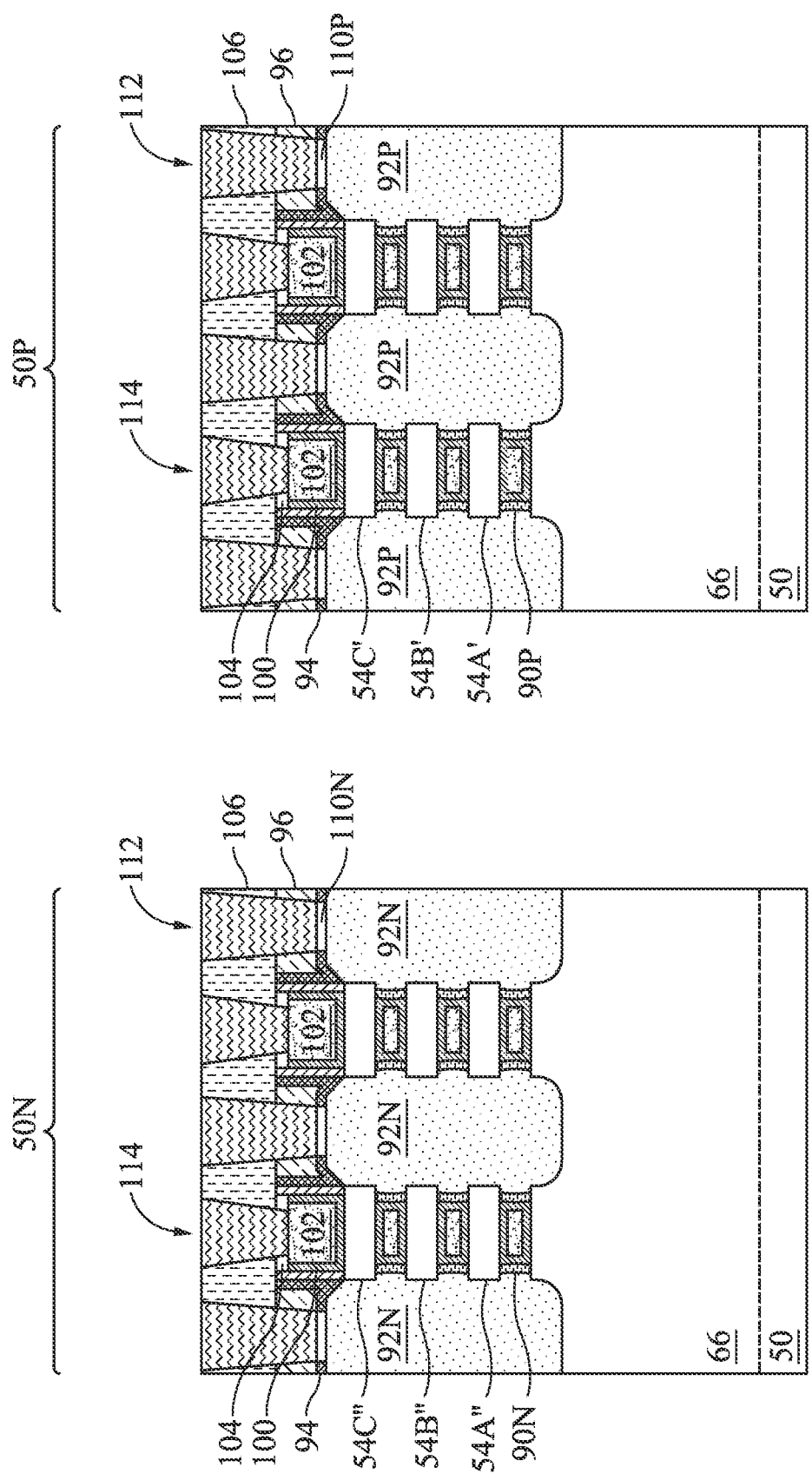
Figure 38C:
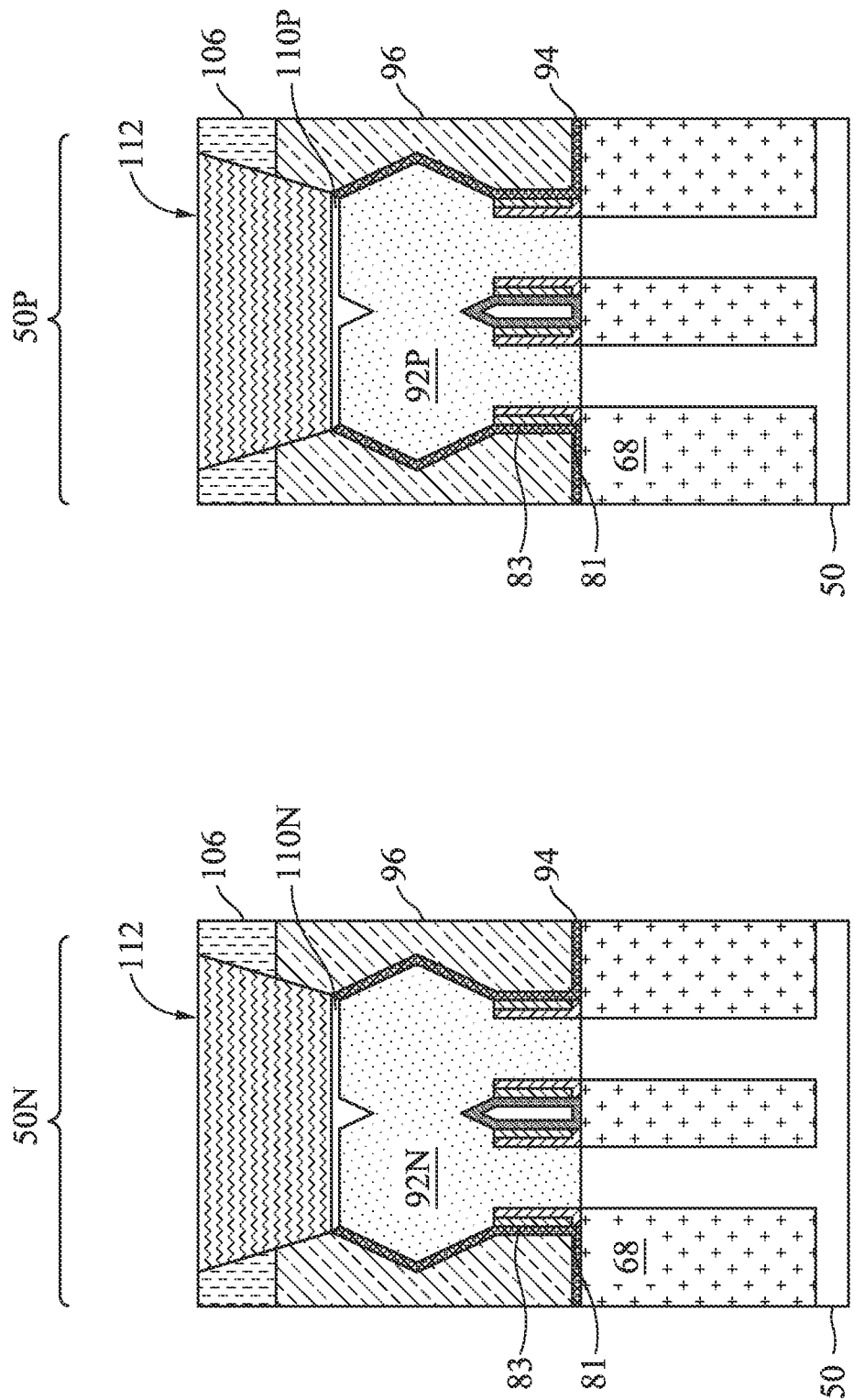

FIGS. 38A-38C illustrate cross-sectional views of a nano-FET device in accordance with some embodiments. FIG. 38A illustrates reference cross-section A-A' illustrated in FIG. 1. FIG. 38B illustrates reference cross-section B-B' illustrated in FIG. 1. FIG. 38C illustrates reference cross-section C-C' illustrated in FIG. 1. The structure of FIGS. 38A-38C is similar to the structure of FIGS. 29A-29C, with like reference numerals indicating like elements formed by like processes and the description is not repeated herein. In the illustrated embodiment, after forming the epitaxial source/drain regions 92N as described above with reference to FIGS. 17A and 17B, a thermal process similar to the thermal process described above with reference to FIGS. 13A and 13B is performed to drive dopants of the epitaxial source/drain regions 92N into the nanostructures 54A-54C to form doped nanostructures 54A"-54C", with the distinction that n-type dopants such as, for example, phosphorus (P) atoms are driven into the nanostructures 54A-54C to form the doped nanostructures 54A"-54C". A dopant concentration profile in the doped nanostructures 54A"-54C" is similar to the dopant concentration profile in the doped nanostructures 54A'-54C' as described above with reference to FIG. 28E, with the distinction that, in the illustrated embodiment, the doped nanostructures 54A"-54C" comprise n-type dopants compared to the doped nanostructures 54A'-54C' that comprise p-type dopants.

Figure 39A:
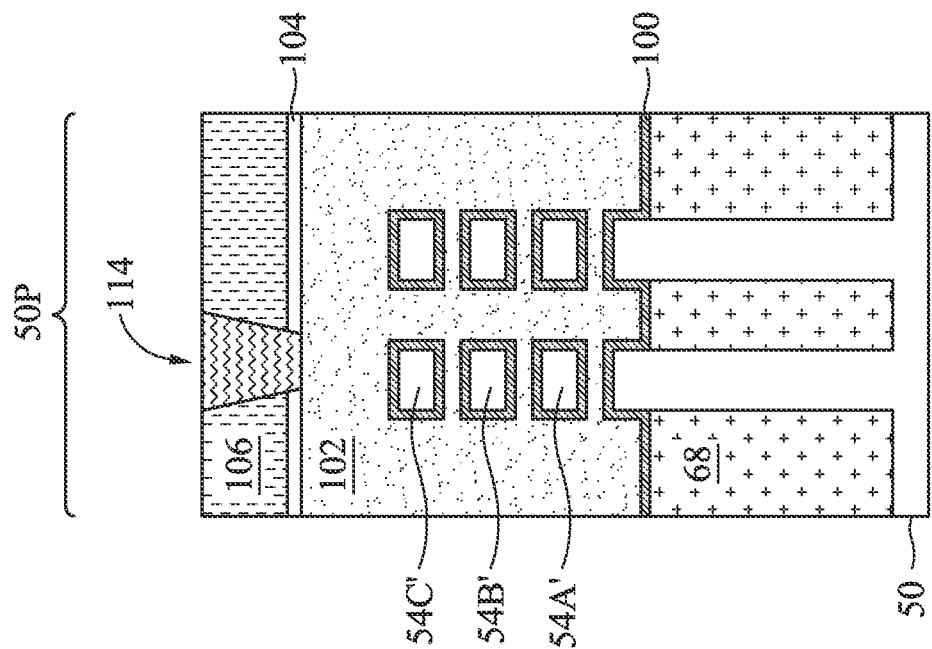
FIGS. 39A, 39B, and 39C are cross-sectional views of a nano-FET, in accordance with some embodiments.
Figure 39A:
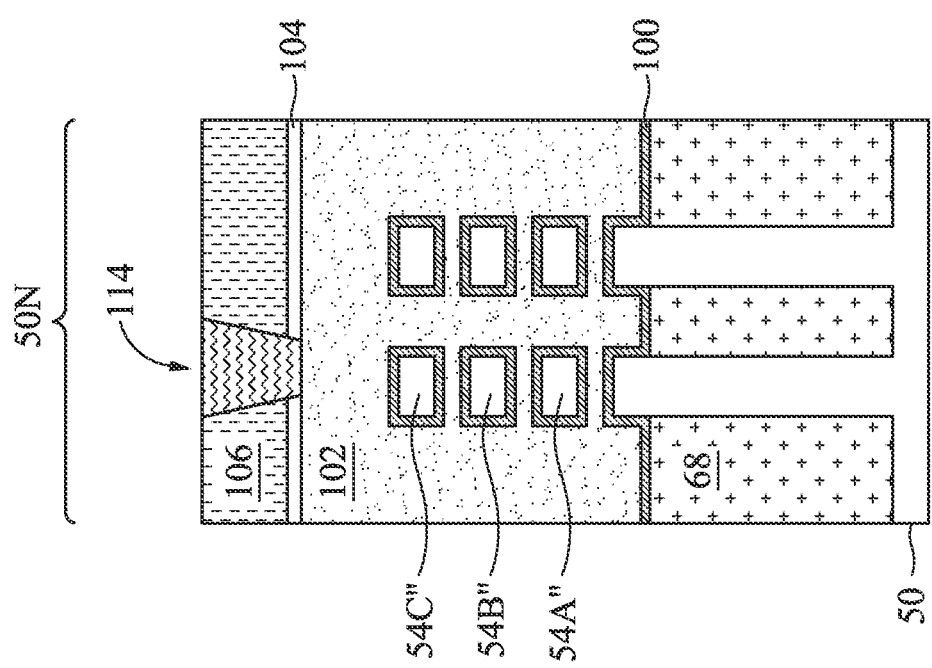
Figure 39B:
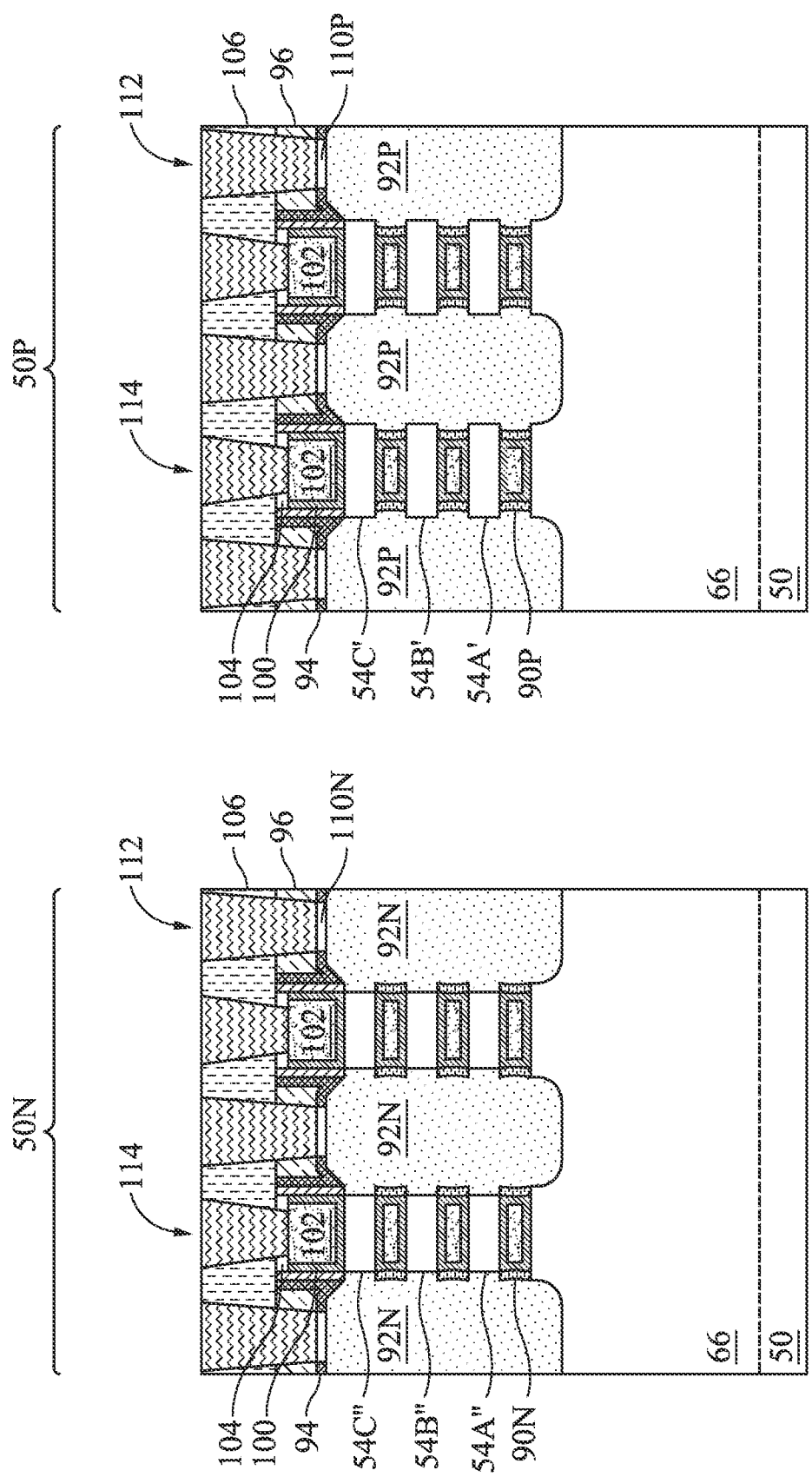
Figure 39C:
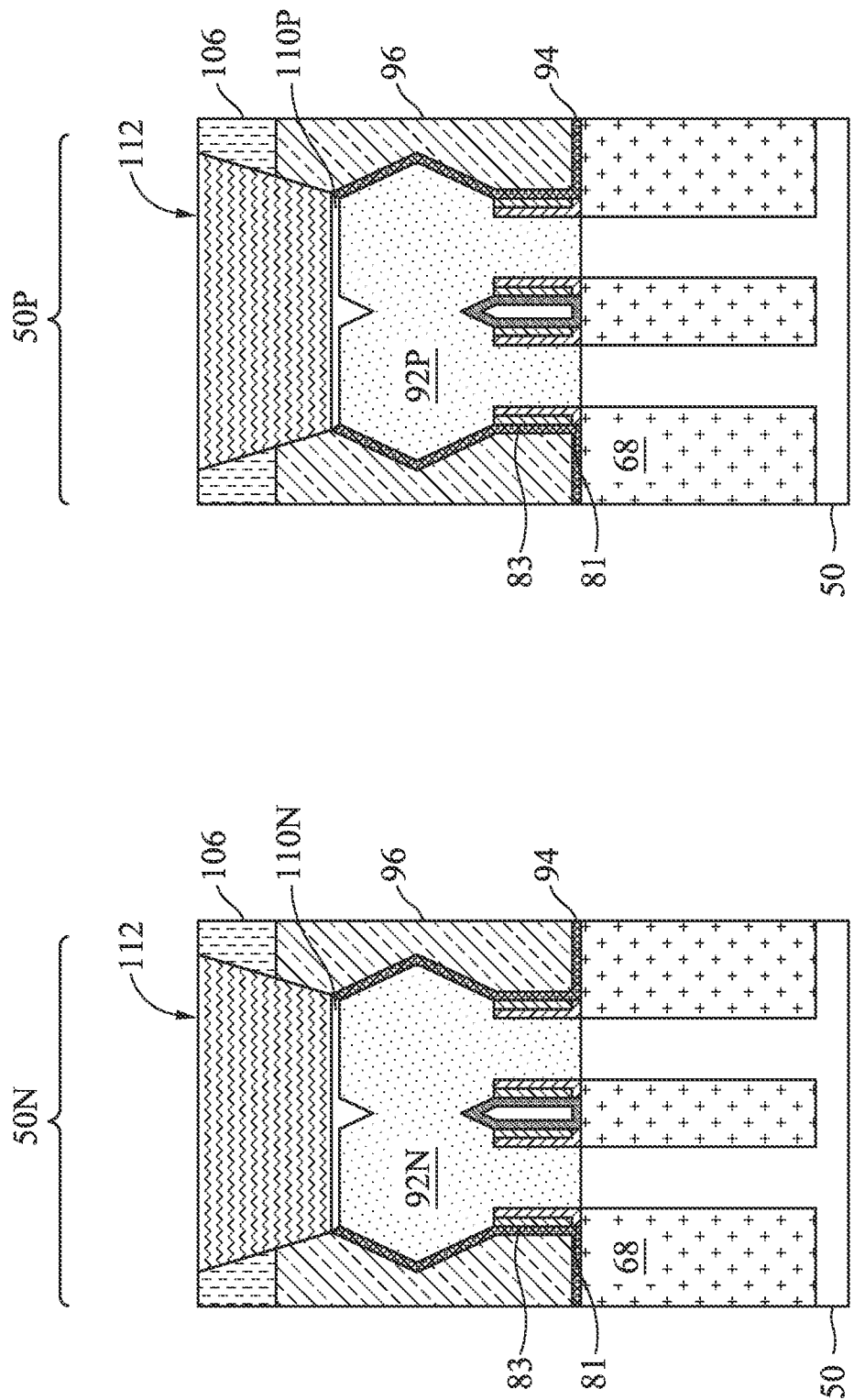

FIGS. 39A-39C illustrate cross-sectional views of a nano-FET device in accordance with some embodiments. FIG. 39A illustrates reference cross-section A-A' illustrated in FIG. 1. FIG. 39B illustrates reference cross-section B-B' illustrated in FIG. 1. FIG. 39C illustrates reference cross-section C-C' illustrated in FIG. 1. The structure of FIGS. 39A-39C is similar to the structure of FIGS. 30A-30C, with like reference numerals indicating like elements formed by like processes and the description is not repeated herein. In the illustrated embodiment, after forming the epitaxial source/drain regions 92N as described above with reference to FIGS. 17A and 17B, a thermal process similar to the thermal process described above with reference to FIGS. 13A and 13B is performed to drive dopants of the epitaxial source/drain regions 92N into the nanostructures 54A-54C to form doped nanostructures 54A"-54C", with the distinction that n-type dopants such as, for example, phosphorus (P) atoms are driven into the nanostructures 54A-54C to form the doped nanostructures 54A"-54C". A dopant concentration profile in the doped nanostructures 54A"-54C" is similar to the dopant concentration profile in the doped nanostructures 54A'-54C' as described above with reference to FIG. 31E, with the distinction that, in the illustrated embodiment, the doped nanostructures 54A"-54C" comprise n-type dopants compared to the doped nanostructures 54A'-54C' that comprise p-type dopants.

Figure 40A:
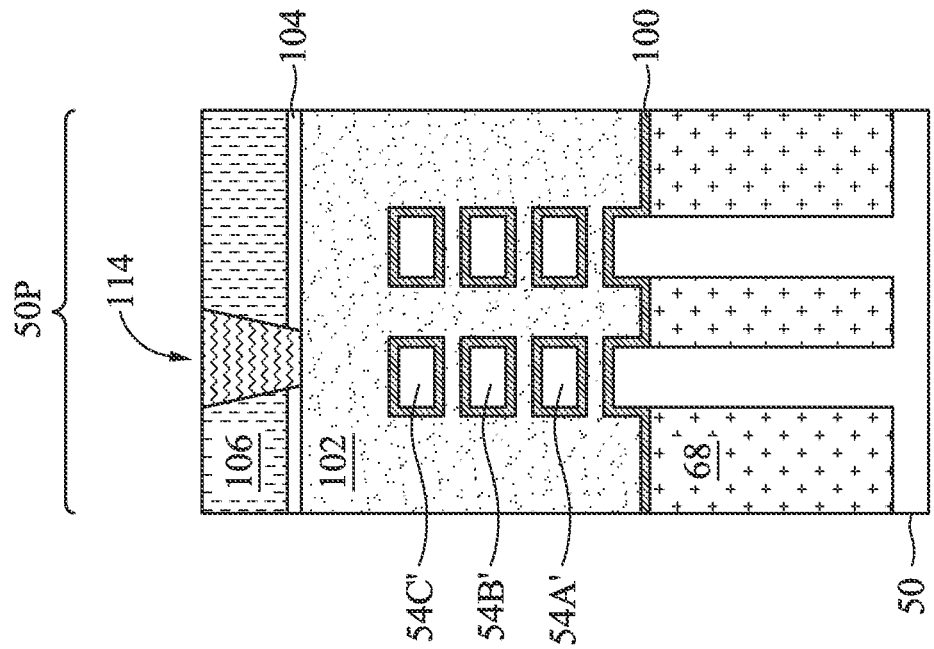
FIGS. 40A, 40B, and 40C are cross-sectional views of a nano-FET, in accordance with some embodiments.
Figure 40A:
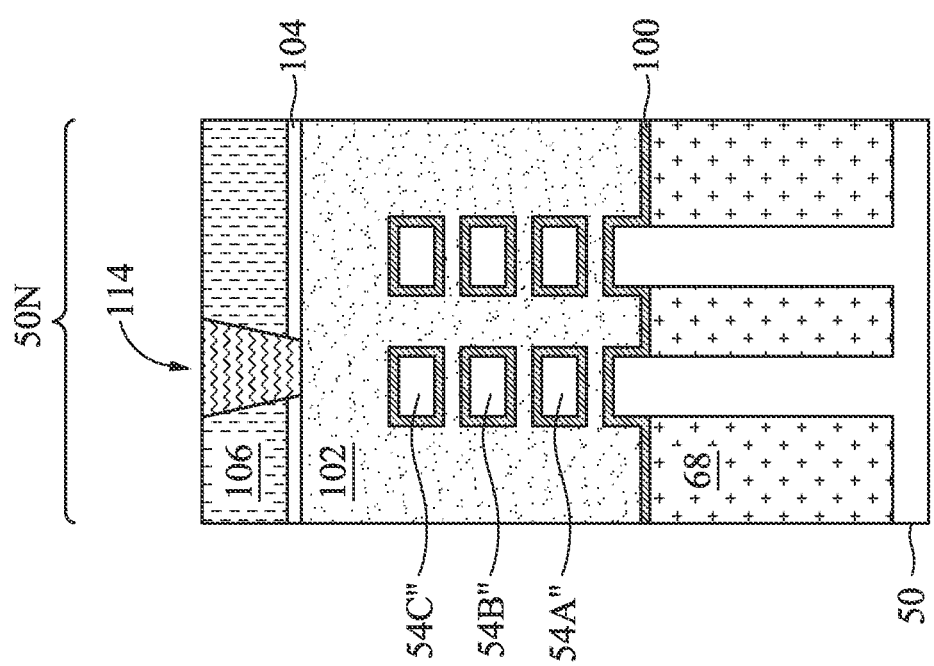
Figure 40B:
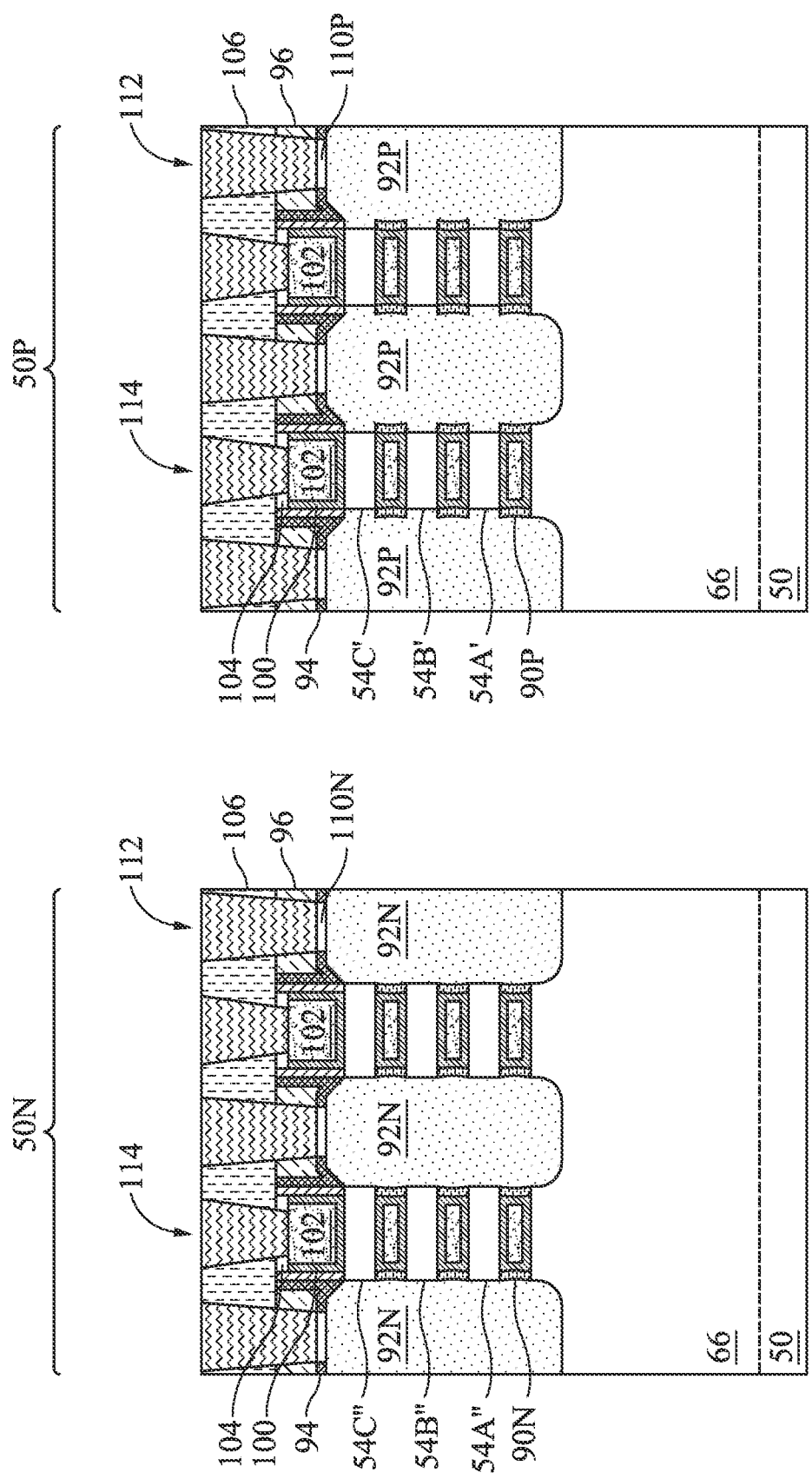
Figure 40C:
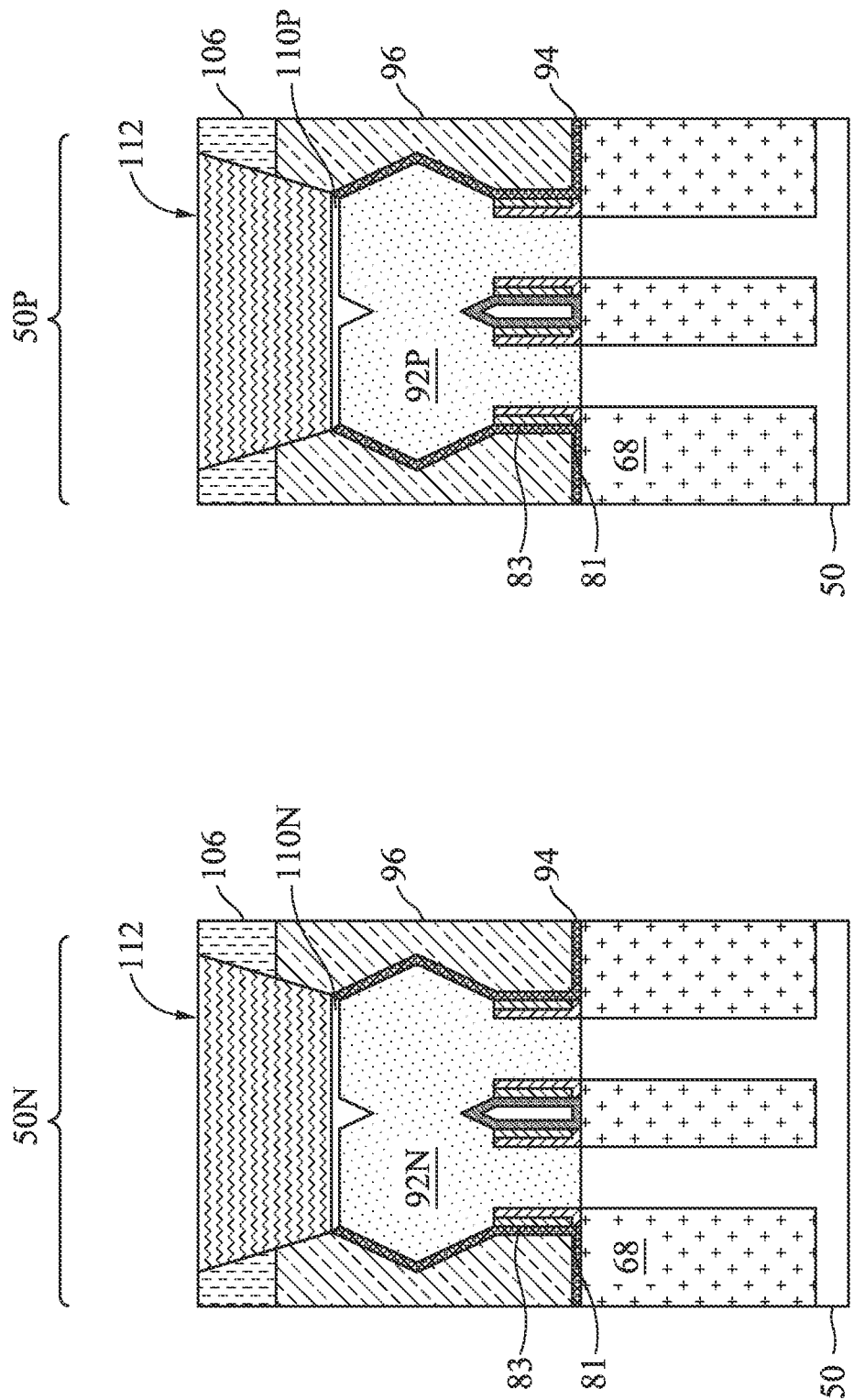

FIGS. 40A-40C illustrate cross-sectional views of a nano-FET device in accordance with some embodiments. FIG. 40A illustrates reference cross-section A-A' illustrated in FIG. 1. FIG. 40B illustrates reference cross-section B-B' illustrated in FIG. 1. FIG. 40C illustrates reference cross-section C-C' illustrated in FIG. 1. The structure of FIGS. 40A-40C is similar to the structure of FIGS. 31A-31C, with like reference numerals indicating like elements formed by like processes and the description is not repeated herein. In the illustrated embodiment, after forming the epitaxial source/drain regions 92N as described above with reference to FIGS. 17A and 17B, a thermal process similar to the thermal process described above with reference to FIGS. 13A and 13B is performed to drive dopants of the epitaxial source/drain regions 92N into the nanostructures 54A-54C to form doped nanostructures 54A"-54C", with the distinction that n-type dopants such as, for example, phosphorus (P) atoms are driven into the nanostructures 54A-54C to form the doped nanostructures 54A"-54C". A dopant concentration profile in the doped nanostructures 54A"-54C" is similar to the dopant concentration profile in the doped nanostructures 54A'-54C' as described above with reference to FIG. 25E, with the distinction that, in the illustrated embodiment, the doped nanostructures 54A"-54C" comprise n-type dopants compared to the doped nanostructures 54A'-54C' that comprise p-type dopants.

Figure 41A:
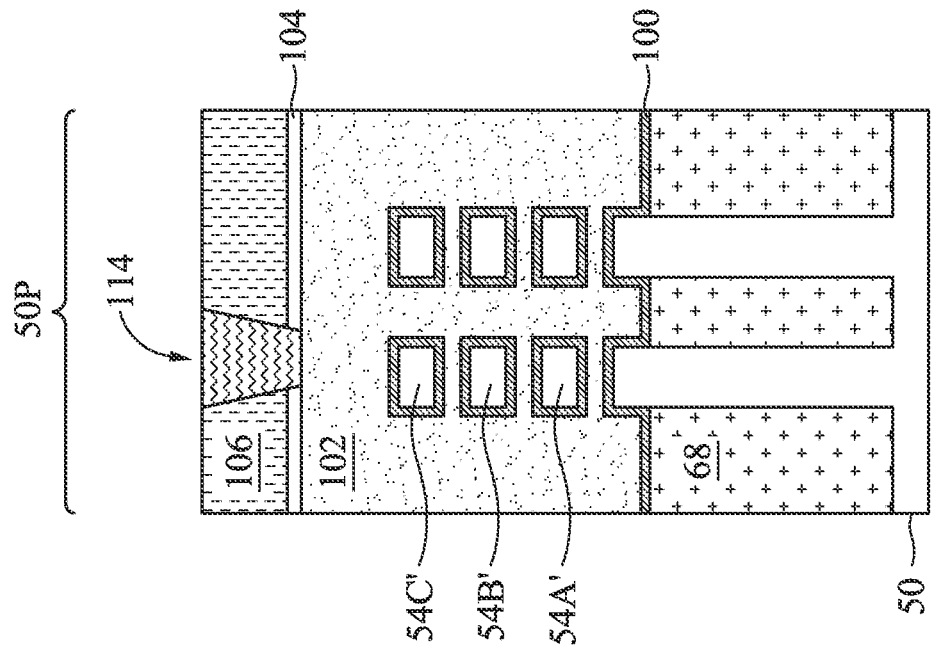
FIGS. 41A, 41B, and 41C are cross-sectional views of a nano-FET, in accordance with some embodiments.
Figure 41A:
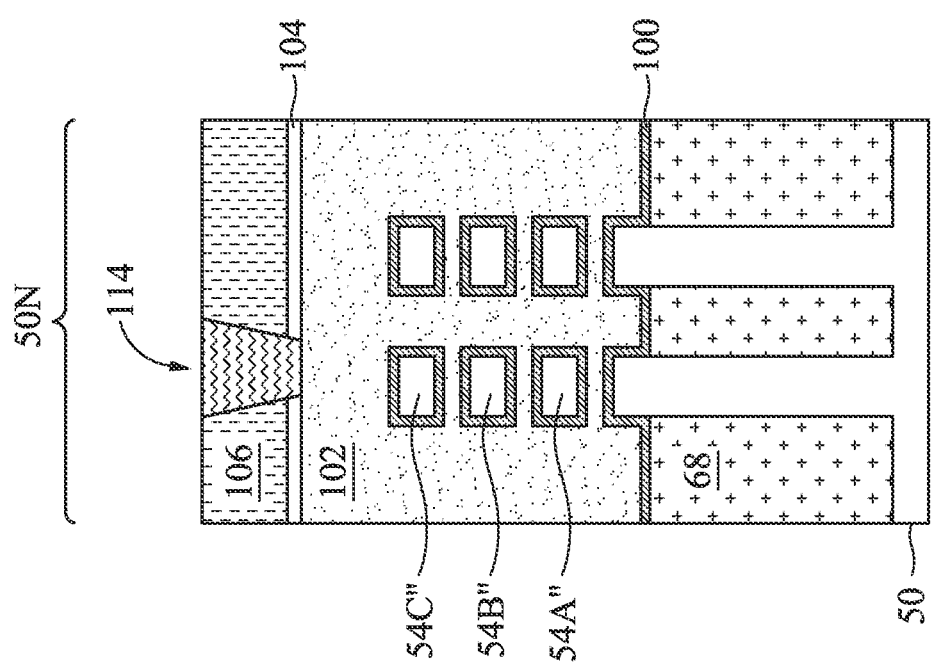
Figure 41B:
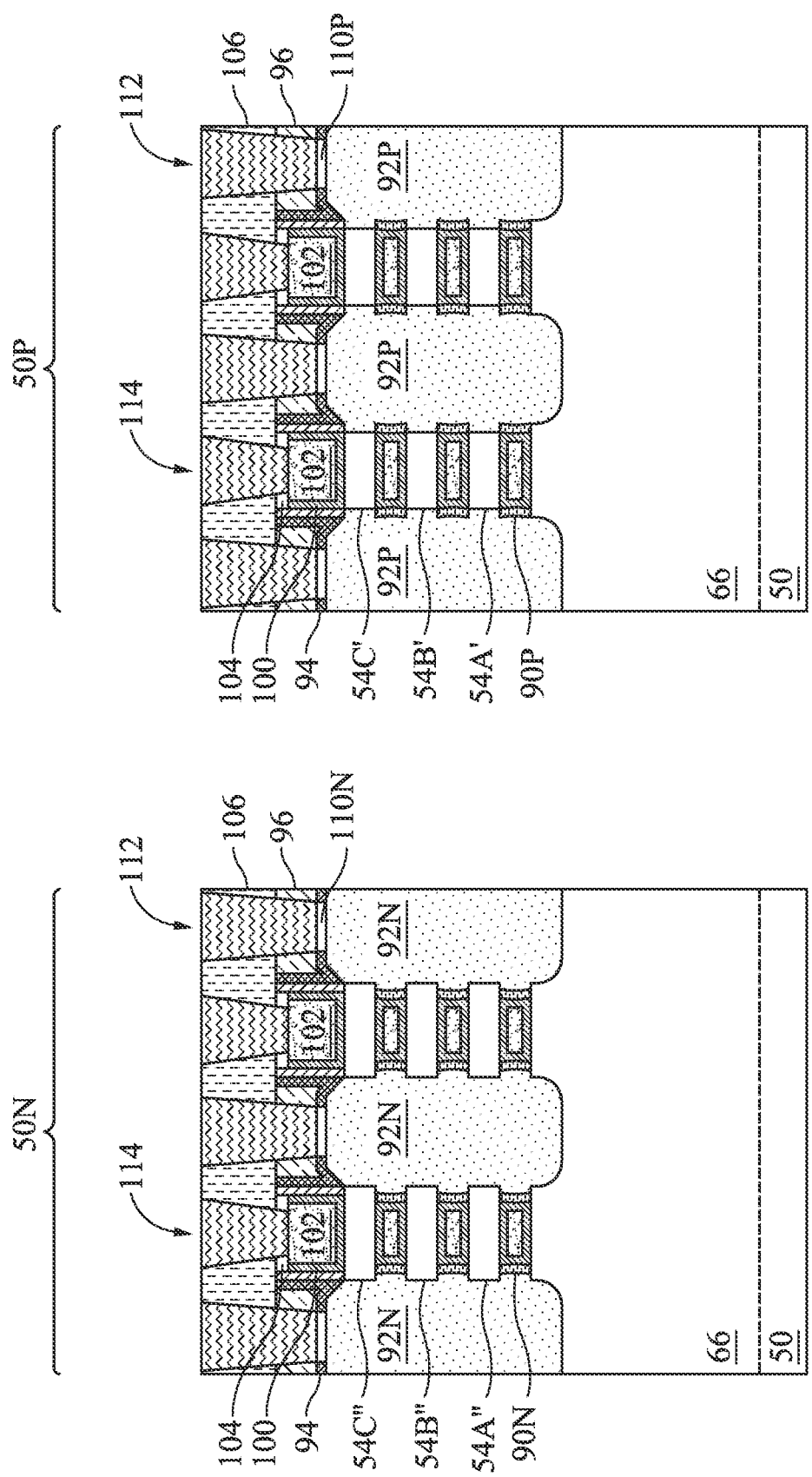
Figure 41C:
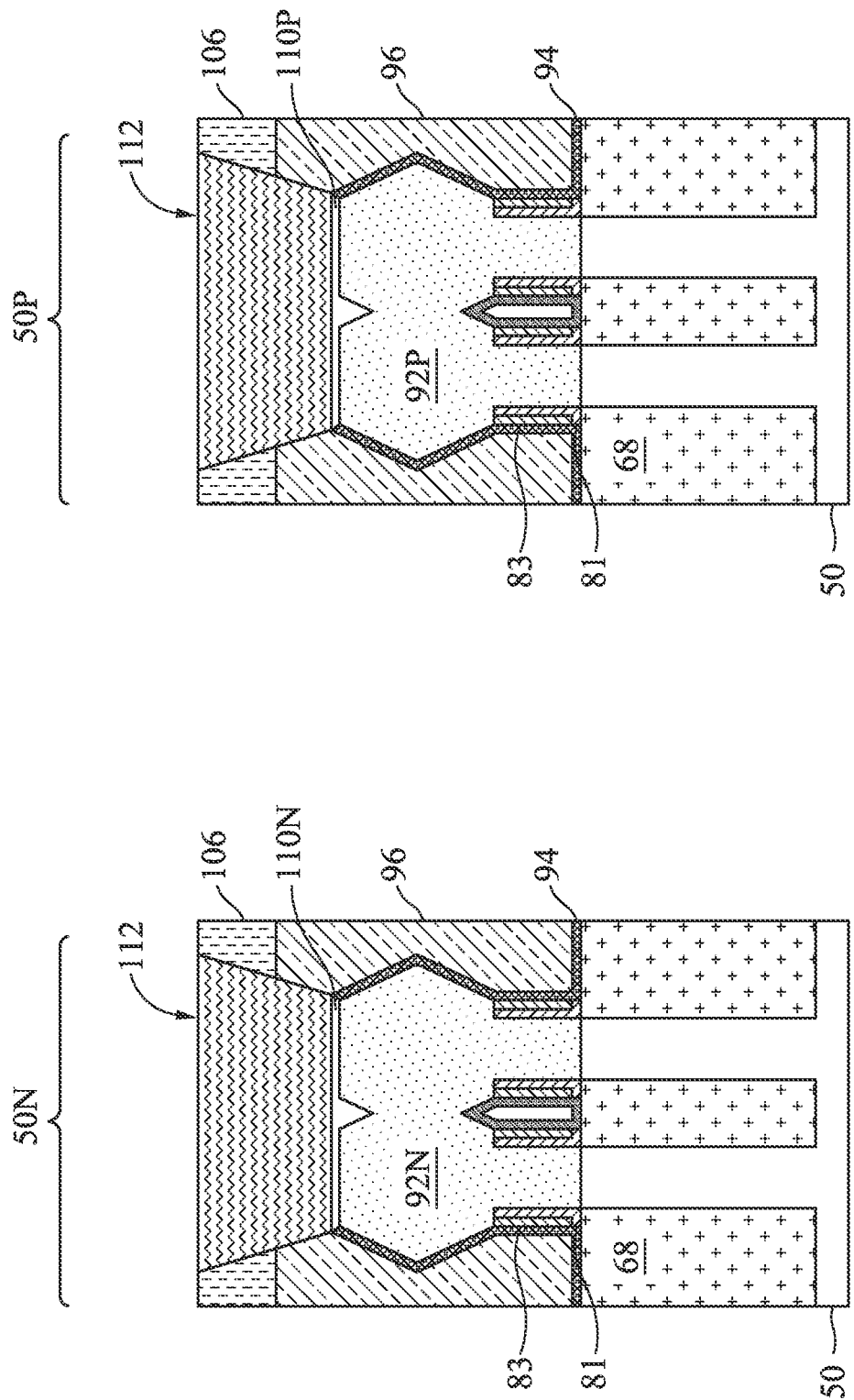

FIGS. 41A-41C illustrate cross-sectional views of a nano-FET device in accordance with some embodiments. FIG. 41A illustrates reference cross-section A-A' illustrated in FIG. 1. FIG. 41B illustrates reference cross-section B-B' illustrated in FIG. 1. FIG. 41C illustrates reference cross-section C-C' illustrated in FIG. 1. The structure of FIGS. 41A-41C is similar to the structure of FIGS. 32A-32C, with like reference numerals indicating like elements formed by like processes and the description is not repeated herein. In the illustrated embodiment, after forming the epitaxial source/drain regions 92N as described above with reference to FIGS. 17A and 17B, a thermal process similar to the thermal process described above with reference to FIGS. 13A and 13B is performed to drive dopants of the epitaxial source/drain regions 92N into the nanostructures 54A-54C to form doped nanostructures 54A"-54C", with the distinction that n-type dopants such as, for example, phosphorus (P) atoms are driven into the nanostructures 54A-54C to form the doped nanostructures 54A"-54C". A dopant concentration profile in the doped nanostructures 54A"-54C" is similar to the dopant concentration profile in the doped nanostructures 54A'-54C' as described above with reference to FIG. 28E, with the distinction that, in the illustrated embodiment, the doped nanostructures 54A"-54C" comprise n-type dopants compared to the doped nanostructures 54A'-54C' that comprise p-type dopants.

Figure 42A:
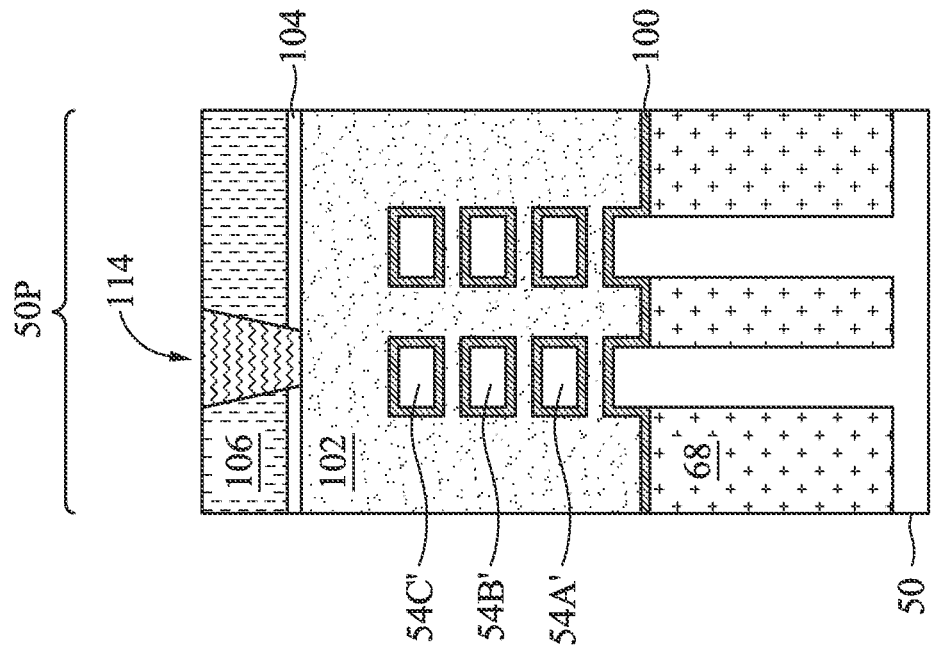
FIGS. 42A, 42B, and 42C are cross-sectional views of a nano-FET, in accordance with some embodiments.
Figure 42A:
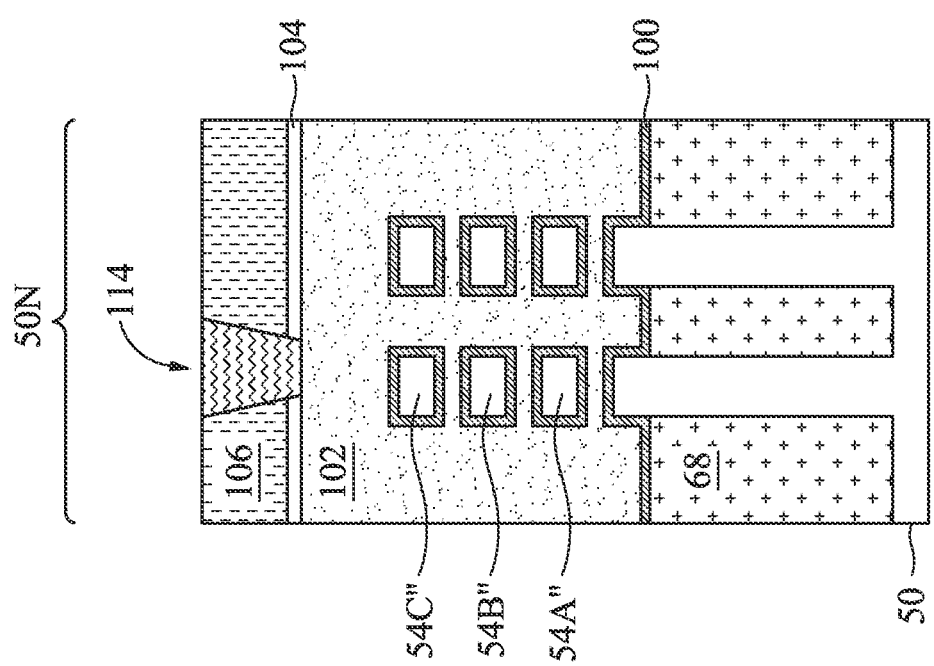
Figure 42B:
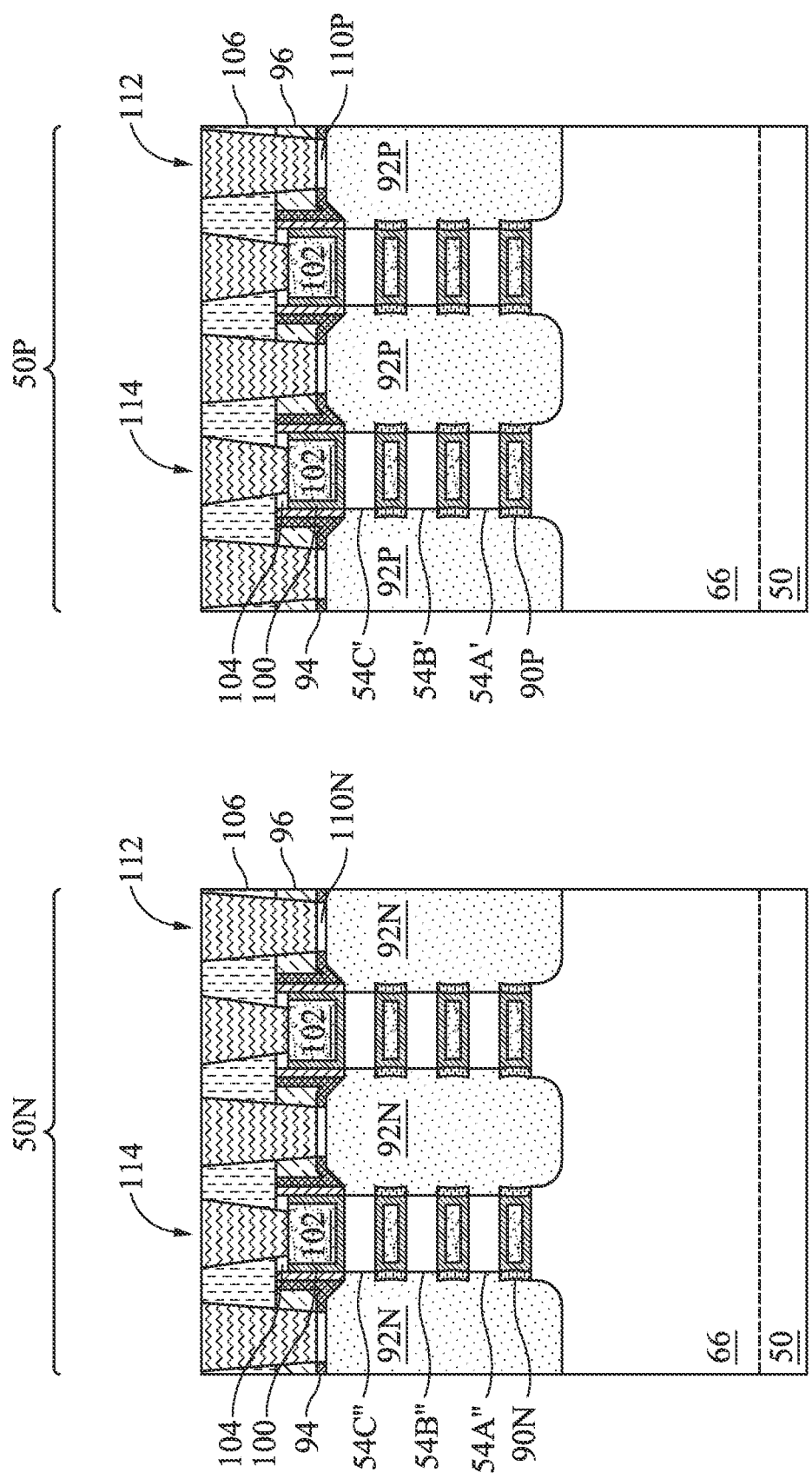
Figure 42C:
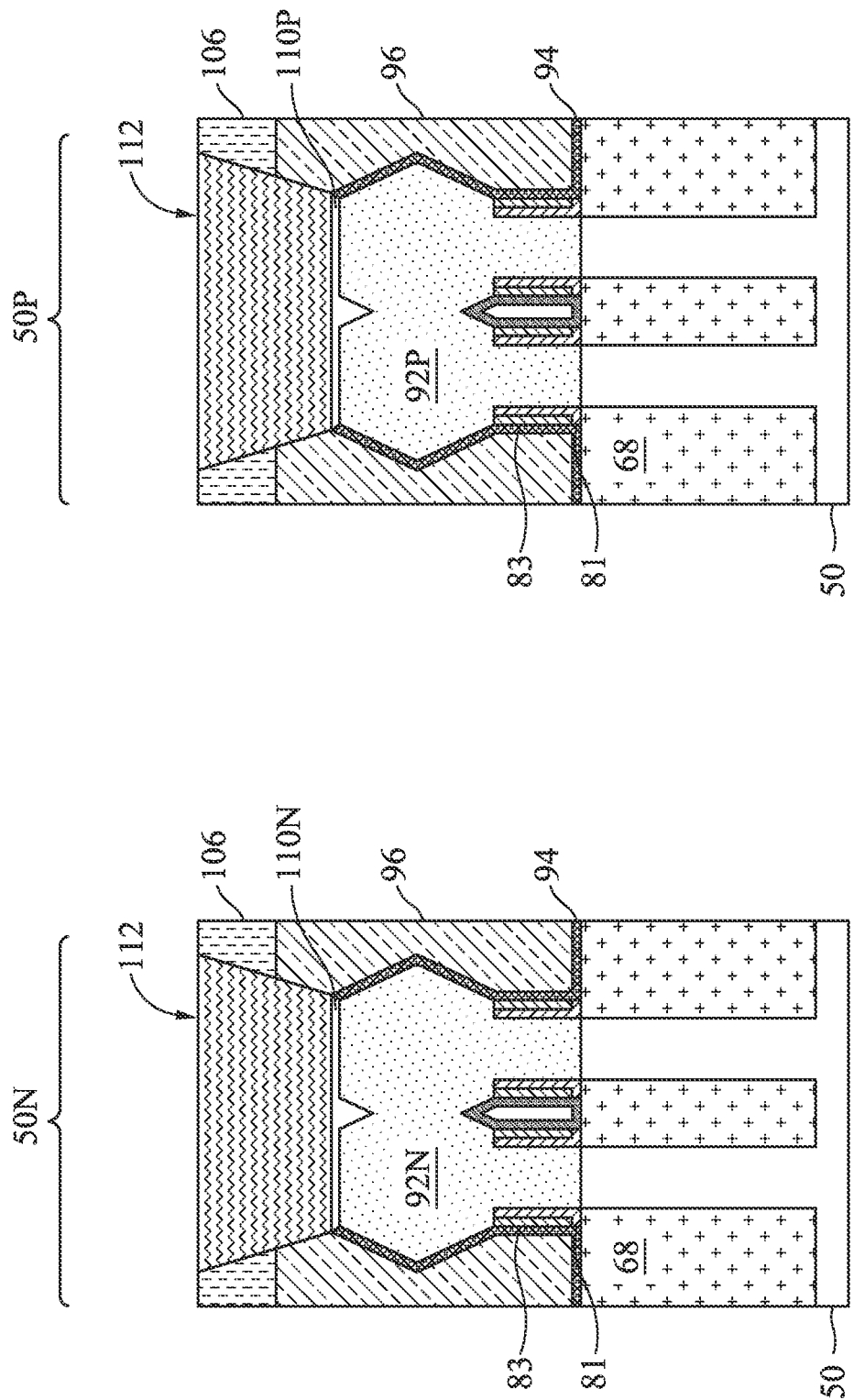

FIGS. 42A-42C illustrate cross-sectional views of a nano-FET device in accordance with some embodiments. FIG. 42A illustrates reference cross-section A-A' illustrated in FIG. 1. FIG. 42B illustrates reference cross-section B-B' illustrated in FIG. 1. FIG. 42C illustrates reference cross-section C-C' illustrated in FIG. 1. The structure of FIGS. 42A-42C is similar to the structure of FIGS. 33A-33C, with like reference numerals indicating like elements formed by like processes and the description is not repeated herein. In the illustrated embodiment, after forming the epitaxial source/drain regions 92N as described above with reference to FIGS. 17A and 17B, a thermal process similar to the thermal process described above with reference to FIGS. 13A and 13B is performed to drive dopants of the epitaxial source/drain regions 92N into the nanostructures 54A-54C to form doped nanostructures 54A"-54C", with the distinction that n-type dopants such as, for example, phosphorus (P) atoms are driven into the nanostructures 54A-54C to form the doped nanostructures 54A"-54C". A dopant concentration profile in the doped nanostructures 54A"-54C" is similar to the dopant concentration profile in the doped nanostructures 54A'-54C' as described above with reference to FIG. 31E, with the distinction that, in the illustrated embodiment, the doped nanostructures 54A"-54C" comprise n-type dopants compared to the doped nanostructures 54A'-54C' that comprise p-type dopants.

Embodiments may achieve advantages. Various embodiments presented herein allow for reducing a channel resistance ($R_{ch}$) of a nano-FET by thermally driving dopants within epitaxial source/drain regions into nanostructures (e.g., nanosheets, nanowire, or the like) of a nano-FET device.

In accordance with an embodiment, a method includes forming a fin structure on a substrate. The fin structure includes a plurality of first nanostructures and a plurality of second nanostructures alternately stacked. A dummy gate is formed along sidewalls and a top surface of the fin structure. A portion of the fin structure exposed by the dummy gate is recessed to form a first recess. An epitaxial source/drain region is formed in the first recess. Dopant atoms within the epitaxial source/drain region are driven into the plurality of second nanostructures. The dummy gate and the plurality of first nanostructures are removed. A replacement gate is formed wrapping around the plurality of second nanostructures. In an embodiment, an average concentration of the dopant atoms in a first region of each of the plurality of second nanostructures is greater than about 0.2 at %, a first side of the first region being aligned with a first side of a gate electrode of the replacement gate. In an embodiment, a concentration of the dopant atoms at the first side of the first region is greater than about 5E18 atoms/cm$^3$. In an embodiment, driving the dopant atoms within the epitaxial source/drain region into the plurality of second nanostructures comprises performing a thermal anneal process at a temperature between about 875° C. and about 1000° C. In an embodiment, the thermal anneal process is performed under a gas atmosphere comprising $N_2$ gas, $O_2$ gas, or a mixture thereof. In an embodiment, the thermal anneal process is performed for a duration between about 1 sec and about 2 sec. In an embodiment, the plurality of second nanostructures comprise silicon and the epitaxial source/drain region comprises boron-doped silicon germanium.

In accordance with another embodiment, a method includes forming a stack comprising first nanosheets and second nanosheets over a substrate. The first nanosheets and the second nanosheets are arranged in an alternating manner in the stack. A dummy gate is formed over the stack. The stack is etched to form a first recess adjacent the dummy gate. The first recess extends through the first nanosheets and the second nanosheets. Sidewalls of the second nanosheets exposed by the first recess are etched to form second recesses. The second recesses extend between adjacent ones of the first nanosheets. Inner spacers are formed in the second recesses. A semiconductor material is epitaxially grown in the first recess to form an epitaxial source/drain region in the first recess. The semiconductor material includes first dopant atoms. The first dopant atoms are thermally driven into the first nanosheets. The dummy gate is etched to form a third recess. The second nanosheets are etched to extend the third recess. A replacement gate is formed in the third recess. Forming the replacement gate includes forming a gate dielectric in the third recess. The gate dielectric wraps around the first nanosheets. A gate electrode is formed over the gate dielectric. The gate electrode fills a remaining portion of the third recess. An average concentration of the first dopant atoms in a first region of each of the first nanosheets is greater than about 0.2 at %. In an embodiment, thermally driving the first dopant atoms into the first nanosheets comprises a high temperature anneal process. In an embodiment, the high temperature anneal process is performed at a temperature between about 875° C. and about 1000° C. In an embodiment, the high temperature anneal process is performed under a gas atmosphere including $N_2$ gas, $O_2$ gas, or a mixture thereof. In an embodiment, the high temperature anneal process is performed for a duration between about 1 sec and about 2 sec. In an embodiment, a concentration of the first dopant atoms at a first side of the first region is greater than about 5E18 atoms/cm$^3$, the first side of the first region being aligned with a first side of the gate electrode.

In accordance with yet another embodiment, a device includes a nanosheet comprising first dopant atoms, and a gate structure wrapping around the nanosheet. An average concentration of the first dopant atoms in a first region of the nanosheet is greater than about 0.2 at %. The first region has a first side and a second side opposite to the first side. The first side of the first region is spaced apart from a first side of the nanosheet. The gate structure includes a gate dielectric wrapping around the nanosheet, and a gate electrode over the gate dielectric. The device further includes an epitaxial source/drain region adjacent to the nanosheet and the gate structure, and an inner spacer interposed between the epitaxial source/drain region and the gate structure. The epitaxial source/drain region is in physical contact with the first side of the nanosheet. The epitaxial source/drain region and the nanosheet include a same dopant species. The inner spacer is in physical contact with the epitaxial source/drain region. In an embodiment, a concentration of the first dopant atoms at the second side of the first region is greater than about 5E18 atoms/cm3. In an embodiment, the first region has a shape of a square box. In an embodiment, the epitaxial source/drain region is in physical contact with a top surface and a bottom surface of the nanosheet. In an embodiment, the epitaxial source/drain region is in physical contact with a top surface and a bottom surface of the inner spacer. In an embodiment, a length of the gate electrode is greater than an effective channel length. In an embodiment, an interface between the inner spacer and the epitaxial source/drain region is curved.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a fin structure on a substrate, the fin structure comprising a plurality of first nanostructures and a plurality of second nanostructures alternately stacked;
forming a dummy gate along sidewalls and a top surface of the fin structure;
recessing a portion of the fin structure exposed by the dummy gate to form a first recess;
forming an epitaxial source/drain region in the first recess;
after forming the epitaxial source/drain region, driving dopant atoms within the epitaxial source/drain region into the plurality of second nanostructures;
removing the dummy gate and the plurality of first nanostructures; and
forming a replacement gate structure wrapping around the plurality of second nanostructures, wherein the replacement gate structure includes a gate dielectric layer and a conductive gate electrode, wherein the dopant atoms extend at least to a point aligned with a lateral edge of the gate dielectric layer of the replacement gate structure.

2. The method of claim 1, wherein an average concentration of the dopant atoms in a first region of each of the plurality of second nanostructures is greater than about 0.2 at %, a first side of the first region being aligned with a first side of a gate electrode of the replacement gate structure.

3. The method of claim 2, wherein a concentration of the dopant atoms at the first side of the first region is greater than about 5E18 atoms/cm$^3$.

4. The method of claim 1, wherein driving the dopant atoms within the epitaxial source/drain region into the plurality of second nanostructures comprises performing a thermal anneal process at a temperature between about 875° C. and about 1000° C.

5. The method of claim 4, wherein the thermal anneal process is performed under a gas atmosphere comprising $N_2$ gas, $O_2$ gas, or a mixture thereof.

6. The method of claim 5, wherein the thermal anneal process is performed for a duration between about 1 sec and about 2 sec.

7. The method of claim 1, wherein the plurality of second nanostructures comprise silicon and the epitaxial source/drain region comprises boron-doped silicon germanium.

8. A method comprising:
forming a stack comprising first nanosheets and second nanosheets over a substrate, the first nanosheets and the second nanosheets being arranged in an alternating manner in the stack;
forming a dummy gate over the stack;
etching the stack to form a first recess adjacent the dummy gate, the first recess extending through the first nanosheets and the second nanosheets;
etching sidewalls of the second nanosheets exposed by the first recess to form second recesses, the second recesses extending between adjacent ones of the first nanosheets;
forming inner spacers in the second recesses;
epitaxially growing a semiconductor material in the first recess to form an epitaxial source/drain region in the first recess, the semiconductor material comprising first dopant atoms;
thermally driving the first dopant atoms from the semiconductor material in the epitaxial source/drain region into the first nanosheets;
after thermally driving, etching the dummy gate to form a third recess;
after etching the dummy gate, etching the second nanosheets to extend the third recess; and
after etching the second nanosheets, forming a replacement gate in the third recess, forming the replacement gate comprising:
forming a gate dielectric in the third recess, the gate dielectric wrapping around the first nanosheets; and
forming a gate electrode over the gate dielectric, the gate electrode filling a remaining portion of the third recess, wherein an average concentration of the first dopant atoms in a first region of each of the first nanosheets is greater than about 0.2 at %.

9. The method of claim 8, wherein thermally driving the first dopant atoms into the first nanosheets comprises a high temperature anneal process.

10. The method of claim 9, wherein the high temperature anneal process is performed at a temperature between about 875° C. and about 1000° C.

11. The method of claim 10, wherein the high temperature anneal process is performed under a gas atmosphere comprising $N_2$ gas, $O_2$ gas, or a mixture thereof.

12. The method of claim 11, wherein the high temperature anneal process is performed for a duration between about 1 sec and about 2 sec.

13. The method of claim 8, wherein a concentration of the first dopant atoms at a first side of the first region is greater than about 5E18 atoms/cm$^3$, the first side of the first region being aligned with a first side of the gate electrode.

14. The method of claim 8, wherein, after thermally driving the first dopant atoms into the first nanosheets, the first dopant atoms extend at least to a point aligned with a sidewall of the inner spacers facing the gate electrode.

15. A method comprising:
forming a strip over a substrate, the strip including alternating layers of a first material and a second material, the first material being a semiconductor material;
forming a source/drain region adjacent the strip, the source/drain region comprising first dopants;
thermally driving the first dopants into the alternating layers of the first material; and
replacing the alternating layers of the second material with a gate structure, wherein the first dopants extend to a point aligned with an edge of a conductive element of the gate structure.

16. The method of claim 15, further comprising:
etching the strip to form a first recess, the first recess extending through the alternating layers of the first material and the second material;
etching sidewalls of the alternating layers of the second material exposed by the first recess to form second recesses; and
forming inner spacers in the second recesses, wherein the gate structure contacts the inner spacers.

17. The method of claim 15, wherein thermally driving the first dopants comprises a high temperature anneal process.

18. The method of claim 17, wherein the high temperature anneal process is performed at a temperature between about 875° C. and about 1000° C.

19. The method of claim 18, wherein the high temperature anneal process is performed under a gas atmosphere comprising $N_2$ gas, $O_2$ gas, or a mixture thereof.

20. The method of claim 15, wherein a first layer of the alternating layers of the first material has an average concentration of the first dopants greater than about 0.2 at % in a region between the edge of the conductive element of the gate structure and a location spaced apart from an edge of the first layer.

* * * * *